(12) United States Patent
Kim et al.

(10) Patent No.: US 9,911,926 B2

(45) Date of Patent: Mar. 6, 2018

US009911926B2

(54) ORGANIC LIGHT-EMITTING DEVICE

(71) Applicant: SAMSUNG DISPLAY CO., LTD., Yongin, Gyeonggi-Do (KR)

(72) Inventors: Sehun Kim, Yongin (KR); Mikyung Kim, Yongin (KR); Kwanhee Lee, Yongin (KR); Hyein Jeong, Yongin (KR); Changwoong Chu, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 230 days.

(21) Appl. No.: 14/741,622

(22) Filed: Jun. 17, 2015

(65) Prior Publication Data

US 2016/0190475 A1 Jun. 30, 2016

(30) Foreign Application Priority Data

Dec. 26, 2014 (KR) ........................ 10-2014-0191123

(51) Int. Cl.
*H01L 51/00* (2006.01)
*H01L 51/50* (2006.01)

(52) U.S. Cl.
CPC ...... *H01L 51/0072* (2013.01); *H01L 51/0067* (2013.01); *H01L 51/0071* (2013.01);
(Continued)

(58) Field of Classification Search
CPC ............. H01L 51/0072; H01L 51/0073; H01L 51/0067; H01L 51/0071; H01L 51/0052;
(Continued)

(56) References Cited

U.S. PATENT DOCUMENTS

2009/0302743 A1 12/2009 Kato et al.
2010/0032658 A1 2/2010 Lee et al.
(Continued)

FOREIGN PATENT DOCUMENTS

JP 07-138561 5/1995
JP 08-239655 9/1996
(Continued)

OTHER PUBLICATIONS

C.W. Tang, et al., Organic electroluminescent diodes, Applied Physics Letters, 51, 913, 1987.

*Primary Examiner* — Ruiyun Zhang
(74) *Attorney, Agent, or Firm* — Lee & Morse, P.C.

(57) ABSTRACT

An organic light-emitting device includes a first electrode, a second electrode facing the first electrode, and an organic layer between the first electrode and the second electrode, the organic layer including an emission layer. The organic layer includes a first compound represented by one of Formulae 1-1 to 1-3 below and a second compound represented by Formula 2 below:

<Formula 1-1>

<Formula 1-2>

<Formula 1-3>

(Continued)

-continued

<Formula 2>

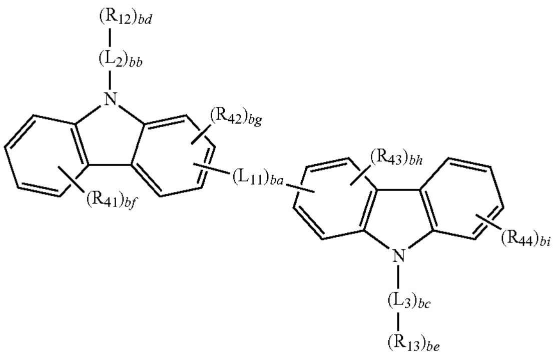

where $A_1$ to $A_5$, $B_1$ to $B_5$, $D_1$ to $D_5$, $R_1$ to $R_5$, $R_{12}$, $R_{13}$, $R_{41}$ to $R_{44}$, $L_{11}$, $L_2$, $L_3$, and ba to bi are as defined in the specification.

20 Claims, 1 Drawing Sheet

(52) U.S. Cl.
CPC ...... *H01L 51/0085* (2013.01); *H01L 51/5016* (2013.01); *H01L 2251/5384* (2013.01); *Y10S 428/917* (2013.01)

(58) Field of Classification Search
CPC ............... H01L 51/006; H01L 51/5206; H01L 51/5016; H01L 2251/5384; Y10S 428/917
USPC ............ 428/690; 257/40, E51.026; 544/212, 544/331, 440; 548/440, 418; 546/111, 546/160, 48; 549/456
See application file for complete search history.

(56) References Cited

U.S. PATENT DOCUMENTS

| | | | |
|---|---|---|---|
| 2011/0062429 | A1 | 3/2011 | Kai et al. |
| 2012/0223295 | A1 | 9/2012 | Inoue et al. |
| 2013/0075716 | A1 | 3/2013 | Nishimura et al. |

FOREIGN PATENT DOCUMENTS

| | | | | |
|---|---|---|---|---|
| JP | 2013-201153 | | | 10/2013 |
| KR | 10-2010-0007780 | | | 1/2010 |
| KR | 10-2011-0010750 | | | 2/2011 |
| KR | 10-2011-0013445 | | | 2/2011 |
| KR | 10-2011-0113470 | A | | 10/2011 |
| KR | 10-2014-0034710 | A | | 3/2014 |
| KR | 10-2014-0037814 | | | 3/2014 |
| KR | 20140034710 | A | * | 3/2014 |

* cited by examiner

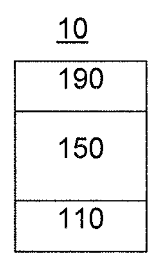
10
190
150
110

ORGANIC LIGHT-EMITTING DEVICE

CROSS-REFERENCE TO RELATED APPLICATION

Korean Patent Application No. 10-2014-0191123, filed on Dec. 26, 2014, in the Korean Intellectual Property Office, and entitled: "Organic Light-Emitting Device," is incorporated by reference herein in its entirety.

BACKGROUND

1. Field

Embodiments relate to an organic light-emitting device.

2. Description of the Related Art

Organic light-emitting devices are self-emission devices that have wide viewing angles, high contrast ratios, short response times, and excellent brightness, driving voltage, and response speed characteristics, and product multicolored images.

An organic light-emitting device may include a substrate and a first electrode disposed on the substrate, and has a structure of a hole transport region, an emission layer, an electron transport region, and a second electrode that are sequentially stacked in the stated order on the first electrode. Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited stated to a ground state, thereby generating light.

SUMMARY

Embodiments are directed to an organic light-emitting device including a first electrode, a second electrode facing the first electrode, and an organic layer between the first electrode and the second electrode, the organic layer including an emission layer. The organic layer includes a first compound represented by one of Formulae 1-1 to 1-3 below and a second compound represented by Formula 2 below:

<Formula 1-1>

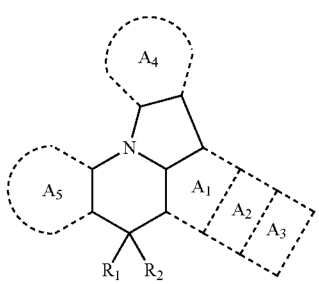

<Formula 1-2>

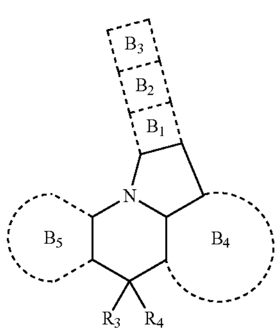

-continued

<Formula 1-3>

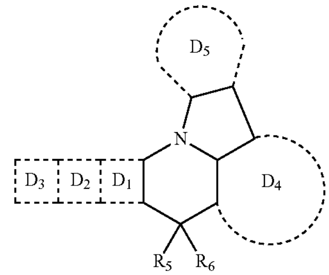

<Formula 2>

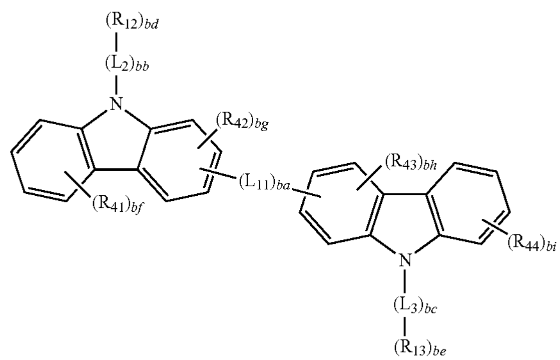

In Formulae 1-1 to 1-3 and 2, ring $A_1$, ring $A_2$, and ring $A_3$ may be condensed together, ring $B_1$, ring $B_2$, and ring $B_3$ may be condensed together, and ring $D_1$, ring $D_2$, and ring $D_3$ may be condensed together, wherein ring $A_2$, ring $B_2$, and ring $C_2$ may be each independently represented by the following Formula 3:

<Formula 3>

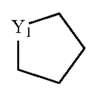

where, $Y_1$ may be O, S, or N-$(L_1)_{aa}$-$(R_{11})_{ab}$, ring $A_1$, rings $A_3$ to $A_5$, ring $B_1$, rings $B_3$ to $B_5$, ring $D_1$, and rings $D_3$ to $D_5$ may be each independently a substituted or unsubstituted benzene ring or a substituted or unsubstituted naphthalene ring, $R_1$ to $R_6$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein each of $R_1$ and $R_2$. $R_3$ and $R_4$, and $R_5$ and $R_6$ may be a non-ring forming substituent which are not linked to each other and do not form a ring.

$L_1$ to $L_3$ and $L_{11}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, aa and ba to be may be each independently selected from 0, 1, 2, and 3, and when aa and ba to be are 0, *-$(L_1)_{aa}$-*', *-$(L_{11})_{ba}$-*', *-$(L_2)_{bb}$-*', and *-$(L_3)_{bc}$-*' may be a single bond, respectively, and when aa and ba to be are 2 or more, 2 or more $L_1$s, 2 or more $L_{11}$s, 2 or more $L_2$s, and 2 or more $L_3$s may be identical to or different from each other, respectively, $R_{11}$ to $R_{13}$ and $R_{41}$ to $R_{44}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_4)(Q_5)$, and $N(Q_6)(Q_7)$, ab, bd, and be may be each independently selected from 1, 2, and 3, and when ab, bd, and be are 2 or more, 2 or more $R_{11}$s, 2 or more $R_{12}$s, and 2 or more $R_{13}$s may be identical to or different from each other, respectively, bf and bi may be each independently selected from 0, 1, 2, 3, and 4, and f when bf and bi are 2 or more, 2 or more $R_{41}$s may and 2 or more $R_{44}$s may be identical to or different from each other, respectively, bg and bh may be each independently selected from 0, 1, 2, and 3, and when bg and bh are 2 or more, 2 or more $R_{42}$s and 2 or more $R_{43}$s may be identical to or different from each other, respectively, at least one of substituents of the substituted benzene ring, the substituted naphthalene ring, the substituted $C_3$-$C_{10}$ cycloalkylene group, the substituted $C_1$-$C_{60}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, $C_6$-$C_{60}$ arylthio group, $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$B(Q_{14})(Q_{15})$, and —$N(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$B(Q_{24})(Q_{25})$, and —$N(Q_{26})(Q_{27})$; and —$Si(Q_{31})(Q_{32})(Q_{33})$, —$B(Q_{34})(Q_{35})$, and —$N(Q_{36})(Q_{37})$, and $Q_1$ to $Q_7$, $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWING

Features will become apparent to those of skill in the art by describing in detail exemplary embodiments with reference to the attached drawing in which:

FIG. 1 illustrates a schematic cross-sectional view of an organic light-emitting device according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout. As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a schematic cross-sectional view of an organic light-emitting device 10 according to an embodiment. The organic light-emitting device 10 includes a first electrode 110, an organic layer 150, and a second electrode 190.

In FIG. 1, a substrate may be additionally disposed under the first electrode 110 or on the second electrode 190. The substrate may be a glass substrate or a transparent plastic substrate, each of which has excellent mechanical strength, thermal stability, transparency, surface smoothness, ease of handling, and water resistance.

The first electrode 110 may be formed by, for example, depositing or sputtering a material for forming the first electrode 110 on the substrate. When the first electrode 110 is an anode, the material for forming the first electrode 110 may be selected from materials having a high work function to facilitate hole injection. The first electrode 110 may be a reflective electrode, a semi-transmissive electrode, or a transmissive electrode. The material for forming the first electrode 110 may be, for example, indium tin oxide (ITO), indium zinc oxide (IZO), tin oxide ($SnO_2$), or zinc oxide (ZnO), each of which has excellent transparency and conductivity. In some implementations, to form the first electrode 110 that is a semi-transmissive electrode or a reflective electrode, the material for forming the first electrode 110 may be at least one selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure or a multi-layer structure made up of a plurality of layers. For example, the first electrode 110 may have a triple-layer structure of ITO/Ag/ITO.

The organic layer 150 may be disposed on the first electrode 110, and may include an emission layer. The organic layer 150 may include a hole transport region and an electron transport region. The hole transport region may be disposed between the first electrode and the emission layer, and the electron transport region may be disposed between the emission layer and the second electrode.

The organic layer 150 may include a first compound and a second compound. The first compound may be represented by one of Formulae 1-1 to 1-3 below and the second compound may be represented by Formula 2 below:

<Formula 1-1>

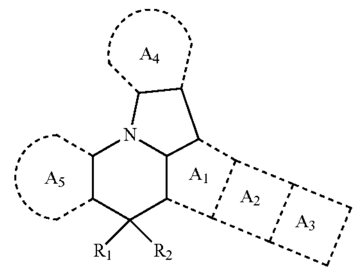

<Formula 1-2>

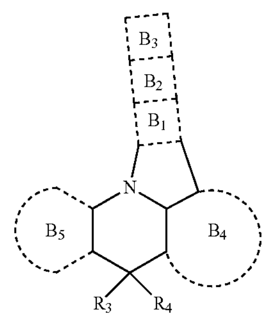

<Formula 1-3>

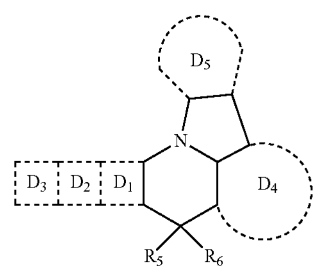

<Formula 2>

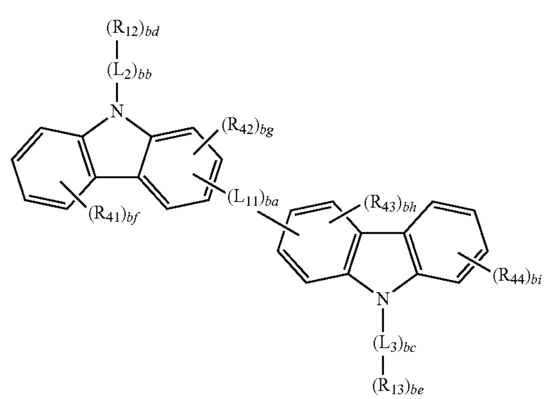

In Formulae 1-1 to 1-3, ring $A_1$, rings $A_2$, and $A_3$, ring $B_1$, ring $B_2$, and ring $B_3$, and ring $D_1$, ring $D_2$, and ring $D_3$ may be each independently condensed with each other, wherein ring $A_2$, ring $B_2$, and ring $C_2$ may be each independently represented by Formula 3:

<Formula 3>

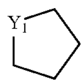

In Formula 3, $Y_1$ may be O, S, or N-$(L_1)_{aa}$-$(R_{11})_{tab}$, ring $A_1$, rings $A_3$ to $A_5$, ring $B_1$, rings $B_3$ to $B_5$, ring $D_1$, and rings $D_3$ to $D_5$ may be each independently a substituted or unsubstituted benzene ring or a substituted or unsubstituted naphthalene ring, and $R_1$ to $R_6$ may be each independently selected from a hydrogen, a deuterium, —F, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein each of $R_1$ and $R_2$, $R_3$ and $R_4$, and $R_5$ and $R_6$ may be a non-ring forming substituent that is not linked to one other to form a ring.

In an exemplary embodiment, in Formulae 1-1 to 1-3, $R_1$ to $R_6$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_1$-$C_{60}$ alkoxy group, and a substituted or unsubstituted $C_6$-$C_{60}$ aryl group.

In another exemplary embodiment, in Formulae 1-1 to 1-3, $R_1$ to $R_6$ may be each independently selected from:

a hydrogen, a deuterium. —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, and a naphthyl group;

a phenyl group, a naphthyl group, a fluorenyl group, a phenanthrenyl group, an anthracenyl group, a fluoranthenyl group, a triphenylenyl group, a pyrenyl group, and a chrysenyl group;

a phenyl group, a naphthyl group, a fluorenyl group, a phenanthrenyl group, an anthracenyl group, a fluoranthenyl group, a triphenylenyl group, a pyrenyl group, and a chrysenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a fluoranthenyl group, a triphenylenyl group, a pyrenyl group, and a chrysenyl group.

For example, in Formulae 1-1 to 1-3, $R_1$ to $R_6$ may be each independently a methyl group or a phenyl group.

For example, in Formulae 1-1 to 1-3, and 2, $L_1$ to $L_3$ and $L_{11}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, and aa and ba to be may be each independently selected from 0, 1, 2, and 3, and for example, when aa and ba to be are 0, *-$(L_1)_{aa}$-*', *-$(L_{11})_{ba}$-*', *-$(L_2)_{bb}$-*', and *-$(L_3)_{bc}$-*' may be a single bond, respectively, and when aa and ba to be are 2 or more, 2 or more $L_1$s, 2 or more $L_{11}$s, 2 or more $L_2$s, and 2 or more $L_3$s may be identical to or different from each other, respectively.

In an exemplary embodiment, in Formulae 1-1 to 1-3, and 2, $L_1$ to $L_3$ and $L_{11}$ may be each independently selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a (uranyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

In an exemplary embodiment, in Formulae 1-1 to 1-3 and 2, $L_1$ to $L_3$ and $L_{11}$ may be each independently selected from:

a phenylene group, a naphthylene group, a fluorenylene group, a phenanthrenylene group, an anthracenylene group, a triphenylenylene group, a pyrenylene group, and a chrysenylene group; and a phenylene group, a naphthylene group, a fluorenylene group, a phenanthrenylene group, an anthracenylene group, a triphenylenylene group, a pyrenylene group, and a chrysenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a phenanthrenyl group, an anthracenyl group, a triphenylenyl group, a pyrenyl group, and a chrysenyl group.

In an exemplary embodiment, in Formulae 1-1 to 1-3 and 2, $L_1$ to $L_3$ and $L_{11}$ may be each independently represented by one of Formulae 4-1 to 4-19 below:

Formula 4-1

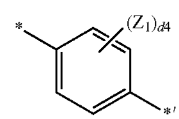

Formula 4-2

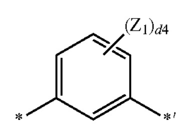

Formula 4-3

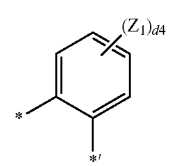

Formula 4-4

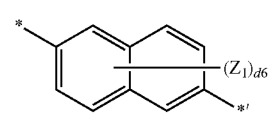

Formula 4-5

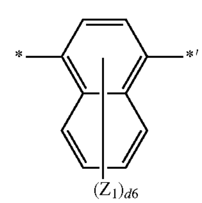

-continued
Formula 4-6
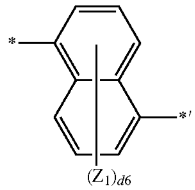
Formula 4-7
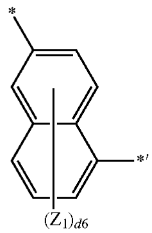
Formula 4-8
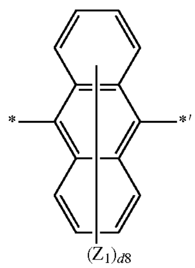
Formula 4-9
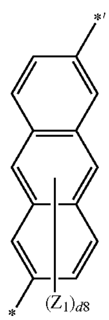
Formula 4-10
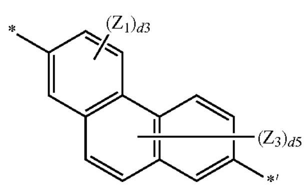
Formula 4-11
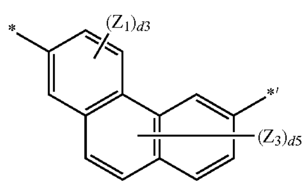
Formula 4-12
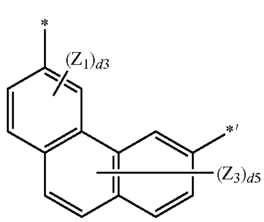
-continued
Formula 4-13
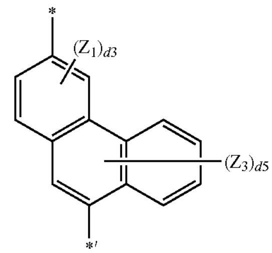
Formula 4-14
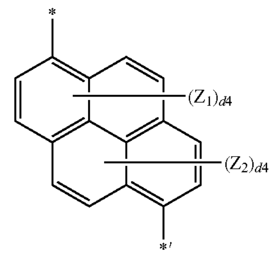
Formula 4-15
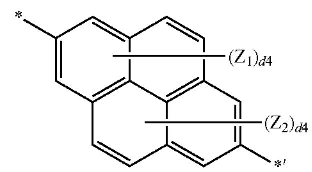
Formula 4-16
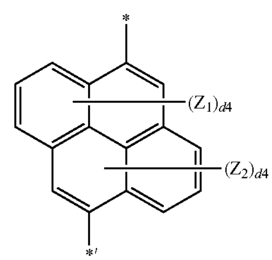
Formula 4-17
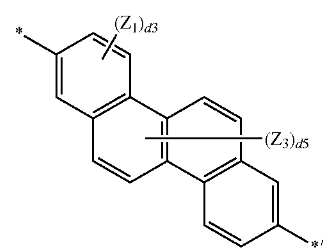
Formula 4-18
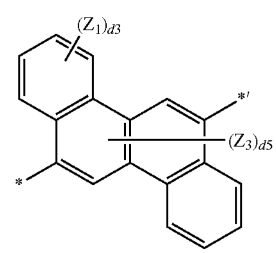

-continued

Formula 4-19

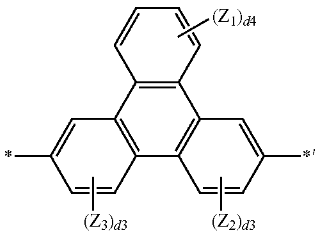

In Formulae 4-1 to 4-19, $Z_1$ to $Z_3$ may be each independently selected a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, or a triazinyl group, d3 may be an integer selected from 1 to 3, d4 may be an integer selected from 1 to 4, d5 may be an integer selected from 1 to 5, d6 may be an integer selected from 1 to 6, and d8 may be an integer selected from 1 to 8, and * and *' may indicate a binding site to a neighboring atom.

In an exemplary embodiment, in Formulae 1-1 to 1-3 and 2, $L_1$ to $L_3$ may be each independently represented by one of Formulae 5-1 to 5-16 below, wherein aa, bb, and be may be each independently 0 or 1, and ba may be 0:

Formula 5-1

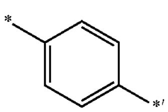

Formula 5-2

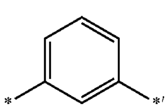

Formula 5-3

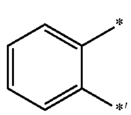

Formula 5-4

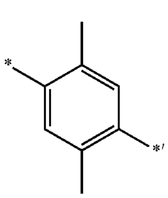

-continued

Formula 5-5

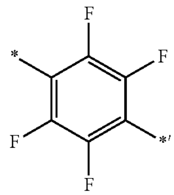

Formula 5-6

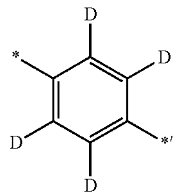

Formula 5-7

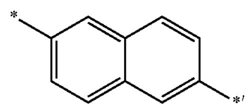

Formula 5-8

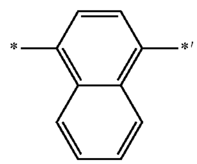

Formula 5-9

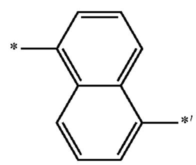

Formula 5-10

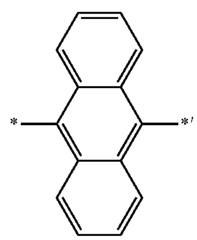

Formula 5-11

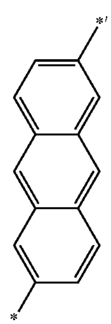

Formula 5-12

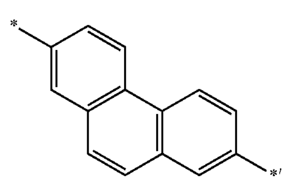

-continued

Formula 5-13

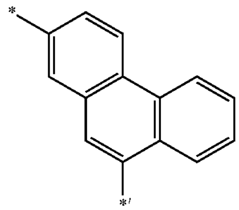

Formula 5-14

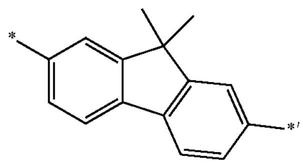

Formula 5-15

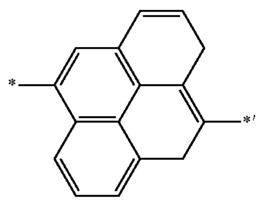

Formula 5-16

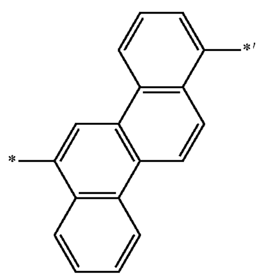

In Formulae 5-1 to 5-16, * and *' may indicate a binding site to a neighboring atom.

For example, in Formulae 1-1 to 1-3 and 2, $L_1$ to $L_3$ may be each independently represented by one of Formulae 6-1 and 6-2 below, aa, bb, and be may be each independently 0 or 1, and ba may be 0:

Formula 6-1

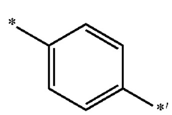

Formula 6-2

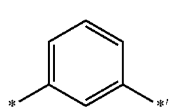

In Formulae 1-1 to 1-3 and 2.

$R_{11}$ to $R_{13}$ and $R_{41}$ to $R_{44}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{10}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_4$)($Q_5$), and N($Q_6$)($Q_7$), ab, bd, and be may be each independently selected from 1, 2, and 3, and for example, when ab, bd, and be are 2 or more, 2 or more $R_{11}$s, 2 or more $R_{12}$s, and 2 or more $R_{13}$s may be identical to or different from each other, respectively, bf and bi may be each independently selected from 0, 1, 2, 3, and 4, and for example, when bf and bi are 2 or more, 2 or more $R_{41}$s and 2 or more $R_{44}$s may be identical to or different from each other, respectively, and bg and bh may be each independently selected from 0, 1, 2, and 3, and for example, when bg and bh are 2 or more, 2 or more $R_{42}$s and 2 or more $R_{41}$s may be identical to or different from each other.

In an exemplary embodiment, the first compound may be represented by one of Formulae 1-1(A), 1-1(B), 1-2(A), 1-2(B), 1-3(A), and 1-3(B) below:

<Formula 1-1(A)>

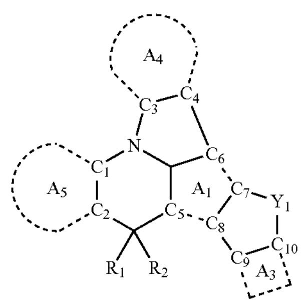

<Formula 1-1(B)>

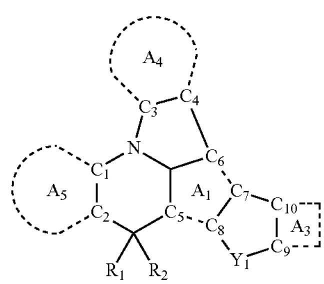

<Formula 1-2(A)>

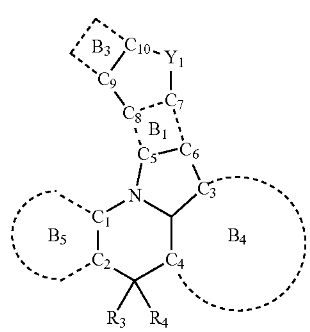

-continued

<Formula 1-2(B)>

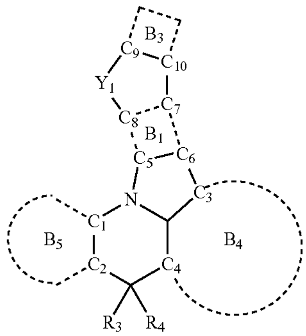

<Formula 1-3(A)>

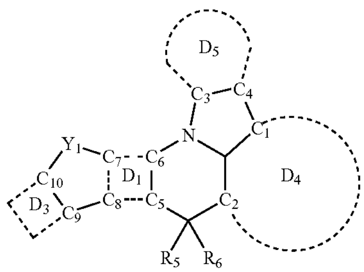

<Formula 1-3 (B)>

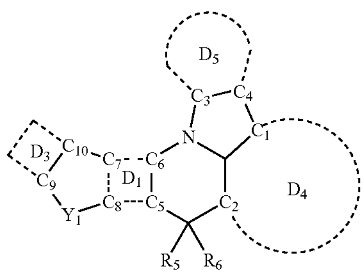

In Formulae 1-1(A), 1-1(B), 1-2(A), 1-2(B) 1-3(A), and 1-3(B), $C_1$ to $C_{10}$ are independently numbered to indicate chemically distinct carbon atoms, ring $A_1$ may be represented by one of Formulae 5-1(1) and 5-1(2) below, ring $B_1$ may be represented by one of Formulae 5-2(1) to 5-2(5) below, ring $D_1$ may be represented by one of Formulae 5-3(1) to 5-3(5) below, ring $A_3$ may be represented by one of Formulae 6-1(1) to 6-1(4) below, ring $B_3$ may be represented by one of Formulae 6-2(1) to 6-2(4) below, ring $D_3$ may be represented by one of Formulae 6-3(1) to 6-3(4) below, ring $A_4$ may be represented by one of Formulae 7-1(1) to 7-1(4) below, ring $B_4$ may be represented by one of Formulae 7-2(1) to 7-2(3) below, ring $D_4$ may be represented by one of Formulae 7-3(1) to 7-3(3) below, rings $A_5$ and $B_5$ may be each independently represented by one of Formulae 8-1(1) to 8-1(4) below, ring $D_5$ may be represented by one of Formulae 8-3(1) to 8-3(4) below, <Formula 5-1(1)>

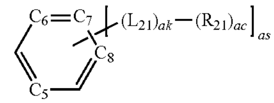

<Formula 5-1(2)>

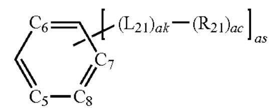

<Formula 5-2(1)>

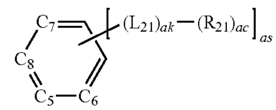

<Formula 5-2(2)>

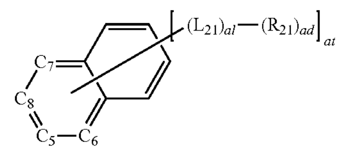

<Formula 5-2(3)>

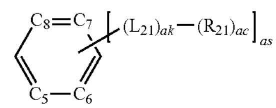

<Formula 5-2(4)>

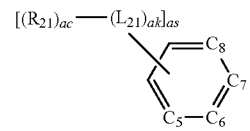

<Formula 5-2(5)>

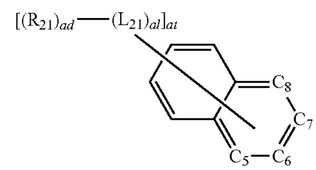

<Formula 5-3(1)>

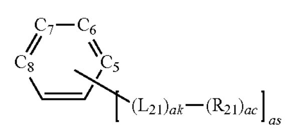

<Formula 5-3(2)>

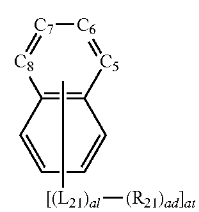

<Formula 5-3(3)>

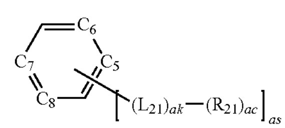

<Formula 5-3(4)>

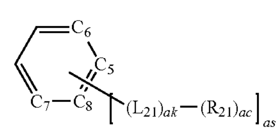

<Formula 5-3(5)>
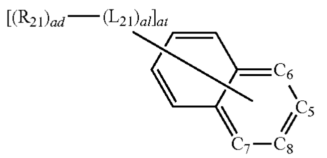
<Formula 6-1(1)>
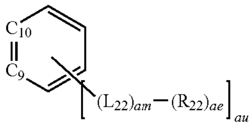
<Formula 6-1(2)>
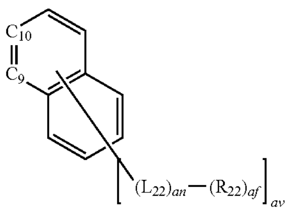
<Formula 6-1(3)>
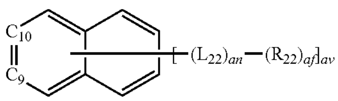
<Formula 6-1(4)>
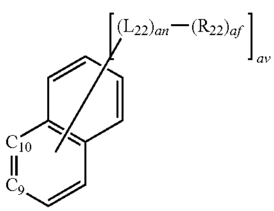
<Formula 6-2(1)>
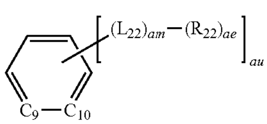
<Formula 6-2(2)>
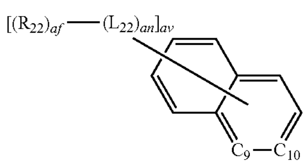
<Formula 6-2(3)>
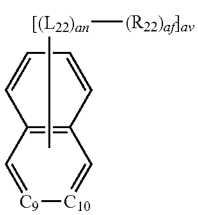
<Formula 6-2(4)>
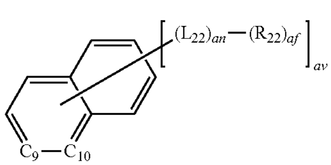
<Formula 6-3(1)>
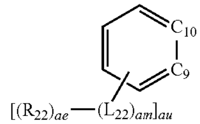
<Formula 6-3(2)>
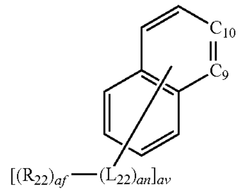
<Formula 6-3(3)>
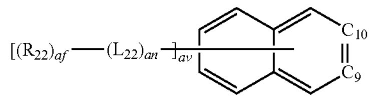
<Formula 6-3(4)>
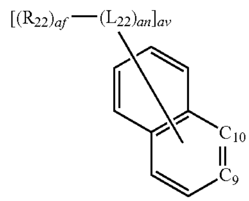
<Formula 7-1(1)>
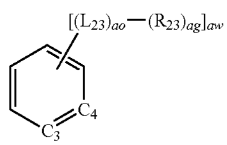
<Formula 7-1(2)>
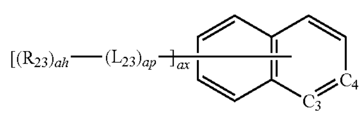
<Formula 7-1(3)>
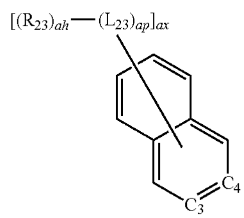
<Formula 7-1(4)>
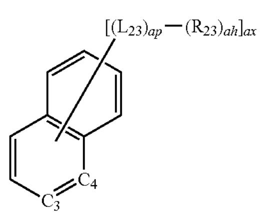
<Formula 7-2(1)>
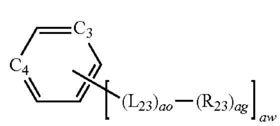

-continued

<Formula 7-2(2)>

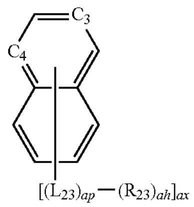

<Formula 7-2(3)>

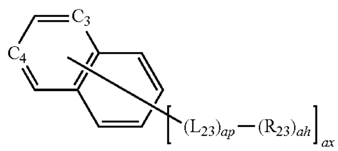

<Formula 7-3(1)>

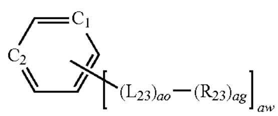

<Formula 7-3(2)>

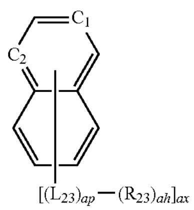

<Formula 7-3(3)>

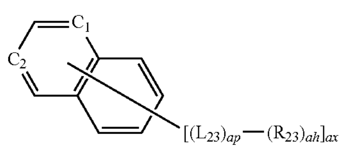

<Formula 8-1(1)>

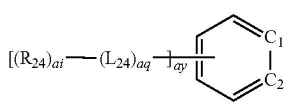

<Formula 8-1(2)>

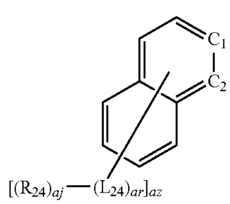

<Formula 8-1(3)>

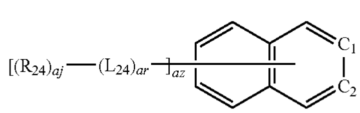

<Formula 8-1(4)>

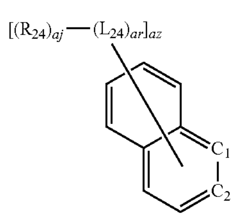

-continued

<Formula 8-3(1)>

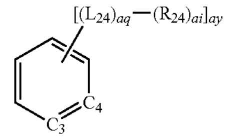

<Formula 8-3(2)>

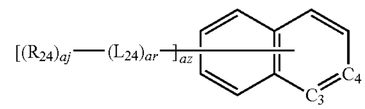

<Formula 8-3(3)>

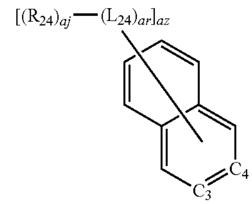

<Formula 8-3(4)>

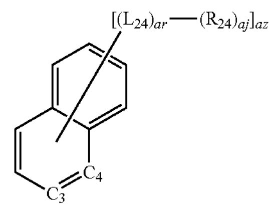

in Formulae 5-1(1), 5-1(2), 5-2(1) to 5-2(5), 5-3(1) to 5-3(5), 6-1(1) to 6-1(4), 6-2(1) to 6-2(4), 6-3(1) to 6-3(4), 7-1(1) to 7-1(4), 7-2(1) to 7-2(3), 7-3(1) to 7-3(3), 8-1(1) to 8-1(4), and 8-3(1) to 8-3(4), descriptions of $L_{21}$ to $L_{24}$ may be understood by referring to the descriptions presented in connection with $L_1$, ak to ar may be each independently selected from 0, 1, 2, and 3, $R_{21}$ to $R_{24}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_4$)($Q_5$), and N($Q_6$)($Q_7$), ac to aj may be each independently selected from 0, 1, 2, and 3, and for example, when ac, ad, ae, af, ag, ai, ah, ai, and aj are 2 or more, 2 or more $R_{21}$s, 2 or more $R_{21}$s, 2 or more $R_{22}$s, 2 or more $R_{22}$s, 2 or more $R_{23}$s, 2 or more $R_{24}$s, 2 or more $R_{23}$s, 2 or more $R_{24}$s, and 2 or more $R_{24}$s may be identical to or different from each other, respectively, as may be selected from 0, 1, and 2, and for example, when as is 2, 2*-[$(L_{21})_{ak}$-$(R_{21})_{ac}$]s may be identical to or different from each other, at, au, aw, and ay may be each independently selected from 0, 1, 2, 3, and 4, and for example, when at, au, aw, and ay are 2 or more, 2 or more *-[$(L_{21})_{ad}$-$(R_{21})_{al}$]s, 2 or more *-[$(L_{22})_{am}$-$(R_{22})_{ae}$]s, 2 or more *-[$(L_{23})_{ao}$-$(R_{23})_{ag}$]s, and 2 or more *-[$(L_{24})_{aq}$-$(R_{24})_{ai}$]s may be identical to or different from each other, respectively, and av, ax, and az may be each independently selected from 0, 1, 2, 3, 4, 5, and 6, and for example, when av, ax, and az are 2 or more, 2 or more *-[$(L_{22})_{an}$-$(R_{22})_{af}$]s, 2 or more *-[$(L_{23})_{ap}$-$(R_{23})_{ah}$]s, and 2 or more *-[$(L_{24})_{ar}$-$(R_{24})_{aj}$]s may be identical to or different from each other, respectively.

In an exemplary embodiment, in Formulae 1-1(A), 1-1(B), 1-2(A), 1-2(B), 1-3(A), and 1-3(B), $R_{11}$ and $R_{21}$ to $R_{24}$ may be each independently selected from a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a benzoquinoxalinyl group, a quinazolinyl group, a benzoquinazolinyl group, a phenanthrolinyl group, a benzoimidazolyl group, an isobenzothiazolyl group, a benzoxazolyl group, an isobenzoxazolyl group, a triazolyl group, an oxadiazolyl group, a triazinyl group, a thiadiazolyl group, an imidazopyridinyl group, and an imidazopyrimidinyl group; and a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a benzoquinoxalinyl group, a quinazolinyl group, a benzoquinazolinyl group, a phenanthrolinyl group, a benzoimidazolyl group, an isobenzothiazolyl group, a benzoxazolyl group, an isobenzoxazolyl group, a triazolyl group, an oxadiazolyl group, a triazinyl group, a thiadiazolyl group, an imidazopyridinyl group, and an imidazopyrimidinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, phenanthridinyl, acridinyl, phenanthrolinyl, phenazinyl, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group.

For example, in Formulae 1-1(A), 1-1(B), 1-2(A), 1-2(B), 1-3(A), and 1-3(B), $R_{11}$ and $R_{21}$ to $R_{24}$ may be each independently selected from groups represented by Formulae 7-1 to 7-44 below:

Formula 7-1

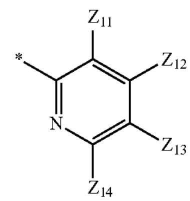

Formula 7-2

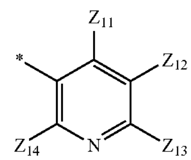

Formula 7-3

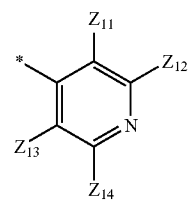

Formula 7-4

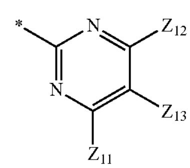

Formula 7-5

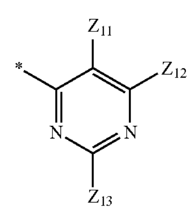

Formula 7-6

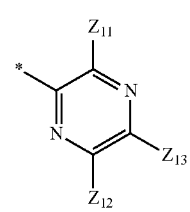

Formula 7-7

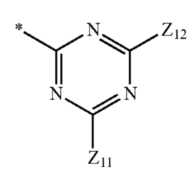

-continued
Formula 7-8
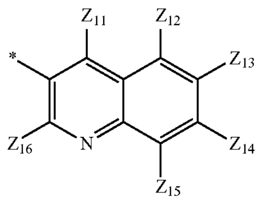
Formula 7-9
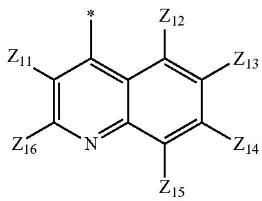
Formula 7-10
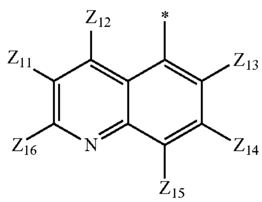
Formula 7-11
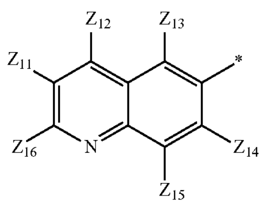
Formula 7-12
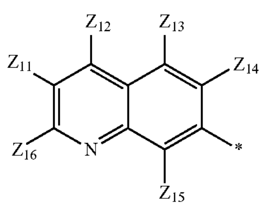
Formula 7-13
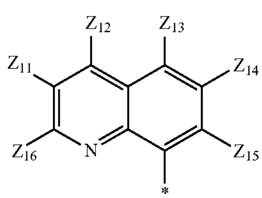
Formula 7-14
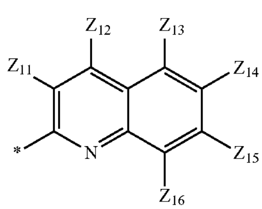
Formula 7-15
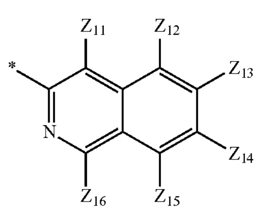
-continued
Formula 7-16
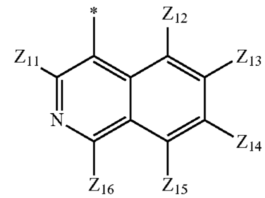
Formula 7-17
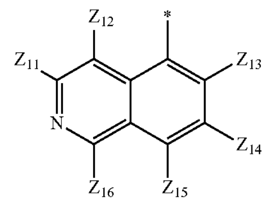
Formula 7-18
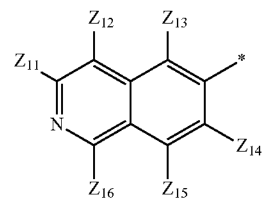
Formula 7-19
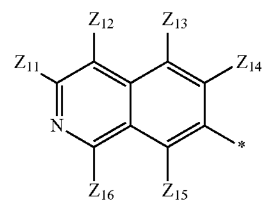
Formula 7-20
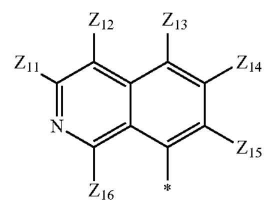
Formula 7-21
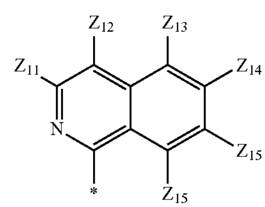
Formula 7-22
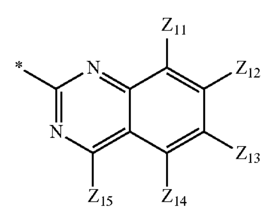

-continued
Formula 7-23
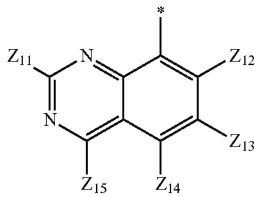
Formula 7-24
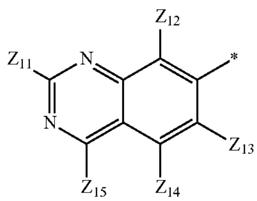
Formula 7-25
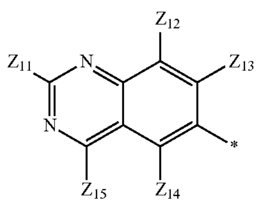
Formula 7-26
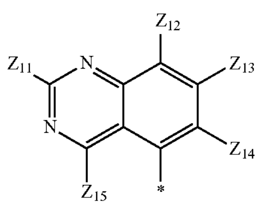
Formula 7-27
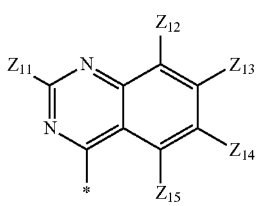
Formula 7-28
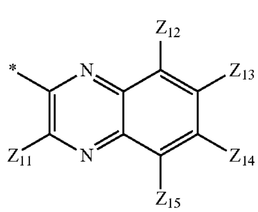
Formula 7-29
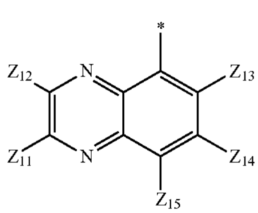
-continued
Formula 7-30
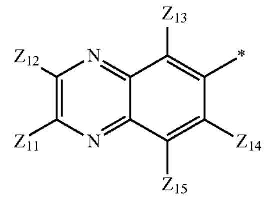
Formula 7-31
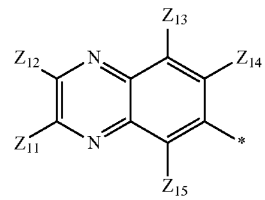
Formula 7-32
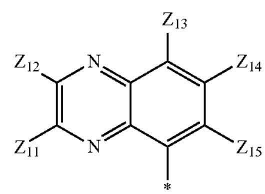
Formula 7-33
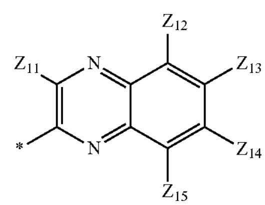
Formula 7-34
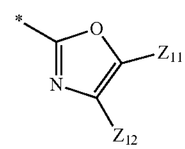
Formula 7-35
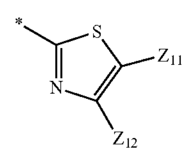
Formula 7-36
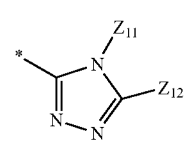
Formula 7-37
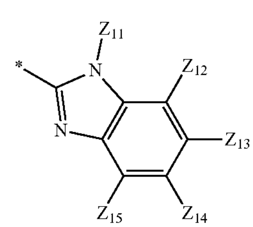

-continued

Formula 7-38

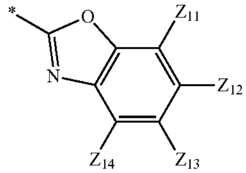

Formula 7-39

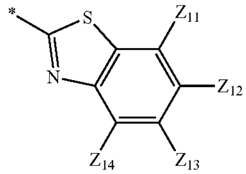

Formula 7-40

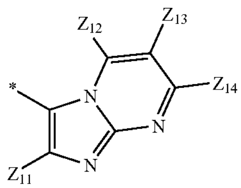

Formula 7-41

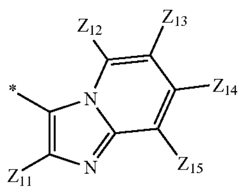

Formula 7-42

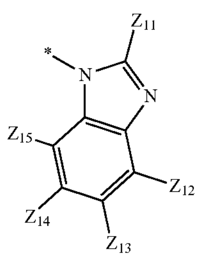

Formula 7-43

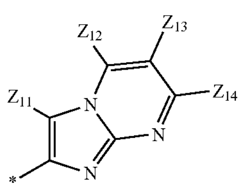

Formula 7-44

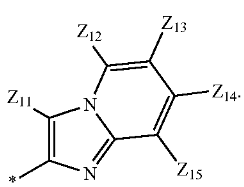

In Formulae 7-1 to 7-44, $Z_{11}$ to $Z_{16}$ may be each independently selected from a hydrogen, a deuterium, —F, —Cl, —Br, —I, a hydroxyl group, a cyano group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, phenanthridinyl, acridinyl, phenanthrolinyl, phenazinyl, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, and

* may indicate a binding site to a neighboring atom.

In an exemplary embodiment, in Formulae 1-1(A), 1-1(B), 1-2(A), 1-2(B), 1-3(A), and 1-3(B), $Y_1$ in Formula 3 may be N-$(L_1)_{aa}$-$(R_{11})_{ab}$, wherein $L_1$ may be represented by one of Formulae 5-1 to 5-16 below, aa may be 0 or 1, $R_{11}$ may be represented by one of Formulae 8-1 to 8-11 below, and ab may be 1:

Formula 5-1

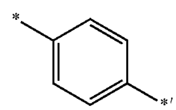

Formula 5-2

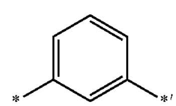

Formula 5-3

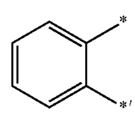

Formula 5-4

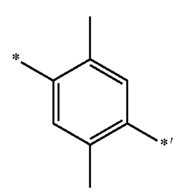

Formula 5-5

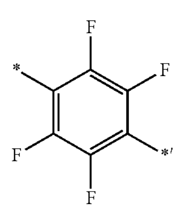

Formula 5-6
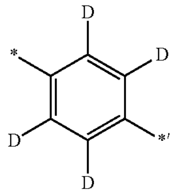
Formula 5-7
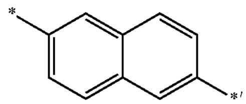
Formula 5-8
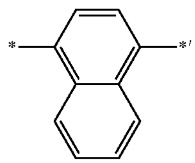
Formula 5-9
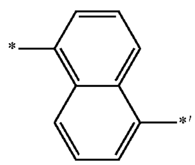
Formula 5-10
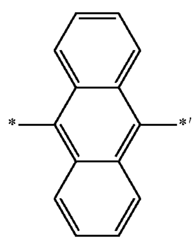
Formula 5-11
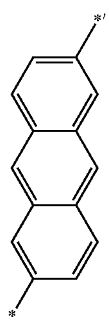
Formula 5-12
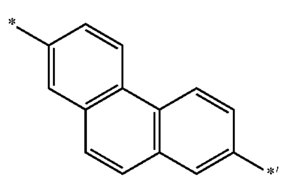
Formula 5-13
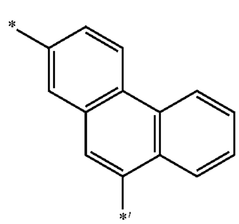
Formula 5-14
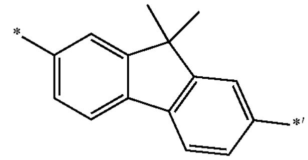
Formula 5-15
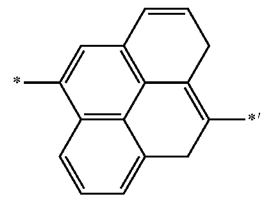
Formula 5-16
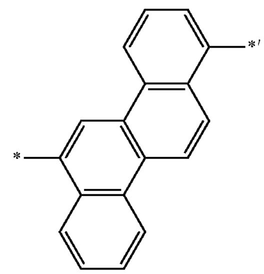
Formula 8-1
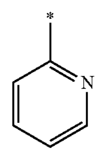
Formula 8-2
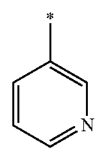
Formula 8-3
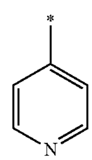
Formula 8-4
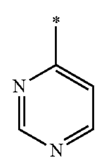
Formula 8-5
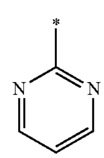
Formula 8-6
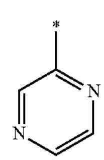

-continued

Formula 8-7

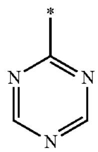

Formula 8-8

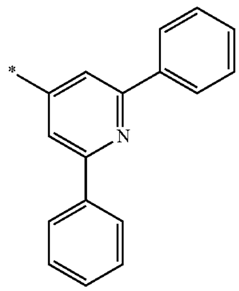

Formula 8-9

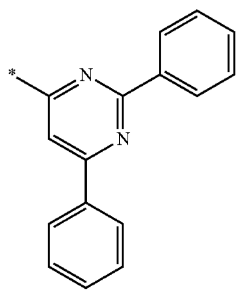

Formula 8-10

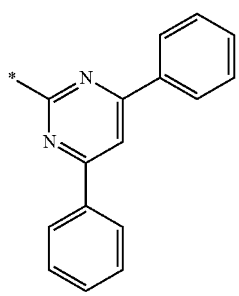

Formula 8-11

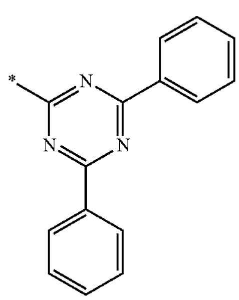

wherein, in Formulae 5-1 to 5-16 and 8-1 to 8-11, * and *' may each indicate a binding site with a neighboring atom.

In some embodiments, when the first compound is represented by one of Formulae 1-1(A), 1-1(B), 1-2(A), 1-2(B), 1-3(A), and 1-3(B), $Y_1$ in Formula 3 may be S or O; ring $A_5$ and ring $B_5$ may be each independently represented by one of Formulae 8-1(1) to 8-1(4); and ring $D_5$ may be represented by one of Formulae 8-3(1) to 8-3(4):

<Formula 8-1(1)>

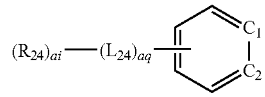

<Formula 8-1(2)>

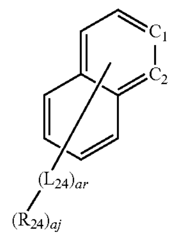

<Formula 8-1(3)>

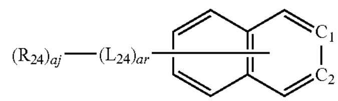

<Formula 8-1(4)>

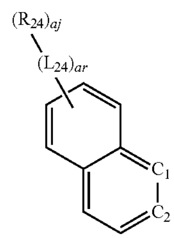

<Formula 8-3(1)>

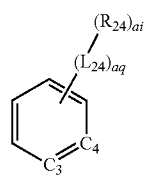

<Formula 8-3(2)>

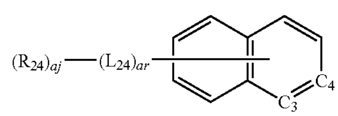

<Formula 8-3(3)>

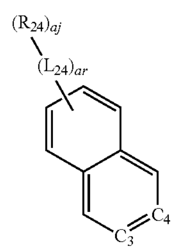

<Formula 8-3(4)>

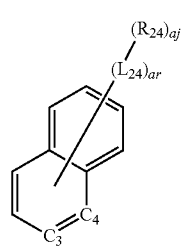

In Formulae 8-1(1) to 8-1(4) and Formulae 8-3(1) to 8-3(4),
$L_{24}$ may be represented by one of Formulae 5-1 to 5-16;
aq and ar may be each independently 0 or 1;
$R_{24}$ may be represented by one of Formulae 8-1 to 8-11; and
ai and aj may be 1:
Formula 5-1
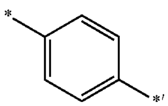
Formula 5-2
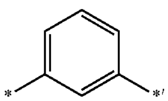
Formula 5-3
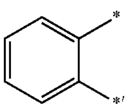
Formula 5-4
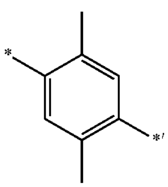
Formula 5-5
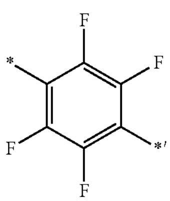
Formula 5-6
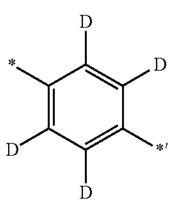
Formula 5-7
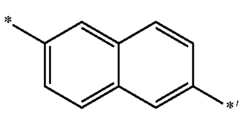
Formula 5-8
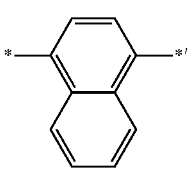
Formula 5-9
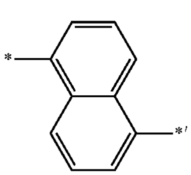
-continued
Formula 5-10
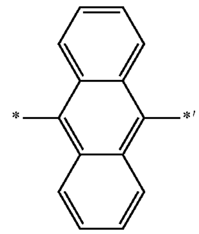
Formula 5-11
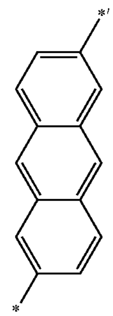
Formula 5-12
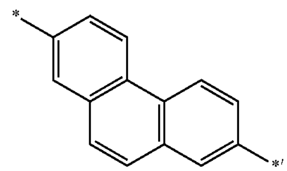
Formula 5-13
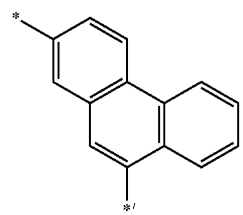
Formula 5-14
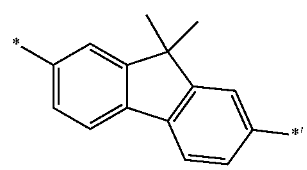
Formula 5-15
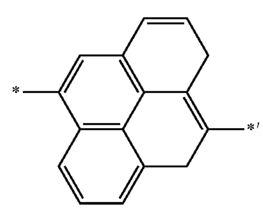
Formula 5-16
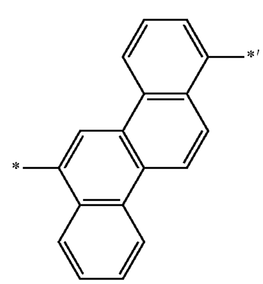

-continued

Formula 8-1

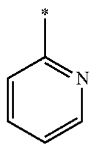

Formula 8-2

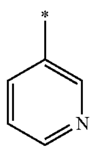

Formula 8-3

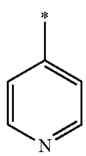

Formula 8-4

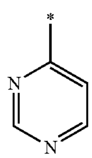

Formula 8-5

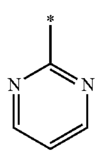

Formula 8-6

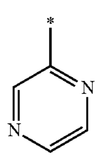

Formula 8-7

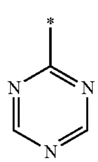

Formula 8-8

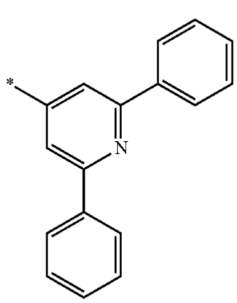

-continued

Formula 8-9

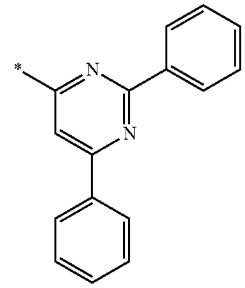

Formula 8-10

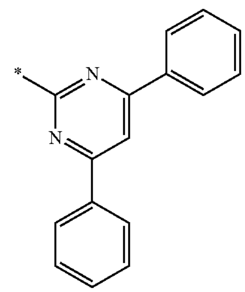

Formula 8-11

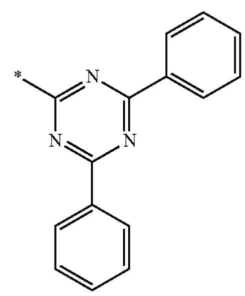

In Formulae 5-1 to 5-16 and 8-1 to 8-11, * and *' may each independently indicate a binding site to a neighboring atom.

In another exemplary embodiment, the first compound may be represented by Formulae 1-1(A), 1-2(A), or 1-3(A), wherein in Formulae 1-1(A), 1-2(A) and 1-3(A), ring $A_1$ may be represented by one of Formulae 5-1(1) and 5-1(2), ring $B_1$ may be represented by one of Formulae 5-2(1) to 5-2(3), ring $D_1$ may be represented by one of Formulae 5-3(1) to 5-3(3), ring $A_3$ may be represented by one of Formulae 6-1(1) and 6-1(2), ring $B_3$ may be represented by one of Formulae 6-2(1) and 6-2(2), ring $D_3$ may be represented by one of Formulae 6-3(1) to 6-3(4), ring $A_4$ may be represented by one of Formulae 7-1(1) and 7-1(3), ring $B_4$ may be represented by one of Formulae 7-2(1) and 7-2(3), ring $D_4$ may be represented by one of Formulae 7-3(1) and 7-3(2), ring $A_5$ may be represented by one of Formulae 8-1(1) and 8-1(3), ring $B_5$ may be represented by one of Formulae 8-2(1) to 8-2(3), and ring $D_5$ may be represented by one of Formulae 8-3(1) and 8-3(4).

In an exemplary embodiment, in Formula 2, $R_{12}$ and $R_{13}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, a dibenzocarbazolyl group, and —Si($Q_{31}$)($Q_{32}$)($Q_{33}$), and $Q_{31}$ to $Q_{33}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group.

For example, in Formula 2, $R_{12}$ and $R_{13}$ may be each independently represented by one of Formulae 9-1 to 9-6 below:

Formula 9-1

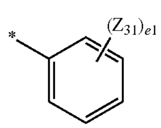

Formula 9-2

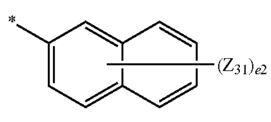

Formula 9-3

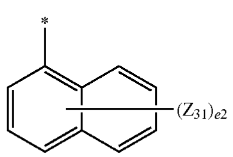

Formula 9-4

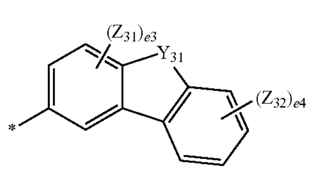

-continued

Formula 9-5

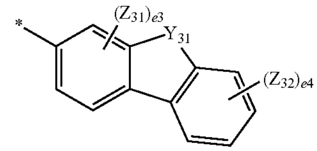

Formula 9-6

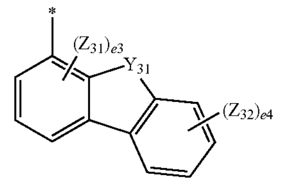

In Formulae Formula 9-1 to 9-6, $Y_{31}$ may be C($Z_{33}$)($Z_{34}$) or N($Z_{35}$), $Z_{31}$ to $Z_{35}$ may be each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, and a naphthyl group; and —Si($Q_{31}$)($Q_{32}$)($Q_{33}$), $Q_{31}$ to $Q_{33}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group, e1 may be an integer selected from 1 to 5, e2 may be an integer selected from 1 to 7, e3 may be an integer selected from 1 to 3, and e4 may be an integer selected from 1 to 4, and * may indicate a binding site to a neighboring atom.

For example, in Formula 2, $R_{12}$ and $R_{13}$ may be each independently one of groups represented by Formulae 11-1 to 11-15 below:
Formula 11-1
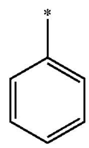
Formula 11-2
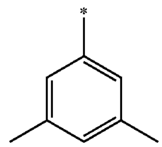
Formula 11-3
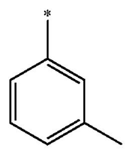
Formula 11-4
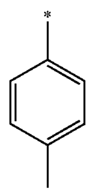
Formula 11-5
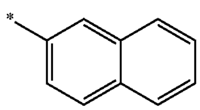
Formula 11-6
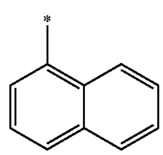
Formula 11-7
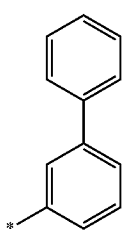
Formula 11-8
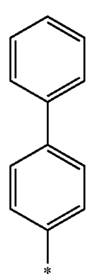
-continued
Formula 11-9
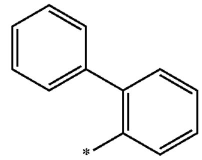
Formula 11-10
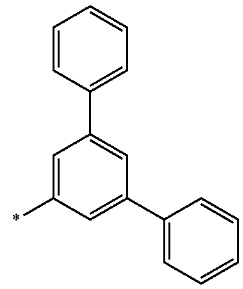
Formula 11-11
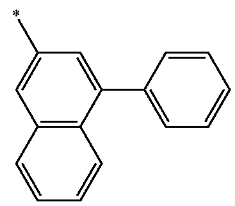
Formula 11-12
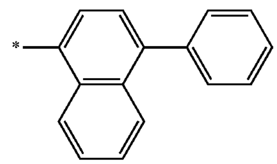
Formula 11-13
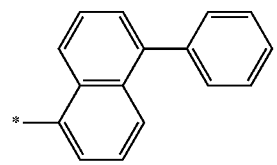
Formula 11-14
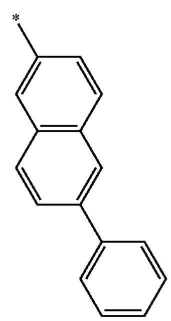
Formula 11-15
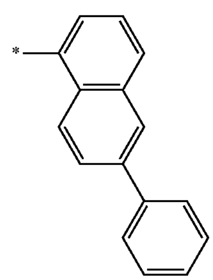

In Formulae 11-1 to 11-15, * may indicate a binding site to a neighboring atom.

For example, in Formula 2, $R_{12}$ and $R_{13}$ may be each independently one selected from the groups of Formula 11-1 to 11-3, and bd and be may be each independently 1 or 2, and for example, when bd and be are 2, 2 $R_{12}$s and 2 $R_{12}$s may be identical to or different from each other, respectively.

In an exemplary embodiment, in Formula 2, $R_{41}$ to $R_{44}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_1$-$C_{20}$ alkoxy group, a substituted or unsubstituted $C_6$-$C_{20}$ aryl group, a substituted or unsubstituted $C_1$-$C_{20}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$)—B($Q_4$)($Q_5$), and N($Q_6$)($Q_7$).

For example, in Formula 2, $R_{41}$ to $R_{44}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, and one of groups represented by Formulae 10-1 to 10-17 below:

Formula 10-1

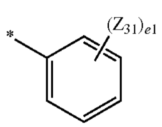

Formula 10-2

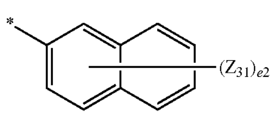

Formula 10-3

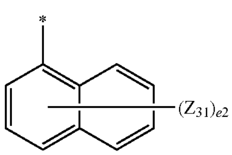

Formula 10-4

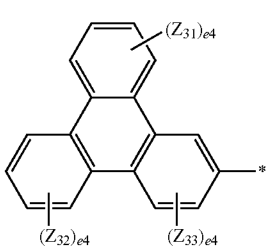

-continued

Formula 10-5

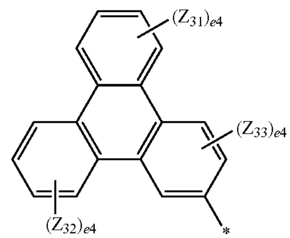

Formula 10-6

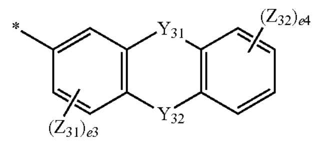

Formula 10-7

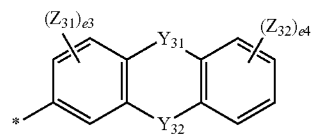

Formula 10-8

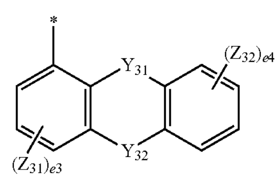

Formula 10-9

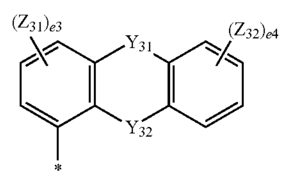

Formula 10-10

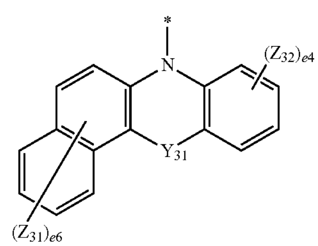

Formula 10-11

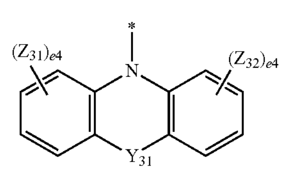

Formula 10-12

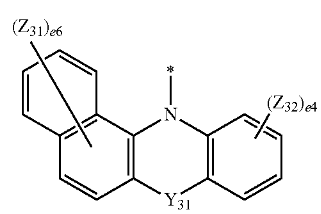

-continued

Formula 10-13

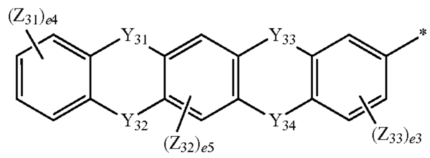

Formula 10-14

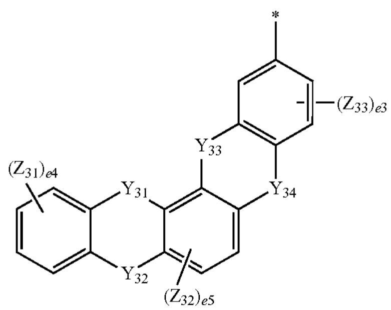

Formula 10-15

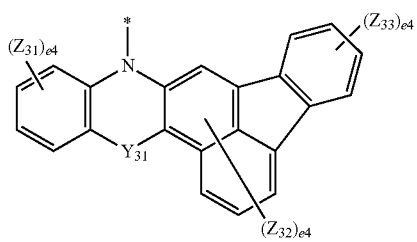

Formula 10-16

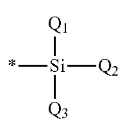

Formula 10-17

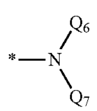

In Formulae 10-1 to 10-17, $Y_{31}$ to $Y_{34}$ may be each independently a single bond, O, S, $C(Z_{34})(Z_{35})$, $N(Z_{36})$, or $Si(Z_{37})(Z_{38})$, $Z_{31}$ to $Z_{38}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, $Q_1$ to $Q_3$, $Q_6$, and $Q_7$ may be each independently selected from:

a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, e1 may be an integer selected from 1 to 5, e2 may be an integer selected from 1 to 7, e3 may be an integer selected from 1 to 3, e4 may be an integer selected from 1 to 4, e5 may be 1 or 2, and e6 may be an integer selected from 1 to 6, and * may indicate a binding site to a neighboring atom.

For example, in Formulae 10-1 to 10-17, $Z_{31}$ to $Z_{38}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, and $Q_1$ to $Q_3$, $Q_6$, and $Q_7$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group.

For example, in Formula 2, $R_4$ to $R_{44}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, and one of groups represented by Formulae 12-1 to 12-49 below:

Formula 12-1
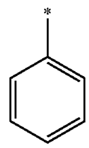
Formula 12-2
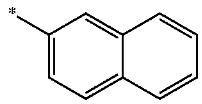
Formula 12-3
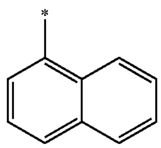
Formula 12-4
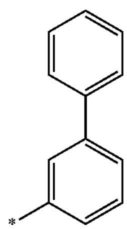
Formula 12-5
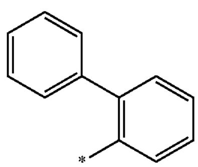
Formula 12-6
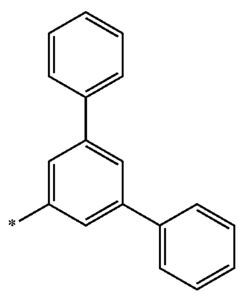
Formula 12-7
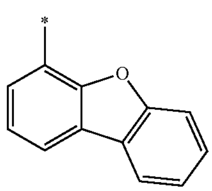
Formula 12-8
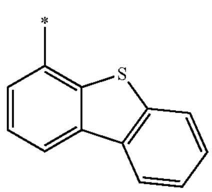
-continued
Formula 12-9
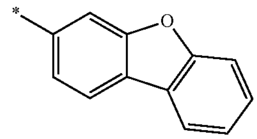
Formula 12-10
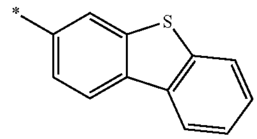
Formula 12-11
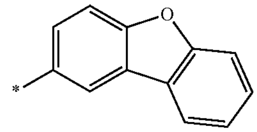
Formula 12-12
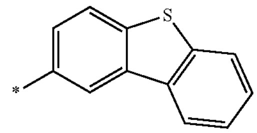
Formula 12-13
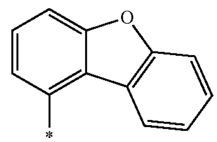
Formula 12-14
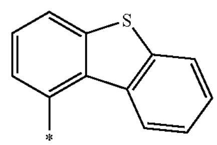
Formula 12-15
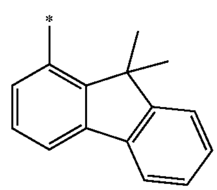
Formula 12-16
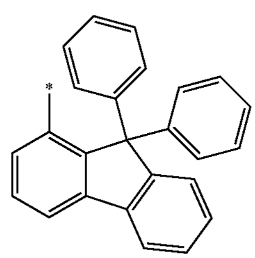
Formula 12-17
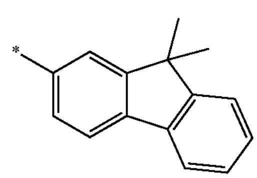

-continued
Formula 12-18
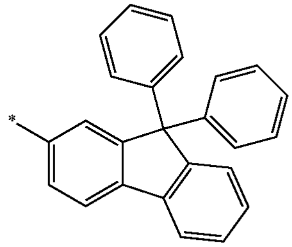
Formula 12-19
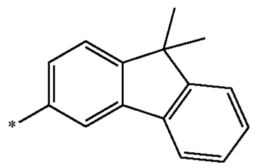
Formula 12-20
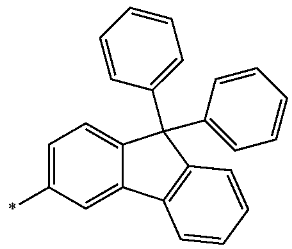
Formula 12-21
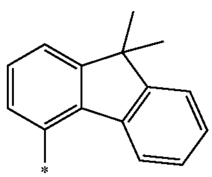
Formula 12-22
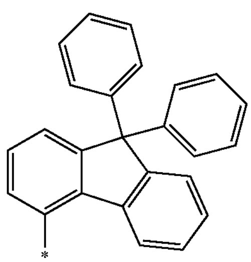
Formula 12-23
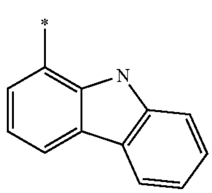
Formula 12-24
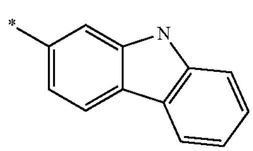
Formula 12-25
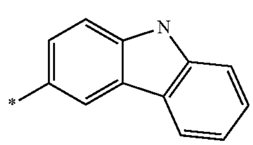
-continued
Formula 12-26
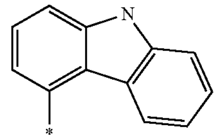
Formula 12-27
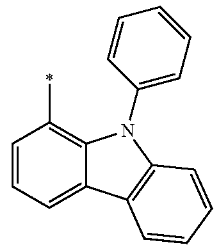
Formula 12-28
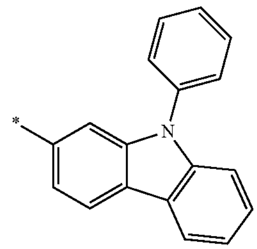
Formula 12-29
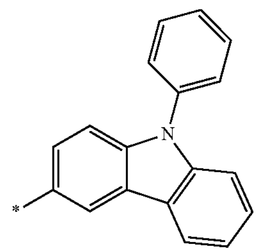
Formula 12-30
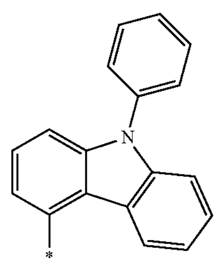
Formula 12-31
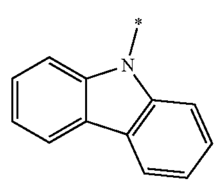
Formula 12-32
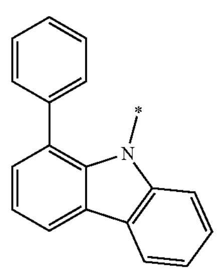

-continued
Formula 12-33
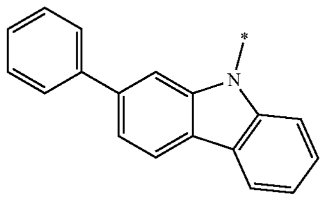
Formula 12-34
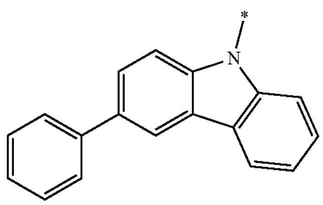
Formula 12-35
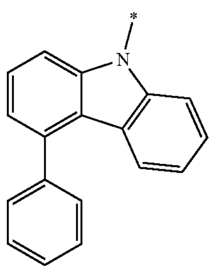
Formula 12-36
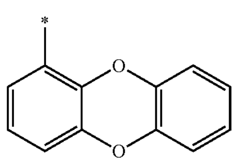
Formula 12-37
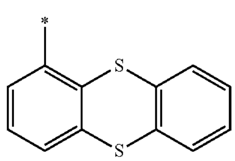
Formula 12-38
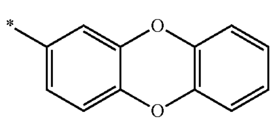
Formula 12-39
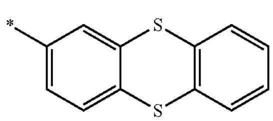
Formula 12-40
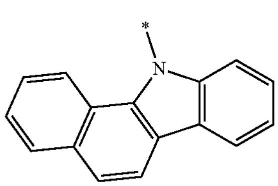
-continued
Formula 12-41
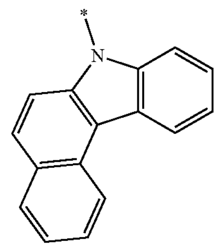
Formula 12-42
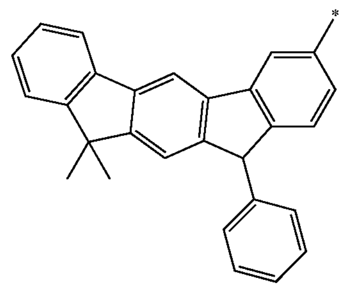
Formula 12-43
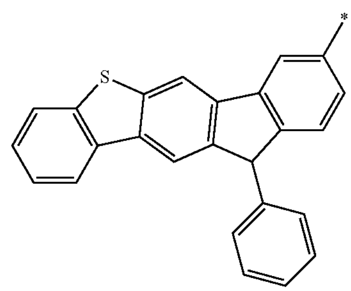
Formula 12-44
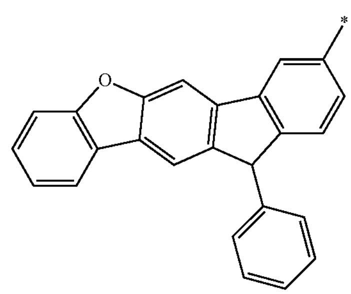
Formula 12-45
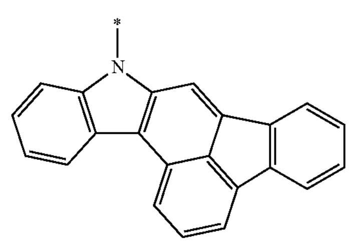
Formula 12-46
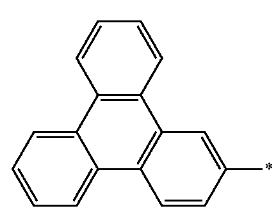

-continued

Formula 12-47

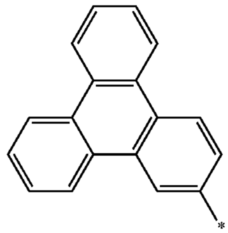

Formula 12-48

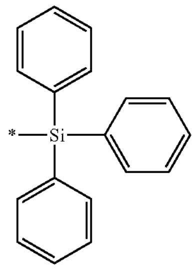

Formula 12-49

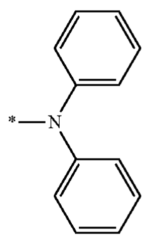

In Formulae 12-1 to 12-49, * may indicate a binding site to a neighboring atom.

In an exemplary embodiment, the first compound may be represented by one of Formulae 1-1(A-1) to 1-1(A-20), 1-1(B-1) to 1-1(B-20), 1-2(A-1) to 1-2(A-27), 1-2(B-1) to 1-2(B-19), 1-3(A-1) to 1-3(A-29), and 1-3(B-1) to 1-3(B-27), and the second compound may be represented by one of Formulae 2(1) to 2(10) below:

<Formula 1-1(A-1)>

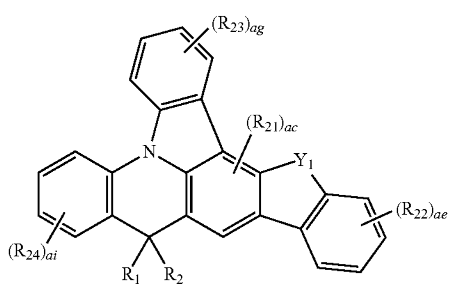

<Formula 1-1(A-2)>

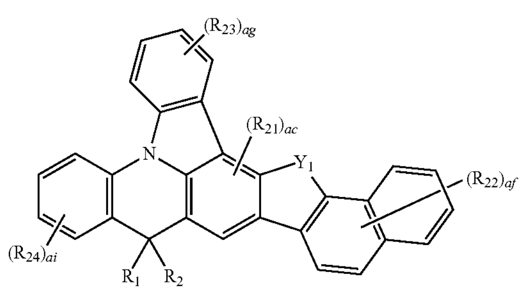

-continued

<Formula 1-1(A-3)>

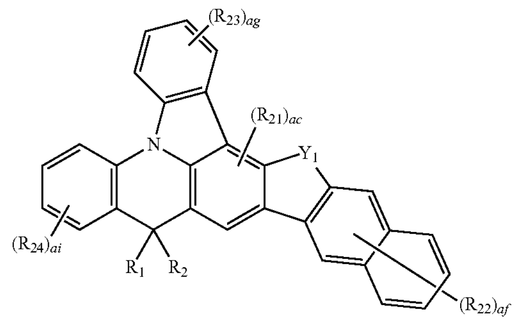

<Formula 1-1(A-4)>

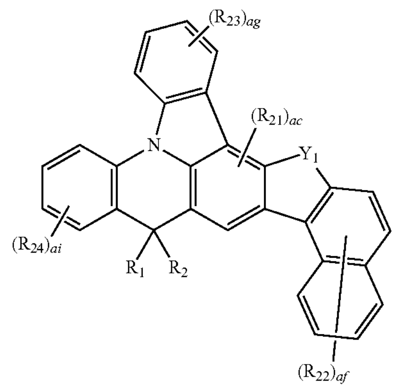

<Formula 1-1(A-5)>

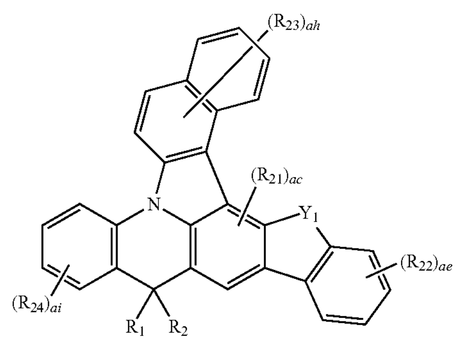

<Formula 1-1(A-6)>

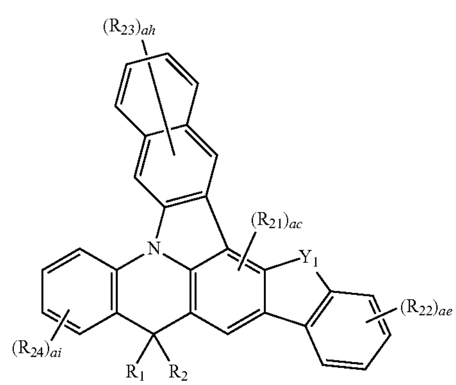

-continued
<Formula 1-1(A-7)>
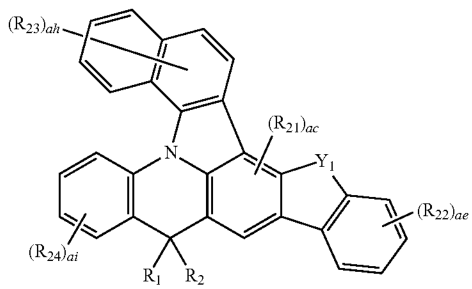
<Formula 1-1(A-8)>
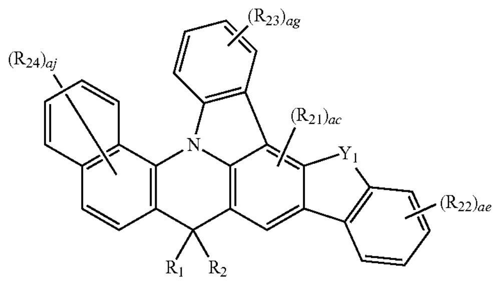
<Formula 1-1(A-9)>
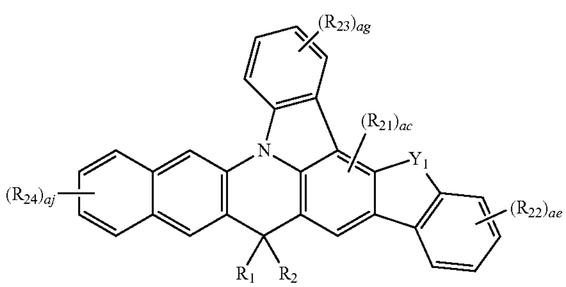
<Formula 1-1(A-10)>
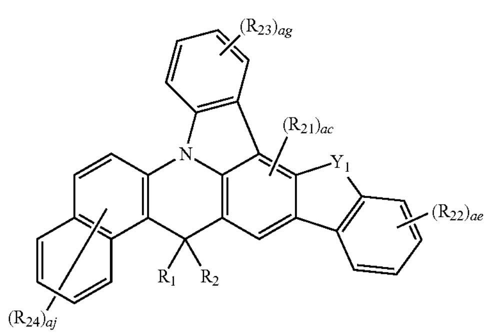
<Formula 1-1(A-11)>
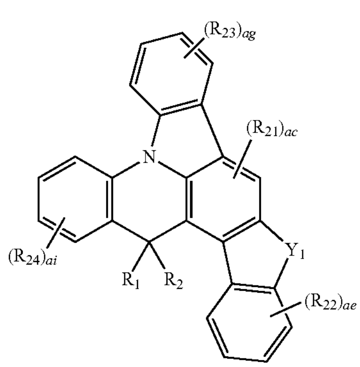
-continued
<Formula 1-1(A-12)>
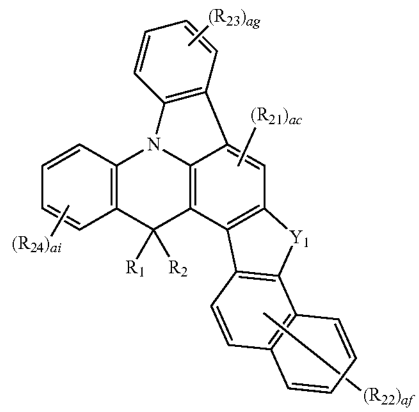
<Formula 1-1(A-13)>
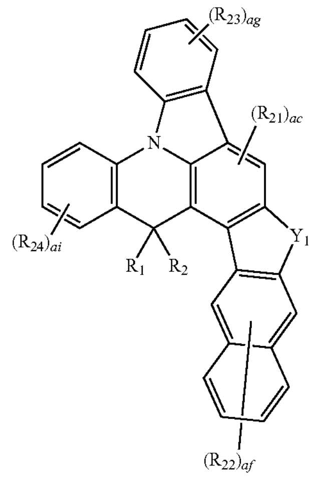
<Formula 1-1(A-14)>
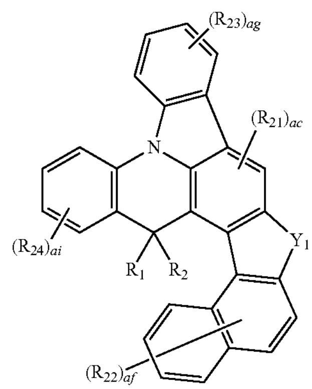

-continued
<Formula 1-1(A-15)>
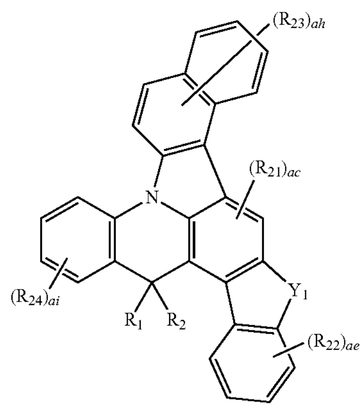
<Formula 1-1(A-16)>
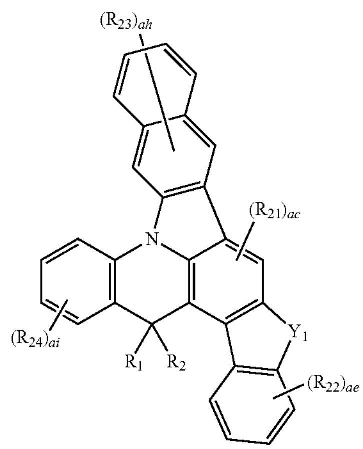
<Formula 1-1(A-17)>
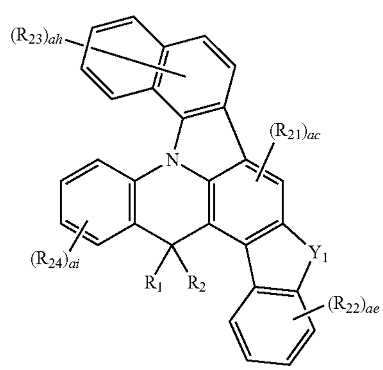
<Formula 1-1(A-18)>
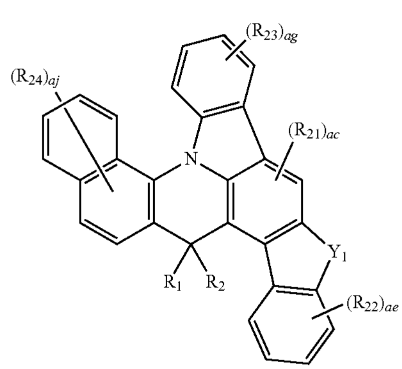
-continued
<Formula 1-1(A-19)>
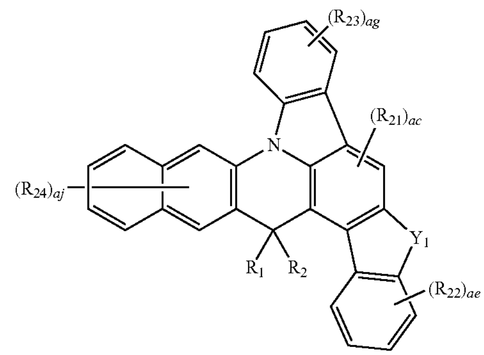
<Formula 1-1(A-20)>
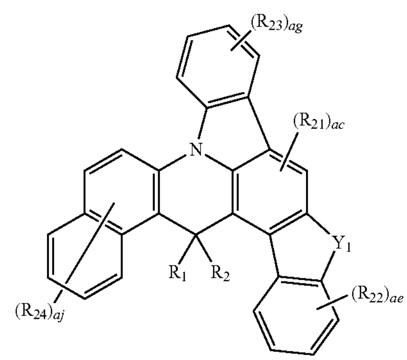
<Formula 1-1(B-1)>
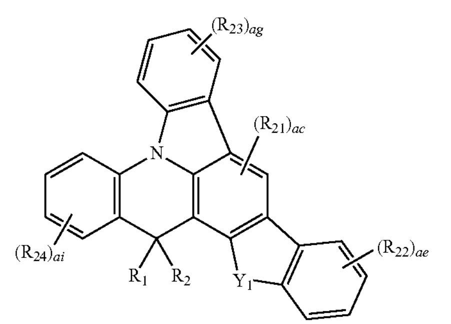
<Formula 1-1(B-2)>
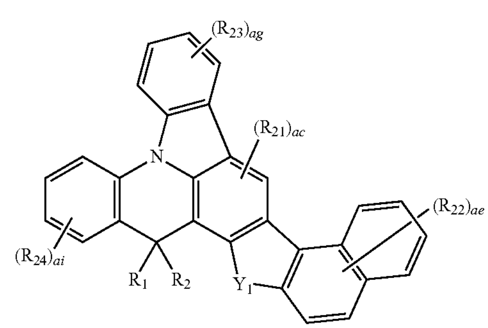

-continued
<Formula 1-1(B-3)>
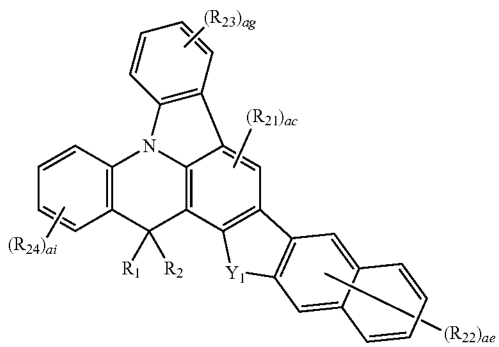
<Formula 1-1(B-4)>
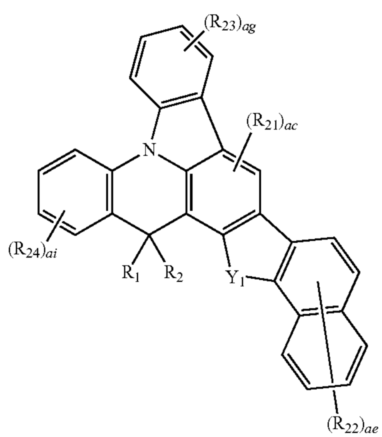
<Formula 1-1(B-5)>
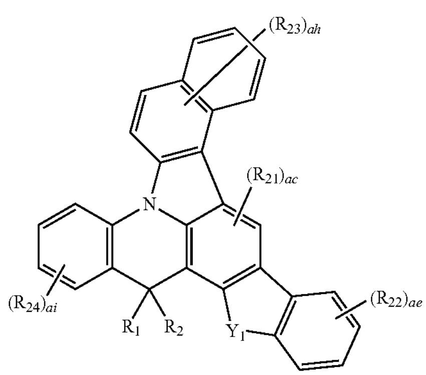
<Formula 1-1(B-6)>
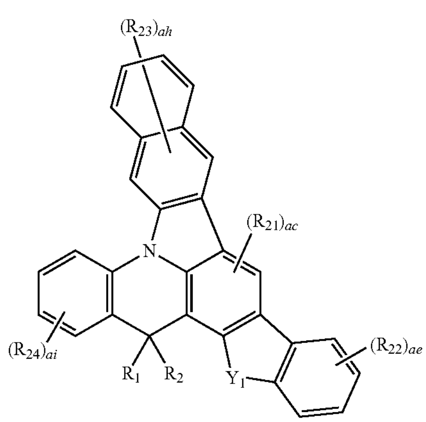
-continued
<Formula 1-1(B-7)>
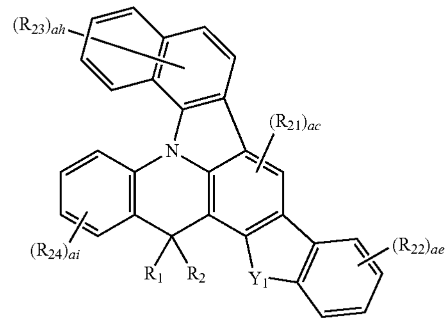
<Formula 1-1(B-8)>
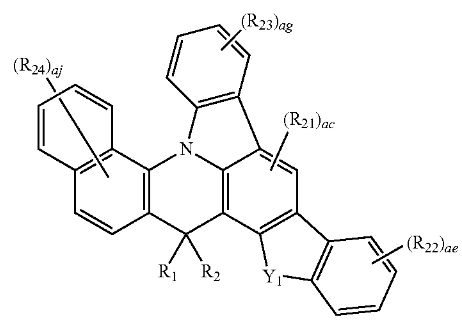
<Formula 1-1(B-9)>
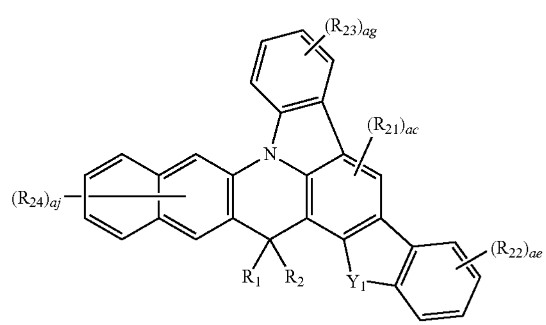
<Formula 1-1(B-10)>
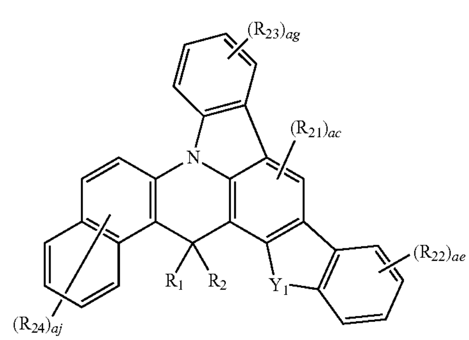

-continued
<Formula 1-1(B-11)>
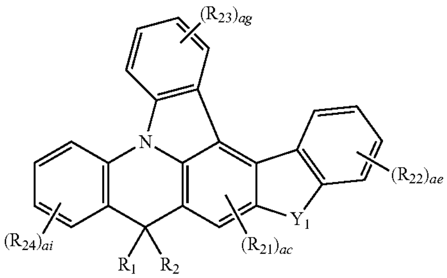
<Formula 1-1(B-12)>
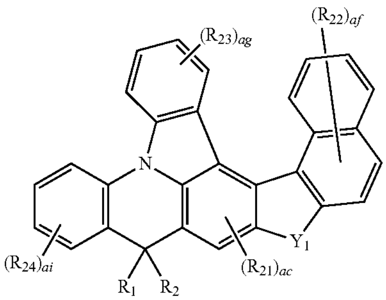
<Formula 1-1(B-13)>
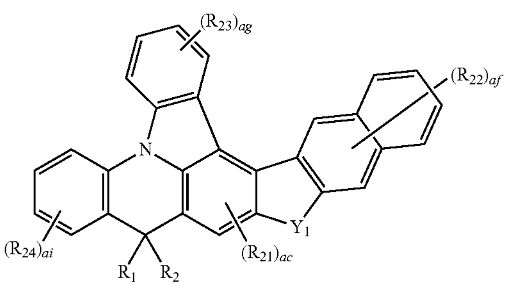
<Formula 1-1(B-14)>
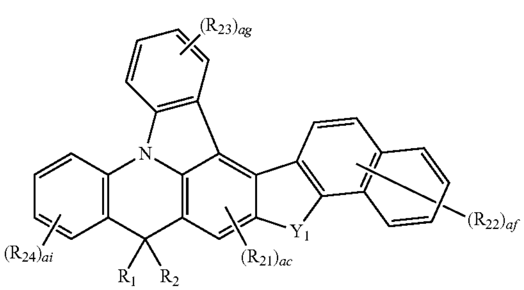
<Formula 1-1(B-15)>
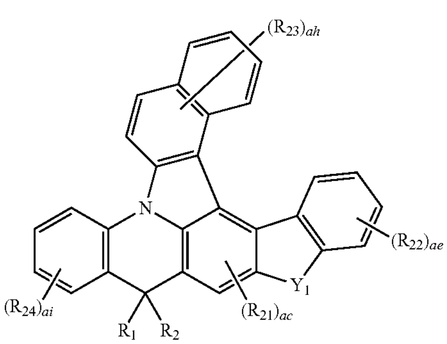
-continued
<Formula 1-1(B-16)>
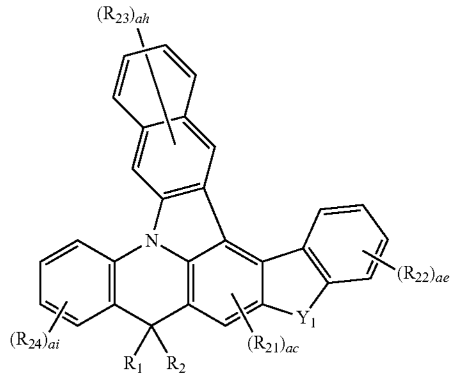
<Formula 1-1(B-17)>
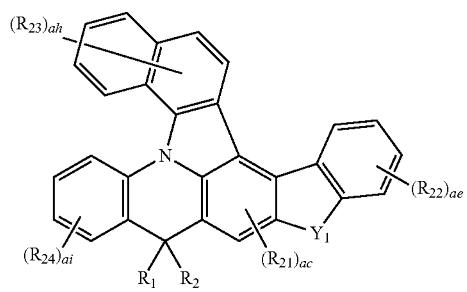
<Formula 1-1(B-18)>
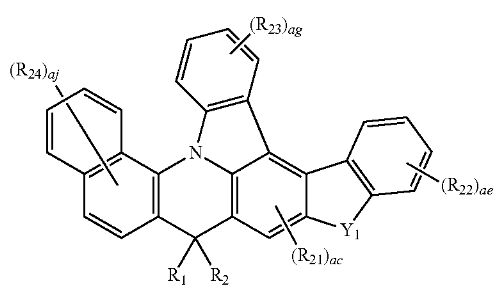
<Formula 1-1(B-19)>
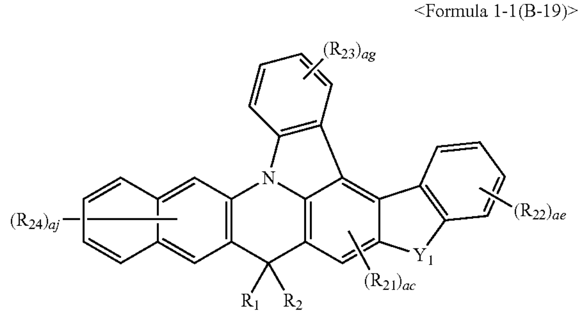

<Formula 1-1(B-20)>
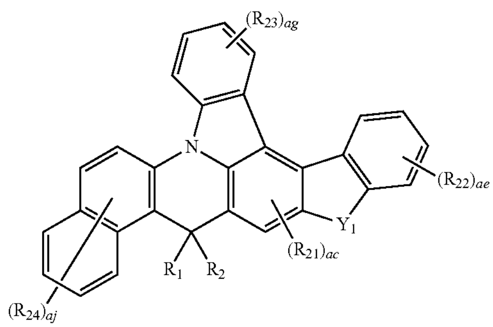
<Formula 1-2(A-1)>
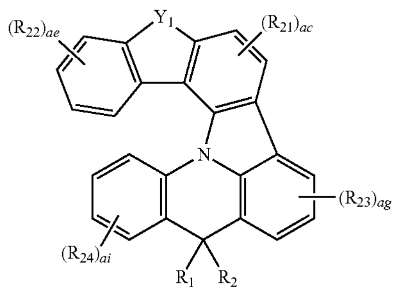
<Formula 1-2(A-2)>
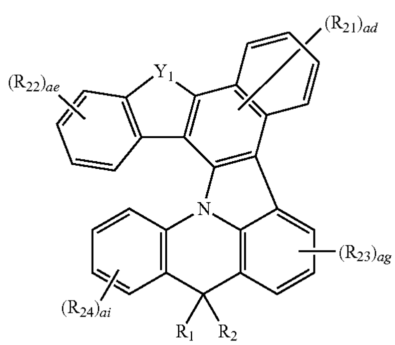
<Formula 1-2(A-3)>
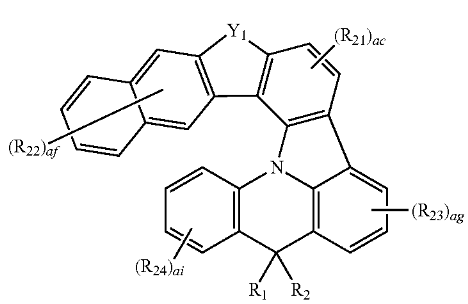
<Formula 1-2(A-4)>
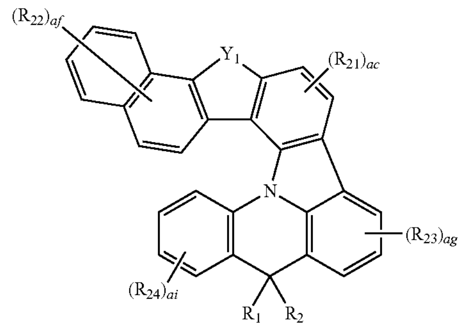
<Formula 1-2(A-5)>
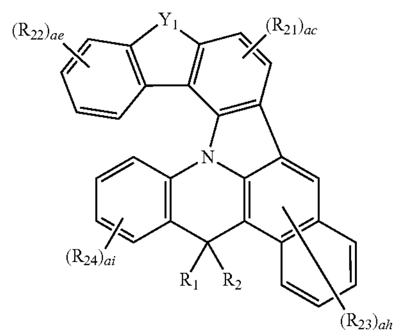
<Formula 1-2(A-6)>
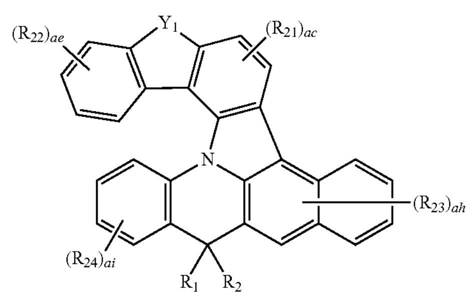
<Formula 1-2(A-7)>
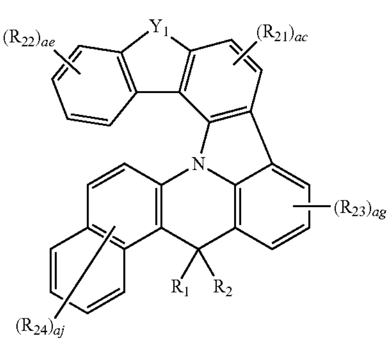

-continued
<Formula 1-2(A-8)>
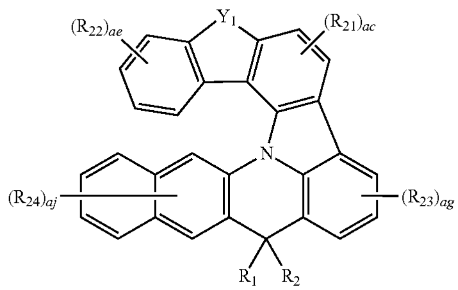
<Formula 1-2(A-9)>
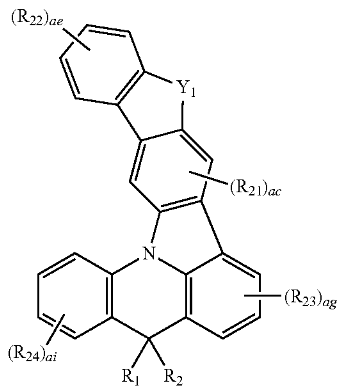
<Formula 1-2(A-10)>
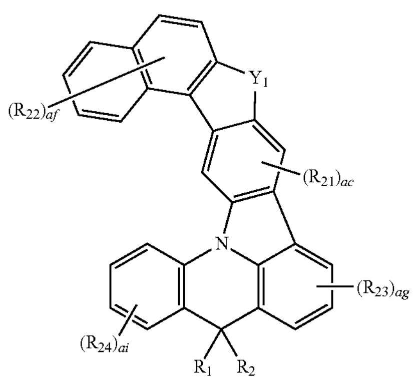
<Formula 1-2(A-11)>
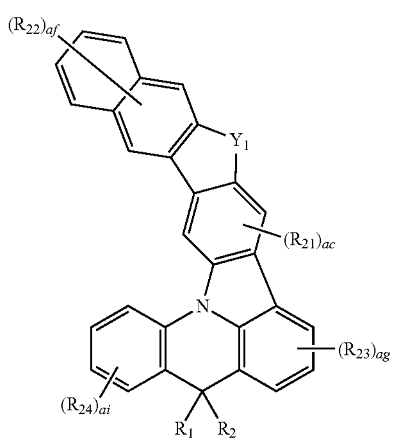
-continued
<Formula 1-2(A-12)>
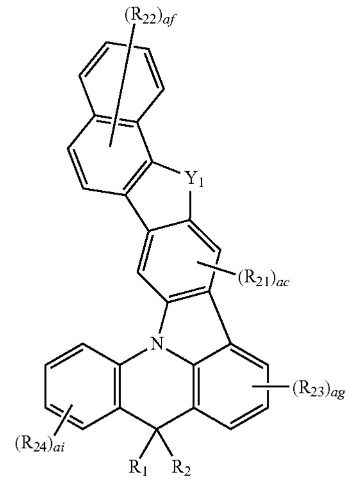
<Formula 1-2(A-13)>
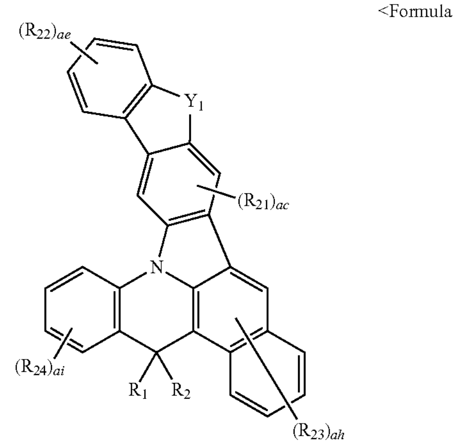
<Formula 1-2(A-14)>
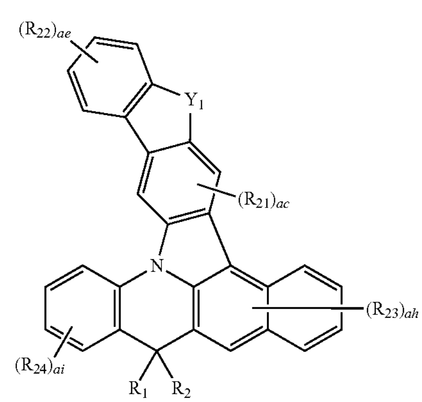

<Formula 1-2(A-15)>
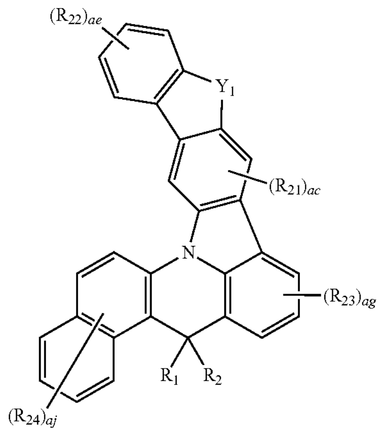
<Formula 1-2(A-16)>
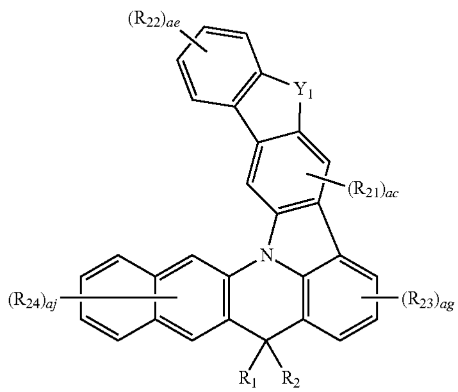
<Formula 1-2(A-17)>
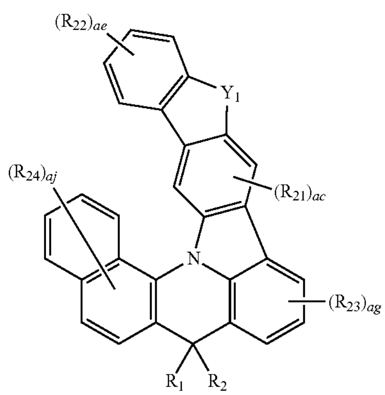
<Formula 1-2(A-18)>
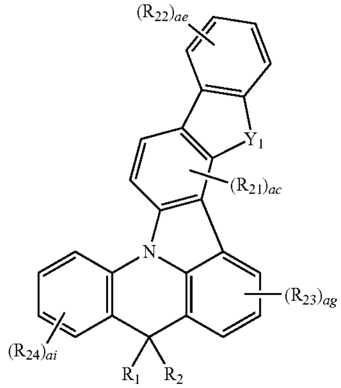
<Formula 1-2(A-19)>
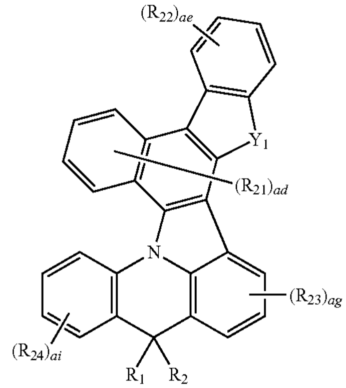
<Formula 1-2(A-20)>
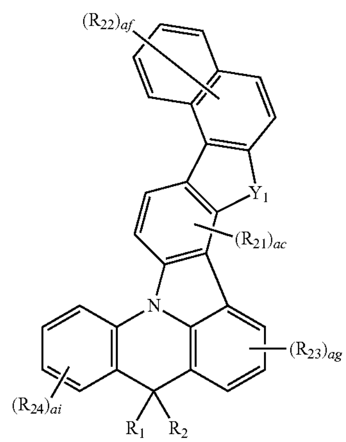
<Formula 1-2(A-21)>
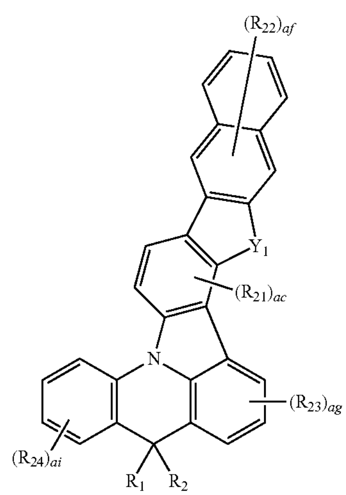

-continued
<Formula 1-2(A-22)>
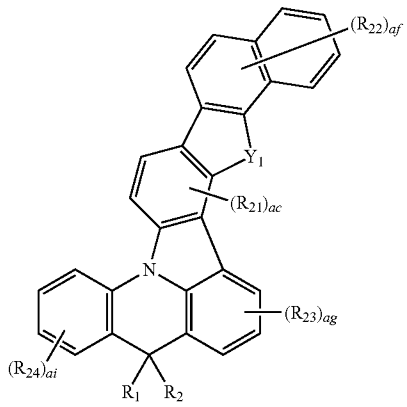
<Formula 1-2(A-23)>
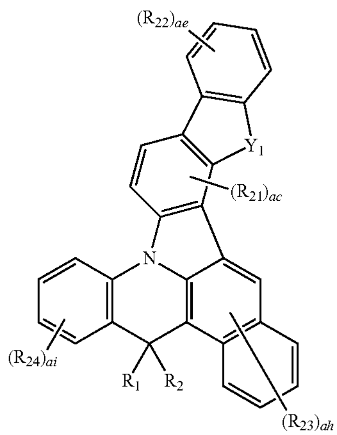
<Formula 1-2(A-24)>
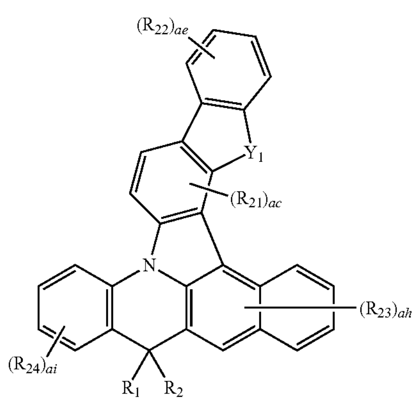
-continued
<Formula 1-2(A-25)>
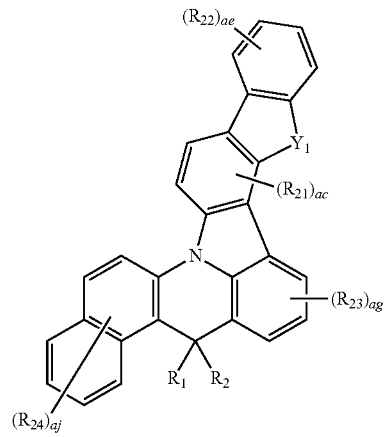
<Formula 1-2(A-26)>
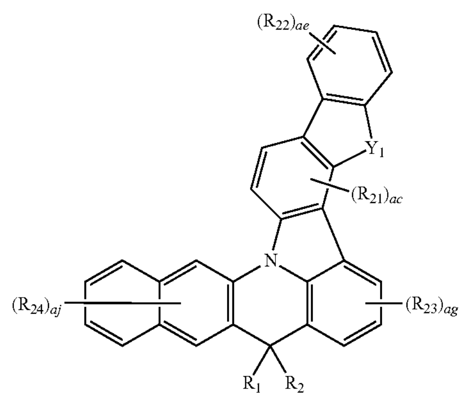
<Formula 1-2(A-27)>
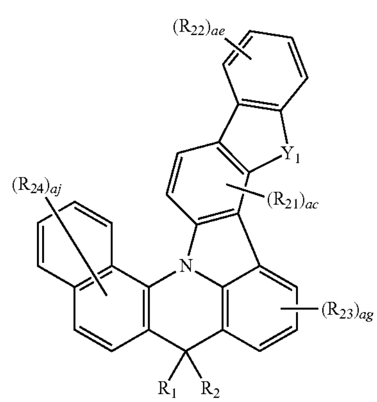

-continued
<Formula 1-2(B-1)>
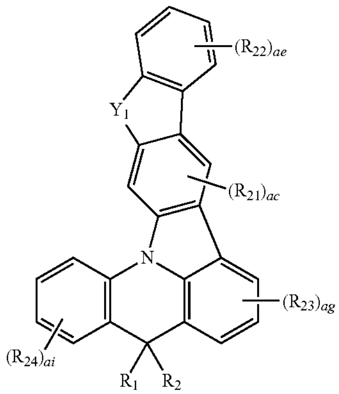
<Formula 1-2(B-2)>
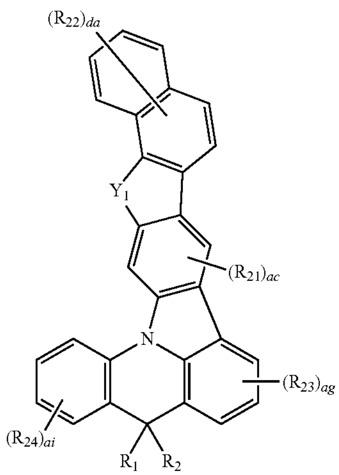
<Formula 1-2(B-3)>
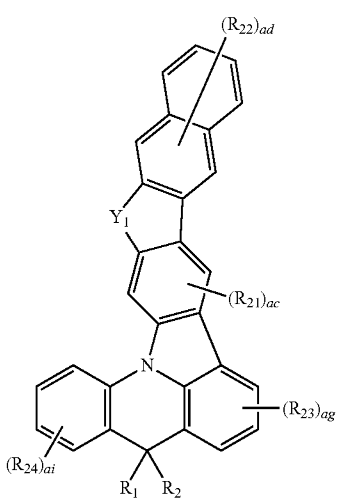
-continued
<Formula 1-2(B-4)>
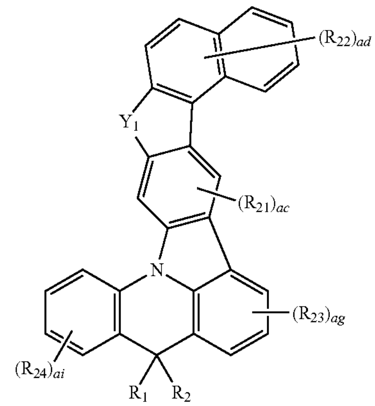
<Formula 1-2(B-5)>
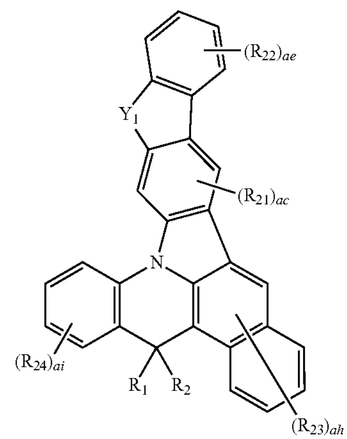
<Formula 1-2(B-6)>
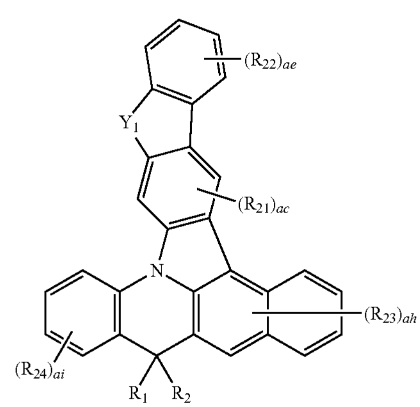

<Formula 1-2(B-7)>
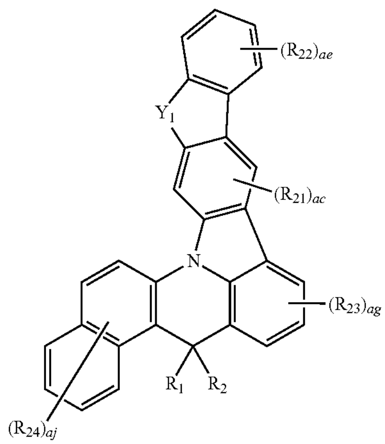
<Formula 1-2(B-8)>
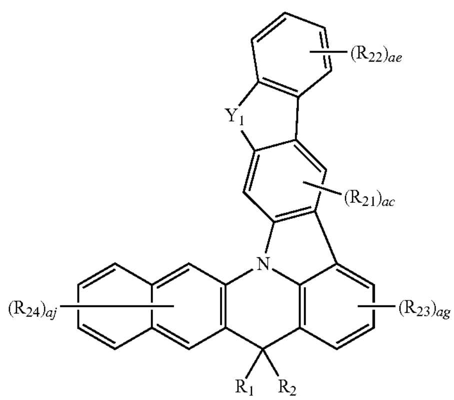
<Formula 1-2(B-9)>
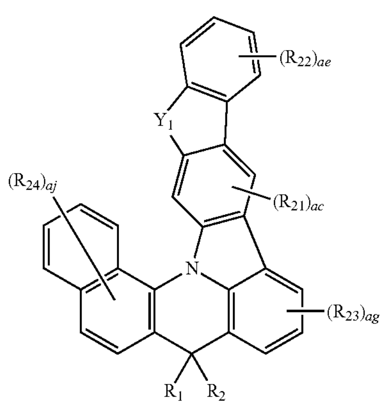
<Formula 1-2(B-10)>
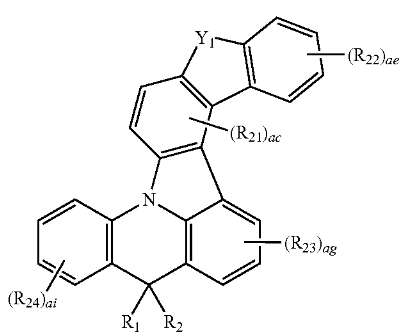
<Formula 1-2(B-11)>
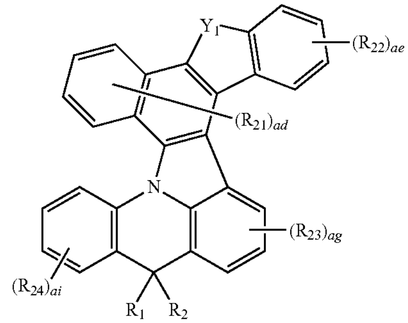
<Formula 1-2(B-12)>
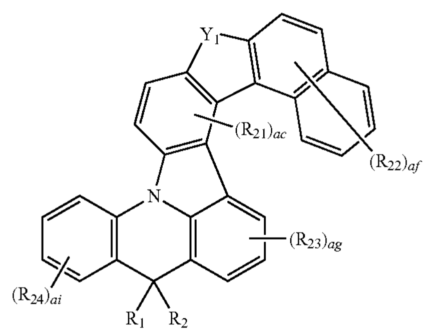
<Formula 1-2(B-13)>
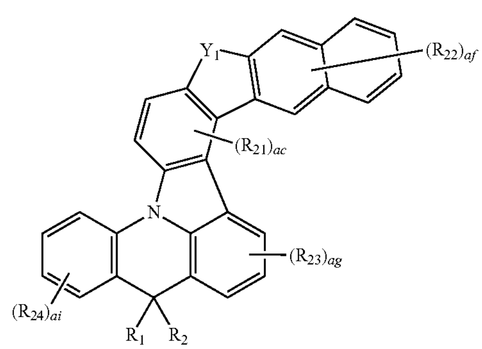
<Formula 1-2(B-14)>
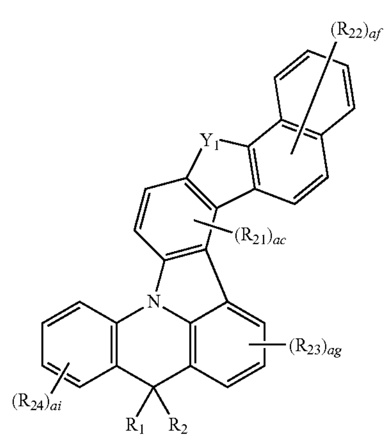

-continued
<Formula 1-2(B-15)>
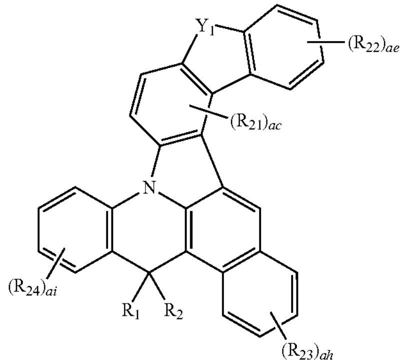
<Formula 1-2(B-16)>
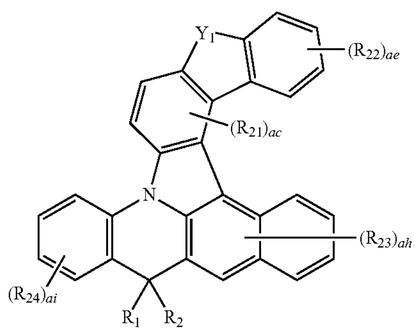
<Formula 1-2(B-17)>
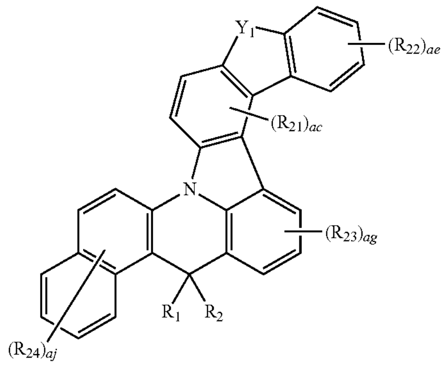
<Formula 1-2(B-18)>
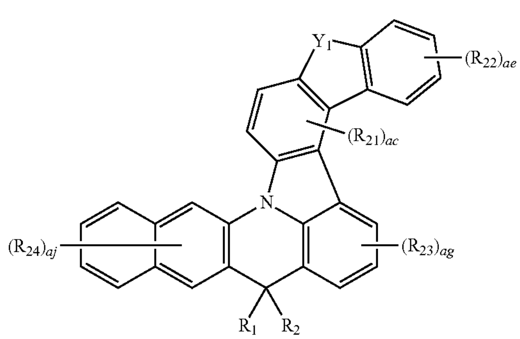
-continued
<Formula 1-2(B-19)>
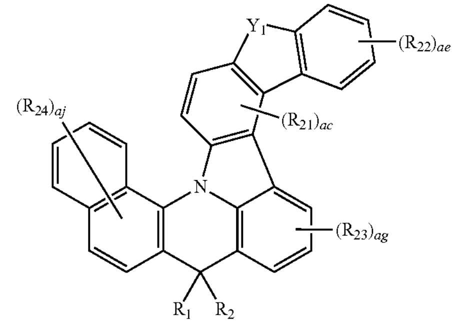
<Formula 1-3(A-1)>
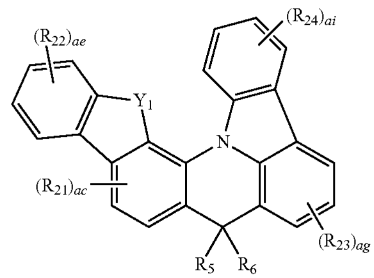
<Formula 1-3(A-2)>
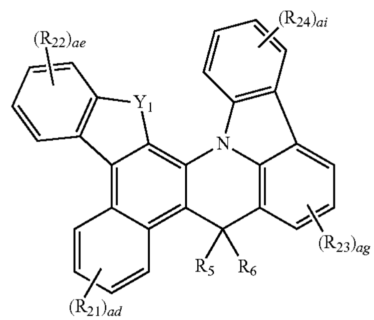
<Formula 1-3(A-3)>
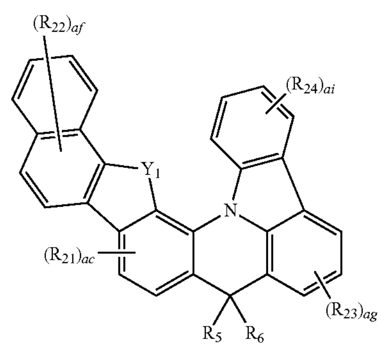
<Formula 1-3(A-4)>
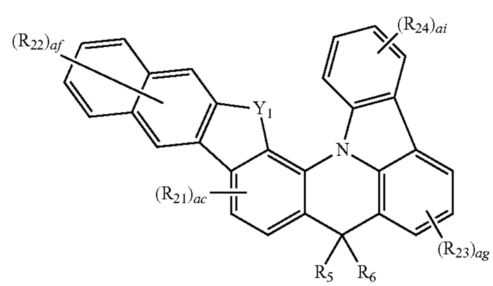

-continued
<Formula 1-3(A-5)>
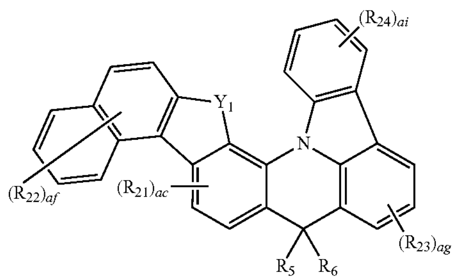
<Formula 1-3(A-6)>
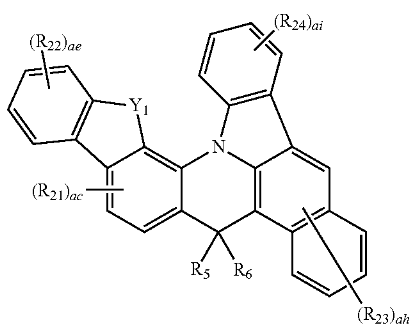
<Formula 1-3(A-7)>
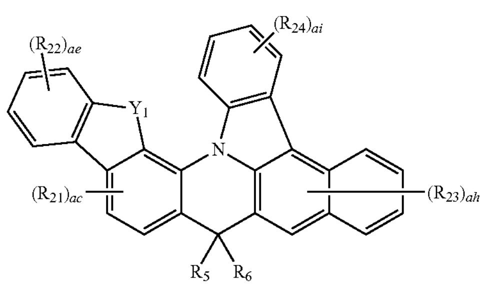
<Formula 1-3(A-8)>
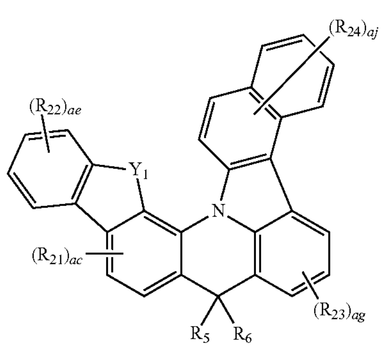
-continued
<Formula 1-3(A-9)>
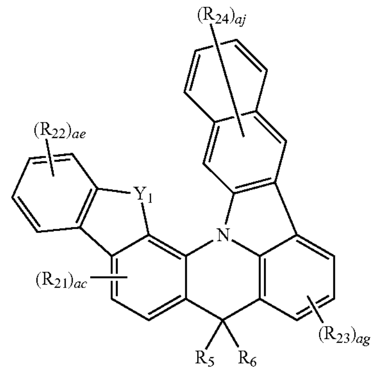
<Formula 1-3(A-10)>
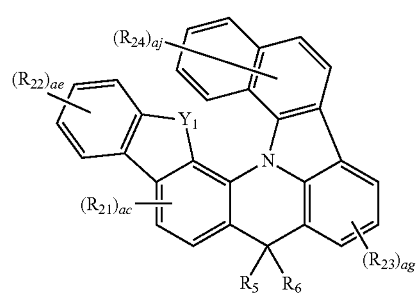
<Formula 1-3(A-11)>
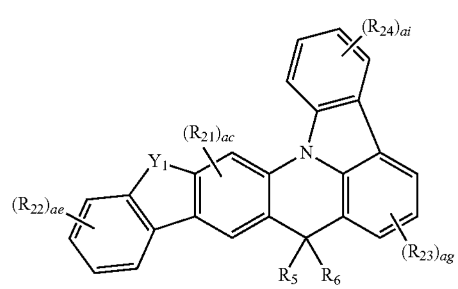
<Formula 1-3(A-12)>
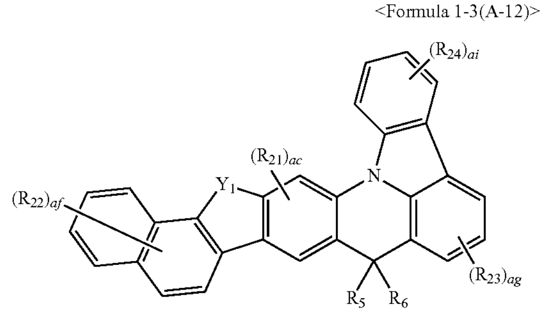

-continued
<Formula 1-3(A-13)>
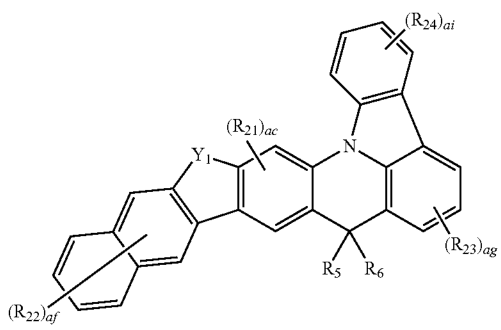
<Formula 1-3(A-14)>
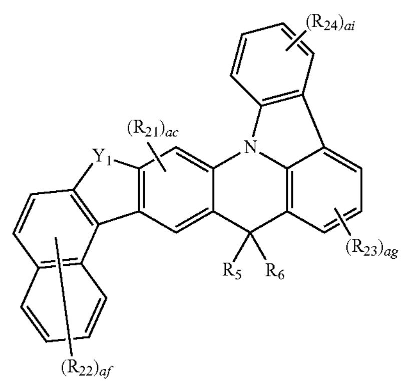
<Formula 1-3(A-15)>
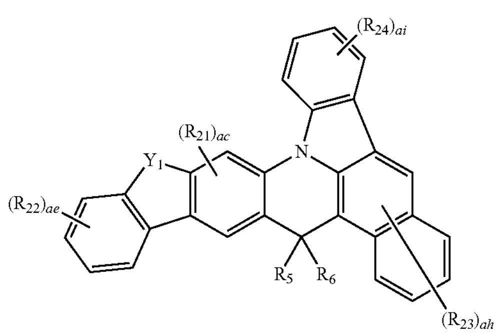
<Formula 1-3(A-16)>
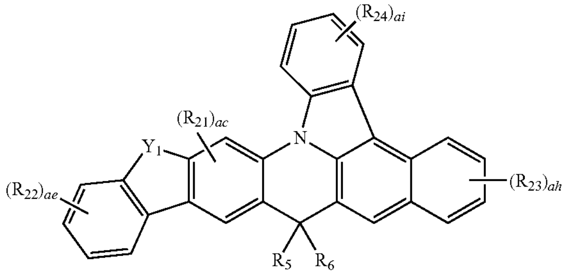
-continued
<Formula 1-3(A-17)>
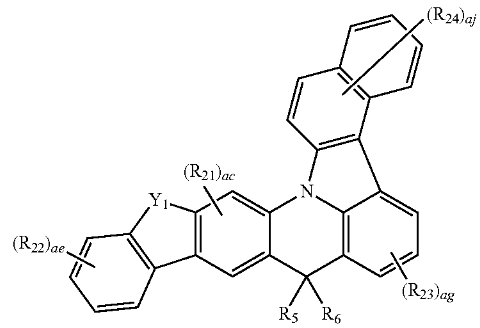
<Formula 1-3(A-18)>
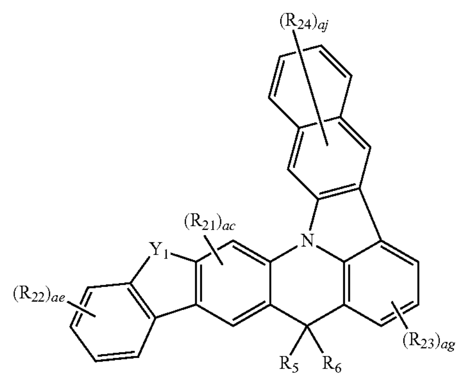
<Formula 1-3(A-19)>
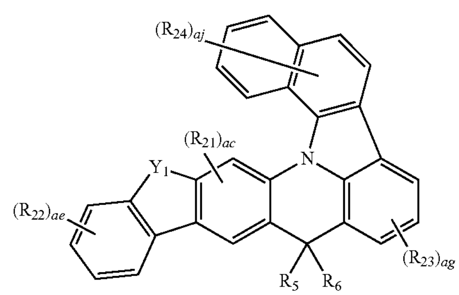
<Formula 1-3(A-20)>
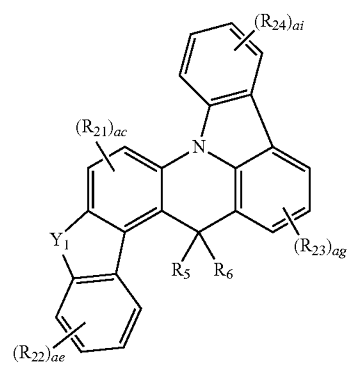

-continued
<Formula 1-3(A-21)>
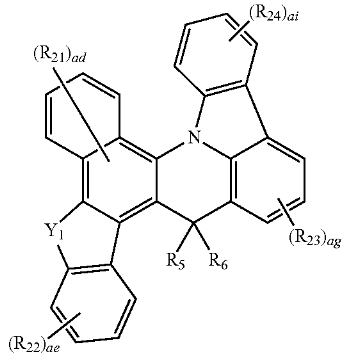
<Formula 1-3(A-22)>
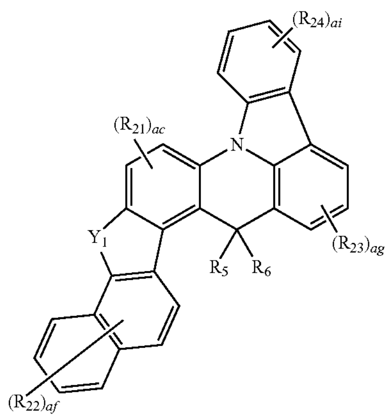
<Formula 1-3(A-23)>
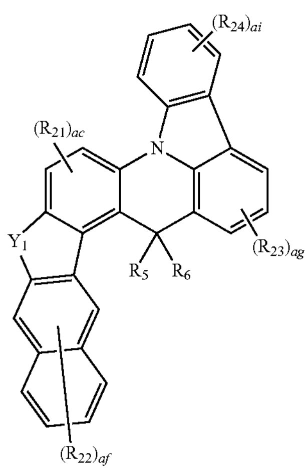
<Formula 1-3(A-24)>
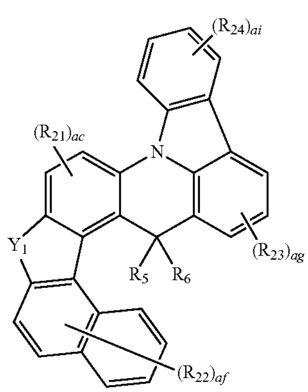
-continued
<Formula 1-3(A-25)>
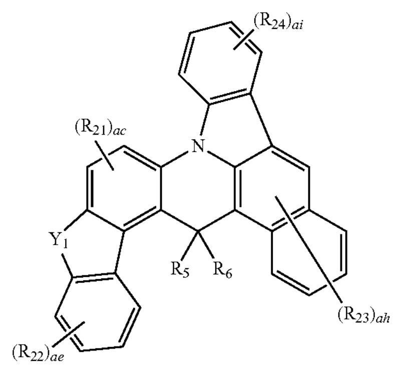
<Formula 1-3(A-26)>
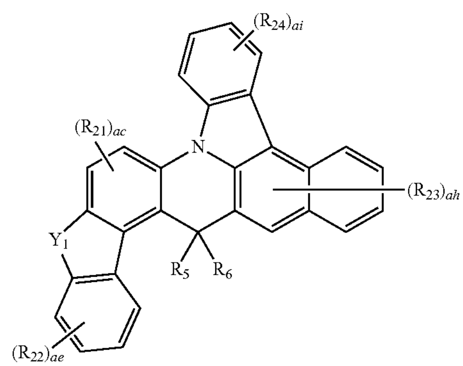
<Formula 1-3(A-27)>
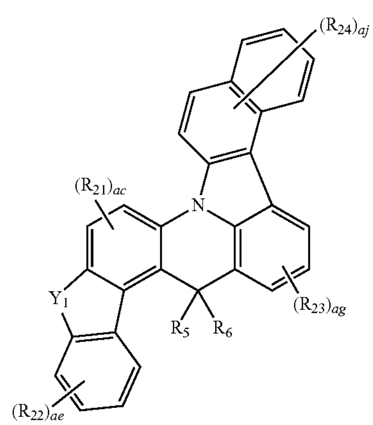
<Formula 1-3(A-28)>
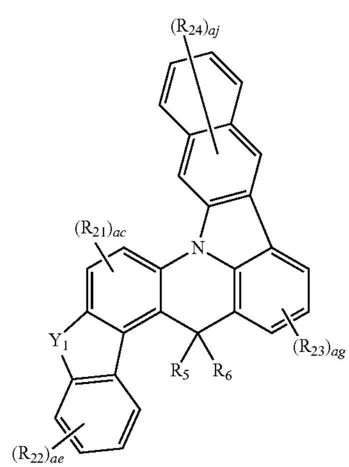

-continued
<Formula 1-3(A-29)>
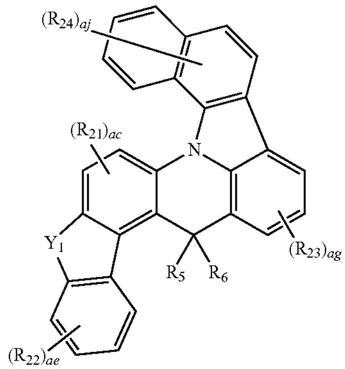
<Formula 1-3(B-1)>
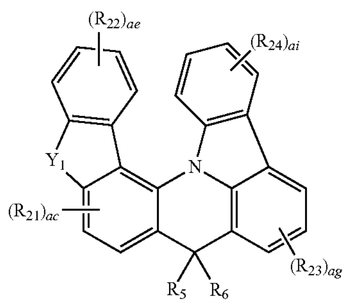
<Formula 1-3(B-2)>
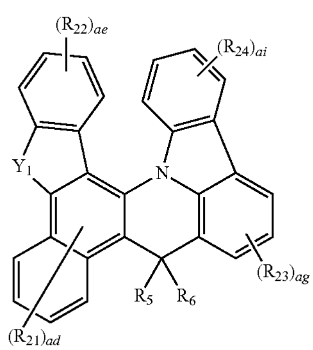
<Formula 1-3(B-3)>
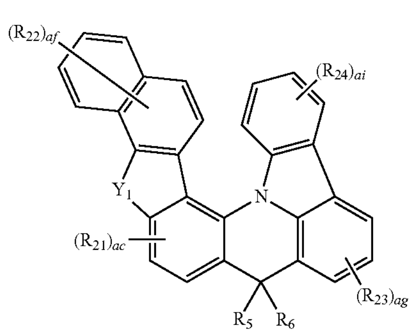
-continued
<Formula 1-3(B-4)>
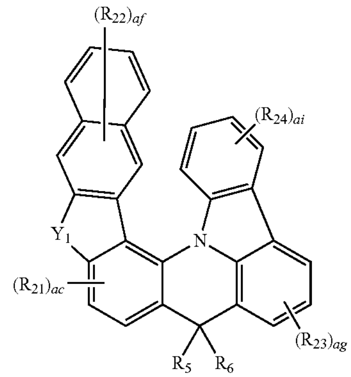
<Formula 1-3(B-5)>
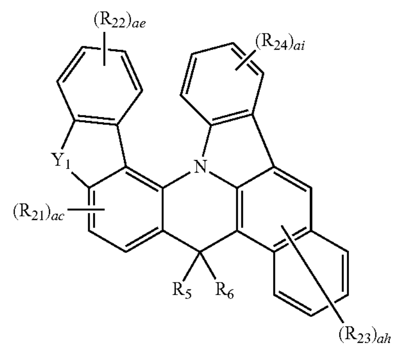
<Formula 1-3(B-6)>
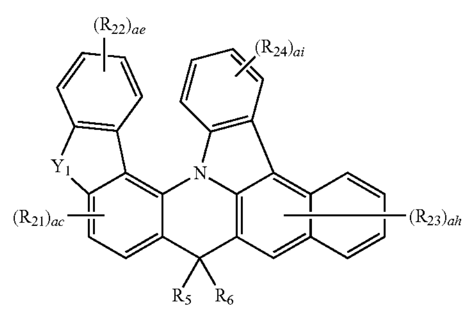
<Formula 1-3(B-7)>
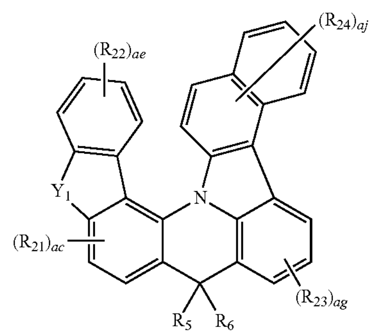

<Formula 1-3(B-8)>
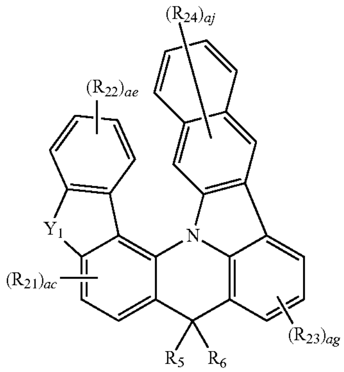
<Formula 1-3(B-9)>
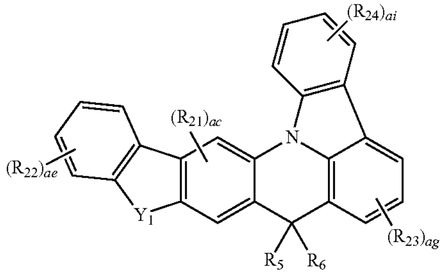
<Formula 1-3(B-10)>
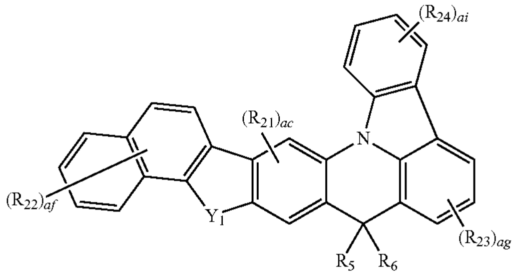
<Formula 1-3(B-11)>
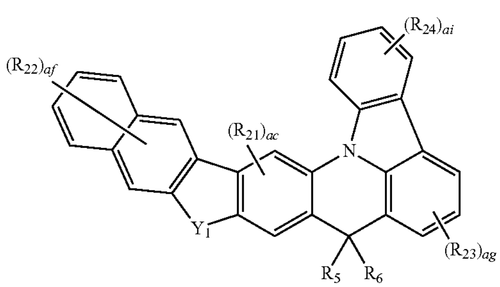
<Formula 1-3(B-12)>
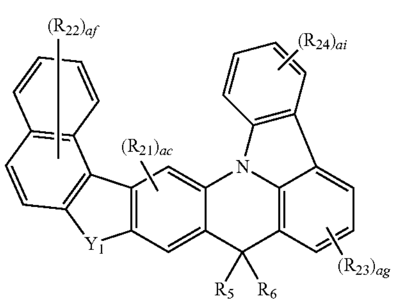
<Formula 1-3(B-13)>
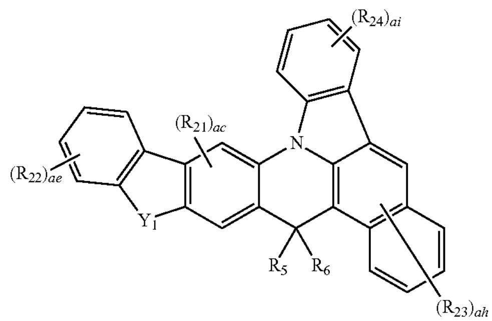
<Formula 1-3(B-14)>
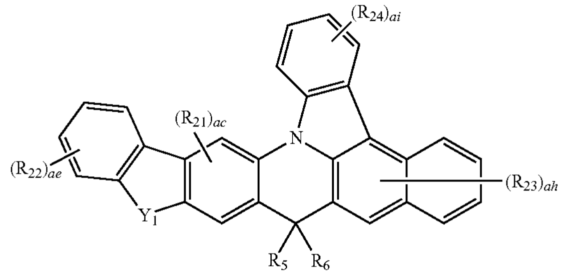
<Formula 1-3(B-15)>
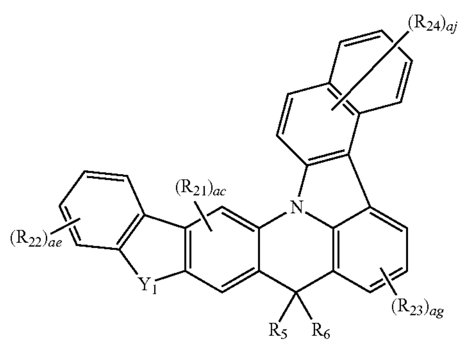
<Formula 1-3(B-16)>
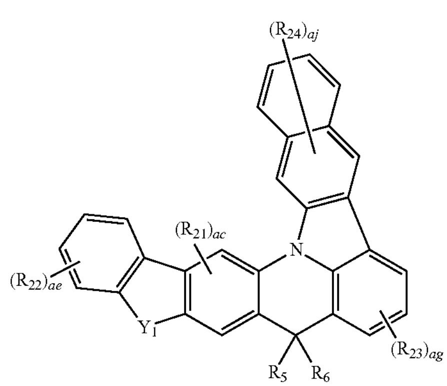

-continued
<Formula 1-3(B-17)>
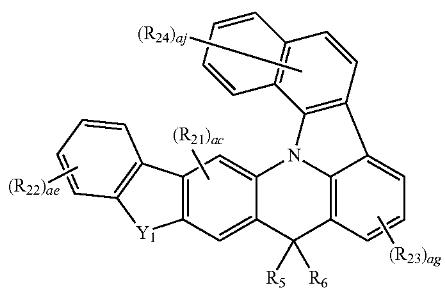
<Formula 1-3(B-18)>
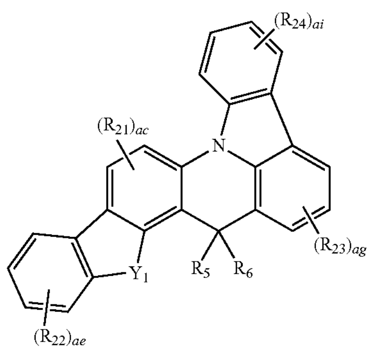
<Formula 1-3(B-19)>
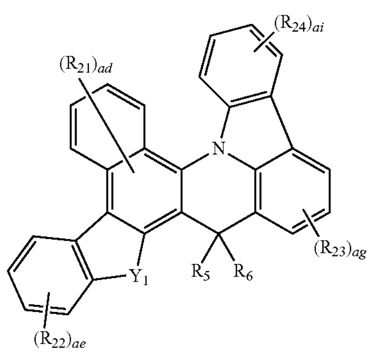
<Formula 1-3(B-20)>
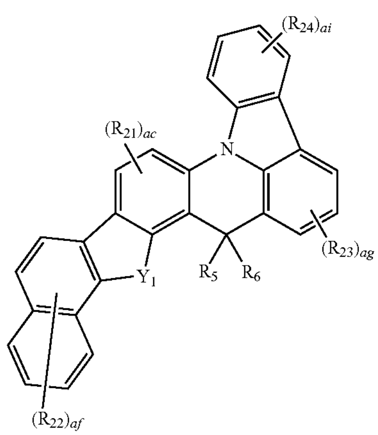
-continued
<Formula 1-3(B-21)>
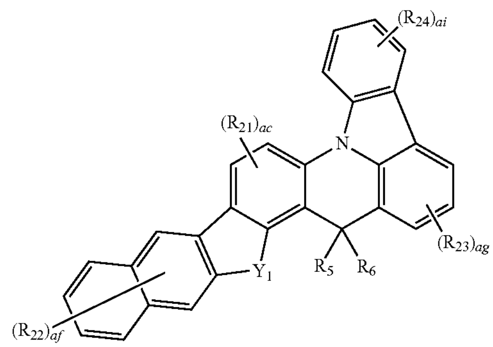
<Formula 1-3(B-22)>
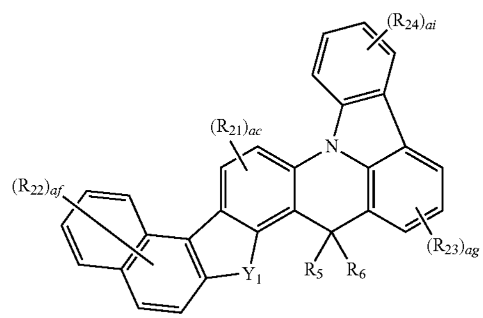
<Formula 1-3(B-23)>
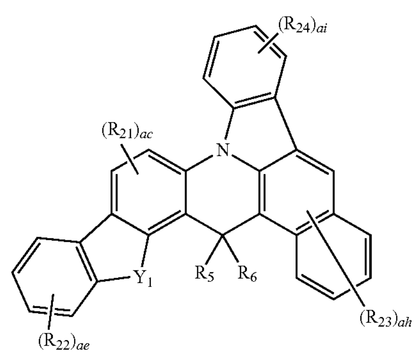
<Formula 1-3(B-24)>
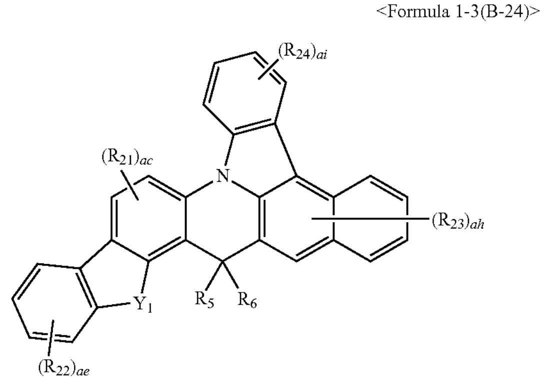

-continued
<Formula 1-3(B-25)>
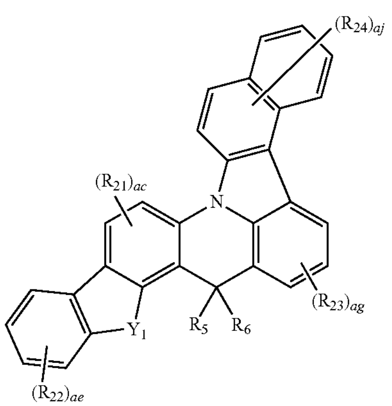
<Formula 1-3(B-26)>
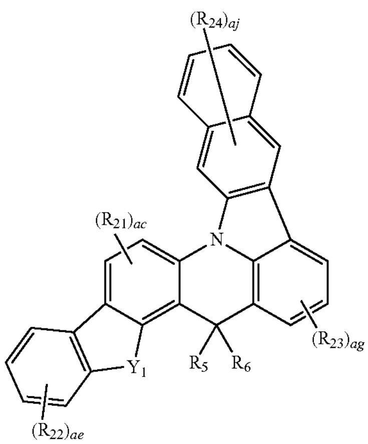
<Formula 1-3(B-27)>
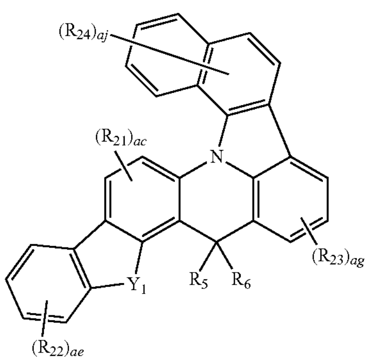
<Formula 2(1)>
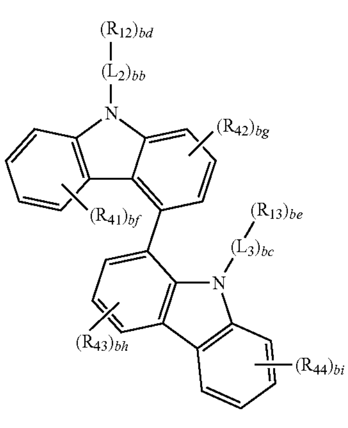
-continued
<Formula 2(2)>
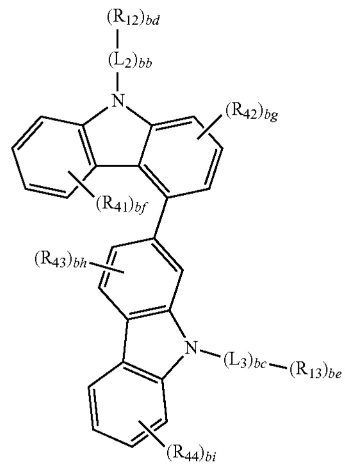
<Formula 2(3)>
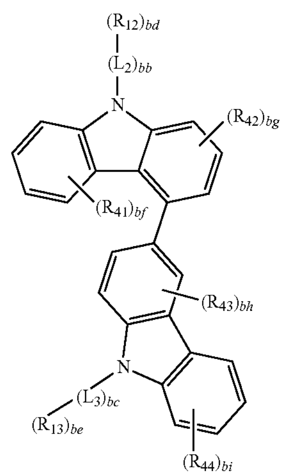
<Formula 2(4)>
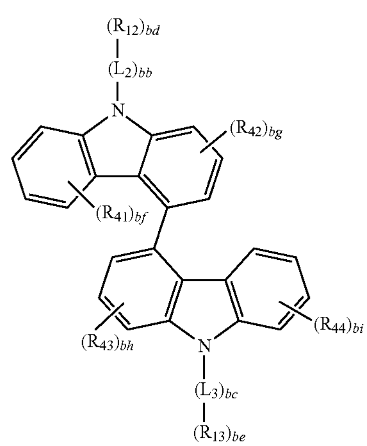

-continued

<Formula 2(5)>

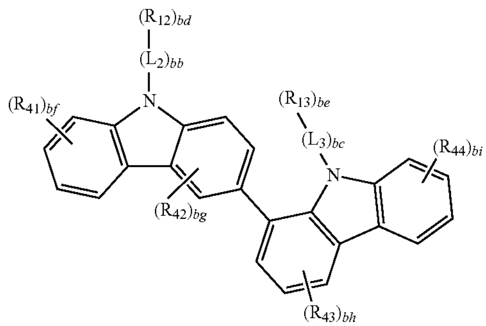

<Formula 2(6)>

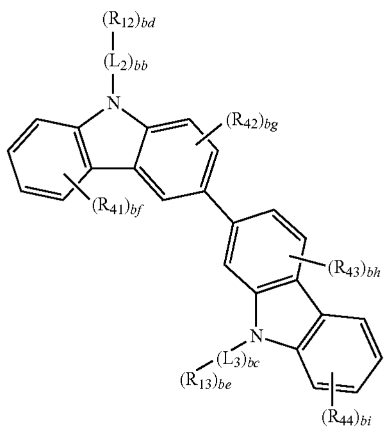

<Formula 2(7)>

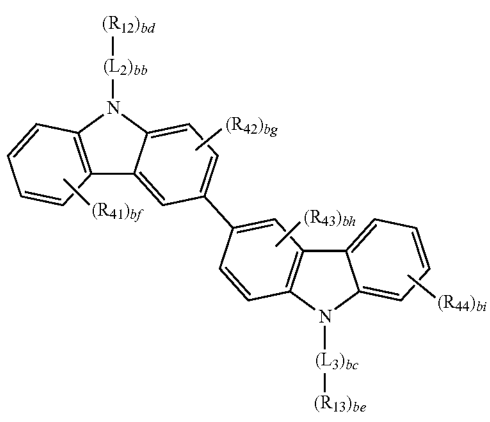

<Formula 2(8)>

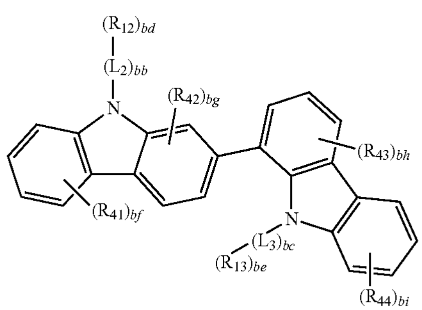

-continued

<Formula 2(9)>

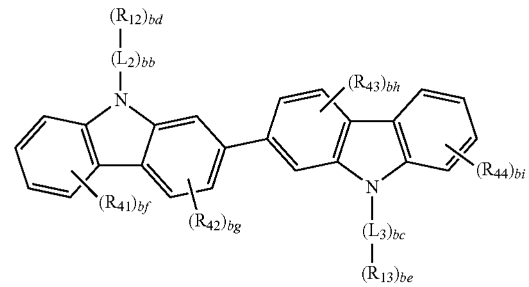

<Formula 2(10)>

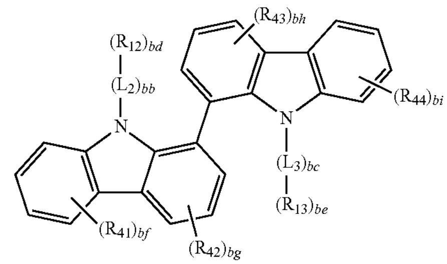

In Formulae 1-1(A-1) to 1-1(A-20), 1-1(B-1) to 1-1(B-20), 1-2(A-1) to 1-2(A-27), 1-2(B-1) to 1-2(B-19), 1-3(A-1) to 1-3(A-29), and 1-3(B-1) to 1-3(B-27), descriptions of $Y_1$, $R_1$ to $R_6$, and $R_{21}$ to $R_{24}$ may be understood by referring to the descriptions provided herein, ac may be selected from 0, 1, and 2, and for example, when ac is 2, $2R_{21}$s may be identical to or different from each other, ad, ae, ag, and ai may be each independently selected from 0, 1, 2, 3, and 4, and for example, when ad, ae, ag, and ai are 2 or more, 2 or more $R_{21}$s, 2 or more $R_{22}$s, 2 or more $R_{23}$s, and 2 or more $R_{24}$s may be identical to or different from each other, respectively, af, ah, and aj may be each independently selected 0, 1, 2, 3, 4, 5, and 6, and for example, when af, ah, and aj are 2 or more, 2 or more $R_{22}$s, 2 or more $R_{23}$s and 2 or more $R_{24}$s may be identical to or different from each other, respectively, and descriptions of $L_3$ and $L_{11}$, $R_{12}$, $R_{13}$, $R_{41}$ to $R_{44}$, and ba to bi in Formulae 2(1) to 2(10) may be understood by referring to the descriptions provided herein.

For example, the first compound may be one of Compounds 1 to 37 below, and the second compound may be one of Compounds 51 to 68 below:

1

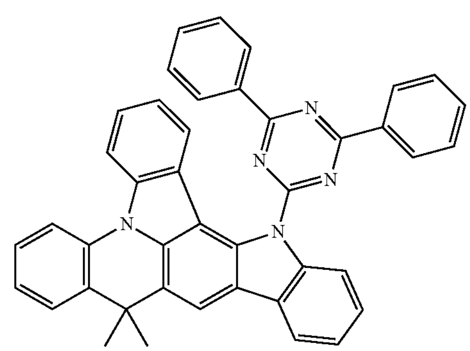

-continued
2
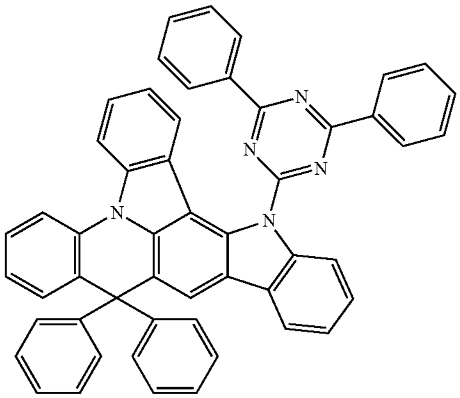
3
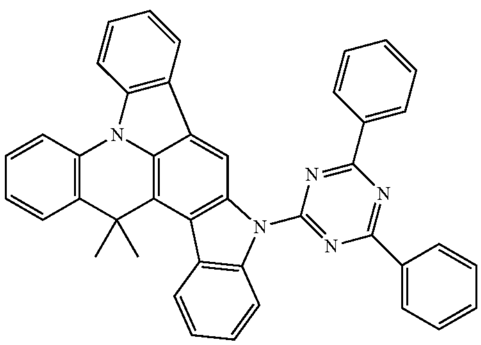
4
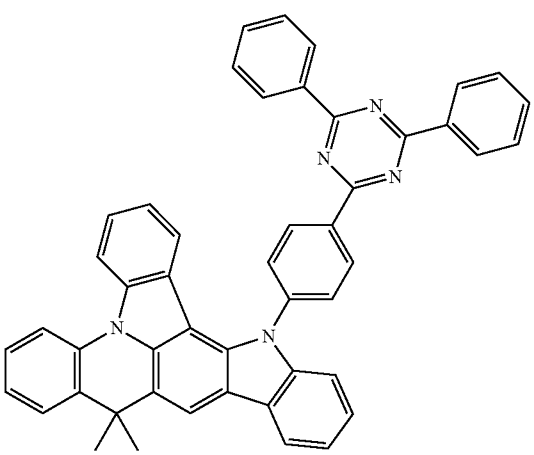
5
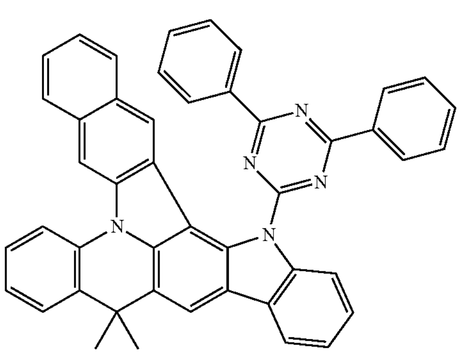
-continued
6
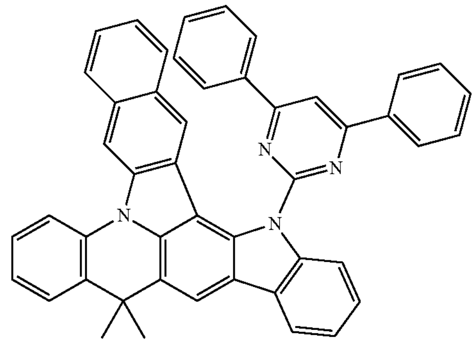
7
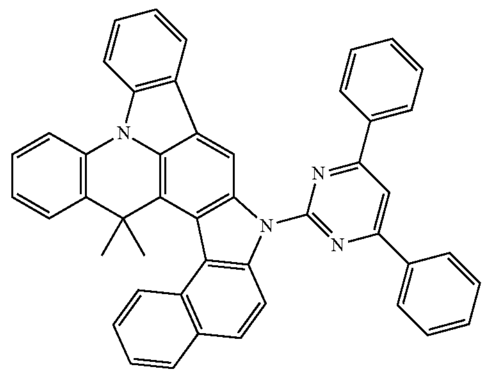
8
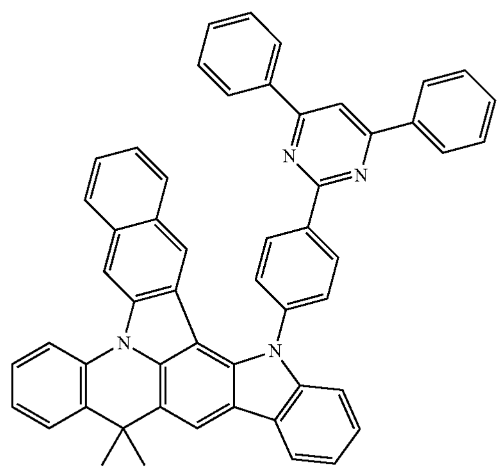
9
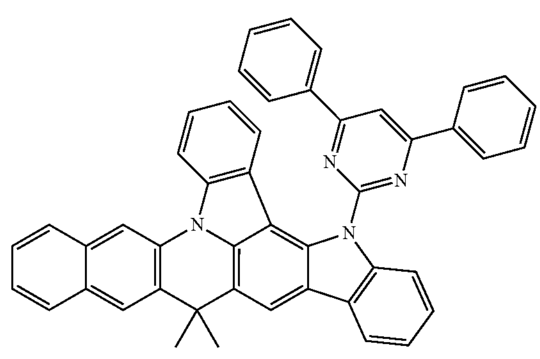

-continued
10
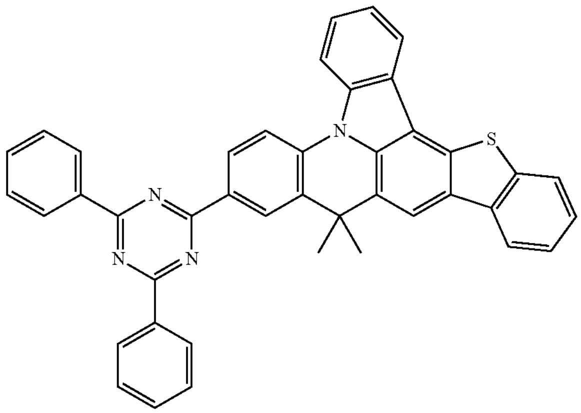
11
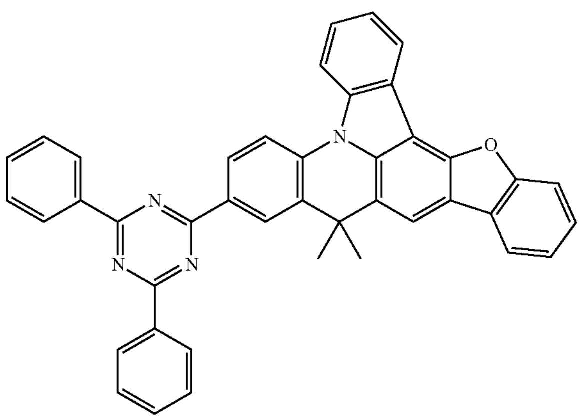
12
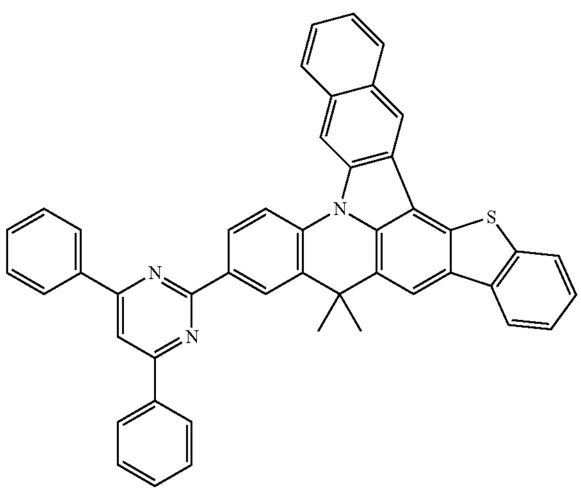
-continued
13
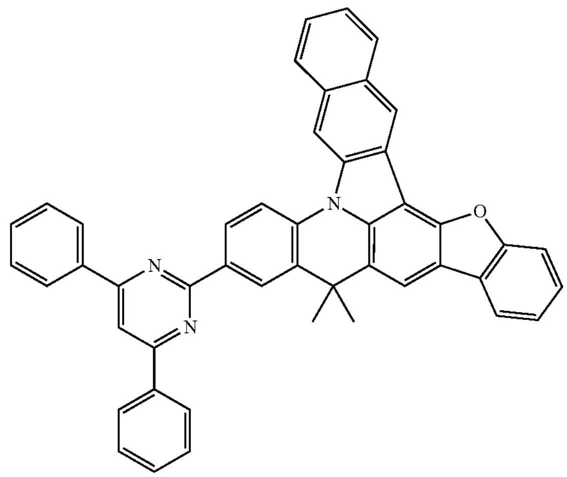
14
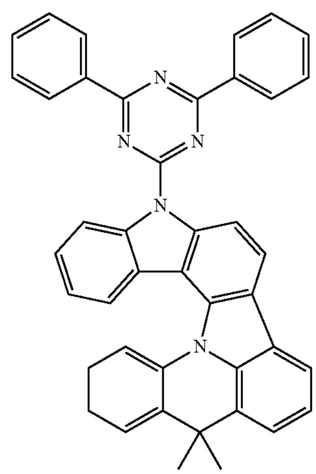
15
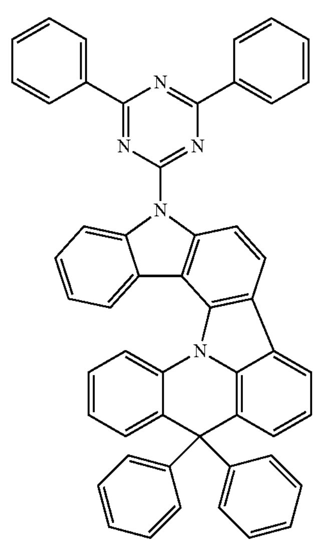

-continued
16
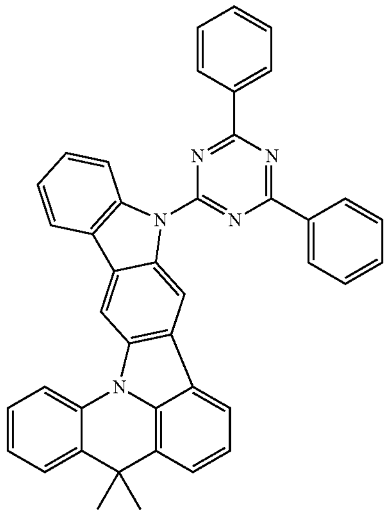
17
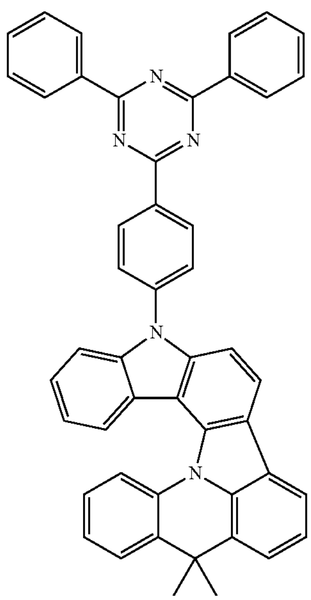
18
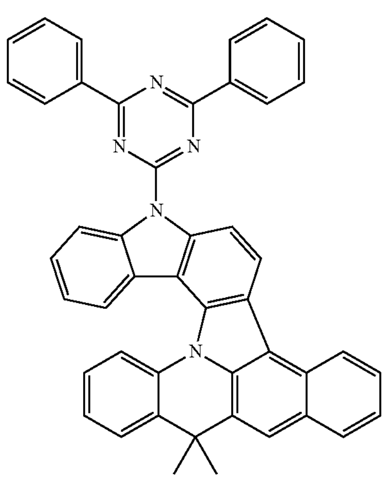
-continued
19
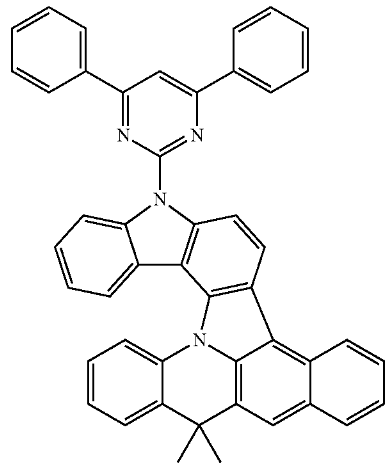
20
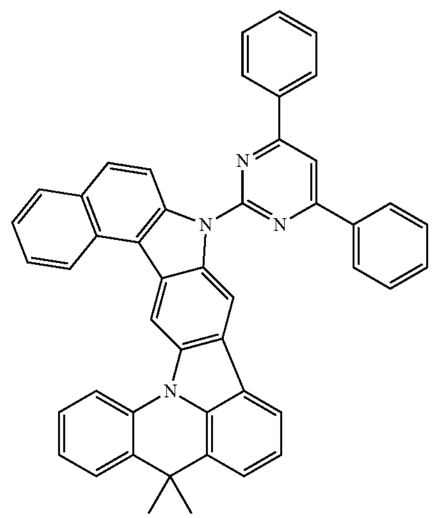
21
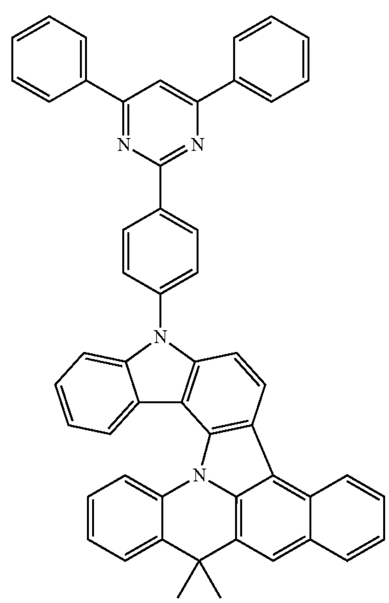

22
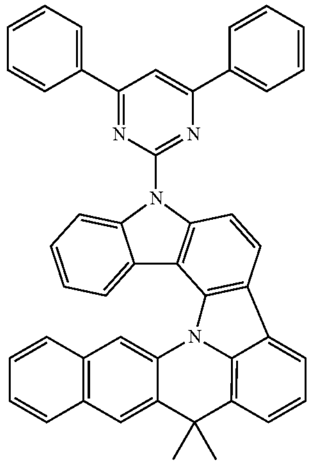
23
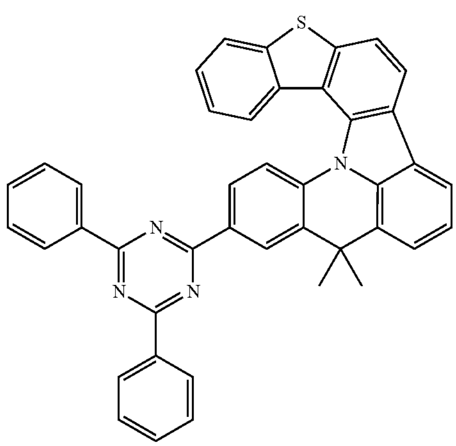
24
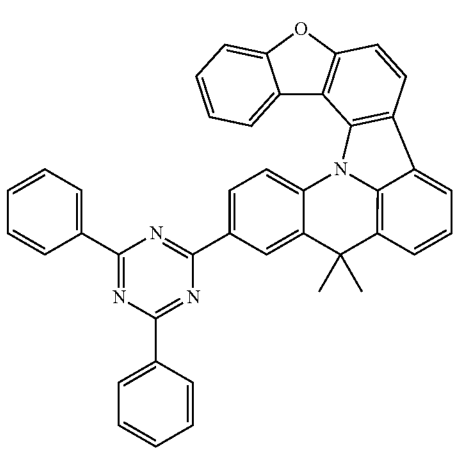
25
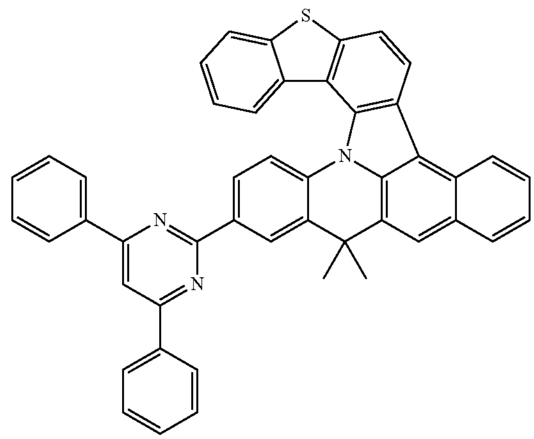
26
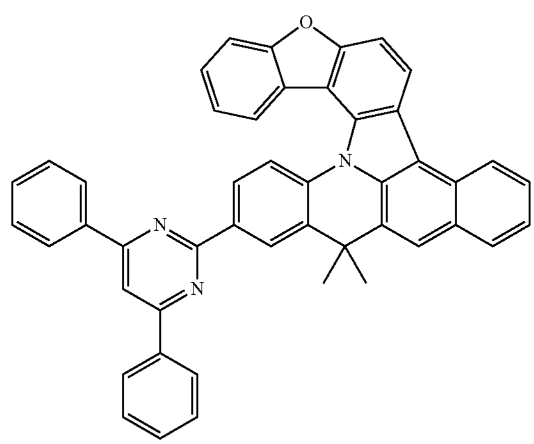
27
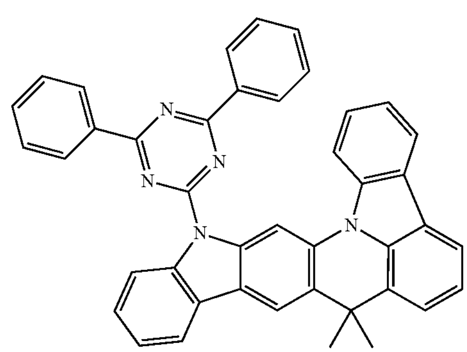

-continued
28
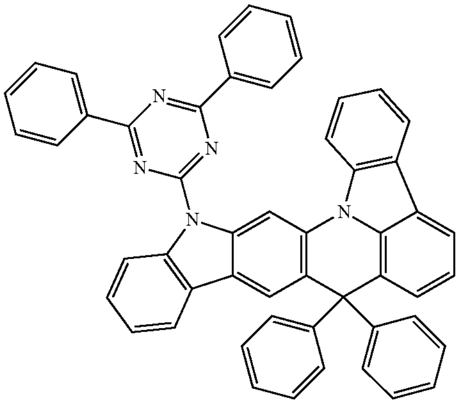
29
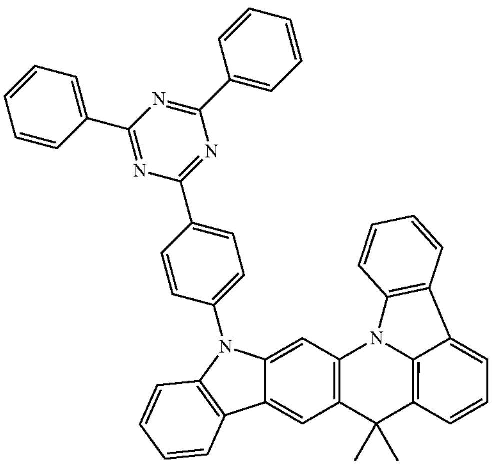
30
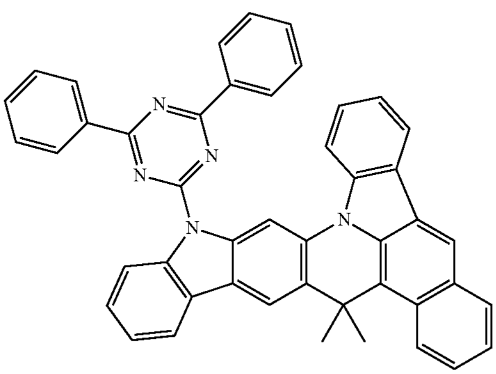
31
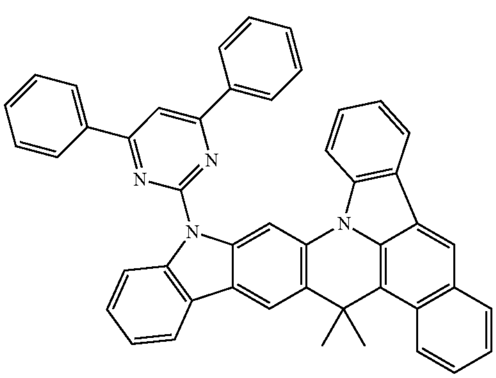
-continued
32
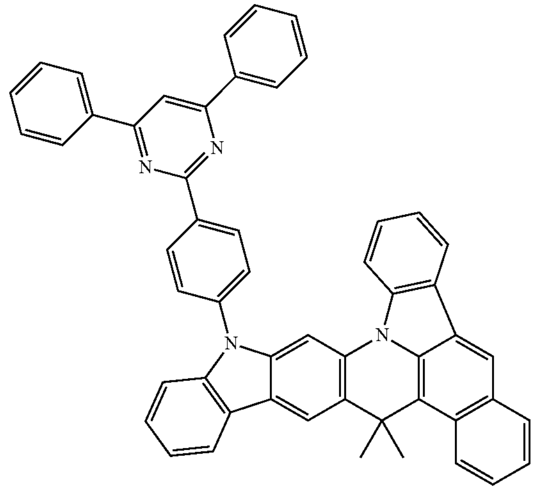
33
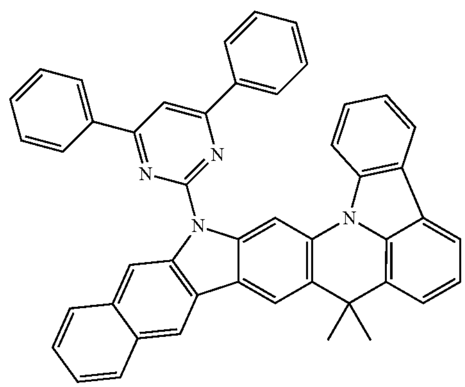
34
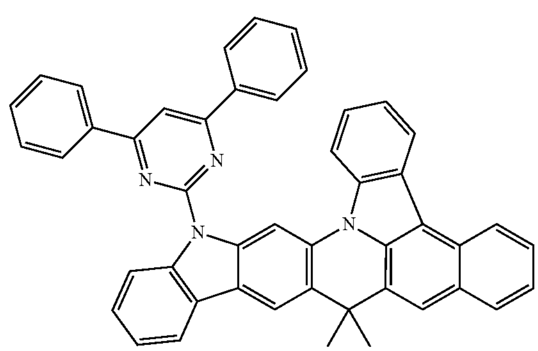

35
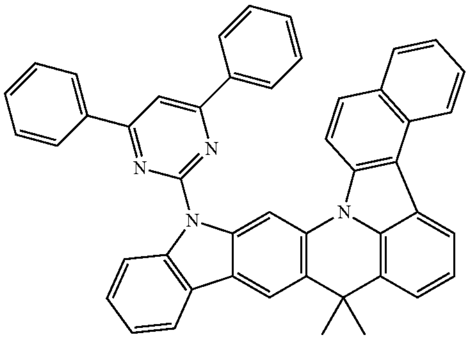
36
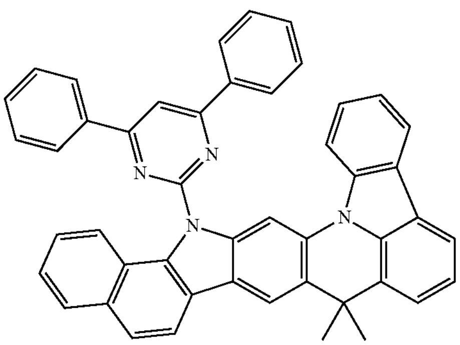
37
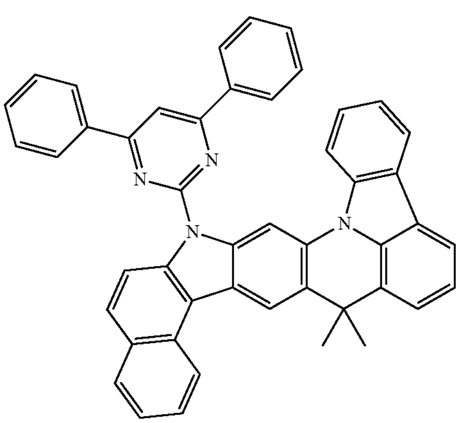
51
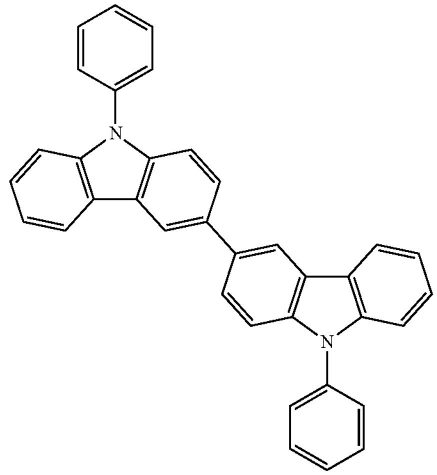
52
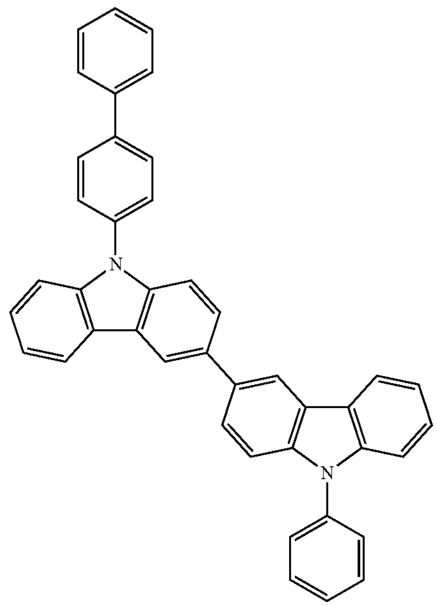
53
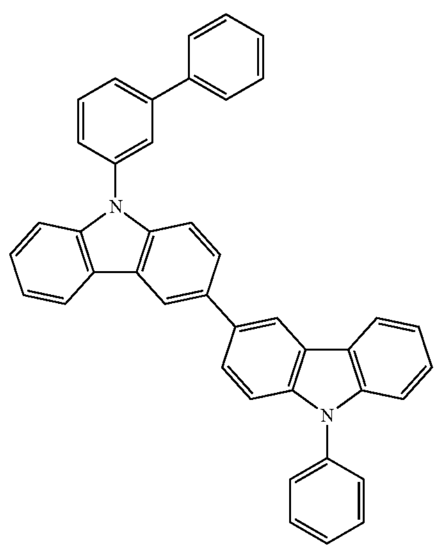

-continued
54
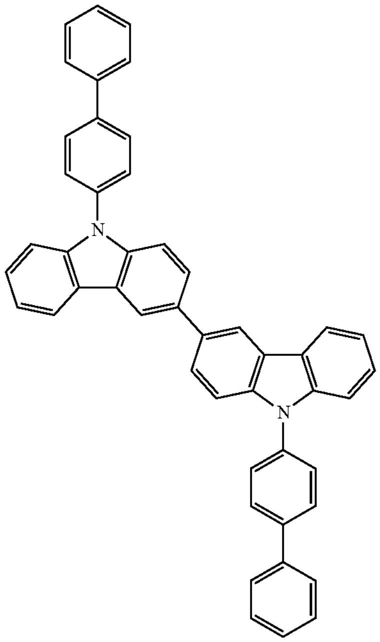
55
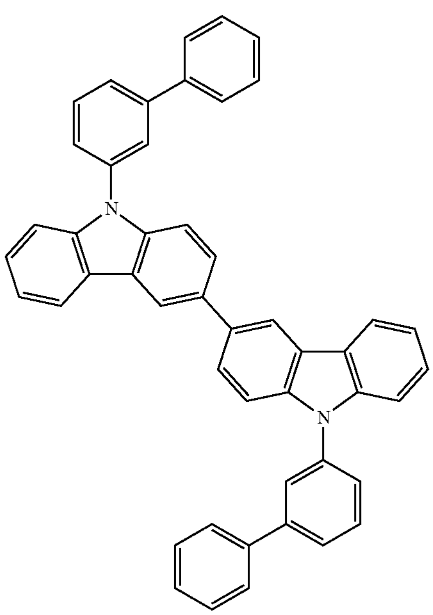
-continued
56
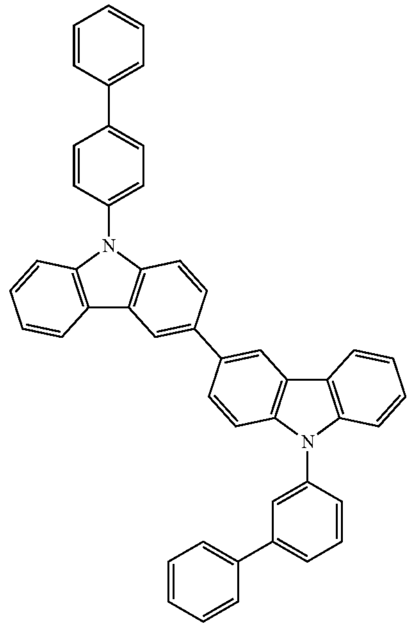
57
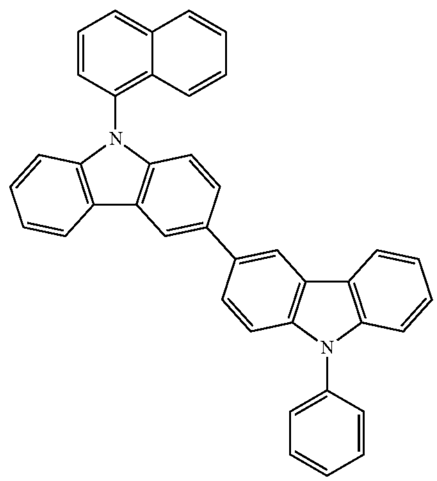
58
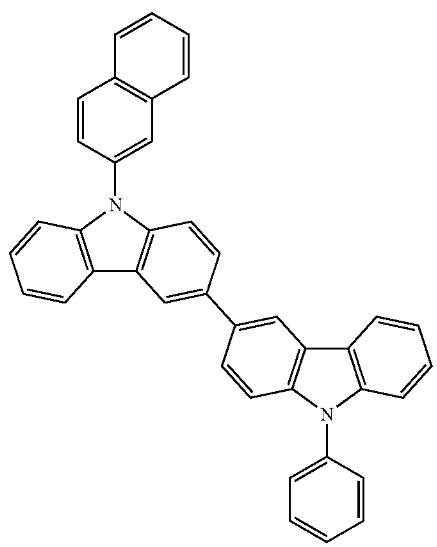

-continued
59
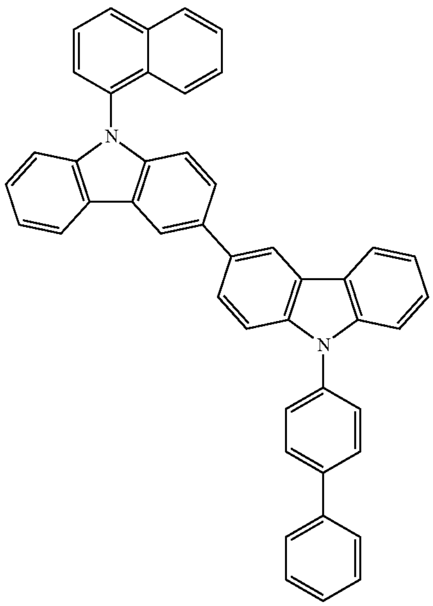
61
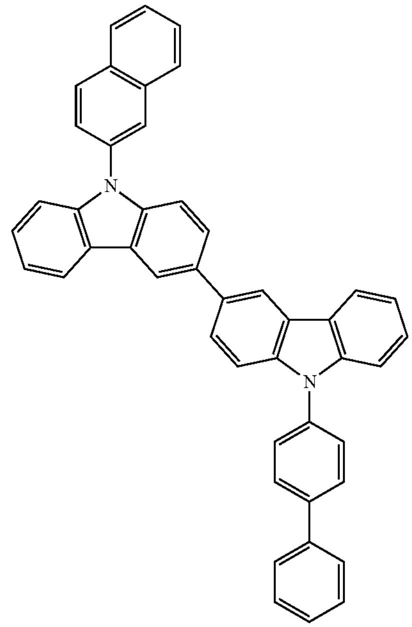
60
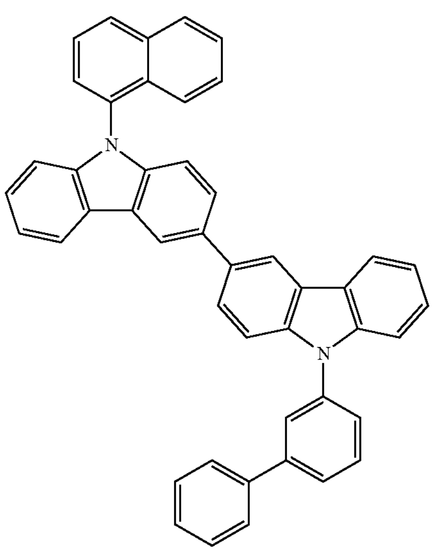
62
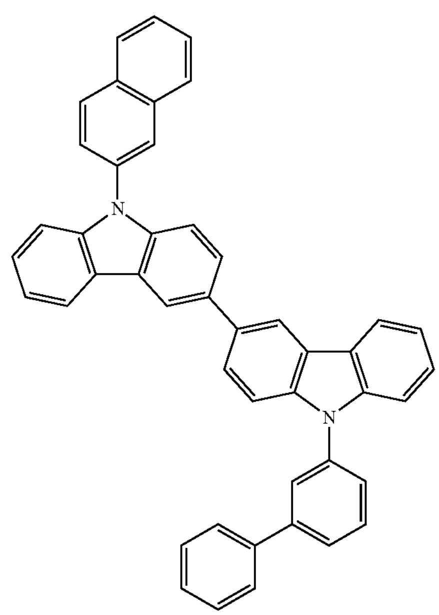

-continued

63

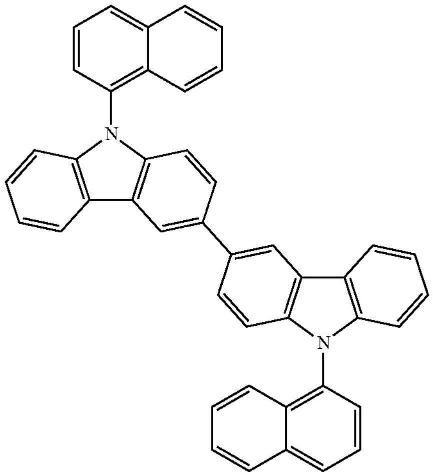

64

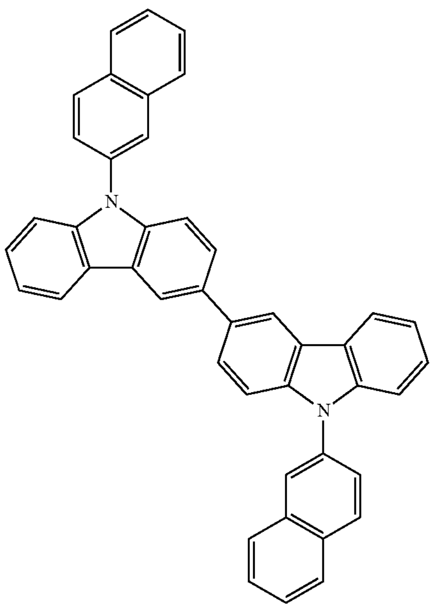

65

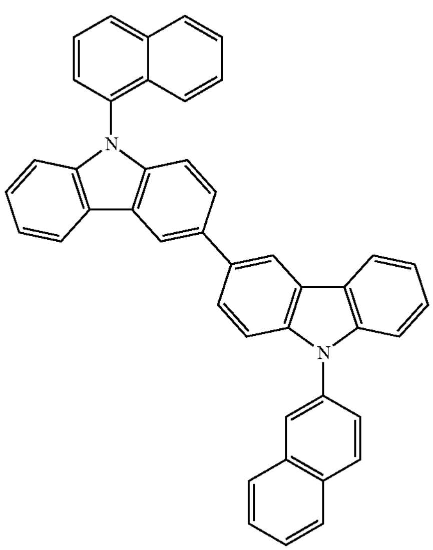

-continued

66

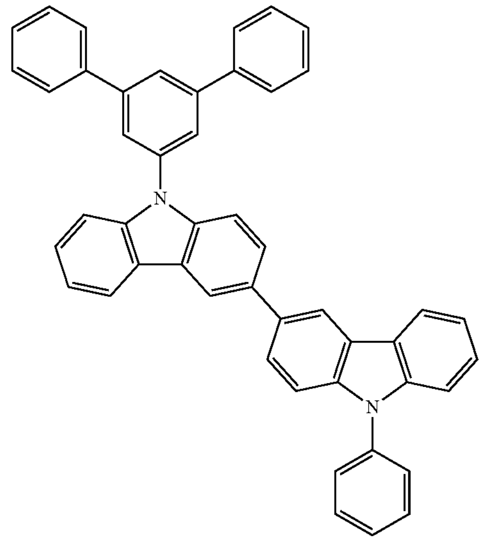

67

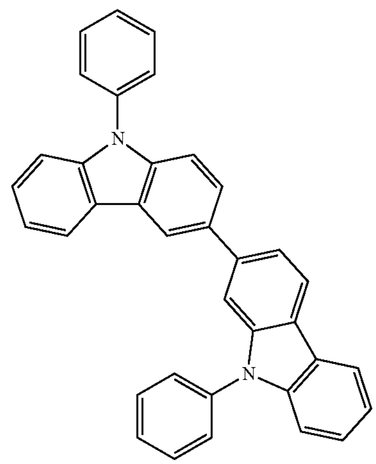

68

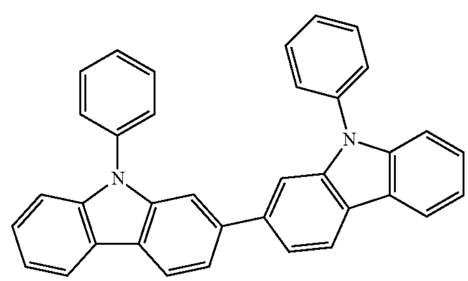

The first compound may include a substituent that has high mobility of electrons, and accordingly, may have excellent electron transporting capability. The second compound may include a substituent that has high mobility of holes, and accordingly, may have excellent hole transporting capability. When the first compound having electron transporting capability and the second compound having hole transporting capability exist separately from each other, the balance of electrons and holes of an organic light-emitting device may be improved, as compared with a case where a single compound has both electron and hole transporting capabilities at the same time in one molecule. Accordingly, an electric device, e.g., an organic light-emitting device, including the first compound and the second compound may improve lifespan and efficiency characteristics.

In addition, the first compound represented by one of Formulae 1-1 to 1-3 above and the second compound represented by Formula 2 above may have excellent thermal stability. In this regard, in formation of a layer including the first compound and the second compound, thermal denaturation of the layer will not easily occur, and thus, an electric device including the first compound and the second compound, e.g., an organic light-emitting device, may increase lifespan characteristics.

In an exemplary embodiment, the first compound and the second compound may be both included in the organic layer 150. In some implementations, the first compound may be included in the emission layer of the organic layer 150, and the second compound may be included in an electron transport region disposed between the emission layer and the second electrode 190. In another exemplary embodiment, the first compound and the second compound may be both included in an emission layer of the organic layer 150. The second compound may be included in the electron transport region disposed between the emission layer and the second electrode 190, the second compound included in the emission layer may be identical to or different from the second compound included in the electron transport region.

When the first compound and the second compound are both included in the emission layer, a region where holes and electrons are combined may be shifted to an interface between the emission layer and the electron transport region, thereby contributing to improve lifespan of an organic light-emitting device.

For example, the emission layer of the organic layer 150 may include a host and a dopant.

When the emission layer includes a dopant, an amount of the dopant may be from about 0.01 to about 15 parts by weight, based on 100 parts by weight of the host.

A thickness of the emission layer may be from about 100 Å to about 1,000 Å, e.g., about 200 Å to about 600 Å. When the thickness of the emission layer is within these ranges, excellent emission characteristics may be obtained without a substantial increase in driving voltage.

The host in the emission layer may include the first compound and the second compound. The dopant in the emission layer may include at least one of a phosphorescent dopant and a fluorescent dopant.

For example, the phosphorescent dopant may include an organometallic compound that includes at least one of iridium (Ir), platinum (Pt), osmium (Os), titanium (Ti), zirconium (Zr), hafnium (Hf), europium (Eu), terbium (Tb), thulium (Tm), rhodium (Rh), and copper (Cu).

For example, the phosphorescent dopant may include an organometallic complex represented by Formula 401 below:

<Formula 401>

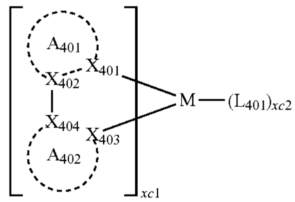

In Formula 401,

M may be selected from Ir, Pt, Os, Ti, Zr, Hf, Eu, Tb, and TM, $X_{401}$ to $X_{404}$ may be each independently nitrogen or carbon, $A_{401}$ and $A_{402}$ rings may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isooxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene, at least one of substituents of the substituted benzene, the substituted naphthalene, the substituted fluorene, the substituted spiro-fluorene, the substituted indene, the substituted pyrrole, the substituted thiophene, the substituted furan, the substituted imidazole, the substituted pyrazole, the substituted thiazole, the substituted isothiazole, the substituted oxazole, the substituted isoxazole, the substituted pyridine, the substituted pyrazine, the substituted pyrimidine, the substituted pyridazine, the substituted quinoline, the substituted isoquinoline, the substituted benzoquinoline, the substituted quinoxaline, the substituted quinazoline, the substituted carbazole, the substituted benzoimidazole, the substituted benzofuran, the substituted benzothiophene, the substituted isobenzothiophene, the substituted benzoxazole, the substituted isobenzoxazole, the substituted triazole, the substituted oxadiazole, the substituted triazine, the substituted dibenzofuran, and the substituted dibenzothiophene may be selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, $C_6$-$C_{60}$ arylthio group, $C_1$-$C_{60}$ heteroaryl group, a monovalent non-aromatic condensed polycyclic group, a monovalent non-aromatic condensed heteropolycyclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$), $L_{401}$ may be an organic ligand, xc1 may be 1, 2, or 3, and xc2 may be 0, 1, 2, or 3.

Descriptions of $Q_{401}$ to $Q_{407}$, $Q_{411}$ to $Q_{417}$, and $Q_{421}$ to $Q_{427}$ may be understood by referring to the descriptions presented in connection with $Q_1$.

In an exemplary embodiment, $L_{401}$ may be a monovalent organic ligand, a divalent organic ligand, or a trivalent organic ligand. For example, $L_{401}$ may be selected from a halogen ligand (e.g., Cl or F), a diketone ligand (e.g., acetylacetonate, 1,3-diphenyl-1,3-propanedionate, 2,2,6,6-tetramethyl-3,5-heptanedionate, or hexafluoroacetonate), a carboxylic acid ligand (e.g., picolinate, dimethyl-3-pyrazolecarboxylate, or benzoate), a carbon monoxide ligand, an isonitrile ligand, a cyano ligand, and a phosphorus ligand (e.g., phosphine or phosphite).

When ring $A_{401}$ in Formula 401 has 2 or more substituents, 2 or more substituents of $A_{401}$ may be bonded to each other to form a saturated ring or an unsaturated ring.

When ring $A_{402}$ in Formula 401 has 2 or more substituents, 2 or more substituents of $A_{402}$ may be bonded to each other to form a saturated ring or an unsaturated ring.

When xc1 in Formula 401 is 2 or more, a plurality of ligands

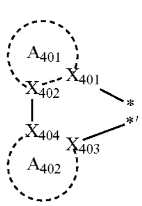

in Formula 401 may be identical to or different from each other. When xc1 in Formula 401 is 2 or more, $A_{401}$ and $A_{402}$ may be each independently bonded to $A_{401}$ and $A_{402}$ of other neighboring ligands, directly or via a linking group (e.g., a $C_1$-$C_5$ alkylene group, —N(R')— (wherein R' may be a $C_1$-$C_{10}$ alkyl group or a $C_6$-$C_{20}$ aryl group), or —C(═O)—).

The phosphorescent dopant may include at least one selected from Compounds PD1 to PD74 below:

PD1

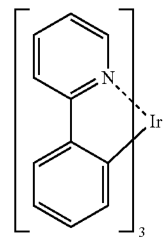

PD2

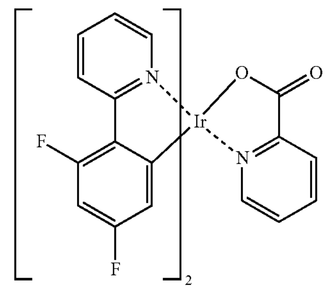

PD3

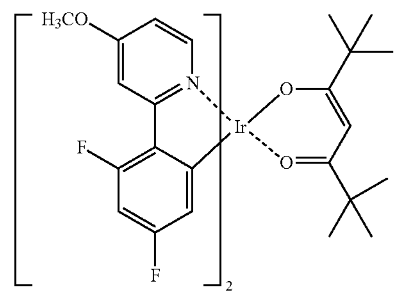

PD4

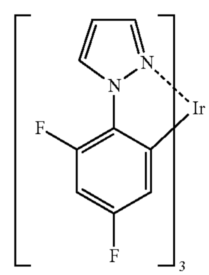

PD5

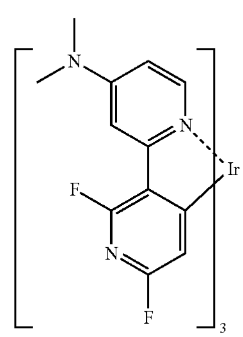

-continued
PD6
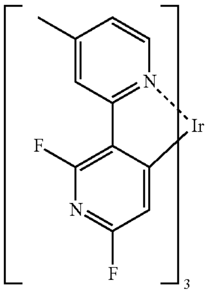
PD7
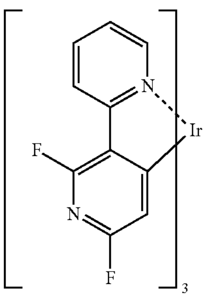
PD8
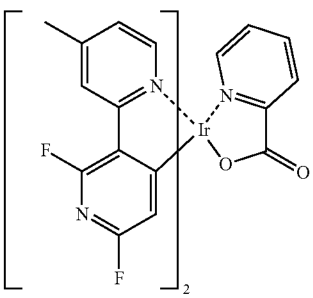
PD9
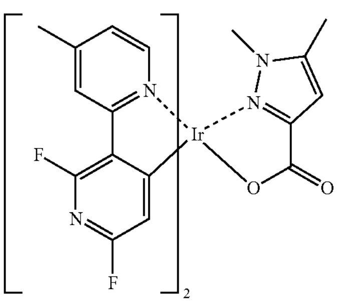
PD10
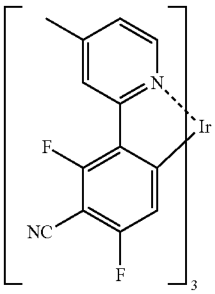
-continued
PD11
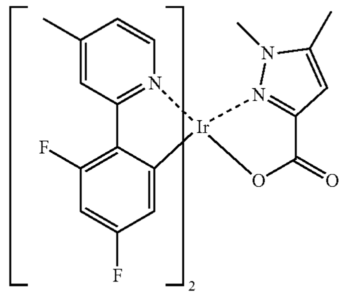
PD12
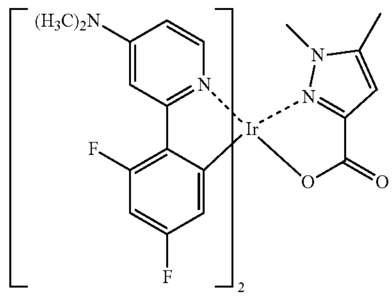
PD13
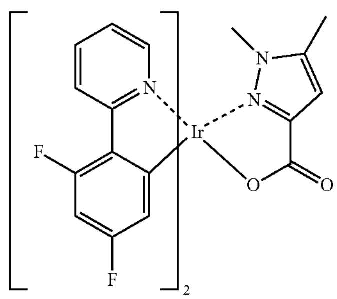
PD14
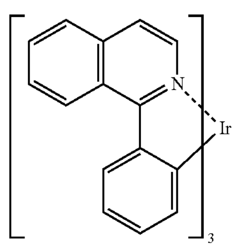
PD15
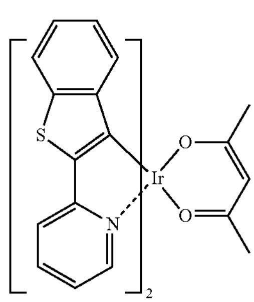

-continued
PD16
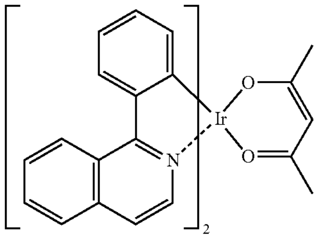
PD17
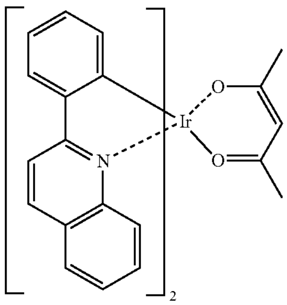
PD18
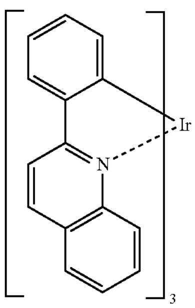
PD19
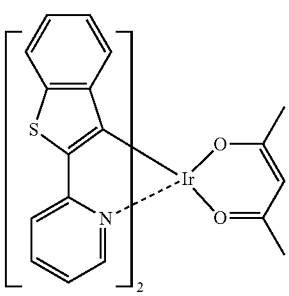
PD20
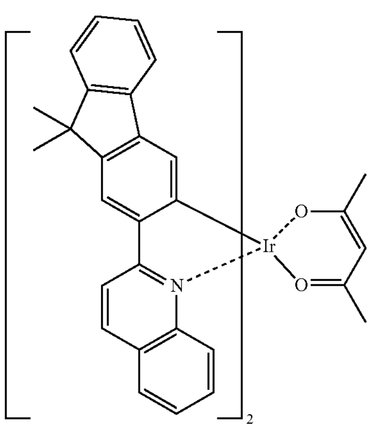
-continued
PD21
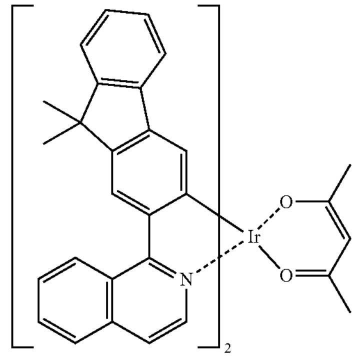
PD22
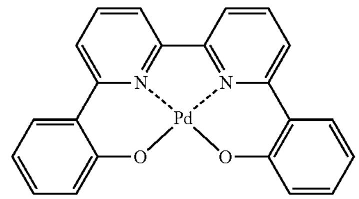
PD23
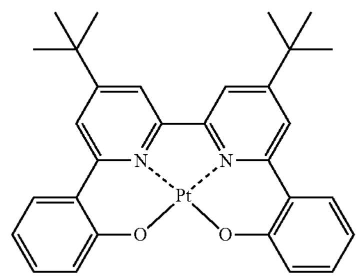
PD24
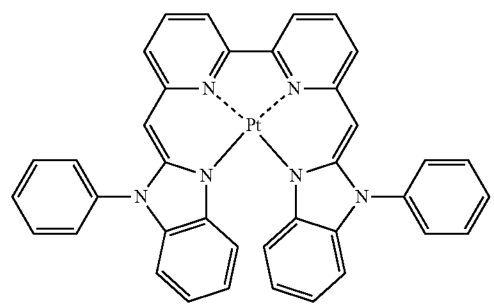
PD25
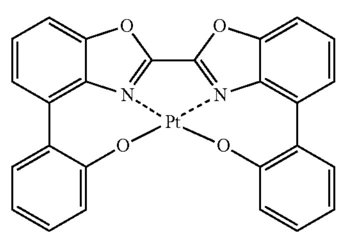
PD26
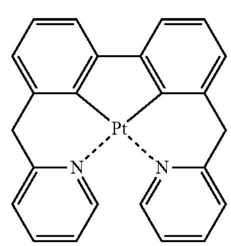

PD27
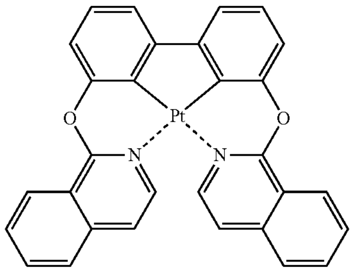
PD28
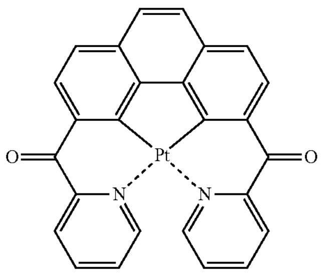
PD29
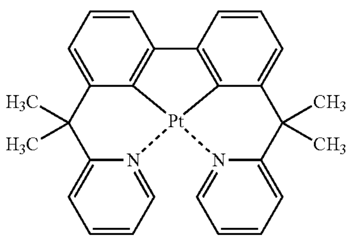
PD30
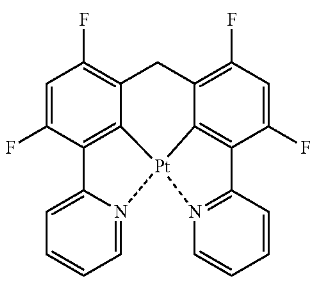
PD31
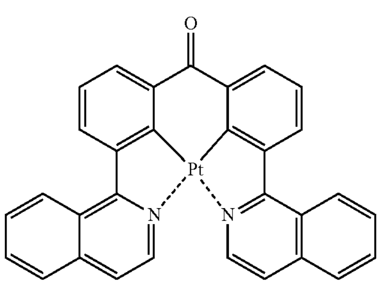
PD32
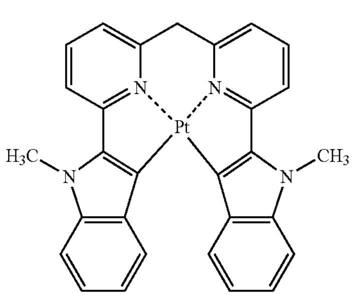
PD33
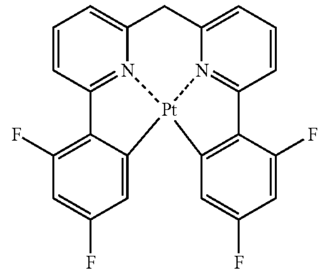
PD34
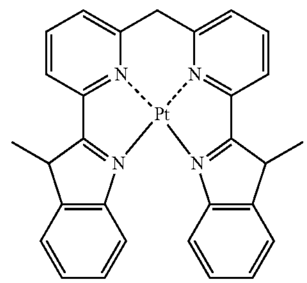
PD35
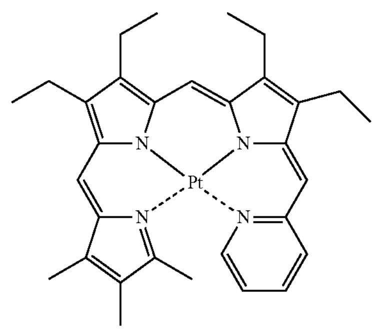
PD36
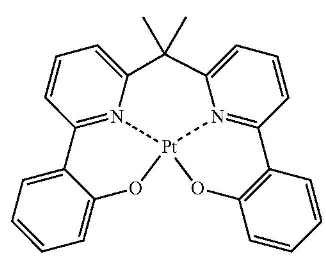
PD37
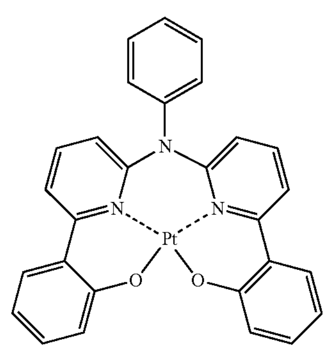

-continued
PD38
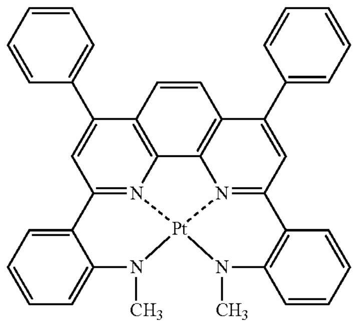
PD39
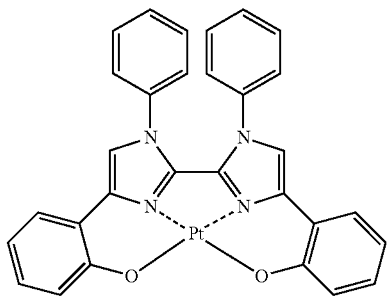
PD40
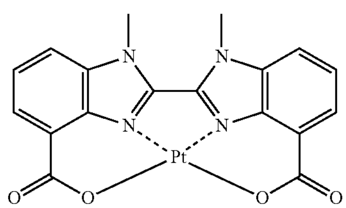
PD41
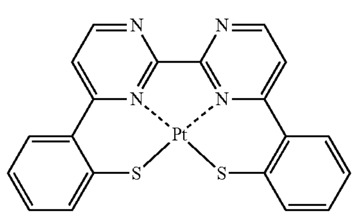
PD42
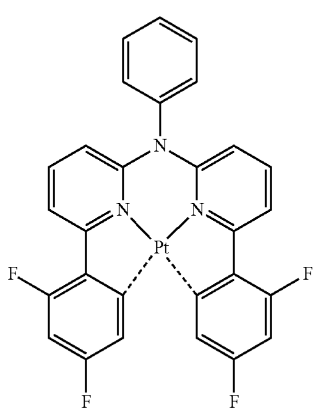
-continued
PD43
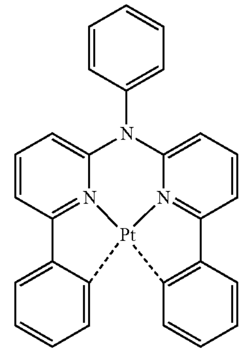
PD44
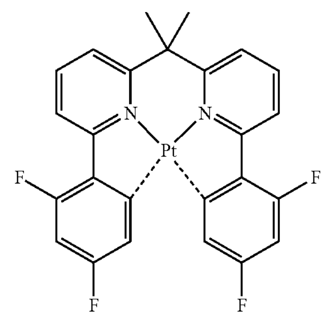
PD45
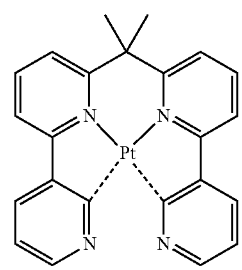
PD46
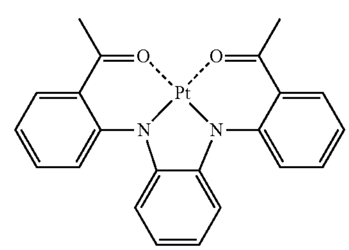
PD47
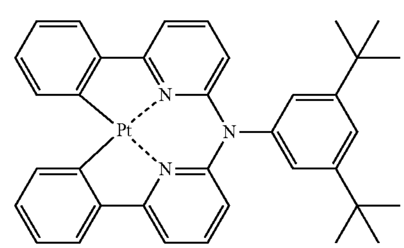

-continued
PD48
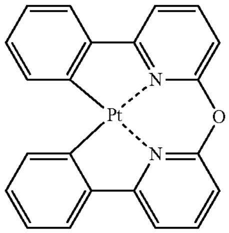
PD49
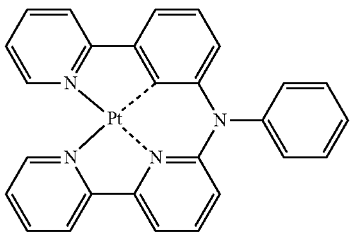
PD50
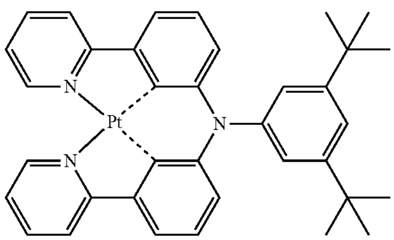
PD51
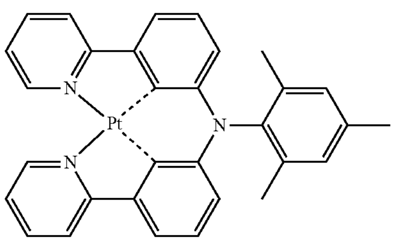
PD52
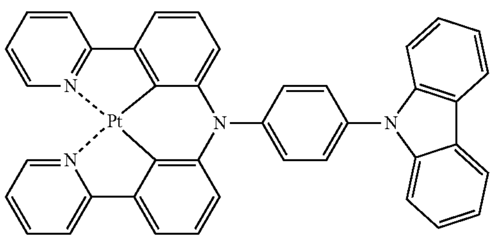
PD53
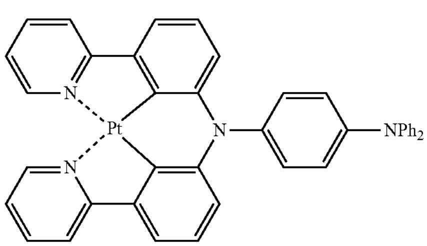
-continued
PD54
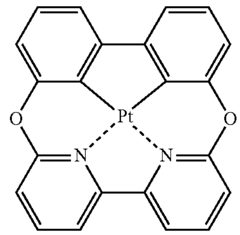
PD55
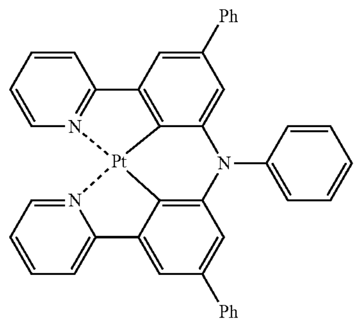
PD56
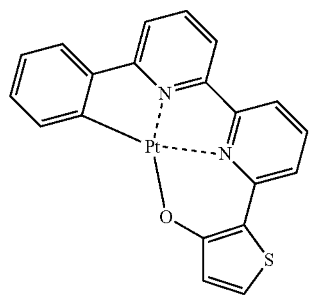
PD57
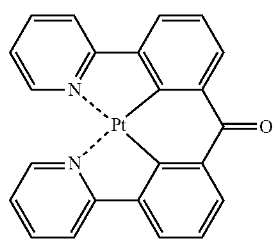
PD58
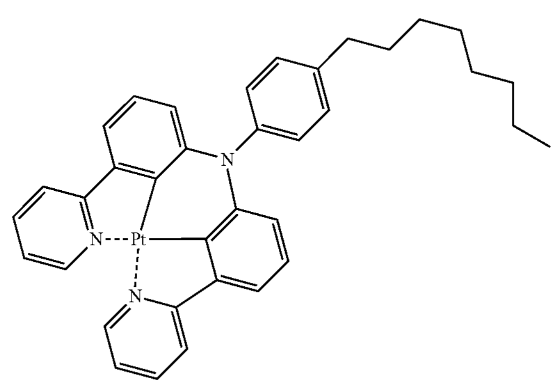

-continued
PD59
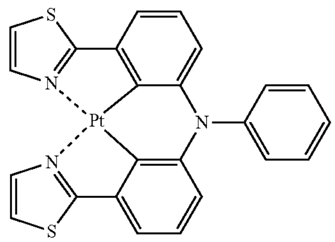
PD60
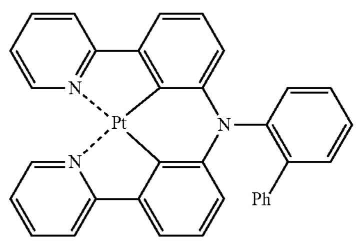
PD61
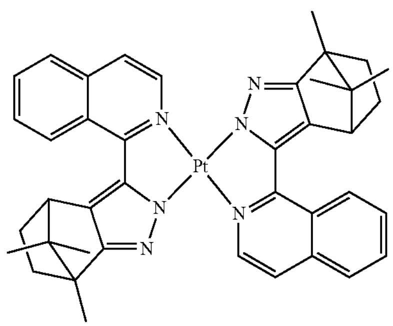
PD62
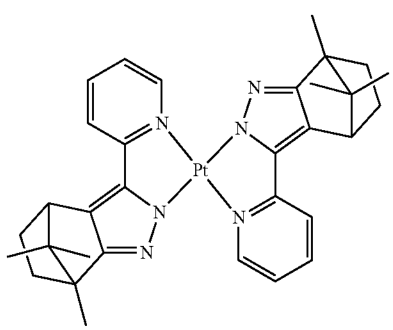
PD63
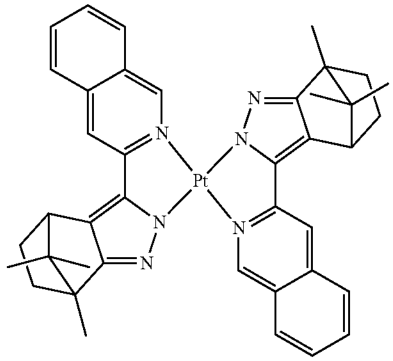
-continued
PD64
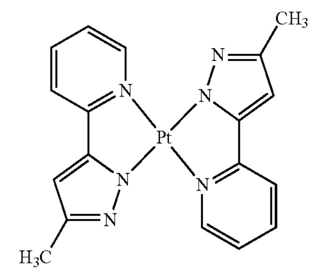
PD65
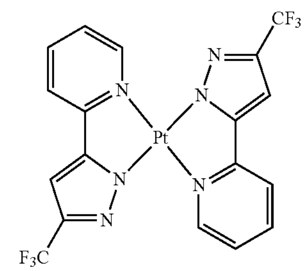
PD66
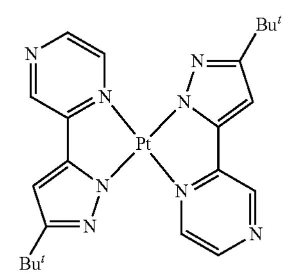
PD67
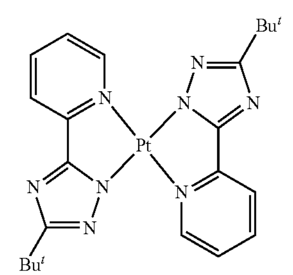
PD68
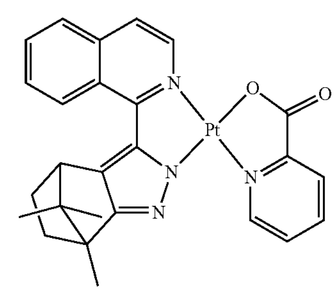

-continued
PD69
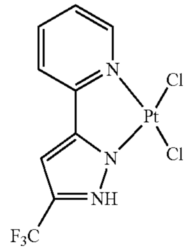
PD70
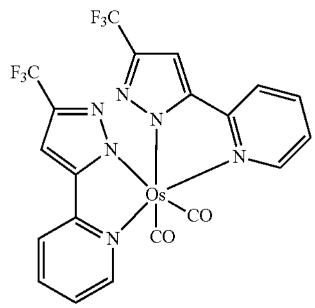
PD71
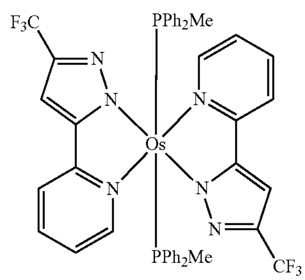
PD72
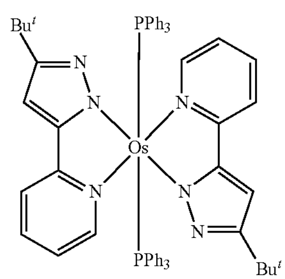
-continued
PD73
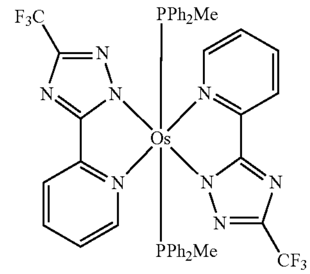
PD74
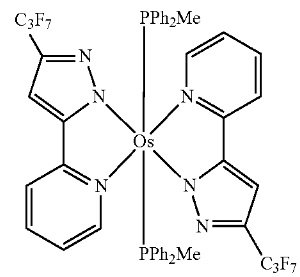
In some implementations, the phosphorescent dopant may include PtOEP below:
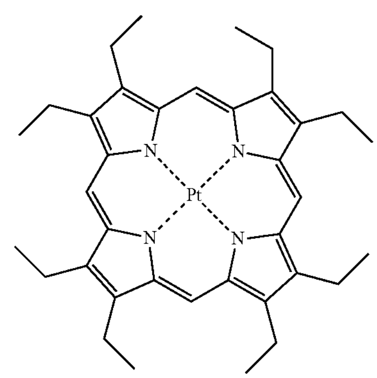
PtOEP
The fluorescent dopant may include at least one of DPAVBi, BDAVBi, TBPe, DCM, DCJTB, Coumarin 6, and C545T below:
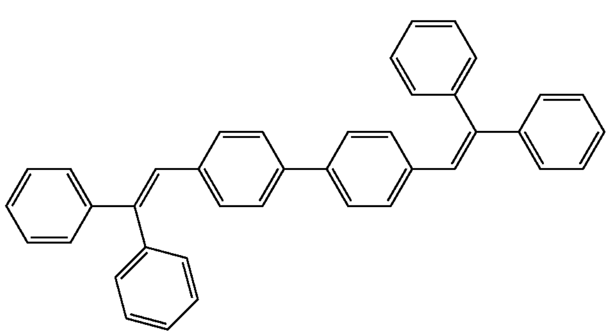
DPVBi -continued

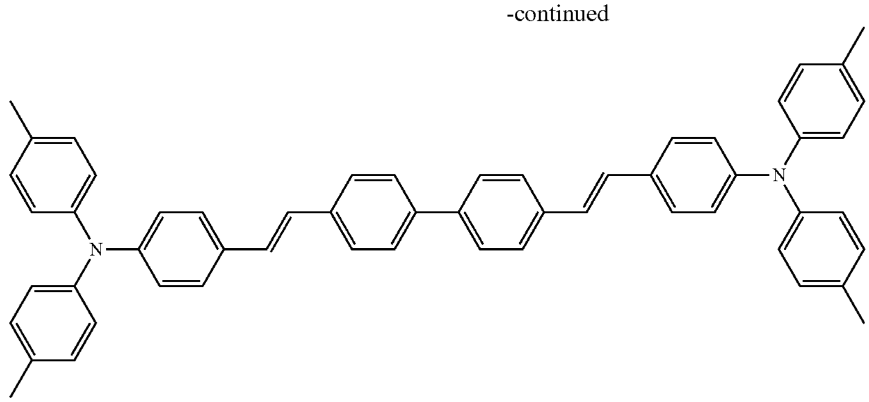

DPAVBi

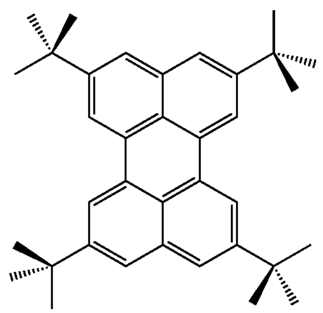

TBPe

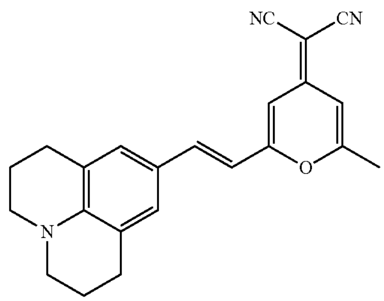

DCM

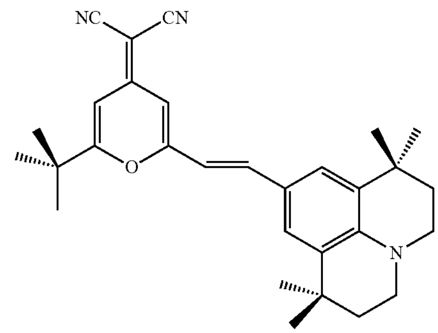

DCJTB

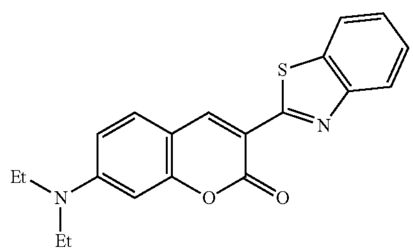

Coumarin 6

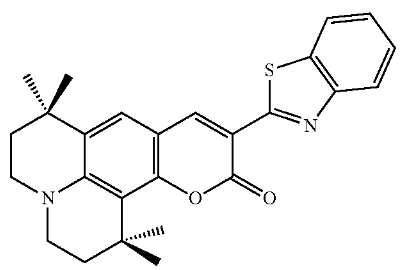

C545T

In some implementations, the fluorescent dopant may include a compound represented by Formula 501 below:

<Formula 501>

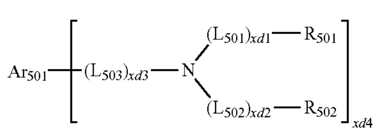

In Formula 501, $Ar_{501}$ may be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{10}$ heteroaryl group, a monovalent non-aromatic condensed polycyclic group, a monovalent non-aromatic condensed heteropolycyclic group, and —$Si(Q_{550})(Q_{502})(Q_{503})$ (wherein $Q_{501}$ to $Q_{503}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group), descriptions of $L_{501}$ to $L_{503}$ may be understood by referring to the descriptions presented in connection with $L_{201}$, $R_{501}$ and $R_{502}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 may be each independently selected from 0, 1, 2, and 3, and xd4 may be selected from 1, 2, 3, and 4.

A weight ratio of the first compound to the second compound may be in a range from 10:90 to 90:10, and for example, may be 80:20, 70:30, 60:40, 50:50, 40:60, 30:70, or 20:80. For example, a weight ratio of the first compound to the second compound may be 5:5. When the weight ratio of the first compound to the second compound is within these ranges, the transporting balance of holes and electrons of the emission layer may occur in an efficient manner.

The hole transport region may include at least one of a hole injection layer (HIL), a hole transport layer (HTL), a buffer layer, and an electron blocking layer (EBL), and the electron transport region may include at least one of a hole blocking layer (HBL), an electron transport layer (ETL), and an electron injection layer (EIL), as examples.

The hole transport region may have a single structure consisting of a single material, a single structure consisting of a plurality of different materials, or a multi-layer structure consisting of a plurality of different materials.

For example, the hole transport region may have a single structure consisting of a plurality of different materials, and for example, may have a structure of HIL/HTL, a structure of HIL/HTL/buffer layer, a structure of HIL/buffer layer, a structure of HTL/buffer layer, a structure of HIL/HTL/EBL, or a structure of HTL/EBL, each of which layers are sequentially stacked in the stated order from the first electrode 110.

When the hole transport region includes an HIL, the HIL may be formed on the first electrode 110 by a suitable method, such as vacuum deposition, spin coating, casting, a Langmuir-Blodgett (LB) method, ink-jet printing, layer printing, and laser induced thermal imaging (LITI).

When the HIL is formed by vacuum deposition, deposition conditions may include a deposition temperature from about 100° C. to about 500° C., a vacuum pressure from about 10-8 torr to about 10-3 torr, and a deposition rate from about 0.01 Å/sec to about 100 Å/sec, which are determined according to a compound that is used to form the HIL and a structure of the HIL.

When the HIL is formed by spin coating, coating conditions may include a coating speed from about 2,000 rpm to about 5,000 rpm and a temperature at which a heat treatment is performed from about 80° C. to about 200° C., which are determined according to a compound that is used to form the HIL and a structure of the HIL.

When the hole transport region includes an HTL, the HTL may be formed on the first electrode 110 or the HIL hole transport layer by a suitable method, such as vacuum deposition, spin coating, casting, an LB method, ink-jet printing, layer printing, and LITI. When the HTL is formed by vacuum deposition and spin coating, deposition and coating conditions may be determined by referring to those applied to form the HIL.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), polyaniline/poly(4-styrenesulfonate) (PANI/PSS), a compound represented by Formula 201 below, and a compound represented by Formula 202 below:

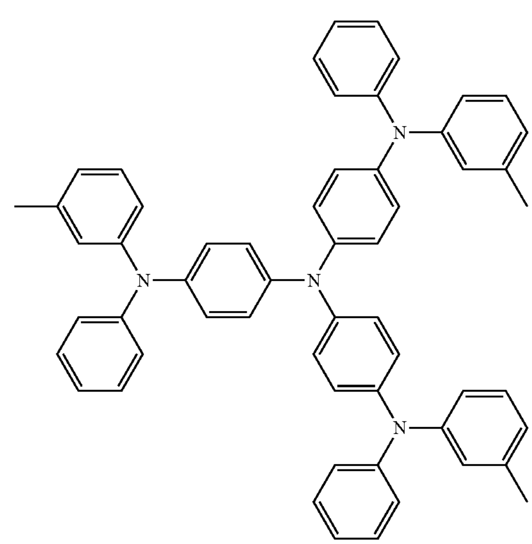

m-MTDATA

-continued
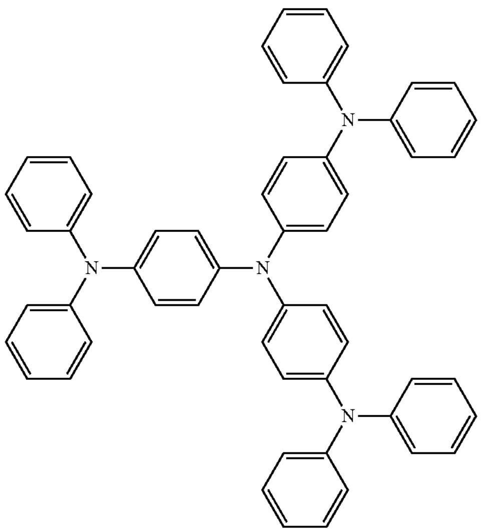
TDATA
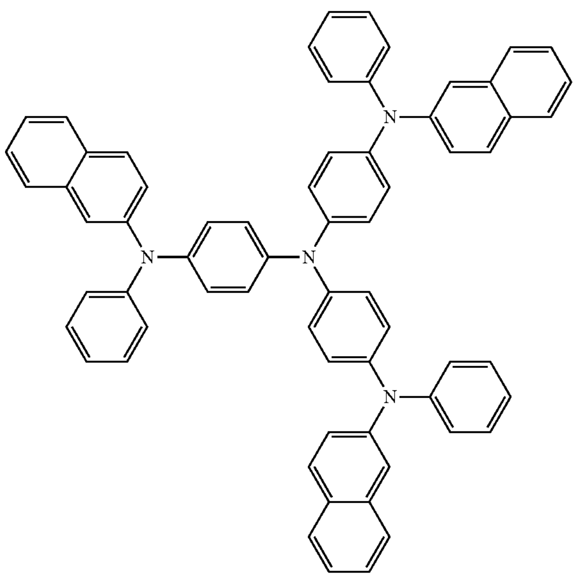
2-TNATA
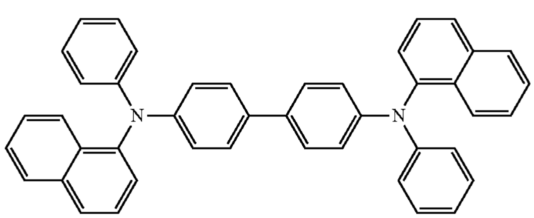
NPB
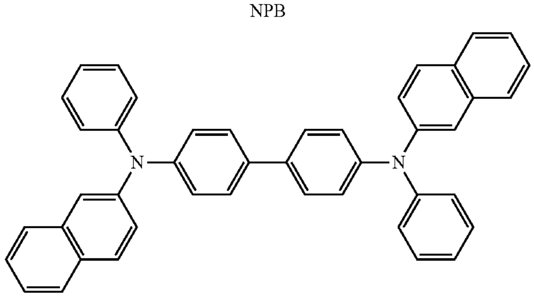
β-NPB
-continued
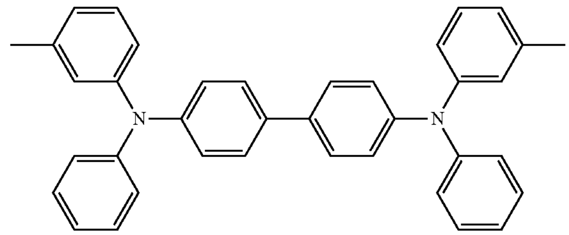
TPD
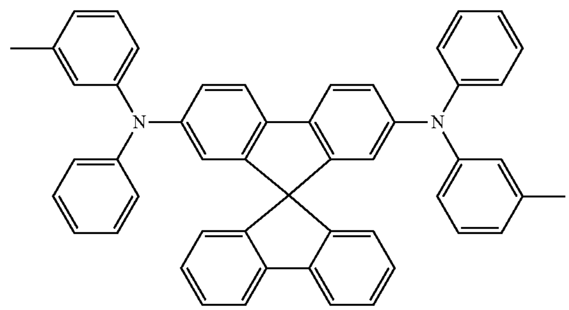
Spiro-TPD
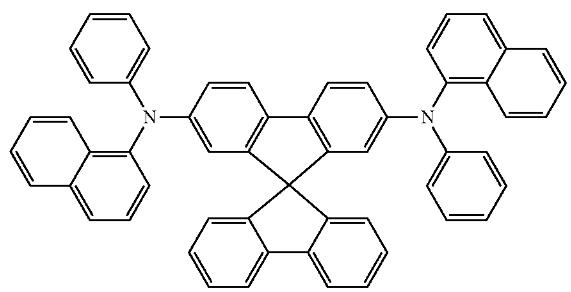
Spiro-NPB
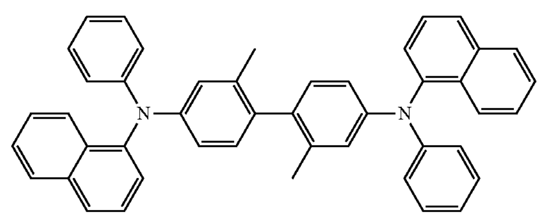
methylated NPB
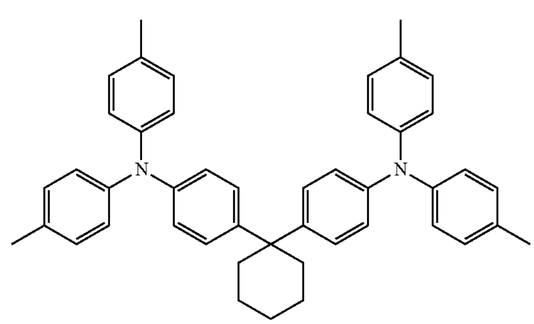
TAPC -continued

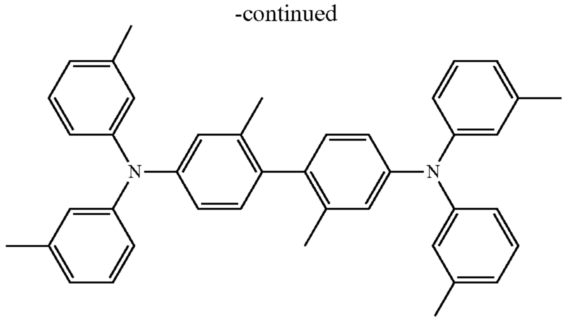

HMTPD

<Formula 201>

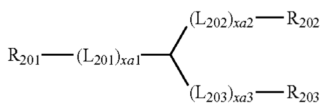

<Formula 202>

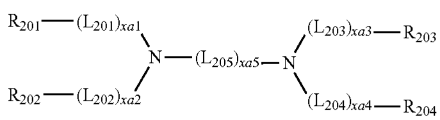

In Formulae 201 and 202, descriptions of $L_{201}$ to $L_{205}$ may be understood by referring to the descriptions presented in connection with $L_1$ to $L_3$, xa1 to xa4 may be each independently selected from 0, 1, 2, and 3, xa5 may be selected from 1, 2, 3, 4, and 5, and $R_{201}$ to $R_{204}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In an exemplary embodiment, in Formulae 201 and 202, $L_{201}$ to $L_{205}$ may be each independently selected from:

a phenylene group, a naphthylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group, xa1 to xa4 may be each independently 0, 1 or, 2, xa5 may be 1, 2, or 3, and $R_{201}$ to $R_{204}$ may be each independently a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but the embodiment is not limited thereto.

The compound of Formula 201 above may be represented by Formula 201A below:

<Formula 201A>

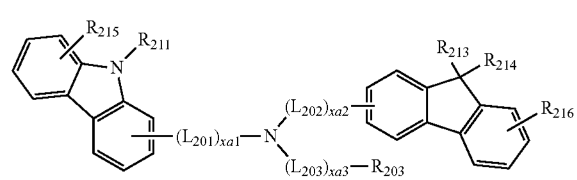

For example, the compound of Formula 201 may be represented by Formula 201A-1 below:

<Formula 201A-1>

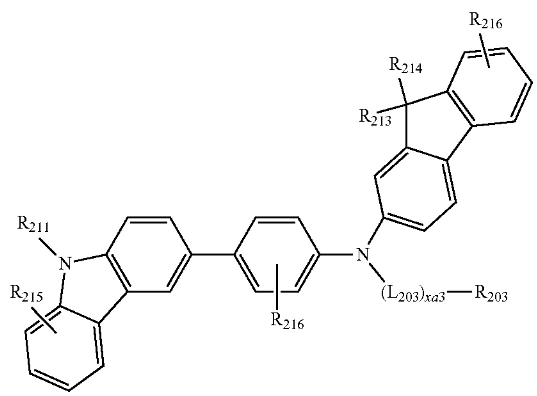

The compound of Formula 202 may be represented by Formula 202A below:

<Formula 202A>

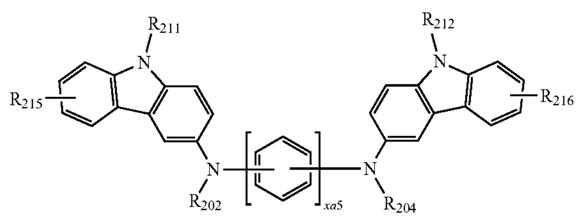

In Formulae 201A, 201A-1, and 202A, descriptions of $L_{201}$ to $L_{203}$, xa1 to xa3, xa5, and $R_{202}$ to $R_{204}$ may be understood by referring to the descriptions provided herein, and descriptions of $R_{211}$ and $R_{212}$ understood by referring to the descriptions presented in connection with $R_{203}$. In Formulae 201A, 201A-1, and 202A, $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, $C_6$-$C_{60}$ arylthio group, $C_1$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, xa1 to xa3 may be each independently 0 or 1, $R_{203}$, $R_{204}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, carboxylic acid a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{213}$ and $R_{214}$ may be each independently selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group group, a quinolinyl group, an isoquinolinyl group, a quinoxalinyl group, a quinazolinyl group, a carbazolyl group, and a triazinyl group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{215}$ and $R_{216}$ may be each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xa5 may be 1 or 2.

In Formulae 201A and 201A-1, $R_{213}$ and $R_{214}$ may be bonded to each other to form a saturated ring or an unsaturated ring.

The compound of Formula 201 and the compound of Formula 202 may include Compounds HT1 to HT20, but are not limited thereto:

HT1

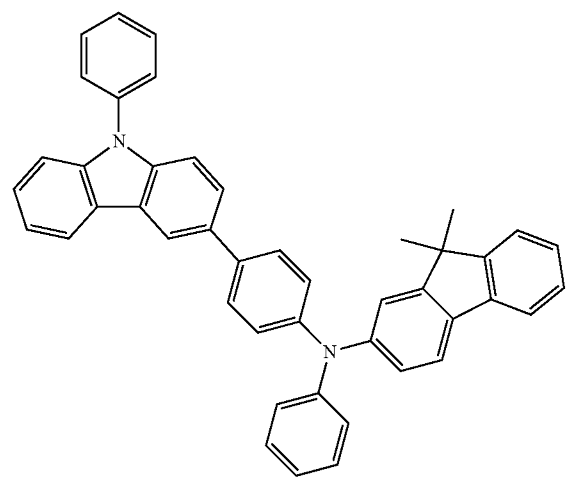

HT2

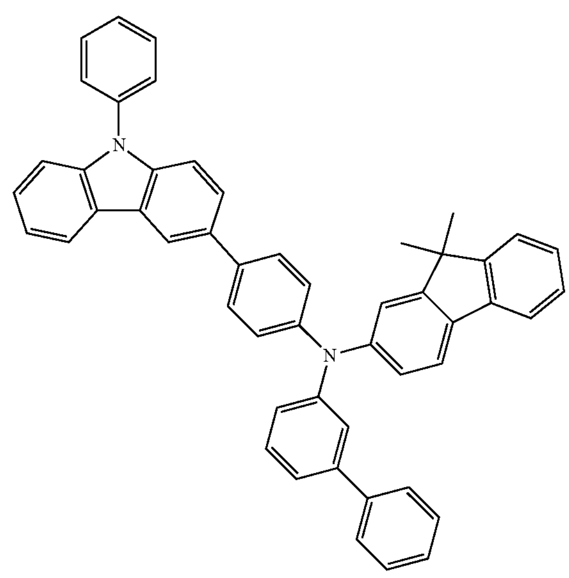

-continued
HT3
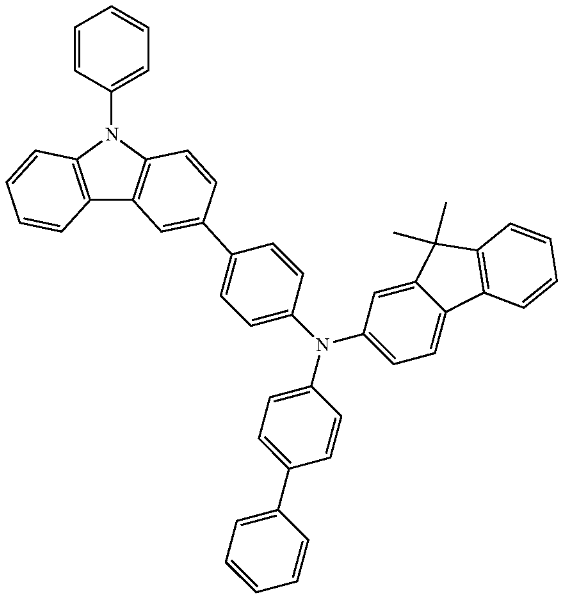
HT4
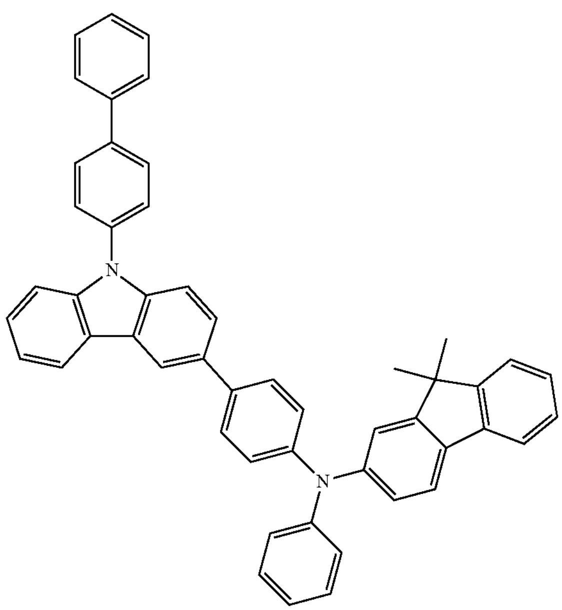
-continued
HT5
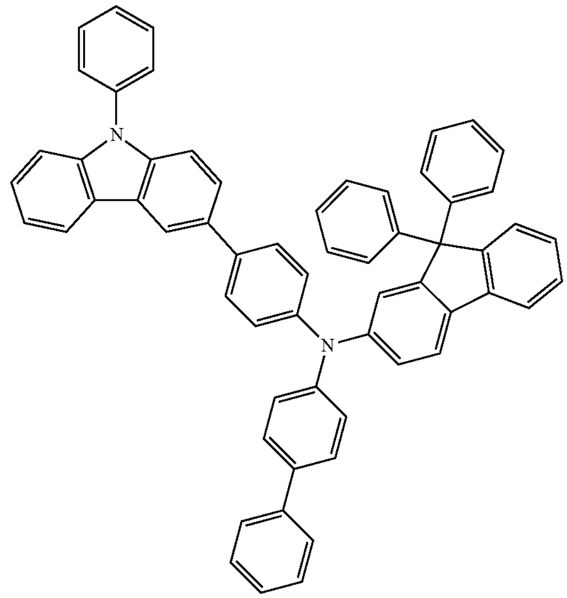
HT6
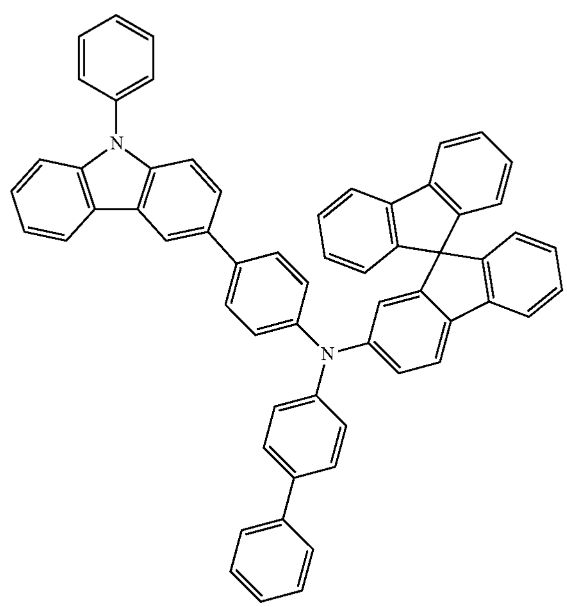

-continued
HT7
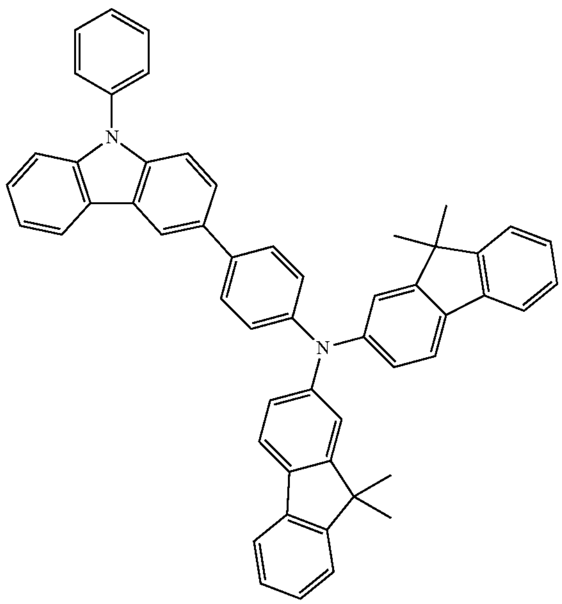
HT8
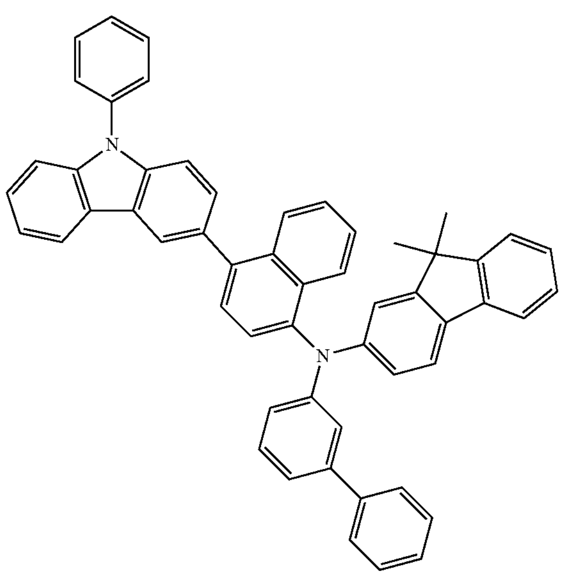
-continued
HT9
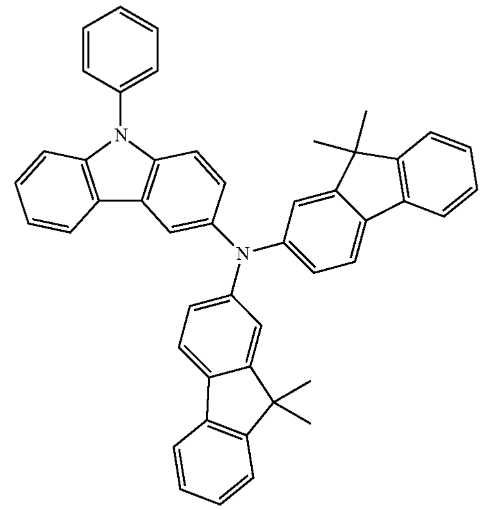
HT10
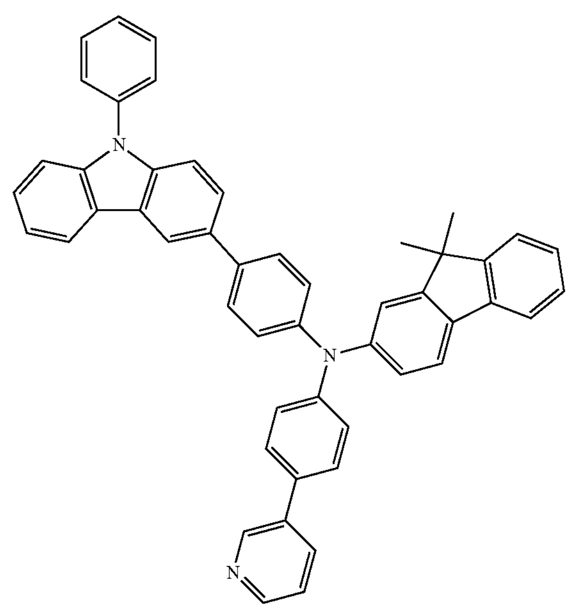

-continued
HT11
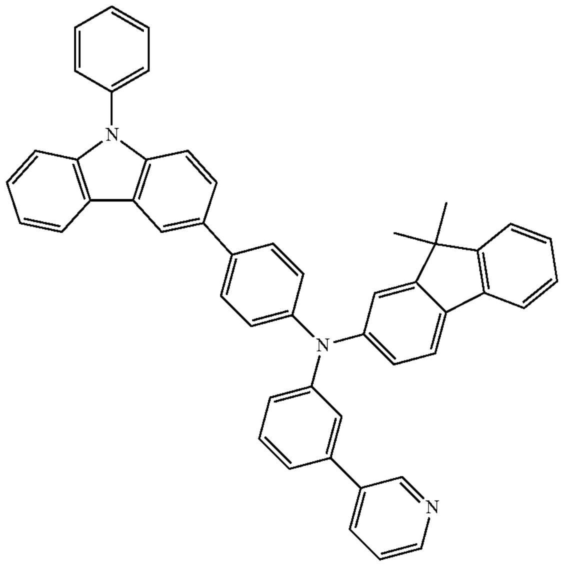
HT12
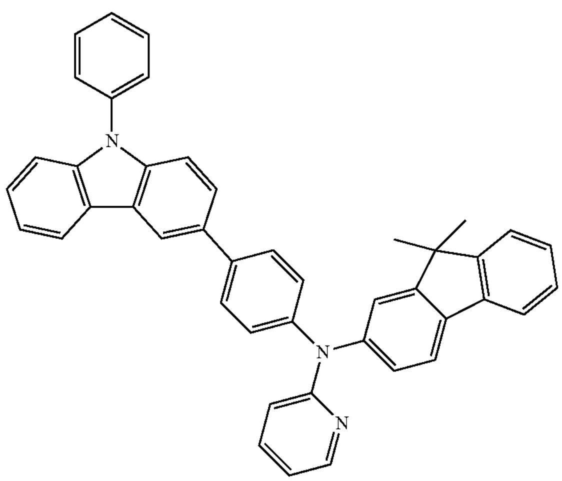
HT13
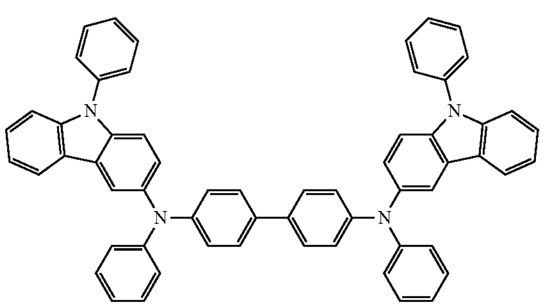
-continued
HT14
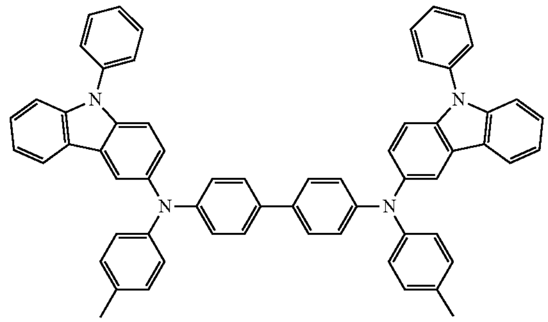
HT15
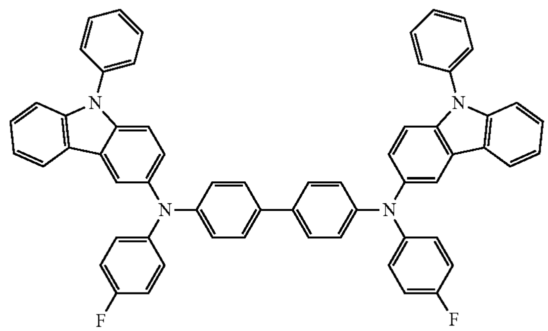
HT16
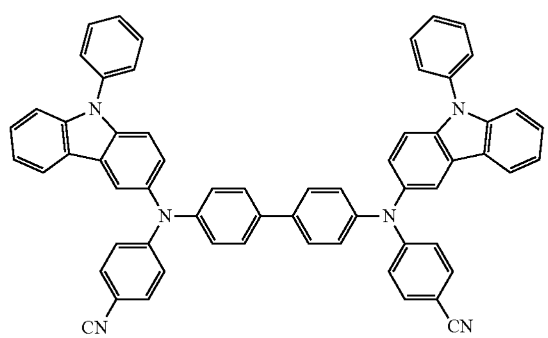
HT17
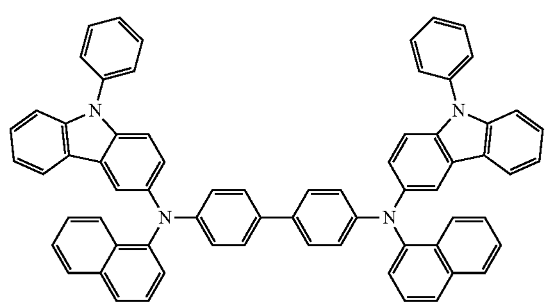

-continued

HT18

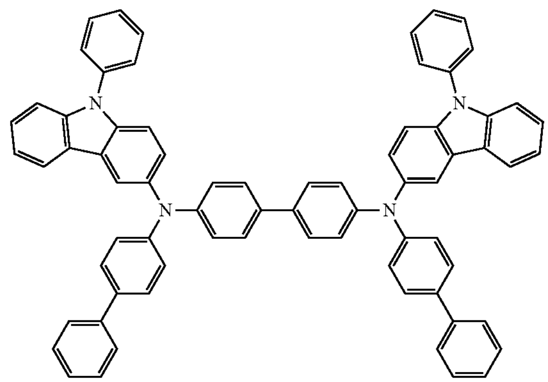

HT19

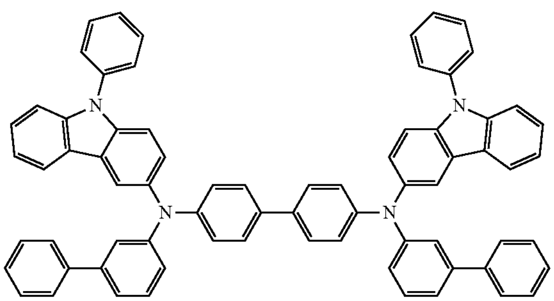

HT20

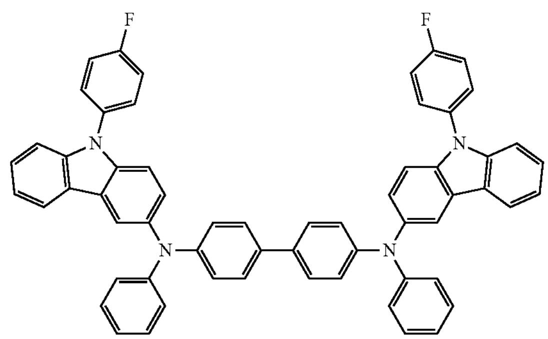

A thickness of the hole transport region may be from about 100 Å to about 10,000 Å, e.g., about 100 Å to about 1,000 Å. When the hole transport region includes both an HIL and an HTL, a thickness of the HIL may be from about 100 Å to about 10,000 Å, e.g., about 100 Å to about 1,000 Å, and a thickness of the HTL may be from about 50 Å to about 2,000 Å, e.g., about 100 Å to about 1,500 Å. When the thicknesses of the hole transport region, the HIL, and the HTL are within these ranges, satisfactory hole transporting characteristics may be obtained without a substantial increase in driving voltage.

The hole transport region may further include, in addition to the materials described above, a charge-generation material for the improvement of conductive characteristics. The charge-generation material may be homogeneously or non-homogeneously dispersed in the hole transport region.

The charge-generation material may be, e.g., a p-dopant. The p-dopant may be one of a quinone derivative, a metal oxide, and a cyano group-containing compound, but is not limited thereto. Examples of the p-dopant include a quinone derivative such as tetracyanoquinonedimethane (TCNQ) or 2,3,5,6-tetrafluoro-tetracyano-1,4-benzoquinonedimethane (F4-TCNQ); a metal oxide such as a tungsten oxide or a molybdenum oxide; and Compound HT-D1 below:

<Compound HT-D1>

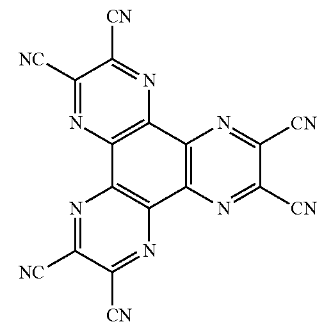

<F4-TCNQ>

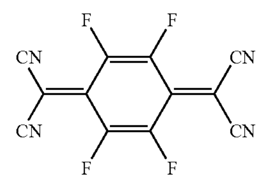

The hole transport region may further include, in addition to the HIL and the HTL, at least one of a buffer layer and an EBL. The buffer layer may compensate for an optical resonance distance of light according to a wavelength of the light emitted from the emission layer, and thus may improve light-emission efficiency. In this regard, a material that is included in the hole transport region may be used as a material that is included in the buffer layer. The EBL may serve as a layer that prevents electrons from being injected from the electron transport region.

For example, a material for forming the EBL may be mCP below:

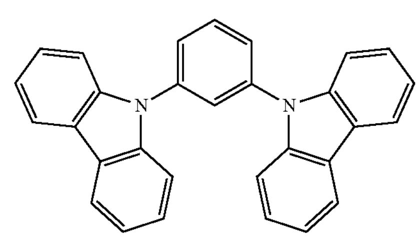

mCP

The electron transport region may include at least one of an HBL, an ETL, and an electron injection layer (EIL), for example.

For example, the electron transport region may have a structure of ETL/EIL or a structure of HBL/ETL/EIL, each of which layers are sequentially stacked in the stated order from the emission layer. The electron transport region may include an HBL. When the emission layer includes a phosphorescent dopant, the HBL may serve as a layer that prevents triplet excitons or holes from being spread out to the ETL.

When the electron transport region includes an HBL, the HBL may be formed on the emission layer by a suitable method, such as vacuum deposition, spin coating, casting, an LB method, ink-jet printing, layer printing, and LITI. When the HBL is formed by vacuum deposition and spin coating, deposition and coating conditions may be determined by referring to those applied to form the HIL.

The HBL may include, for example, at least one of BCP and Bphen below, but is not limited thereto:

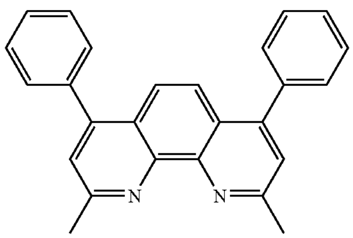

BCP

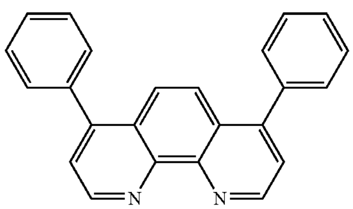

Bphen

A thickness of the HBL may be from about 20 Å to about 1,000 Å, e.g., about 30 Å to about 300 Å. When the thickness of the HBL is within these ranges, excellent hole blocking characteristics may be obtained without a substantial increase in driving voltage.

The electron transport region may include an ETL, and the ETL may be formed on the emission layer or the HBL by using various methods, such as vacuum deposition, spin coating, casting, an LB method, ink-jet printing, layer printing, and LITI. When the ETL is formed by vacuum deposition and spin coating, deposition and coating conditions may be determined by referring to those applied to form the HIL.

The ETL may include at least one of the BCP and Bphen above and $Alq_3$, Balq, TAZ, and NTAZ below:

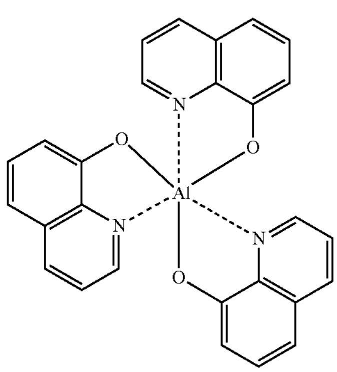

$Alq_3$

-continued

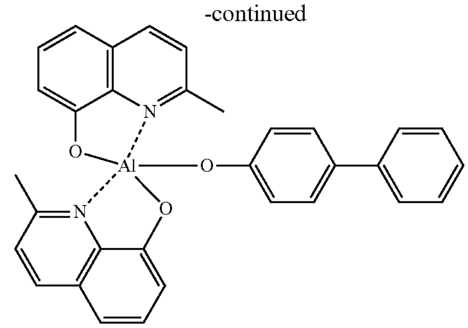

Balq

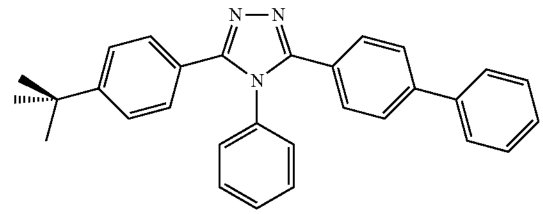

TAZ

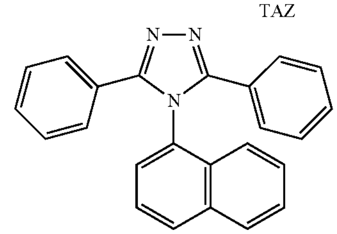

NTAZ

In some implementations, the ETL may include at least one of a compound represented by Formula 601 below and a compound represented by Formula 602 below:

$$Ar_{601}\text{-}[(L_{601})_{xe1}\text{-}E_{601}]_{xe2}$$ <Formula 601>

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$) (wherein $Q_{301}$ to $Q_{303}$ may be each independently selected from a hydrogen, $C_1$-$C_{60}$ alkyl group, a $C_2$-$C_{60}$ alkenyl group, a $C_6$-$C_{60}$ aryl group, and a $C_1$-$C_{60}$ heteroaryl group), descriptions of $L_{601}$ may be understood by referring to the descriptions presented in connection with $L_{201}$, $E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, xe1 may be selected from 0, 1, 2, and 3, and xe2 may be selected from 1, 2, 3, and 4, <Formula 602>

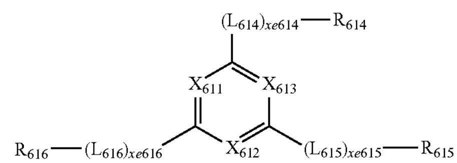

in Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one of $X_{611}$ to $X_{613}$ may be N, descriptions of $L_{611}$ to $L_{616}$ may be understood by referring to the descriptions presented in connection with $L_{201}$, $R_{611}$ to $R_{616}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xe611 to xe616 may be each independently selected 0, 1, 2, and 3.

The compound of Formula 601 and the compound of Formula 602 may be selected from Compounds ET1 to ET15 below:

-continued
ET1
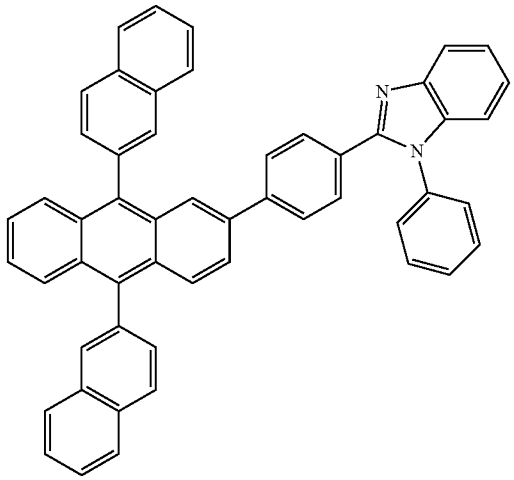
ET2
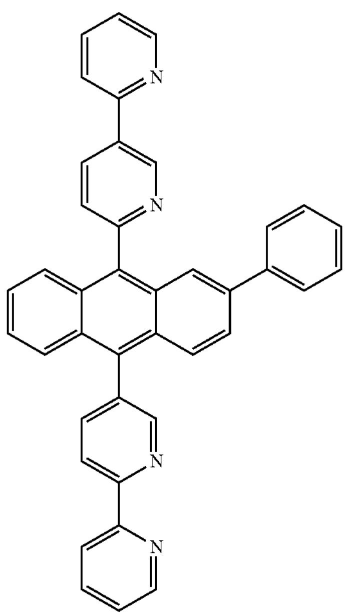
ET3
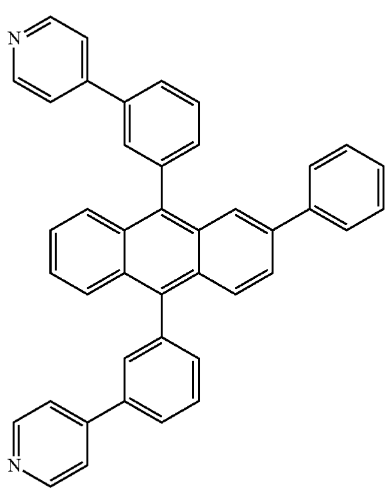
ET4
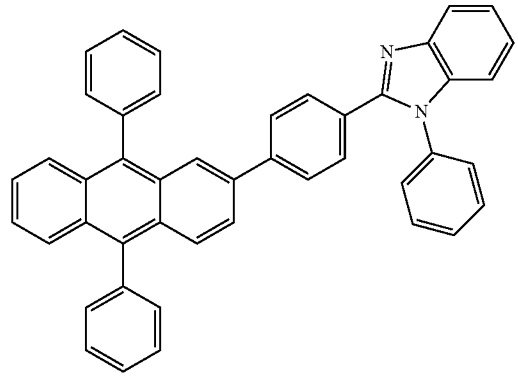
ET5
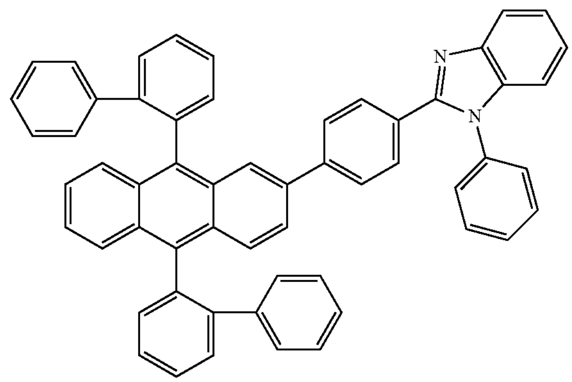
ET6
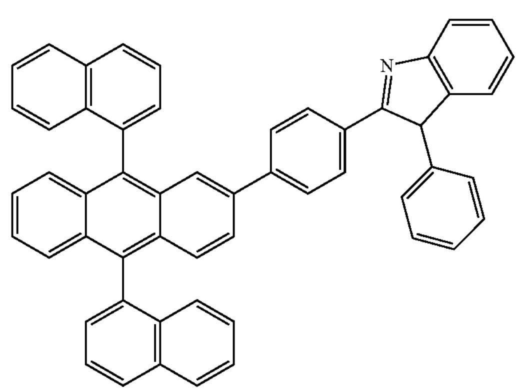

ET7
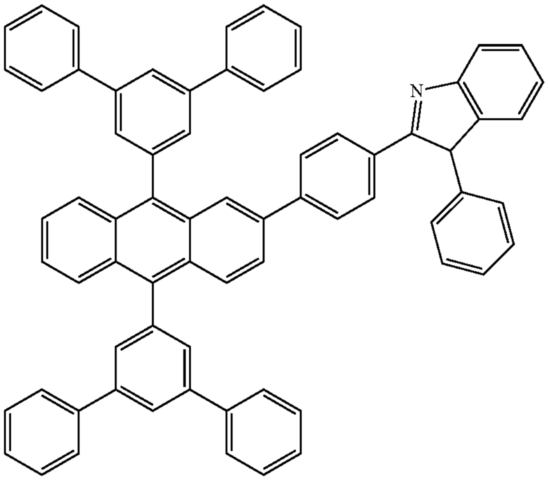
ET8
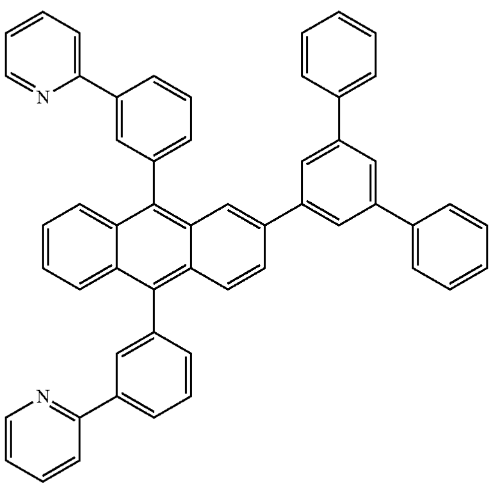
ET9
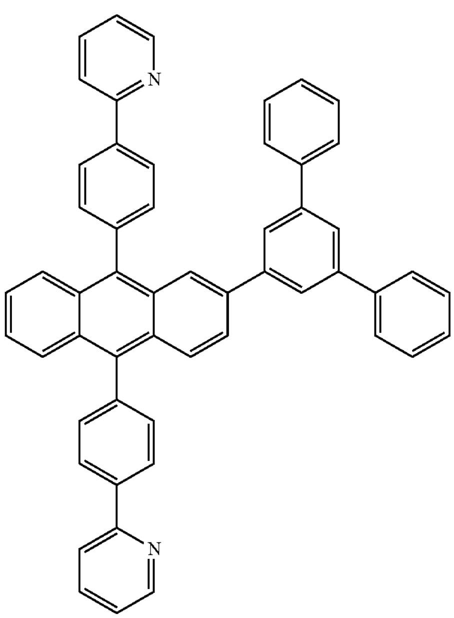
ET10
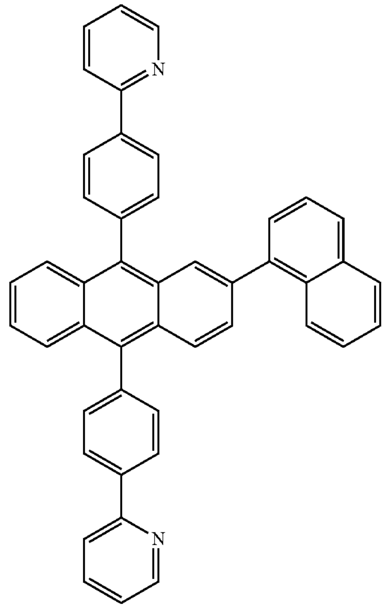
ET11
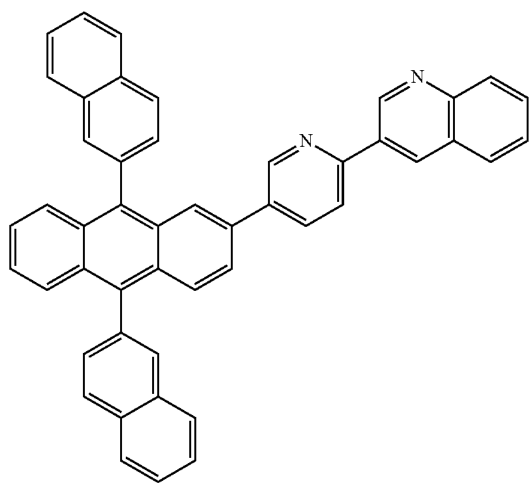
ET12
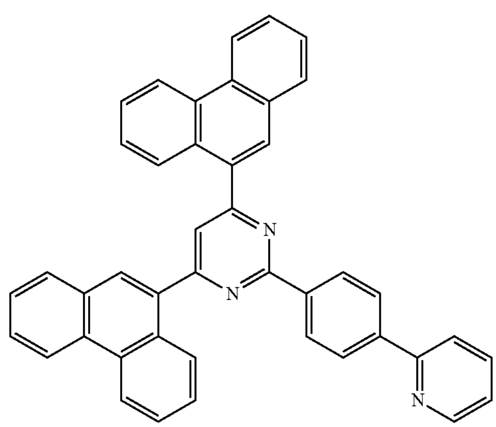

-continued

ET13

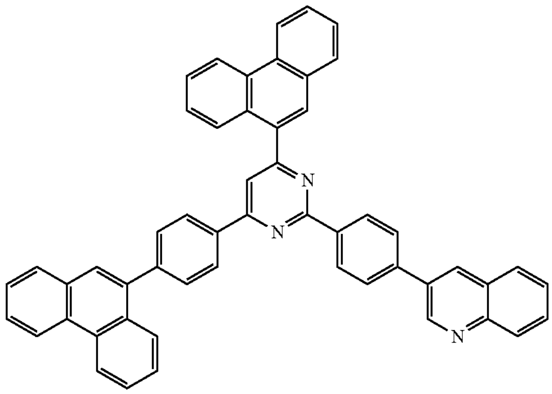

ET14

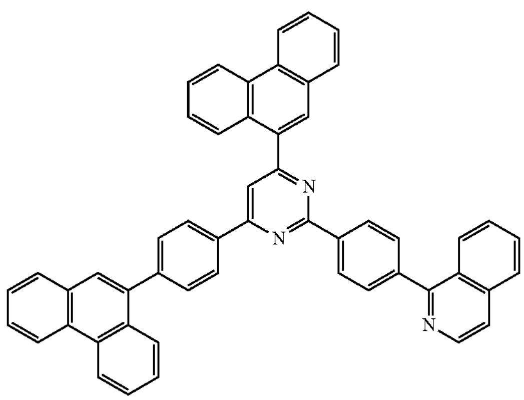

ET15

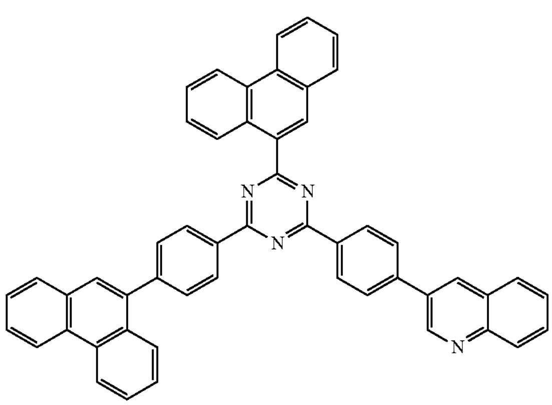

A thickness of the ETL may be from about 100 Å to about 1,000 Å, e.g., about 150 Å to about 500 Å. When the thickness of the ETL is within these ranges, excellent electron transporting characteristics may be obtained without a substantial increase in driving voltage.

The ETL may further include, in addition to the materials described above, a metal-containing material.

The metal-containing material may include a Li complex. The Li complex may include, for example, Compound ET-D1 (e.g., lithium quinolate (LiQ) or ET-D2 below:

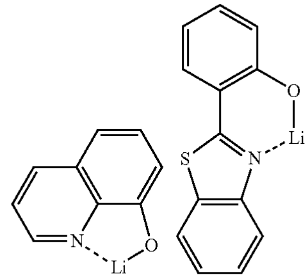

ET-D1 ET-D2

The electron transport region may include an EIL that facilitates electron injection from the second electrode 190.

The EIL may be formed on the ETL by a suitable method, such as vacuum deposition, spin coating, casting, an LB method, inkjet printing, laser printing, and LITI. When the EIL is formed by vacuum deposition and spin coating, deposition and coating conditions may be determined by referring to those applied to form the HIL.

The EIL may include at least one selected from LiF, NaCl, CsF, $Li_2O$, BaO, and LiQ.

A thickness of the EIL may be from about 1 Å to about 100 Å, e.g., about 3 Å to about 90 Å. When the thickness of the EIL is within these ranges, satisfactory electron injecting characteristics may be obtained without a substantial increase in driving voltage.

The second electrode 190 may be disposed on the organic layer 150. The second electrode 190 may be a cathode, which is an electron injection electrode. Here, a material for forming the second electrode 190 may be a material having a low work function, such as a metal, an alloy, an electrically conductive compound, or a mixture thereof. Detailed examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some implementations, the material for forming the second electrode 190 may include ITO or IZO. The second electrode 190 may be a reflective electrode, a semi-transmissive electrode, or a transmissive electrode.

Hereinbefore, the organic light-emitting device is described by referring to FIG. 1.

The term "$C_1$-$C_{60}$ alkyl group" used herein refers to a linear or branched aliphatic hydrocarbon monovalent group having 1 to 60 carbon atoms. Examples thereof include a methyl group, an ethyl group, a propyl group, an isobutyl group, a sec-butyl group, a ter-butyl group, a pentyl group, an iso-amyl group, and a hexyl group. The term "$C_1$-$C_{60}$ alkylene group" used herein refers to a divalent group having the same structure as the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group). Examples thereof include a methoxy group, an ethoxy group, and an isopropyloxy group.

The term "$C_2$-$C_{60}$ alkenyl group" used herein refers to a hydrocarbon group formed by substituting at least one carbon double bond in the middle or terminal of the $C_2$-$C_{60}$ alkyl group. Examples thereof include an ethenyl group, a prophenyl group, and a butenyl group. The term "$C_2$-$C_{60}$ alkenylene group" used herein refers to a divalent group having the same structure as the $C_2$-$C_{60}$ alkenyl group.

The term "$C_2$-$C_{60}$ alkynyl group" used herein refers to a hydrocarbon group formed by substituting at least one carbon triple bond in the middle or terminal of the $C_2$-$C_{60}$ alkyl group. Examples thereof include an ethynyl group and a propynyl group. The term "$C_2$-$C_{60}$ alkynylene group" used herein refers to a divalent group having the same structure as the $C_2$-$C_{60}$ alkynyl group.

The term "$C_3$-$C_{10}$ cycloalkyl group" used herein refers to a monovalent hydrocarbon monocyclic group having 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" used herein refers to a divalent group having the same structure as the $C_3$-$C_{10}$ cycloalkyl group.

The term "$C_1$-$C_{10}$ heterocycloalkyl group" used herein refers to a monovalent monocyclic group having at least one heteroatom selected from N, O, Si, P and S as a ring-forming atom and 1 to 10 carbon atoms. Examples thereof include a tetrahydrofuranyl group and a tetrahydrothiophenyl group. The term "$C_1$-$C_{10}$ heterocycloalkylene group" used herein refers to a divalent group having the same structure as the $C_1$-$C_{10}$ heterocycloalkyl group.

The term "$C_3$-$C_{10}$ cycloalkenyl group" used herein refers to a monovalent monocyclic group that has 3 to 10 carbon atoms and at least one double bond in the ring thereof and does not have aromacity. Examples thereof include a cyclopentenyl group, a cyclohexenyl group, and a cycloheptenyl group. The term "$C_3$-$C_{10}$ cycloalkenylene group" used herein refers to a divalent group having the same structure as the $C_3$-$C_{10}$ cycloalkenyl group.

The term "$C_1$-$C_{10}$ heterocycloalkenyl group" used herein refers to a monovalent monocyclic group that has at least one heteroatom selected from N, O, P, and S as a ring-forming atom, 1 to 10 carbon atoms, and at least one double bond in its ring, examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" used herein refers to a divalent group having the same structure as the $C_1$-$C_{10}$ heterocycloalkenyl group.

The term "$C_6$-$C_{60}$ aryl group" used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, these rings may be fused to each other.

The term "$C_1$-$C_{60}$ heteroaryl group" used herein refers to a monovalent group having a carbocyclic aromatic system that has at least one heteroatom selected from N, O, Si, P, and S as a ring-forming atom, and 1 to 60 carbon atoms. The term "$C_1$-$C_{60}$ heteroarylene group" used herein refers to a divalent group having a carbocyclic aromatic system that has at least one heteroatom selected from N, O, P, and S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, these rings may be fused to each other.

The term "$C_6$-$C_{60}$ aryloxy group" used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" (e.g., a group having 8 to 60 carbon atoms) used herein refers to a monovalent group that has two or more rings condensed to each other, has carbon atoms only as a ring-forming atom, and has non-aromacity in the entire molecular structure. An example of the monovalent non-aromatic condensed polycyclic group is a fluorenyl group. The term "divalent non-aromatic condensed polycyclic group" used herein refers to a divalent group having the same structure as the monovalent non-aromatic condensed polycyclic group.

The term "monovalent non-aromatic condensed heteropolycyclic group" (e.g., a group having 1 to 60 carbon atoms) used herein refers to a monovalent group that has two or more rings condensed to each other, has heteroatoms as a ring-forming atom selected from N, O, Si, P, and S, in addition to C, and has non-aromacity in the entire molecular structure. An example of the monovalent non-aromatic condensed heteropolycyclic group is a carbazolyl group. The term "divalent non-aromatic condensed heteropolycyclic group" used herein refers to a divalent group having the same structure as the monovalent non-aromatic condensed heteropolycyclic group.

At least one of substituents of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, $C_6$-$C_{60}$ arylthio group, $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$B(Q_{14})(Q_{15})$, and —$N(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —B($Q_{24}$)($Q_{25}$), and —N($Q_{26}$)($Q_{27}$); and —Si($Q_{31}$)($Q_{32}$)($Q_{33}$), —B($Q_{34}$)($Q_{35}$), and —N($Q_{36}$)($Q_{37}$), and $Q_1$ to $Q_7$, $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{10}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, at least one of substituents of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —N($Q_{11}$)($Q_{12}$), —B($Q_{13}$)($Q_{14}$), and —Si($Q_{15}$)($Q_{16}$)($Q_{17}$);

a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —$N(Q_{21})(Q_{22})$, —$B(Q_{23})(Q_{24})$, and —$Si(Q_{25})(Q_{26})(Q_{27})$; and —$N(Q_{31})(Q_{32})$, —$B(Q_{33})(Q_{34})$, and —$Si(Q_{35})(Q_{36})(Q_{37})$, and $Q_1$ to $Q_7$, $Q_{11}$ to $Q_{17}$, $Q_{21}$ to $Q_{27}$, and $Q_{31}$ to $Q_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, but the embodiment is not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1: Synthesis of Compound 1

Compound 1 was synthesized according to Reaction Scheme 1 below:

<Reaction Scheme 1>

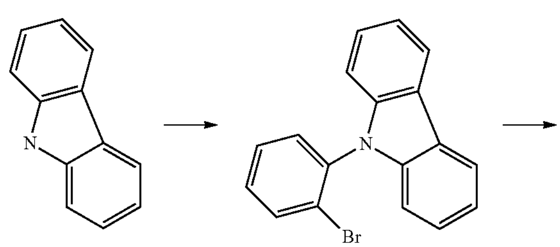

Intermediate 1-1

-continued

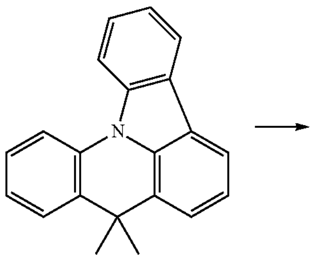

Intermediate 1-2

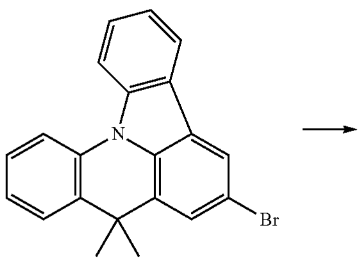

Intermediate 1-3

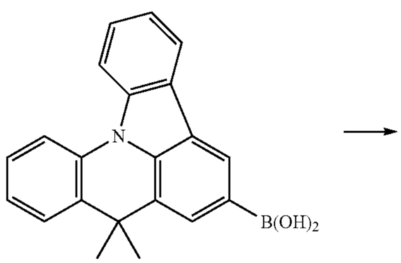

Intermediate 1-4

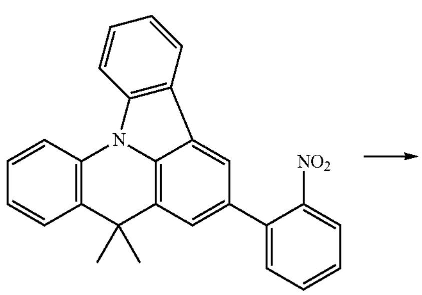

Intermediate 1-5

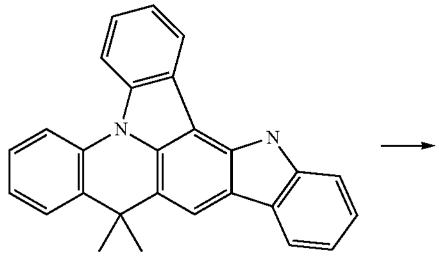

Intermediate 1-6

-continued

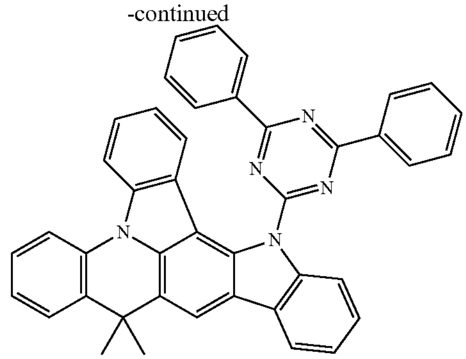

Compound 1

Synthesis of Intermediate 1-1

20 g (119.61 mmol) of carbazole, 67.68 g (239.22 mmol) of 2-bromoiodobenzene, 11.40 g (59.81 mmol) of copper iodide, and 33.06 g (239.22 mmol) of potassium carbonate were dissolved in xylene under a nitrogen atmosphere, and the mixed solution was stirred under reflux. After 12 hours, the mixed solution was cooled to room temperature, distilled water was added thereto, and the mixed solution was subjected to extraction using methyl chloride (MC), dried using magnesium sulfate, and distillation under reduced pressure. The resultant product was column-separated to obtain 32.64 g (101.67 mmol, Yield: 85%) of Intermediate 1-1.

Synthesis of Intermediate 1-2

20 g (62.30 mmol) of Intermediate 1-1 was dissolved in 100 ml of tetrahydrofuran (THF), and 24.91 ml (62.30 mmol, 2.5M in hexane) of n-buLi was slowly added thereto at a temperature of −78° C. After 2 hours of stirring, 4.70 ml (80.99 mmol) of acetone was added to the mixed solution. The mixed solution was slowly heated to room temperature, and subjected to extraction using MC after adding $NaHCO_3$ aqueous solution thereto. The resultant product obtained therefrom was dried using magnesium sulfate, and the residues obtained by evaporating the solvent were put in a two-neck flask to be mixed with 100 ml of acetic acid. An HCl aqueous solution having the same amount as the catalyst (5 mol %, 12N) was added to the mixed solution, and then, stirred under reflux. After 12 hours, the mixed solution was cooled to room temperature, and subjected to extraction using MC after adding distilled water thereto. The resultant product obtained therefrom was dried using magnesium sulfate, and the residues obtained by evaporating the solvent were column-separated, so as to obtain 11.47 g (40.50 mmol, yield: 65%) of Intermediate 1-2.

Synthesis of Intermediate 1-3

20 g (70.64 mmol) of Intermediate 1-2 was dissolved in 200 ml of dimethylformamide (DMF), and 13.83 g (77.70 mmol) of N-bromosuccinimide (NBS) was added thereto. After 10 hours of stirring at room temperature, the mixed solution was subjected to extraction using ethyl acetate (EA) after evaporating an organic solvent under reduced pressure and adding distilled water thereto. The resultant product obtained therefrom was dried using magnesium sulfate, and the residues obtained by evaporating the solvent under reduced pressure were column-separated, so as to obtain 22.19 g (61.45 mmol, yield: 87%) of Intermediate 1-3.

Synthesis of Intermediate 1-4

20 g (55.39 mmol) of Intermediate 1-3 was dissolved in 200 ml of THF, and 22.15 ml (55.39 mmol, 2.5M in hexane) of n-buLi was slowly added thereto at a temperature of −78° C. After 1 hour of stirring, 8.02 ml (72.01 mmol) of trimethyl borate was added to the mixed solution. The mixed solution was slowly heated to room temperature, stirred for 12 hours, and subjected to extraction using EA after adding distilled water thereto. The resultant product obtained therefrom was dried using magnesium sulfate, and the residues obtained by evaporating the solvent under reduced pressure were column-separated, so as to obtain 10.87 g (33.24 mmol, yield: 60%) of Intermediate 1-4.

Synthesis of Intermediate 1-5

20 g (61.14 mmol) of Intermediate 1-4, 14.81 g (73.36 mmol) of bromo-2-nitrobenzene, 1.78 g (1.53 mmol) of tetrakis(triphenyl phosphine)palladium(0) ($Pd(PPh_3)_4$). 49.98 ml (101.89 mmol) of 2M $K_2CO_3$ aqueous solution, 160 ml of toluene, and 60 ml of ethanol were mixed and stirred under reflux. After 4 hours, the mixed solution was cooled to room temperature, and subjected to extraction using EA after adding distilled water thereto. The resultant product obtained therefrom was dried using magnesium sulfate, and the residues obtained by evaporating the solvent under reduced pressure were column-separated, so as to obtain 18.78 g (46.46 mmol, yield: 76%) of Intermediate 156.

Synthesis of Intermediate 1-6

10 g (24.74 mmol) of Intermediate 1-5 and 100 ml of triethyl phosphite were mixed and stirred at a temperature of 180° C. After 10 hours, the mixed solution was cooled down to room temperature, and subjected to extraction using EA after evaporating an organic solvent under reduced pressure and adding distilled water thereto. The resultant product obtained therefrom was dried using magnesium sulfate, and the residues obtained by evaporating the solvent under reduced pressure were column-separated, so as to obtain 5.51 g (14.85 mmol, yield: 60%) of Intermediate 1-6.

Synthesis of Compound 1

10 g (26.92 mmol) of Intermediate 1-6 was dissolved in 100 ml of DMF, and 1.62 g (40.38 mmol, 60% dispersion in mineral oil) of NaH was added to a reaction container in which 100 ml of DMF was dissolved. After 1 hour, 8.65 g (32.31 mmol) of 2-chloro-4,6-diphenyl triazine dissolved in 100 ml of DMF was added to the reaction container. After 12 hours of stirring, distilled water was added to the reaction container, and then, solids obtained therefrom were filtered under reduced pressure and recrystallized by using EA and DMF, so as to obtain 8.77 g (14.54 mmol, yield: 54%) of Compound 1.

MS: m/z 603.24 $[M]^+$ $^1$H NMR ($CDCl_3$) δ 8.55 (1H), 8.32 (1H), 8.28 (4H), 8.12 (1H), 7.94 (1H), 7.63 (1H), 7.51 (4H), 7.50 (1H), 7.41 (2H), 7.40 (1H), 7.37 (1H), 7.33 (1H), 7.30 (1H), 7.29 (11H), 7.26 (1H), 7.25 (1H), 1.72 (6H)

Synthesis Example 2: Synthesis of Compound 2

Compound 2 (yield: 52%) was obtained in the same manner as in synthesizing Intermediate 1-2 of Synthesis Example 1, except that benzophenone was used instead of acetone.

MS: m/z 727.27 $[M]^+$ $^1$H NMR ($CDCl_3$) δ 8.55 (1H), 8.28 (4H), 8.25 (1H), 8.12 (1H), 7.94 (11H), 7.63 (1H), 7.51 (41H), 7.50 (1H), 7.41 (2H), 7.39 (1H), 7.33 (61-1), 7.29 (1H), 7.26 (2H), 7.25 (1H), 7.23 (1H), 7.22 (1H), 7.11 (4H)

Synthesis Example 3: Synthesis of Compound 3

Compound 3 was synthesized according to Reaction Scheme 2 below:

<Reaction Scheme 2>

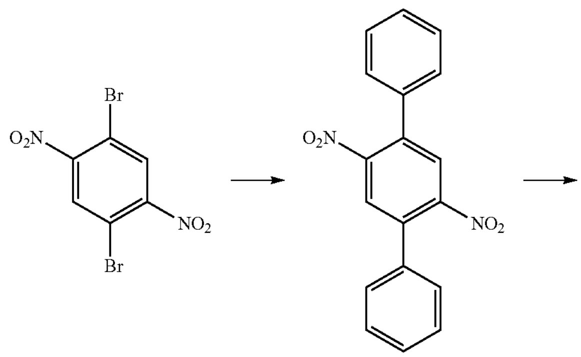

Intermediate 3-1

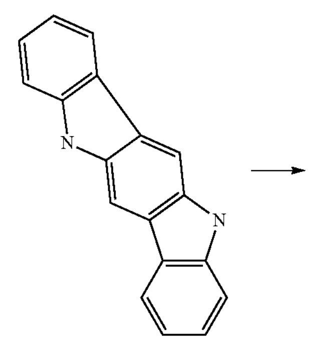

Intermediate 3-2

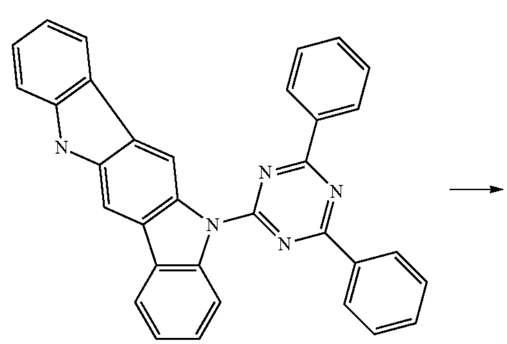

Intermediate 3-3

-continued

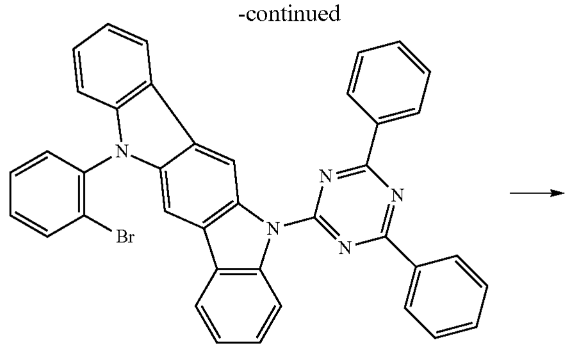

Intermediate 3-4

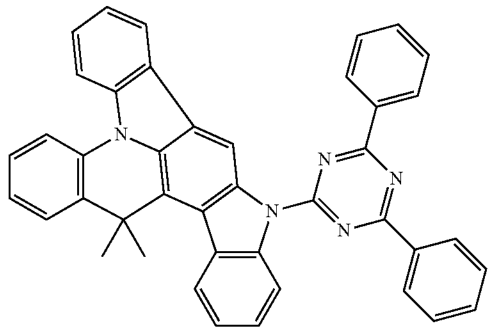

Compound 3

Synthesis of Intermediate 3-1

20 g (61.76 mmol) of 1,4-dibromo-2,5-dinitrobenzene, 18.83 g (154.40 mmol) of 1-phenyl boronic acid, 4.32 g (3.71 mmol) of $Pd(PPh_3)_4$, 90.88 ml (185.28 mmol) of 2M $K_2CO_3$ aqueous solution, 200 ml of toluene, and 100 ml of ethanol were mixed and stirred under reflux. After 10 hours, the mixed solution was cooled to room temperature, and subjected to extraction using EA after adding distilled water thereto. The resultant product obtained therefrom was dried using magnesium sulfate, and the residues obtained by evaporating the solvent under reduced pressure were column-separated, so as to obtain 17.79 g (55.58 mmol, yield: 90%) of Intermediate 3-1.

Synthesis of Intermediate 3-2

Intermediate 3-2 was obtained in the same manner synthesizing Intermediate 1-6 of Synthesis Example 1, except that Intermediate 3-1 was used instead of Intermediate 1-5.

Synthesis of Intermediate 3-3

Intermediate 3-3 was obtained in the same manner as in synthesizing Compound 1 of Synthesis Example 1, except that Intermediate 3-2 was used instead of Intermediate 1-6.

Synthesis of Intermediate 3-4

Intermediate 3-4 was obtained in the same manner as in synthesizing Intermediate 1-1 of Synthesis Example 1, except that Intermediate 3-3 was used instead of carbazole.

Synthesis of Compound 3

Compound 3 (yield: 56%) was obtained in the same manner as in synthesizing Intermediate 1-2 of Synthesis Example 1, except that Intermediate 3-4 was used instead of Intermediate 1-1.

MS: m/z 603.24 $[M]^+$ $^1H$ NMR ($CDCl_3$) δ 8.55 (1H), 8.28 (4H), 8.12 (1H), 7.94 (1H), 7.63 (1H), 7.51 (4H), 7.50 (1H), 7.41 (2H), 7.40 (1H), 7.37 (2H), 7.33 (1H), 7.30 (1H), 7.29 (1H), 7.26 (1H), 7.25 (1H), 1.72 (6H)

Synthesis Example 4: Synthesis of Compound 4

Compound 4 (yield: 60%) was obtained in the same manner as in synthesizing Compound 1 of Synthesis Example 1, except that 2-(4-chlorophenyl)-4,6-diphenyl triazine was used instead of 2-chloro-4,6-diphenyl triazine.

MS: m/z 679.27 $[M]^+$ $^1H$ NMR ($CDCl_3$) δ 8.55 (1H), 8.32 (1H), 8.28 (4H), 8.12 (11), 7.94 (1H), 7.79 (21-1), 7.68 (21-1), 7.63 (1H), 7.51 (4H), 7.50 (1H), 7.41 (2H), 7.40 (1H), 7.37 (1H), 7.33 (1H), 7.30 (1H), 7.29 (1H), 7.26 (1H), 7.25 (1H), 1.72 (6H)

Synthesis Example 5: Synthesis of Compound 10

Compound 10 was synthesized according to Reaction Scheme 3 below:

<Reaction Scheme 3>

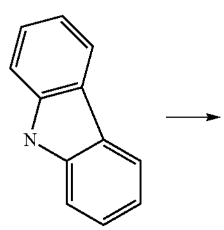

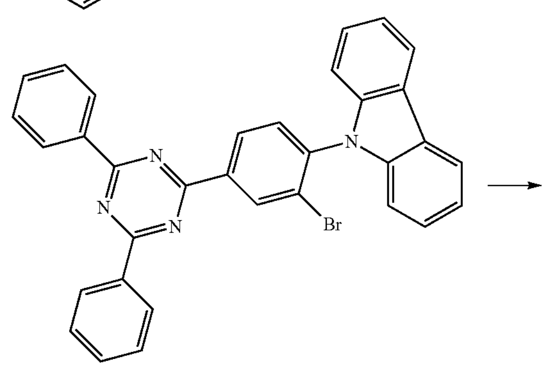

Intermediate 10-1

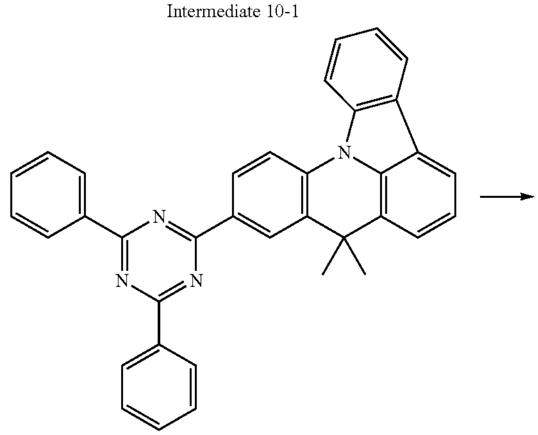

Intermediate 10-2

-continued

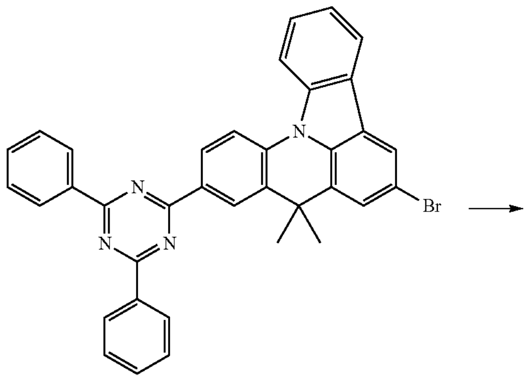

Intermediate 10-3

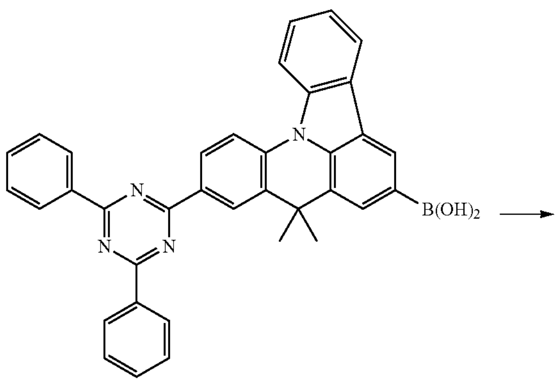

Intermediate 10-4

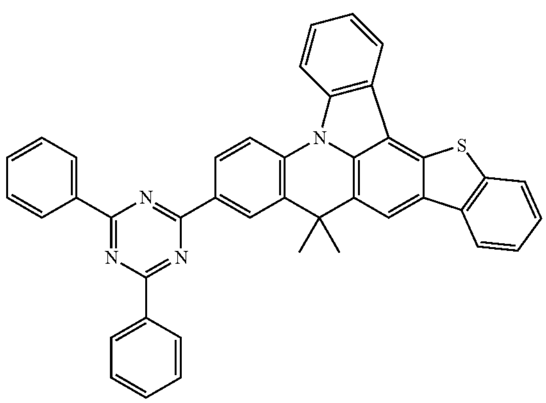

Compound 10

Synthesis of Intermediate 10-1

Intermediate 10-1 was obtained in the same manner as in synthesizing Intermediate 1-1 of Synthesis Example 1, except that 2-(3-bromo-4-iodophenyl)-4,6-diphenyl-1,3-,5-triazine was used instead of 2-bromoiodo benzene.

Synthesis of Intermediates 10-2, 10-3, and 10-4

Intermediates 10-2, 10-3, and 10-4 were sequentially synthesized in the same manner as in synthesizing Intermediates 1-2, 1-3, and 1-4 of Synthesis Example 1, except that Intermediate 10-1 was used instead of Intermediate 1-1.

Synthesis of Compound 10

Compound 10 (yield: 48%) was synthesized in the same manner as in synthesizing Intermediate 1-5 of Synthesis Example 1, except that Intermediate 10-4 and 2-bromobenzenethiol were used instead of Intermediate 1-4 and bromo-2-nitrobenzene, respectively.

MS: m/z 620.20 $[M]^+$ $^1$H NMR ($CDCl_3$) δ 8.45 (1H), 8.28 (4H), 8.12 (1H), 7.98 (1H), 7.86 (1H), 7.68 (1H), 7.63 (1H), 7.61 (1H), 7.60 (1H), 7.52 (1H), 7.51 (4H), 7.50 (2H), 7.41 (2H), 7.29 (1H), 1.72 (6H)

Synthesis Example 6: Synthesis of Compound 11

Compound 11 (yield: 50%) was obtained in the same manner as in synthesizing Compound 10 of Synthesis Example 10, except that 2-bromophenol was used instead of 2-bromobenzenethiol.

MS: m/z 604.23 $[M]^+$ $^1$H NMR ($CDCl_3$) δ 8.28 (4H), 8.12 (1H), 7.89 (1H), 7.86 (1H), 7.66 (1H), 7.63 (1H), 7.61 (1H), 7.60 (1H), 7.51 (4H), 7.50 (1H), 7.41 (2H), 7.38 (1H), 7.36 (1H), 7.32 (1H), 7.29 (1H), 1.72 (6H)

Synthesis Example 7: Synthesis of Compound 14

Compound 14 was synthesized according to Reaction Scheme 4 below:

<Reaction Scheme 4>

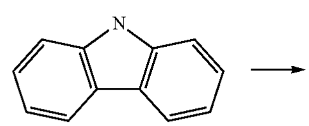

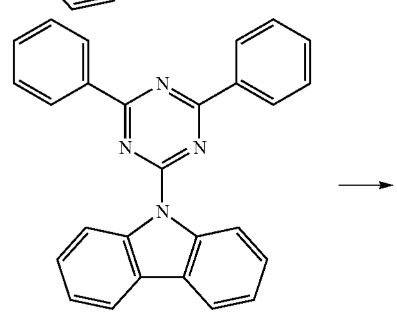

Intermediate 1-1

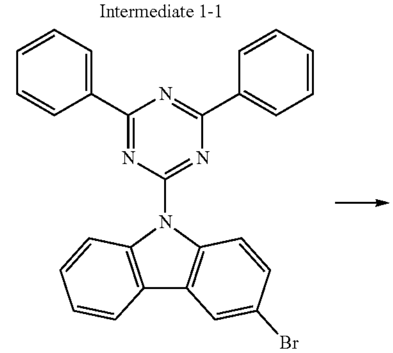

Intermediate 1-2

-continued

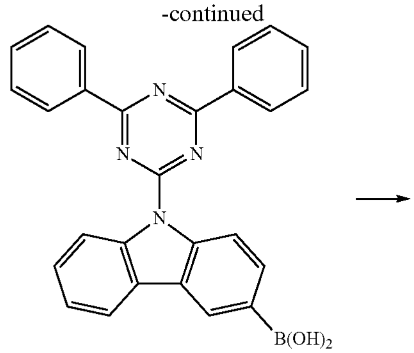

Intermediate 1-3

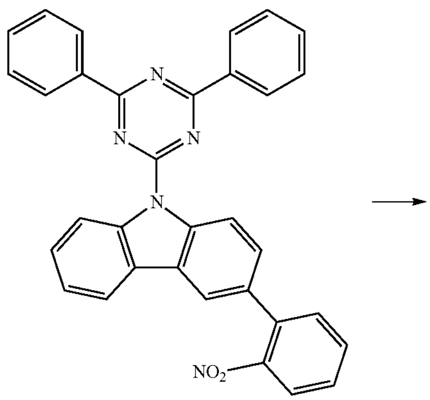

Intermediate 1-4

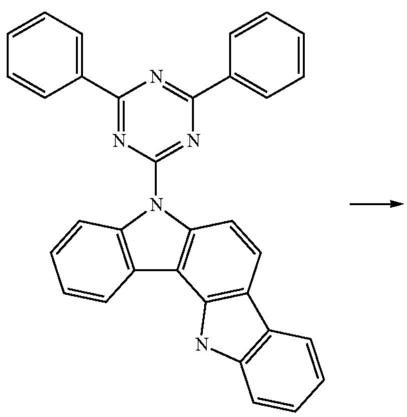

Intermediate 1-5

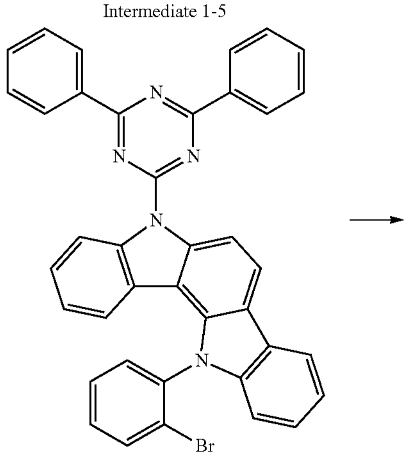

Intermediate 1-6

-continued

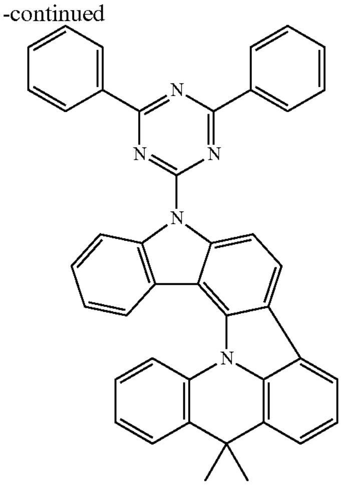

Compound 14

Synthesis of Intermediate 1-1

20 g (119.61 mmol) of carbazole was dissolved in 100 ml of DMF and put in a reaction container in which 7.07 g (179.42 mmol, 60% dispersion in mineral oil) of NaH was dissolved in 100 ml. After 1 hour, 38.42 g (143.53 mmol) of 2-chloro-4,6-diphenyl triazine dissolved in 100 ml of DMF was added to the mixed solution. After 12 hours of stirring, distilled water was added to the mixed solution, and then, solids obtained therefrom were filtered under reduced pressure and recrystallized by using EA and DMF, so as to obtain 25.74 g (64.59 mmol, yield: 54%) of Intermediate 1-1.

Synthesis of Intermediate 1-2

20 g (50.19 mmol) of Intermediate 1-1 was dissolved in 200 ml of DMF, and 9.83 g (55.21 mmol) of NBS was added thereto. After 10 hours of stirring at room temperature, the mixed solution was subjected to extraction using EA after evaporating an organic solvent under reduced pressure and adding distilled water thereto. The resultant product obtained therefrom was dried using magnesium sulfate, and the residues obtained by evaporating the solvent under reduced pressure were column-separated, so as to obtain 22.04 g (41.90 mmol, yield: 92%) of Intermediate 1-2.

Synthesis of Intermediate 1-3

20 g (41.90 mmol) of Intermediate 1-2 was dissolved in 200 ml of THF, and 16.76 ml (41.90 mmol, 2.5M in hexane) of n-buLi was slowly added thereto at a temperature of −78° C. After 1 hour of stirring, 6.07 ml (54.47 mmol) of trimethyl borate was added to the mixed solution. The mixed solution was slowly heated to room temperature, stirred for 12 hours, and subjected to extraction using EA after adding distilled water thereto. The resultant product obtained therefrom was dried using magnesium sulfate, and the residues obtained by evaporating the solvent under reduced pressure were column-separated, so as to obtain 7.41 g (16.67 mmol, yield: 40%) of Intermediate 1-3.

Synthesis of Intermediate 1-4

10 g (22.61 mmol) of Intermediate 1-3, 5.48 g (27.13 mmol) of bromo-2-nitrobenzene, 0.79 g (0.68 mmol) of tetrakis(triphenyl phosphine)palladium(0) ($Pd(PPh_3)_4$), 22.18 ml (45.22 mmol) of 2M $K_2CO_3$ aqueous solution, 80 ml of toluene, and 30 ml of ethanol were mixed and stirred under reflux. After 4 hours, the mixed solution was cooled to room temperature, and subjected to extraction using EA after adding distilled water thereto. The resultant product obtained therefrom was dried using magnesium sulfate, and the residues obtained by evaporating the solvent under reduced pressure were column-separated, so as to obtain 8.69 g (16.73 mmol, yield: 74%) of Intermediate 1-4.

Synthesis of Intermediate 1-5

10 g (19.25 mmol) of Intermediate 1-4 and 100 ml of triethyl phosphite were mixed and stirred at a temperature of 180° C. After 10 hours, the mixed solution was cooled down to room temperature, and subjected to extraction using EA after evaporating an organic solvent under reduced pressure and adding distilled water thereto. The resultant product obtained therefrom was dried using magnesium sulfate, and the residues obtained by evaporating the solvent under reduced pressure were column-separated, so as to obtain 5.62 g (11.55 mmol, yield: 60%) of Intermediate 1-5.

Synthesis of Intermediate 1-6

10 g (20.55 mmol) of Intermediate 1-5, 11.63 g (41.11 mmol) of 2-bromoiodobenzene, 1.96 g (10.28 mmol) of copper iodide, and 5.68 g (41.11 mmol) of potassium carbonate were dissolved in xylene under a nitrogen atmosphere, and the mixed solution was stirred under reflux. After 12 hours, the reaction solution was cooled to room temperature, and subjected to extraction using MC after adding distilled water thereto. The resultant product obtained therefrom was dried using magnesium sulfate, and the residues obtained by evaporating the solvent were column-separated, so as to obtain 5.55 g (8.63 mmol, yield: 42%) of Intermediate 1-6.

Synthesis of Compound 14

10 g (15.56 mmol) of Intermediate 1-6 was dissolved in 100 ml of THF, and 6.22 ml (15.56 mmol, 2.5M in hexane) of n-buLi was slowly added thereto at a temperature of −78° C. After 2 hours of stirring, 1.20 ml (20.23 mmol) of acetone was added to the mixed solution. The mixed solution was slowly heated to room temperature, and subjected to extraction using MC after adding $NaHCO_3$ aqueous solution thereto. The resultant product obtained therefrom was dried using magnesium sulfate, and the residues obtained by evaporating the solvent were put in a two-neck flask and mixed with 100 ml of acetic acid. An HCL aqueous solution having the same amount as the catalyst (5 mol %, 12N) was added to the mixed solution, and then, stirred under reflux. After 12 hours, the reaction solution was cooled to room temperature, and subjected to extraction using MC after adding distilled water thereto. The resultant product obtained therefrom was dried using magnesium sulfate, and the residues obtained by evaporating the solvent were column-separated, so as to obtain 5.45 g (9.03 mmol, yield: 58%) of Compound 14.

MS: m/z 603.24 $[M]^+$ $^1$H-NMR ($CDCl_3$) δ 7.55 (2H), 7.48 (41-1), 7.40 (1H), 7.37 (1H), 7.32 (411), 7.22 (2H), 7.20 (2H), 7.10 (2H), 7.08 (1H), 7.00 (2H), 6.95 (1H), 6.92 (1H), 1.67 (6H)

Synthesis Example 8: Synthesis of Compound 15

10 g (15.56 mmol) of Intermediate 1-6, which was prepared in the same manner as in Synthesis Example 7, was mixed with 100 ml of THF, and 6.22 ml (15.56 mmol, 2.5M in hexane) of n-buLi was slowly added thereto at a temperature of −78° C. After 2 hours of stirring, 3.69 g (20.23 mmol) of benzophenone dissolved in 50 ml of THF was added to the mixed solution. The mixed solution was slowly heated to room temperature, and subjected to extraction using MC after adding $NaHCO_3$ aqueous solution thereto. The resultant product obtained therefrom was dried using magnesium sulfate, and the residues obtained by evaporating the solvent were put in a two-neck flask and mixed with 100 ml of acetic acid. An HCl aqueous solution having the same amount as the catalyst (5 mol %, 12N) was added to the mixed solution, and then, stirred under reflux. After 12 hours, the reaction solution was cooled to room temperature, and subjected to extraction using MC after adding distilled water thereto. The resultant product obtained therefrom was dried using magnesium sulfate, and the residues obtained by evaporating the solvent were column-separated, so as to obtain 6.12 g (8.40 mmol, yield: 54%) of Compound 15.

MS: m/z 727.27 $[M]^+$ $^1$H NMR ($CDCl_3$) δ 7.55 (2H), 7.48 (4H), 7.40 (1H), 7.36 (1H), 7.32 (4H), 7.22 (2H), 7.14 (4H), 7.10 (4H), 7.08 (1H), 7.07 (2H), 7.06 (411), 7.00 (2H), 6.88 (2H)

Synthesis Example 9: Synthesis of Compound 16

Compound 16 was synthesized according to Reaction Scheme 5 below:

<Reaction Scheme 5>

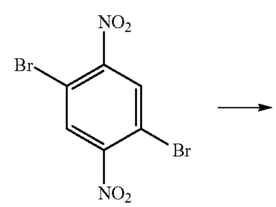

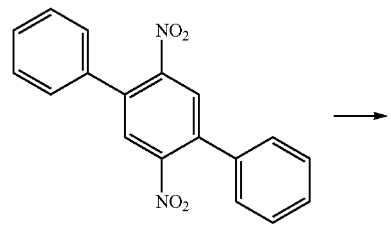

Intermediate 3-1

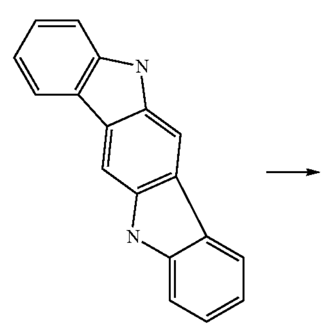

Intermediate 3-2

-continued

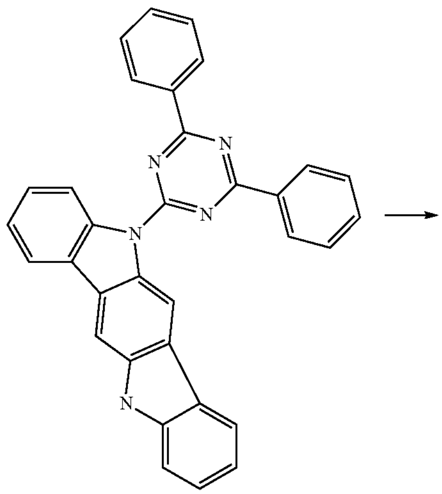

Intermediate 3-3

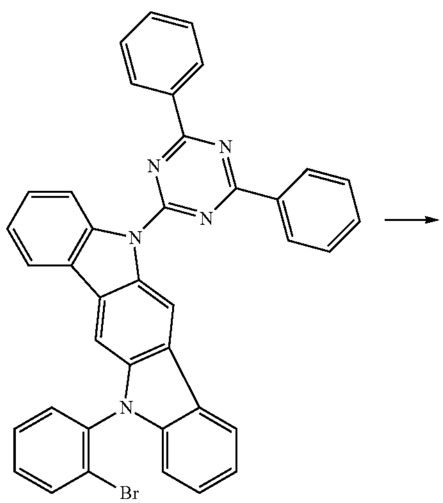

Intermediate 3-4

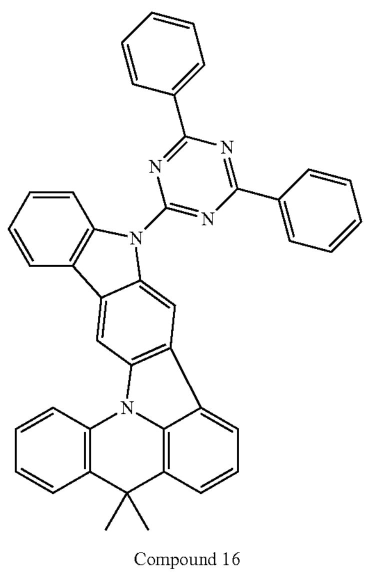

Compound 16

Synthesis of Intermediate 3-1

20 g (61.36 mmol) of 1,4-dibromo-2,5-dinitrobenzene, 18.7 g (153.40 mmol) of 1-phenyl boronic acid, 4.30 g (3.68 mmol) of $Pd(PPh_3)_4$, 90.29 ml (184.08 mmol) of 2M $K_2CO_3$ aqueous solution, 200 ml of toluene, and 100 ml of ethanol were mixed and stirred under reflux. After 10 hours, the mixed solution was cooled to room temperature, and subjected to extraction using EA after adding distilled water thereto. The resultant product obtained therefrom was dried using magnesium sulfate, and the residues obtained by evaporating the solvent under reduced pressure were column-separated, so as to obtain 16.99 g (53.38 mmol, yield: 87%) of Intermediate 3-2.

Synthesis of Intermediate 3-2

9.27 g (36.44 mmol, yield: 58%) of Intermediate 3-2 obtained in the same manner as in synthesizing Intermediate 1-5 of Synthesis Example 7, except that 20 g (62.83 mmol) of Intermediate 3-1 and 200 ml of triethylphosphite were used instead of 10 g of Intermediate 1-4 of Synthesis Example 7 and 100 ml of triethyl phosphite, respectively.

Synthesis of Intermediate 3-3

20 g (78.65 mmol) of Intermediate 3-2 was dissolved in 100 ml of DMF and put in a reaction container in which 4.65 g (117.98 mmol, 60% dispersion in mineral oil) of NaH was dissolved in 100 ml of DMF. After 1 hour, 37.90 g (141.57 mmol) of 2-chloro-4,6-diphenyl triazine dissolved in 100 ml of DMF was added to the mixed solution. After 12 hours of stirring, distilled water was added to the mixed solution, and then, solids obtained therefrom were filtered under reduced pressure and recrystallized by using EA and DMF, so as to obtain 10.71 g (22.02 mmol, yield: 28%) of Intermediate 3-3.

Synthesis of Intermediate 3-4

5.28 g (8.22 mmol, yield: 40%) of Intermediate 3-4 was obtained in the same manner as in synthesizing Intermediate 1-6 of Synthesis Example 7, except that Intermediate 3-3 was used instead of Intermediate 1-5 of Synthesis Example 7.

Synthesis of Compound 16

5.07 g (8.40 mmol, yield: 54%) of Compound 16 was obtained in the same manner as in synthesizing Compound 14 of Synthesis Example 7, except that Intermediate 3-4 was used instead of Intermediate 1-6 of Synthesis Example 7.

MS: m/z 603.24 $[M]^+$ $^1H$ NMR ($CDCl_3$) δ 7.55 (2H), 7.48 (4H), 7.40 (211), 7.37 (1H), 7.32 (4H), 7.22 (2H), 7.20 (2H), 7.10 (2H), 7.08 (11-1), 7.00 (1H), 6.95 (1H), 6.92 (1H), 1.67 (6H)

Synthesis Example 10: Synthesis of Compound 17

Compound 17 was synthesized according to Reaction Scheme 6 below:

<Reaction Scheme 6>

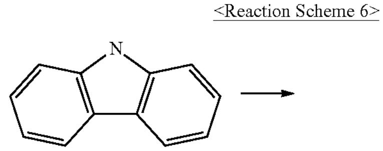

-continued
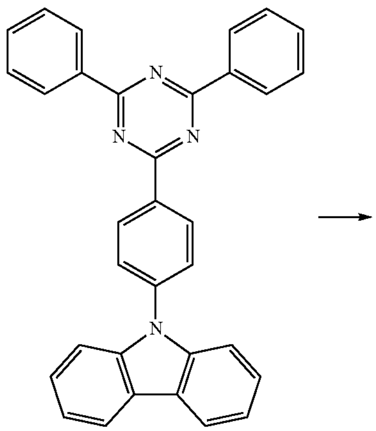
Intermediate 4-1
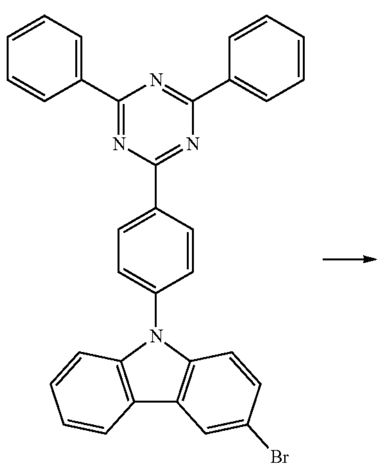
Intermediate 4-2
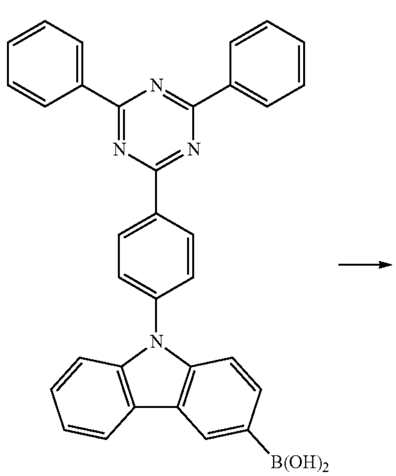
Intermediate 4-3
-continued
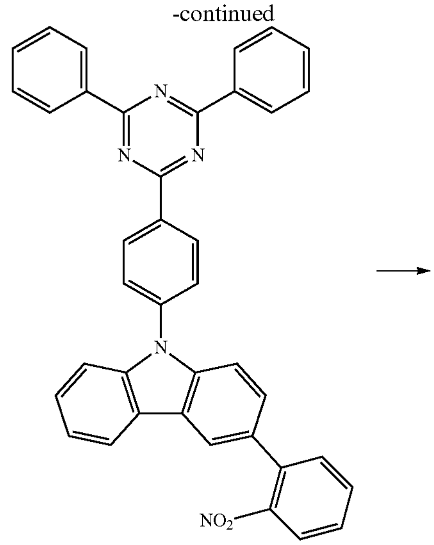
Intermediate 4-4
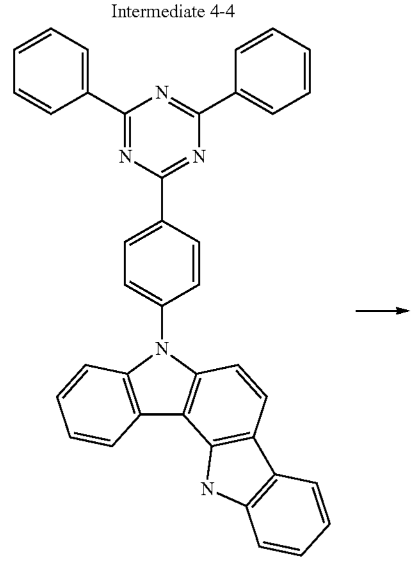
Intermediate 4-5
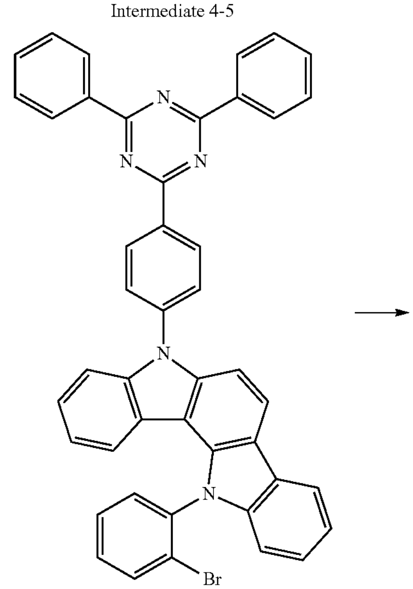
Intermediate 4-6

-continued

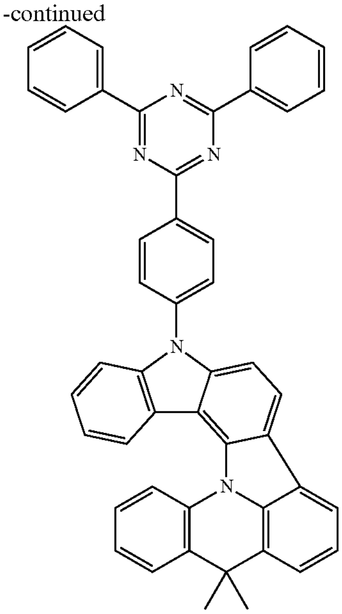

Compound 17

Synthesis of Intermediate 4-1

31.79 g (66.98 mmol, yield: 56%) of Intermediate 4-1 was obtained in the same manner as in synthesizing Intermediate 1-1 of Synthesis Example 7, except that 49.35 g (143.53 mmol) of 2-(4-chlorophenyl)-4,6-diphenyl triazine was used instead of 2-chloro-4,6-diphenyl triazine.

Synthesis of Intermediate 4-2

20.99 g (37.93 mmol, yield: 90%) of Intermediate 4-2 was obtained in the same manner as in synthesizing Intermediate 1-2 of Synthesis Example 7, except that 20 g (42.14 mmol) of Intermediate 4-1 used instead of Intermediate 1-1 of Synthesis Example 7.

Synthesis of Intermediate 4-3

20 g (36.14 mmol) of Intermediate 4-2 was dissolved in 200 ml of THF, and 14.45 ml (41.90 mmol, 2.5M in hexane) of n-buLi was slowly added thereto at a temperature of −78° C. After 1 hour of stirring, 5.23 ml (46.98 mmol) of trimethyl borate was added to the mixed solution. The mixed solution was slowly heated to room temperature, stirred for 12 hours, and subjected to extraction using EA after adding distilled water thereto. The resultant product obtained therefrom was dried using magnesium sulfate, and the residues obtained by evaporating the solvent under reduced pressure were column-separated, so as to obtain 7.49 g (14.45 mmol, yield: 40%) of Intermediate 4-3.

Synthesis of Intermediate 4-4

10 g (19.29 mmol) of Intermediate 4-3, 4.67 g (23.15 mmol) of bromo-2-nitrobenzene, 0.68 g (0.58 mmol) of $Pd(PPh_3)_4$, 18.92 ml (38.58 mmol) of 2M $K_2CO_3$ aqueous solution, 80 ml of toluene, and 30 ml of ethanol were mixed and stirred under reflux. After 4 hours, the mixed solution was cooled to room temperature, and subjected to extraction using EA after adding distilled water thereto. The resultant product obtained therefrom was dried using magnesium sulfate, and the residues obtained by evaporating the solvent under reduced pressure were column-separated, so as to obtain 8.27 g (13.89 mmol, yield: 72%) of Intermediate 4-4.

Synthesis of Intermediate 4-5

5.67 g (10.07 mmol, yield: 60%) of Intermediate 4-5 was obtained in the same manner as in synthesizing Intermediate 1-5 of Synthesis Example 7, except that 10 g (16.79 mmol) of Intermediate 4-4 was used instead of Intermediate 1-4 of Synthesis Example 7.

Synthesis of Intermediate 4-6

10 g (17.77 mmol) of Intermediate 4-5, 10.06 g (35.55 mmol) of 2-bromoiodobenzene, 1.69 g (8.89 mmol) of copper iodide, and 4.91 g (35.55 mmol) of potassium carbonate were dissolved in xylene under a nitrogen atmosphere, and the mixed solution was stirred under reflux. After 12 hours, the reaction solution was cooled to room temperature, and subjected to extraction using MC after adding distilled water thereto. The resultant product obtained therefrom was dried using magnesium sulfate, and the residues obtained by evaporating the solvent were column-separated, so as to obtain 5.11 g (7.11 mmol, yield: 40%) of Intermediate 4-6.

Synthesis of Compound 17

10 g (13.91 mmol) of Intermediate 4-6 was dissolved in 100 ml of THF, and 5.56 ml (13.91 mmol, 2.5M in hexane) of n-buLi was slowly added thereto at a temperature of −78° C. After 2 hours of stirring, 1.05 ml (18.09 mmol) of acetone was added to the mixed solution. The mixed solution was slowly heated to room temperature, and subjected to extraction using MC after adding $NaHCO_3$ aqueous solution thereto. The resultant product obtained therefrom was dried using magnesium sulfate, and the residues obtained by evaporating the solvent were put in a two-neck flask and mixed with 100 ml of acetic acid. An HCl aqueous solution having the same amount as the catalyst (5 mol %, 12N) was added to the mixed solution, and then, stirred under reflux. After 12 hours, the reaction solution was cooled to room temperature, and subjected to extraction using MC after adding distilled water thereto. The resultant product obtained therefrom was dried using magnesium sulfate, and the residues obtained by evaporating the solvent were column-separated, so as to obtain 5.68 g (8.35 mmol, yield: 60%) of Compound 17.

MS: m/z 679.27 $[M]^+$ $^1H$ NMR ($CDCl_3$) δ 7.55 (2H), 7.50 (2H), 7.48 (4H), 7.40 (1H), 7.37 (1H), 7.32 (4H), 7.30 (2H), 7.22 (2H), 7.20 (2H), 7.10 (2H), 7.08 (1H), 7.00 (2H), 6.95 (1H), 6.92 (1H), 1.67 (6H)

Synthesis Example 11: Synthesis of Compound 23

Compound 23 was synthesized according to Reaction Scheme 7 below:

<Reaction Scheme 7>

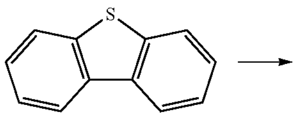

Intermediate 10-1

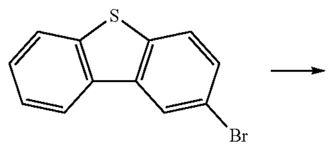

Intermediate 10-2

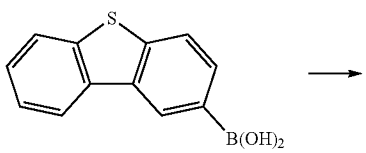

Intermediate 10-3

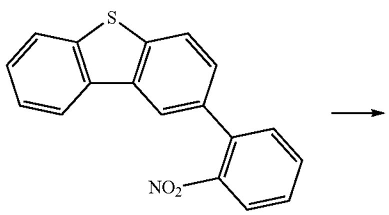

Intermediate 10-4

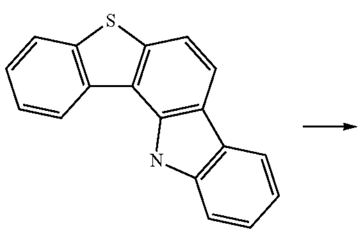

Intermediate 10-5

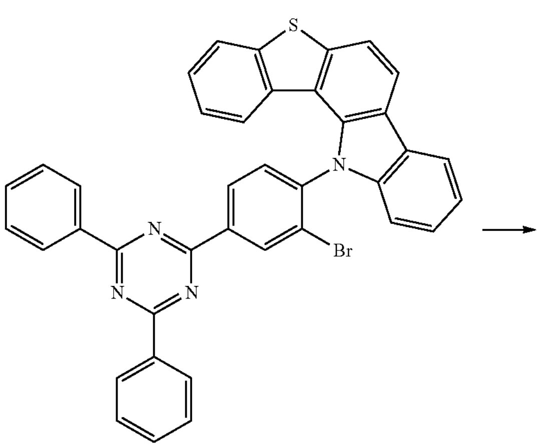

Intermediate 10-6

-continued

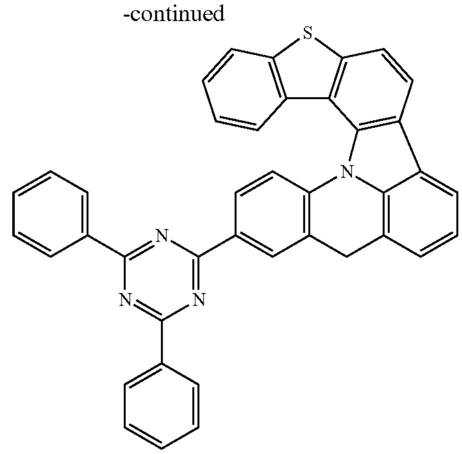

Compound 23

Synthesis of Intermediate 10-2

Intermediate 10-2 was obtained in the same manner as in synthesizing Intermediate 1-2 of Synthesis Example 7, except that Intermediate 10-1 was used instead of Intermediate 1-1 of Synthesis Example 7.

Synthesis of Intermediate 10-3

Intermediate 10-3 was obtained in the same manner as in synthesizing Intermediate 1-3 of Synthesis Example 7, except that Intermediate 10-2 was used instead of Intermediate 1-2 of Synthesis Example 7.

Synthesis of Intermediate 10-4

Intermediate 10-4 was obtained in the same manner as in synthesizing Intermediate 1-4 of Synthesis Example 7, except that Intermediate 10-3 was used instead of Intermediate 1-3 of Synthesis Example 7.

Synthesis of Intermediate 10-5

Intermediate 10-5 was obtained in the same manner as in synthesizing Intermediate 1-5 of Synthesis Example 7, except that Intermediate 10-4 was used instead of Intermediate 1-4 of Synthesis Example 7.

Synthesis of Intermediate 10-6

Intermediate 10-6 was obtained in the same manner as in synthesizing Intermediate 1-6 of Synthesis Example 7, except that Intermediate 10-5 and 2-(4-bromo-3-iodo-phenyl)-4,6-diphenyl-triazine were used instead of Intermediate 1-5 of Synthesis Example 7 and 2-bromoiodobenzene, respectively.

Synthesis of Compound 23

Compound 23 (yield: 52%) was obtained in the same manner as in synthesizing Compound 14 of Synthesis Example 7, except that Intermediate 10-6 was used instead of Intermediate 1-6 of Synthesis Example 7.

MS: m/z 620.20 [M]+

$^{1}$H NMR ($CDCl_3$) δ 7.86 (2H), 7.78 (1H), 7.48 (4H), 7.37 (1H), 7.33 (1H), 7.32 (4H), 7.30 (2H), 7.22 (2H), 7.20 (1H), 6.95 (1H), 6.92 (1H), 1.67 (6H)

Synthesis Example 12: Synthesis of Compound 24

Compound 24 (yield: 54%) was obtained in the same manner as in Synthesis Example 11, except that Intermediate 11-1 below was used instead of Intermediate 10-1 of Synthesis Example 7.

Intermediate 11-1

<Intermediate 11-1>

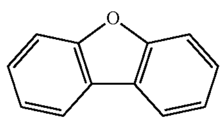

MS: m/z 604.23 [M]+

$^{1}$H NMR ($CDCl_3$) δ 7.49 (1H), 7.48 (4H), 7.42 (2H), 7.37 (1H), 7.32 (4H), 7.30 (2H), 7.22 (2H), 7.20 (1H), 7.19 (2H), 7.13 (1H), 6.95 (1H), 6.92 (1H), 1.67 (6H)

Synthesis Example 13: Synthesis of Compound 27

Compound 27 was synthesized according to Reaction Scheme 13 below:

<Reaction Scheme 13>

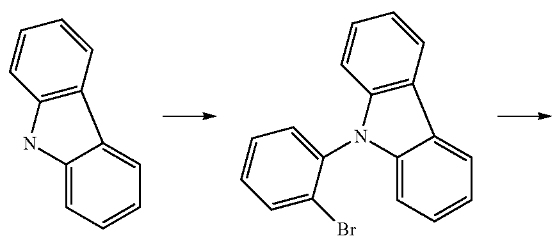

Intermediate 13-1

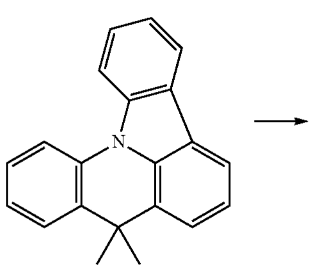

Intermediate 13-2

-continued

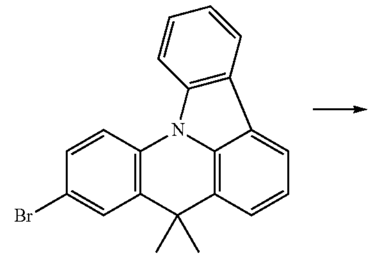

Intermediate 13-3

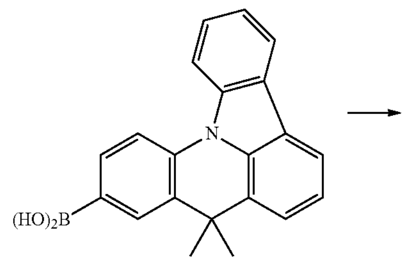

Intermediate 13-4

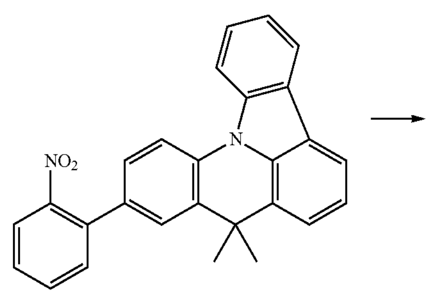

Intermediate 13-5

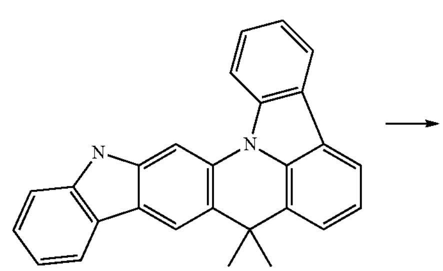

Intermediate 13-6

-continued

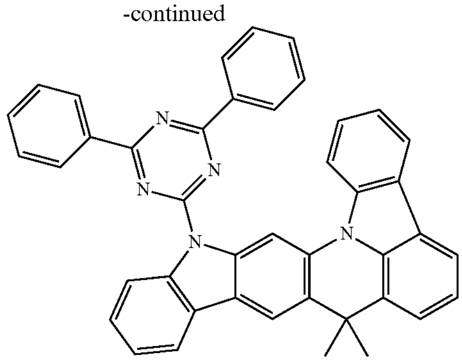

Compound 27

Synthesis of Intermediate 13-2

Intermediate 13-2 was obtained in the same manner as in synthesizing Intermediate 1-2 of Synthesis Example 1, except that Intermediate 13-1 was used instead of Intermediate 1-1 of Synthesis Example 1.

Synthesis of Intermediate 13-3

Intermediate 13-3 was obtained in the same manner as in synthesizing Intermediate 1-3 of Synthesis Example 1, except that Intermediate 13-2 was used instead of Intermediate 1-2 of Synthesis Example 1.

Synthesis of Intermediate 13-4

Intermediate 13-4 was obtained in the same manner as in synthesizing Intermediate 1-4 of Synthesis Example 1, except that Intermediate 13-3 was used instead of Intermediate 1-3 of Synthesis Example 1.

Synthesis of Intermediate 13-5

Intermediate 13-5 was obtained in the same manner as in synthesizing Intermediate 1-5 of Synthesis Example 1, except that Intermediate 13-4 was used instead of Intermediate 1-4 of Synthesis Example 1.

Synthesis of Intermediate 13-6

Intermediate 13-6 was obtained in the same manner as in synthesizing Intermediate 1-6 of Synthesis Example 1, except that Intermediate 13-5 was used instead of Intermediate 1-5 of Synthesis Example 1.

Synthesis of Compound 27

Compound 27 (yield: 48%) was obtained in the same manner as in synthesizing Compound 1 of Synthesis Example 1, except that Intermediate 13-6 was used instead of Intermediate 1-6 of Synthesis Example 1.

MS: m/z 603.24 $[M]^+$ $^1H$ NMR ($CDCl_3$) δ 8.96 (1H), 8.45 (1H), 8.36 (4H), 8.19 (2H), 7.58 (2H), 7.51 (1H), 7.50 (8H), 7.24 (1H), 7.20 (2H), 6.98 (1H), 1.69 (6H)

Example 1

A 15 $\Omega/cm^2$ (1.200 Å) ITO glass substrate (manufactured by Corning) was cut into a size of 50 mm×50 mm×0.7 mm and ultrasonically washed out with isopropyl alcohol and pure water, each for 10 minutes. The ITO glass substrate was irradiated by UV for 30 minutes, cleaned by exposing to ozone, and then, transported to a vacuum evaporator.

2-TNATA was vacuum deposited on the ITO anode to form an HIL having a thickness of 600 Å. NPB was vacuum deposited on the HIL to form an HTL having a thickness of 200 Å. Then, Compound 1 and Compound 52 as host 1 and host 2 (at a weight ratio of 1:1) and PD1 as a dopant (8 wt %) were co-deposited on the HTL to form an emission layer having a thickness of 300 Å.

ET1 was vacuum deposited on the emission layer to form an ETL having a thickness of 200 Å, and ET-D1 was deposited on the ETL to form an EIL having a thickness of 10 Å. Then, Al was deposited on the EIL to form a cathode having a thickness of 1,000 Å, thereby manufacturing an organic light-emitting device.

Example 2

An organic light-emitting device was manufactured in the same manner as in Example 1, except that in forming the emission layer, Compound 2 was used instead of Compound 1 as a host.

Example 3

An organic light-emitting device was manufactured in the same manner as in Example 1, except that in forming the emission layer, Compound 3 was used instead of Compound 1 as a host.

Example 4

An organic light-emitting device was manufactured in the same manner as in Example 1, except that in forming the emission layer, Compound 4 was used instead of Compound 1 as a host.

Example 5

An organic light-emitting device was manufactured in the same manner as in Example 1, except that in forming the emission layer, Compound 10 was used instead of Compound 1 as a host.

Example 6

An organic light-emitting device was manufactured in the same manner as in Example 1, except that in forming the emission layer, Compound 11 was used instead of Compound 1 as a host.

Example 7

An organic light-emitting device was manufactured in the same manner as in Example 1, except that in forming the emission layer, Compound 53 was used instead of Compound 52 as a host.

Example 8

An organic light-emitting device was manufactured in the same manner as in Example 2, except that in forming the emission layer, Compound 53 was used instead of Compound 52 as a host.

Example 9

An organic light-emitting device was manufactured in the same manner as in Example 3 except that in forming the emission layer, Compound 53 was used instead of Compound 52 as a host.

Example 10

An organic light-emitting device was manufactured in the same manner as in Example 4, except that in forming the emission layer, Compound 53 was used instead of Compound 52 as a host.

Example 11

An organic light-emitting device was manufactured in the same manner as in Example 5, except that in forming the emission layer, Compound 53 was used instead of Compound 52 as a host.

Example 12

An organic light-emitting device was manufactured in the same manner as in Example 6, except that in forming the emission layer, Compound 53 was used instead of Compound 52 as a host.

Example 13

An organic light-emitting device was manufactured in the same manner as in Example 1, except that in forming the emission layer, Compound 14 was used instead of Compound 1 as a host.

Example 14

An organic light-emitting device was manufactured in the same manner as in Example 1, except that in forming the emission layer, Compound 15 was used instead of Compound 1 as a host.

Example 15

An organic light-emitting device was manufactured in the same manner as in Example 1, except that in forming the emission layer, Compound 16 was used instead of Compound 1 as a host.

Example 16

An organic light-emitting device was manufactured in the same manner as in Example 1, except that in forming the emission layer, Compound 17 was used instead of Compound 1 as a host.

Example 17

An organic light-emitting device was manufactured in the same manner as in Example 1, except that in forming the emission layer, Compound 23 was used instead of Compound 1 as a host.

Example 18

An organic light-emitting device was manufactured in the same manner as in Example 1, except that in forming the emission layer, Compound 24 was used instead of Compound 1 as a host.

Example 19

An organic light-emitting device was manufactured in the same manner as in Example 13, except that in forming the emission layer, Compound 53 was used instead of Compound 52 as a host.

Example 20

An organic light-emitting device was manufactured in the same manner as in Example 14, except that in forming the emission layer, Compound 53 was used instead of Compound 52 as a host.

Example 21

An organic light-emitting device was manufactured in the same manner as in Example 15, except that in forming the emission layer, Compound 53 was used instead of Compound 52 as a host.

Example 22

An organic light-emitting device was manufactured in the same manner as in Example 16, except that in forming the emission layer, Compound 53 was used instead of Compound 52 as a host.

Example 23

An organic light-emitting device was manufactured in the same manner as in Example 17, except that in forming the emission layer, Compound 53 was used instead of Compound 52 as a host.

Example 24

An organic light-emitting device was manufactured in the same manner as in Example 18, except that in forming the emission layer, Compound 53 was used instead of Compound 52 as a host.

Example 25

An organic light-emitting device was manufactured in the same manner as in Example 1, except that in forming the emission layer, Compound 27 was used instead of Compound 1 as a host.

Example 26

An organic light-emitting device was manufactured in the same manner as in Example 25, except that in forming the emission layer, Compound 53 was used instead of Compound 52 as a host.

Comparative Example 1

An organic light-emitting device was manufactured in the same manner as in Example 1, except that in forming the emission layer, only CPB was used instead of Compound 1 and Compound 52 as host 1 and host 2.

Comparative Example 2

An organic light-emitting device was manufactured in the same manner as in Example 1, except that in forming the emission layer, CPB was used instead of Compound 52 as a host.

Comparative Example 3

An organic light-emitting device was manufactured in the same manner as in Example 15, except that in forming the emission layer, CPB was used instead of Compound 52 as a host.

Comparative Example 4

An organic light-emitting device was manufactured in the same manner as in Example 1, except that in forming the emission layer, Compound A below was used instead of Compound 1 as a host.

<Compound A>

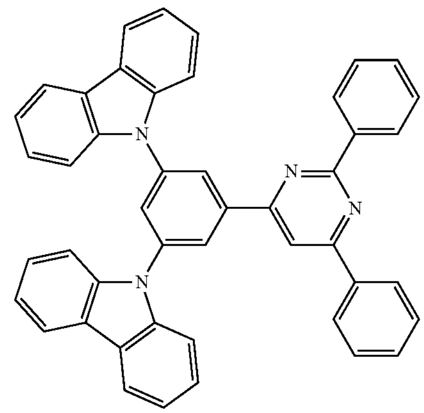

Evaluation Example 1

Driving voltages, efficiencies, and color coordinates of the organic light-emitting devices of Examples 1 to 24 and Comparative Examples 1 to 4 were evaluated by supplying power with a voltage and current meter (Keithley Source-Measure Unit (SMU) 236) and using a luminance meter (PR650 Spectroscan, available from Photo Research, Inc.). The results are shown in Table 1. Lifetime T95 was measured as the time (hour) taken until a measured initial luminance (assumed as 100% @10 mA/cm$^2$) is reduced to 95%.

TABLE 1

| | Emission layer | | Driving voltage | Efficiency | Color coordinates | | Lifespan ($T_{95}$) |
|---|---|---|---|---|---|---|---|
| | Host 1 | Host 2 | (V) | (cd/A) | CIEx | CIEy | (hr) |
| Example 1 | Compound 1 | Compound 52 | 4.6 | 27.3 | 0.314 | 0.603 | 210 |
| Example 2 | Compound 2 | Compound 52 | 4.7 | 29.8 | 0.312 | 0.604 | 270 |
| Example 3 | Compound 3 | Compound 52 | 4.2 | 29.0 | 0.312 | 0.605 | 240 |
| Example 4 | Compound 4 | Compound 52 | 4.5 | 26.5 | 0.312 | 0.605 | 210 |
| Example 5 | Compound 10 | Compound 52 | 4.8 | 27.3 | 0.314 | 0.601 | 210 |
| Example 6 | Compound 11 | Compound 52 | 4.6 | 25.9 | 0.313 | 0.605 | 210 |
| Example 7 | Compound 1 | Compound 53 | 4.6 | 27.2 | 0.314 | 0.603 | 220 |
| Example 8 | Compound 2 | Compound 53 | 4.7 | 29.2 | 0.311 | 0.607 | 250 |
| Example 9 | Compound 3 | Compound 53 | 4.3 | 29.5 | 0.312 | 0.605 | 260 |
| Example 10 | Compound 4 | Compound 53 | 4.6 | 28.2 | 0.311 | 0.607 | 240 |
| Example 11 | Compound 10 | Compound 53 | 4.8 | 26.8 | 0.312 | 0.605 | 220 |
| Example 12 | Compound 11 | Compound 53 | 4.7 | 27.0 | 0.312 | 0.608 | 200 |
| Example 13 | Compound 14 | Compound 52 | 4.5 | 26.5 | 0.310 | 0.605 | 200 |
| Example 14 | Compound 15 | Compound 52 | 4.7 | 29.4 | 0.312 | 0.604 | 250 |
| Example 15 | Compound 16 | Compound 52 | 4.1 | 28.4 | 0.312 | 0.605 | 260 |
| Example 16 | Compound 17 | Compound 52 | 4.5 | 27.5 | 0.313 | 0.605 | 210 |
| Example 17 | Compound 23 | Compound 52 | 4.7 | 26.9 | 0.314 | 0.606 | 190 |
| Example 18 | Compound 24 | Compound 52 | 4.6 | 26.8 | 0.312 | 0.605 | 210 |
| Example 19 | Compound 14 | Compound 53 | 4.5 | 27.7 | 0.314 | 0.605 | 210 |
| Example 20 | Compound 15 | Compound 53 | 4.7 | 28.7 | 0.312 | 0.607 | 250 |
| Example 21 | Compound 16 | Compound 53 | 4.2 | 29.4 | 0.312 | 0.605 | 270 |
| Example 22 | Compound 17 | Compound 53 | 4.6 | 28.9 | 0.311 | 0.603 | 240 |
| Example 23 | Compound 23 | Compound 53 | 4.7 | 27.8 | 0.312 | 0.605 | 220 |
| Example 24 | Compound 24 | Compound 53 | 4.7 | 27.5 | 0.312 | 0.608 | 210 |
| Example 25 | Compound 27 | Compound 52 | 4.7 | 26.5 | 0.312 | 0.607 | 180 |
| Example 26 | Compound 27 | Compound 53 | 4.6 | 27.3 | 0.311 | 0.605 | 190 |
| Comparative Example 1 | CBP | | 5.5 | 25.2 | 0.312 | 0.605 | 80 |
| Comparative Example 2 | Compound 1 | CBP | 4.9 | 24.8 | 0.311 | 0.604 | 70 |
| Comparative Example 3 | Compound 16 | CBP | 5.0 | 25.7 | 0.310 | 0.607 | 80 |

TABLE 1-continued

| | Emission layer | | Driving voltage | Efficiency | Color coordinates | | Lifespan ($T_{95}$) |
|---|---|---|---|---|---|---|---|
| | Host 1 | Host 2 | (V) | (cd/A) | CIEx | CIEy | (hr) |
| Comparative Example 4 | Compound A | Compound 52 | 4.8 | 24.2 | 0.314 | 0.604 | 100 |

Referring to Table 1, it was confirmed that the organic light-emitting devices of Examples 1 to 26 had excellent driving voltage, luminance, efficiency, and lifespan ($T_{95}$) characteristics compared with those of the organic light-emitting devices of Comparative Examples 1 to 4.

As described above, according to the one or more of the above exemplary embodiments, an organic light-emitting device may have high efficiency and long life span characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising a first electrode;

a second electrode facing the first electrode; and an organic layer between the first electrode and the second electrode, the organic layer including an emission layer, wherein the organic layer includes a first compound represented by one of Formulae 1-1 to 1-3 below and a second compound represented by Formula 2 below:

<Formula 1-1>

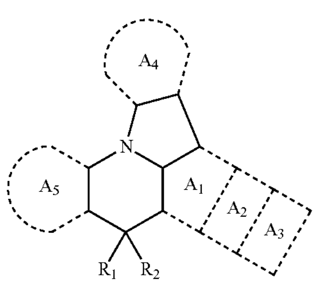

<Formula 1-2>

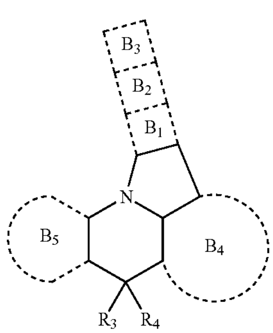

-continued

<Formula 1-3>

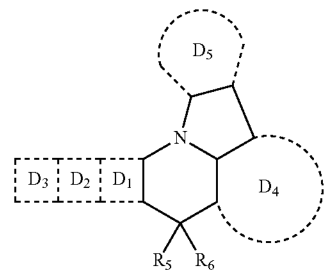

<Formula 2>

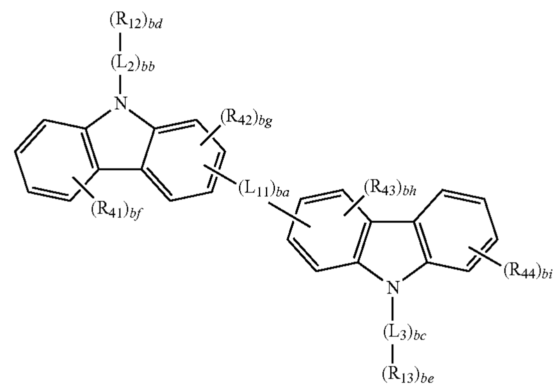

wherein in Formulae 1-1 to 1-3 and 2, ring $A_1$, ring $A_2$, and ring $A_3$ are condensed together, ring $B_1$, ring $B_2$, and ring $B_3$ are condensed together, and ring $D_1$, ring $D_2$, and ring $D_3$ are condensed together, ring $A_2$, ring $B_2$, and ring $C_2$ are each independently represented by the following Formula 3:

<Formula 3>

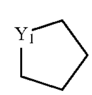

in Formula 3, $Y_1$ is O, S, or N-$(L_1)_{aa}$-$(R_{11})_{ab}$, ring $A_1$, rings $A_3$, to $A_5$, ring $B_1$, rings $B_3$ to $B_5$, ring $D_1$, and rings $D_3$ to $D_5$ are each independently a substituted or unsubstituted benzene ring or a substituted or unsubstituted naphthalene ring, $R_1$ to $R_6$ are each independently selected from the group consisting of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein each of $R_1$ and $R_2$, $R_3$ and $R_4$, and $R_5$ and $R_6$ is a non-ring forming substituent which are not linked to each other and do not form a ring, $L_1$ to $L_3$ and $L_{11}$ are each independently selected from the group consisting of a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, aa and ba to be are each independently 0, 1, 2, or 3, and, when aa and ba to be are 0, *-$(L_1)_{aa}$-', *-$(L_{11})_{ba}$-*', *-$(L_2)_{bb}$-*', and *-$(L_3)_{bc}$-*' represent a single bond, and when aa and ba to be are 2 or more, 2 or more $L_1$s, 2 or more $L_{11}$s, 2 or more $L_e$s, and 2 or more $L_a$s are identical to or different from each other, $R_{11}$ to $R_{13}$ and $R_{41}$ to $R_{44}$ are each independently selected from the group consisting of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$B(Q_4)(Q_5)$, and $N(Q_6)(Q_7)$, ab, bd and be are each independently 1, 2, or 3, and when ab, bd, and be are 2 or more, 2 or more $R_{11}$s, 2 or more $R_{12}$s, and 2 or more $R_{13}$s are identical to or different from each other, bf and bi are each independently 0, 1, 2, 3, or 4, and when bf and bi are 2 or more, 2 or more $R_{41}$s and 2 or more $R_{44}$s are identical to or different from each other, respectively, bg and bh are each independently selected from 0, 1, 2, or 3, and when bg and bh are 2 or more, 2 or more $R_{42}$s and 2 or more $R_{43}$s are identical to or different from each other, respectively, at least one of substituents of the substituted benzene ring, the substituted naphthalene ring, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from the group consisting of:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, $C_6$-$C_{60}$ arylthio group, $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$B(Q_{14})(Q_{15})$, and —$N(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —B($Q_{24}$)($Q_{25}$), and —N($Q_{26}$)($Q_{27}$); and —Si($Q_{31}$)($Q_{32}$)($Q_{33}$), —B($Q_{34}$)($Q_{35}$), and —N($Q_{36}$)($Q_{37}$), and $Q_1$ to $Q_7$, $Q_{11}$ to $Q_{17}$, $Q_{21}$ to $Q_{27}$, and $Q_{31}$ to $Q_{37}$ are each independently selected from the group consisting of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device as claimed in claim 1, wherein the first compound is represented by one of Formulae 1-1(A), 1-1(B), 1-2(A), 1-2(B), 1-3(A), and 1-3(B) below:

<Formula 1-1(A)>

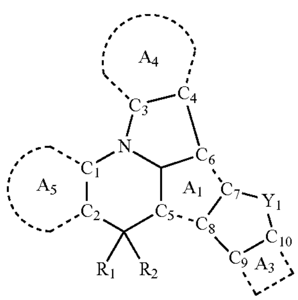

<Formula 1-1(B)>

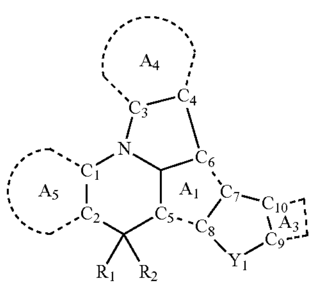

-continued

<Formula 1-2(A)>

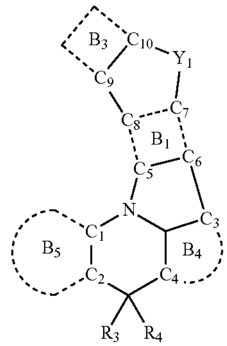

<Formula 1-2(B)>

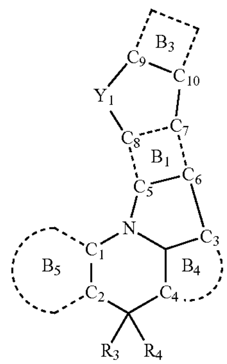

<Formula 1-3(A)>

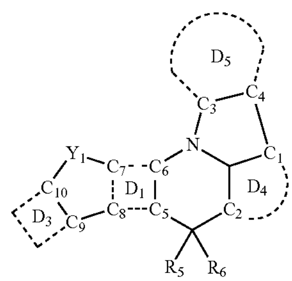

<Formula 1-3(B)>

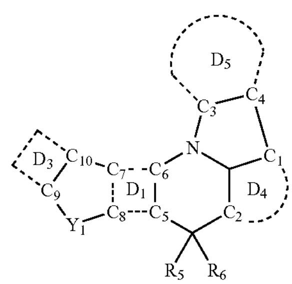

wherein in Formulae 1-1(A), 1-1(B), 1-2(A), 1-2(B), 1-3(A), and 1-3(B), $C_1$ to $C_{10}$ are each independently numbered to indicate chemically distinct carbon atoms, $Y_1$ is defined the same as $Y_1$ of Formula 3;

ring $A_1$ is represented by one of Formulae 5-1(1) and 5-1(2) below, ring $B_1$ is represented by one of Formulae 5-2(1) to 5-2(5) below, ring $D_1$ is represented by one of Formulae 5-3(1) to 5-3(5) below, ring $A_3$ is represented by one of Formulae 6-1(1) to 6-1(4) below, ring $B_3$ is represented by one of Formulae 6-2(1) to 6-2(4) below, ring $D_3$ is represented by one of Formulae 6-3(1) to 6-3(4) below, ring $A_4$ is represented by one of Formulae 7-1(1) to 7-1(4) below, ring $B_4$ is represented by one of Formulae 7-2(1) to 7-2(3) below, ring $D_4$ is represented by one of Formulae 7-3(1) to 7-3(3) below, rings $A_5$ and $B_5$ are each independently represented by one of Formulae 8-1(1) to 8-1(4) below, and ring $D_5$ is represented by one of Formulae 8-3(1) to 8-3(4) below, <Formula 5-1(1)>

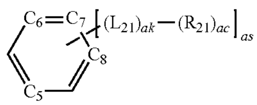

<Formula 5-1(2)>

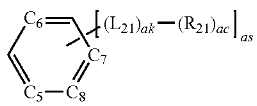

<Formula 5-2(1)>

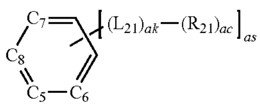

<Formula 5-2(2)>

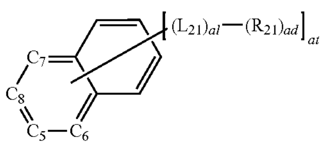

<Formula 5-2(3)>

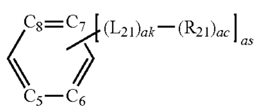

<Formula 5-2(4)>

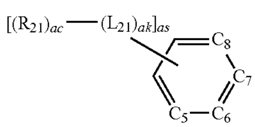

<Formula 5-2(5)>

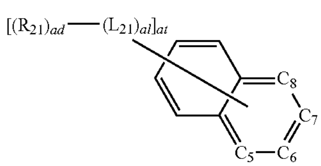

<Formula 5-3(1)>

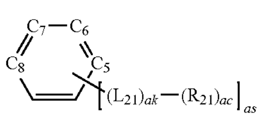

<Formula 5-3(2)>

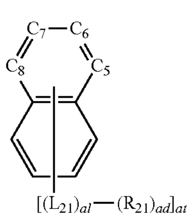

-continued

<Formula 5-3(3)>

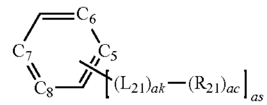

<Formula 5-3(4)>

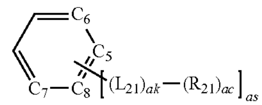

<Formula 5-3(5)>

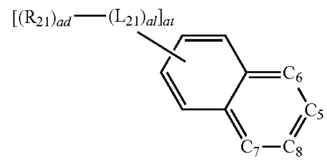

<Formula 6-1(1)>

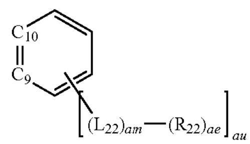

<Formula 6-1(2)>

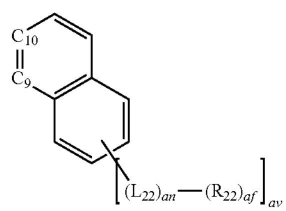

<Formula 6-1(3)>

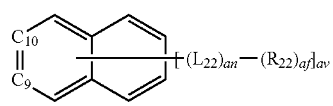

<Formula 6-1(4)>

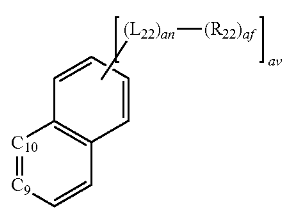

<Formula 6-2(1)>

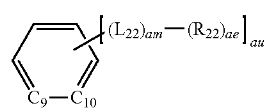

<Formula 6-2(2)>

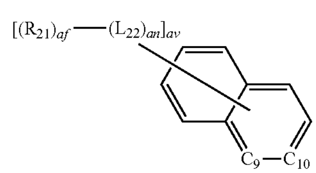

<Formula 6-2(3)>

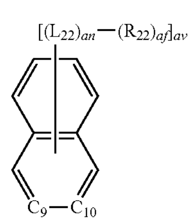

<Formula 6-2(4)>
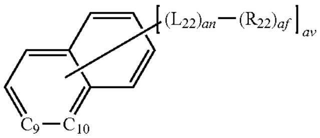
<Formula 6-3(1)>
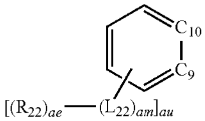
<Formula 6-3(2)>
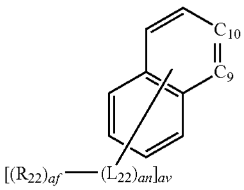
<Formula 6-3(3)>
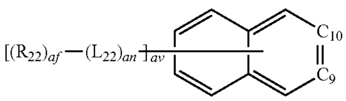
<Formula 6-3(4)>
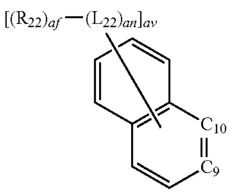
<Formula 7-1(1)>
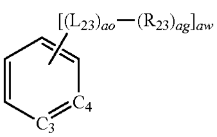
<Formula 7-1(2)>
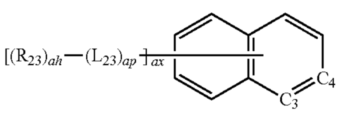
<Formula 7-1(3)>
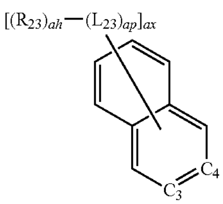
<Formula 7-1(4)>
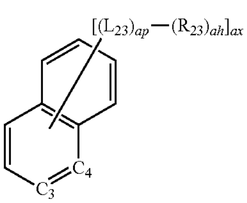
<Formula 7-2(1)>
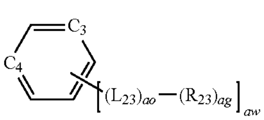
<Formula 7-2(2)>
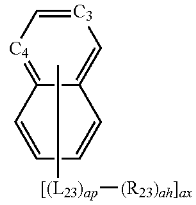
<Formula 7-2(3)>
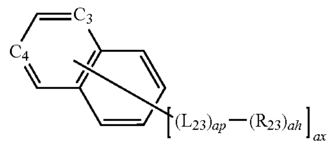
<Formula 7-3(1)>
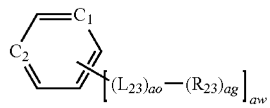
<Formula 7-3(2)>
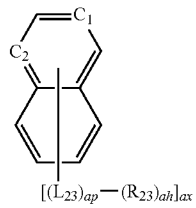
<Formula 7-3(3)>
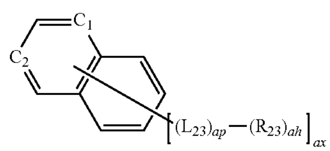
<Formula 8-1(1)>
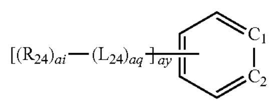
<Formula 8-1(2)>
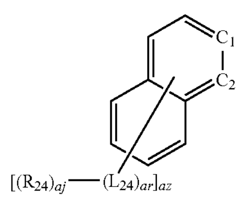
<Formula 8-1(3)>
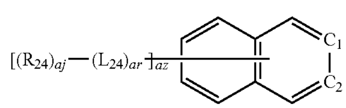
<Formula 8-1(4)>
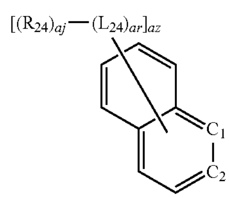
<Formula 8-3(1)>
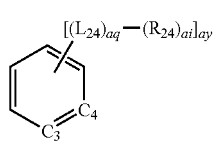

-continued

<Formula 8-3(2)>

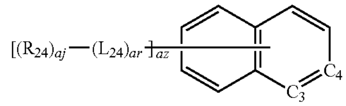

<Formula 8-3(3)>

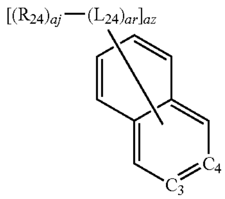

<Formula 8-3(4)>

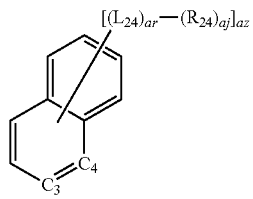

wherein in Formulae 5-1(1) and 5-1(2), 5-2(1) to 5-2(5), 5-3(1) to 5-3(5), 6-1(1) to 6-1(4), 6-2(1) to 6-2(4), 6-3(1) to 6-3(4), 7-1(1) to 7-1(4), 7-2(1) to 7-2(3), 7-3(1) to 7-3(3), 8-1(1) to 8-1(4), and 8-3(1) to 8-3(4), descriptions of $L_{21}$ to $L_{24}$ are understood by referring to the descriptions with respect to $L_1$, ak to ar are each independently 0, 1, 2, or 3, $R_{21}$ to $R_{24}$ are each independently selected from the group consisting of:

a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_4$)($Q_5$), and N($Q_6$)($Q_7$), ac to aj are each independently 0, 1, 2, or 3, and when ac, ad, ae, af, ag, ai, ah, ai, and aj are 2 or more, 2 or more $R_{21}$s, 2 or more $R_{21}$s, 2 or more $R_{22}$s, 2 or more $R_{22}$s, 2 or more $R_{23}$s, 2 or more $R_{24}$s, 2 or more $R_{23}$s, 2 or more $R_{24}$s, and 2 or more $R_{24}$s are identical to or different from each other, respectively, as is selected from 0, 1, or 2, and when as is 2, 2 *-[$(L_{21})_{ak}$-$(R_{21})_{ac}$]s are be identical to or different from each other, at, au, aw, and ay are each independently 0, 1, 2, 3, or 4, and when at, au, aw, and ay are 2 or more, 2 or more *-[$(L_{21})_{ak}$-$(R_{21})_{ac}$]s, 2 or more *-[$(L_{22})_{am}$-$(R_{22})_{ae}$]s, 2 or more *-[$(L_{23})_{ao}$-$(R_{23})_{ag}$]s, and 2 or more *-[$(L_{24})_{aq}$-$(R_{24})_{ai}$]s are be identical to or different from each other, respectively, av, ax, and az are each independently 0, 1, 2, 3, 4, 5, or 6, and when av, ax, and az are 2 or more, 2 or more *-[$(L_{22})_{an}$-$(R_{22})_{af}$]s, 2 or more *-[$(L_{23})_{ap}$-$(R_{23})_{af}$]s, and 2 or more*-[$(L_{24})_{ar}$-$(R_{24})_{aj}$]s are be identical to or different from each other, respectively, and descriptions of substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group, and $Q_1$ to $Q_7$ are understood the same by referring to the descriptions as claimed in claim 1.

3. The organic light-emitting device as claimed in claim 2, wherein the first compound is represented by Formulae 1-1(A), 1-2(A), or 1-3(A), and in Formulae 1-1 (A), 1-2(A), and 1-3(A), ring $A_1$ is represented by one of Formulae 5-1(1) and 5-1(2), ring $B_1$ is represented by one of Formulae 5-2(1) to 5-2(3), ring $D_1$ is represented by one of Formulae 5-3(1) to 5-3(3), ring $A_3$ is represented by one of Formulae 6-1 (1) and 6-1 (2), ring $B_3$ is represented by one of Formulae 6-2(1) and 6-2(2), ring $D_3$ is represented by one of Formulae 6-3(1) to 6-3(4), ring $A_4$ is represented by one of Formulae 7-1(1) and 7-1(3), ring $B_4$ is represented by one of Formulae 7-2(1) and 7-2(3), ring $D_4$ is represented by one of Formulae 7-3 (1) and 7-3(2), ring $A_5$ is represented by one of Formulae 8-1(1) and 8-1(3), ring $B_5$ is represented by one of Formulae 8-2(1) to 8-2(3), and ring $D_5$ is represented by one of Formulae 8-3(1) and 8-3(4).

4. The organic light-emitting device as claimed in claim 1, wherein in Formulae 1-1 to 1-3, $R_1$ to $R_6$ are each independently selected from the group consisting of:

a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a$C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, and a naphthyl group;

a phenyl group, a naphthyl group, a fluorenyl group, a phenanthrenyl group, an anthracenyl group, a fluoranthenyl group, a triphenylenyl group, a pyrenyl group, and a chrysenyl group; and a phenyl group, a naphthyl group, a fluorenyl group, a phenanthrenyl group, an anthracenyl group, a fluoranthenyl group, a triphenylenyl group, a pyrenyl group, and a chrysenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a phenanthrenyl group, an anthracenyl group, a fluoranthenyl group, a triphenylenyl group, a pyrenyl group, and a chrysenyl group.

5. The organic light-emitting device as claimed in claim 1, wherein $L_1$ to $L_3$ and $L_{11}$ are each independently selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

6. The organic light-emitting device as claimed in claim 1, wherein $L_1$ to $L_3$ and $L_{11}$ are each independently selected from the group consisting of:

a phenylene group, a naphthylene group, a fluorenylene group, a phenanthrenylene group, an anthracenylene group, a triphenylenylene group, a pyrenylene group, and a chrysenylene group; and a phenylene group, a naphthylene group, a fluorenylene group, a phenanthrenylene group, an anthracenylene group, a triphenylenylene group, a pyrenylene group, and a chrysenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{20}$ alkoxy group, a phenyl group, a naphthyl group, a fluorenyl group, a phenanthrenyl group, an anthracenyl group, a triphenylenyl group, a pyrenyl group, and a chrysenyl group.

7. The organic light-emitting device as claimed in claim 1, wherein:

$L_1$ to $L_3$ are each independently represented by one of Formulae 5-1 to 5-16 below, and aa, bb, and be are each independently 0 or 1, and ba is 0:

Formula 5-1

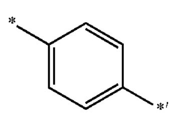

Formula 5-2

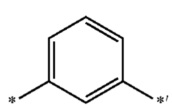

Formula 5-3

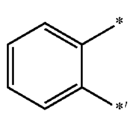

Formula 5-4

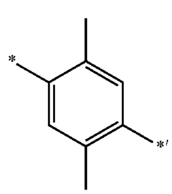

Formula 5-5

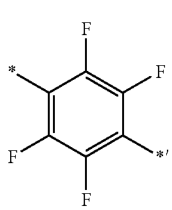

-continued

Formula 5-6

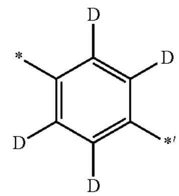

Formula 5-7

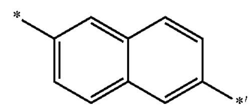

Formula 5-8

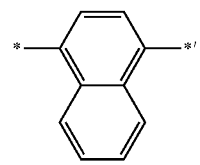

Formula 5-9

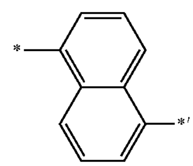

Formula 5-10

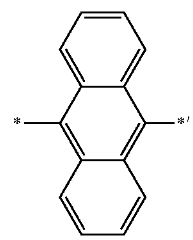

Formula 5-11

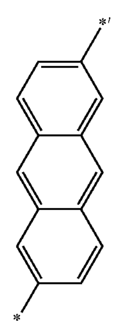

Formula 5-12

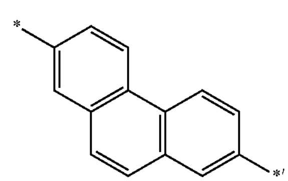

Formula 5-13

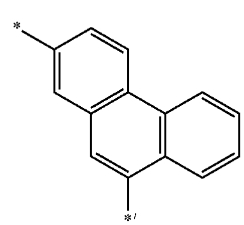

-continued

Formula 5-14

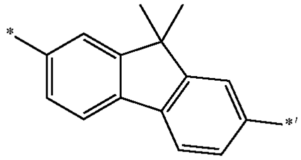

Formula 5-15

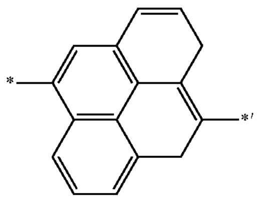

Formula 5-16

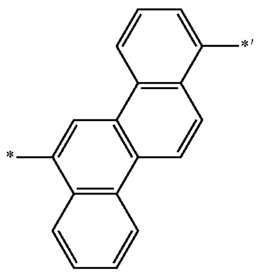

wherein in Formulae 5-1 to 5-16, * and *' indicate a binding site to a neighboring atom.

8. The organic light-emitting device as claimed in claim 2, wherein:

$R_{11}$ and $R_{21}$ to $R_{24}$ are each independently selected from the group consisting of a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a benzoquinoxalinyl group, a quinazolinyl group, a benzoquinazolinyl group, a phenanthrolinyl group, a benzoimidazolyl group, an isobenzothiazolyl group, a benzoxazolyl group, an isobenzoxazolyl group, a triazolyl group, an oxadiazolyl group, a triazinyl group, a thiadiazolyl group, an imidazopyridinyl group, and an imidazopyrimidinyl group; and a pyrrolyl group, an indolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a benzoquinoxalinyl group, a quinazolinyl group, a benzoquinazolinyl group, a phenanthrolinyl group, a benzoimidazolyl group, an isobenzothiazolyl group, a benzoxazolyl group, an isobenzoxazolyl group, a triazolyl group, an oxadiazolyl group, a triazinyl group, a thiadiazolyl group, an imidazopyridinyl group, and an imidazopyrimidinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, phenanthridinyl, acridinyl, phenanthrolinyl, phenazinyl, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group.

9. The organic light-emitting device as claimed in claim 2, wherein:

$R_{11}$ and $R_{21}$ to $R_{24}$ are each independently selected from groups represented by Formulae 7-1 to 7-44 below:

Formula 7-1

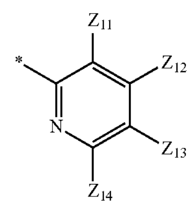

Formula 7-2

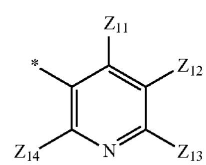

Formula 7-3

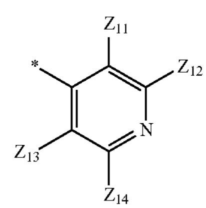

Formula 7-4

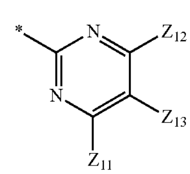

-continued
Formula 7-5
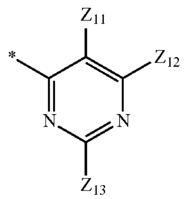
Formula 7-6
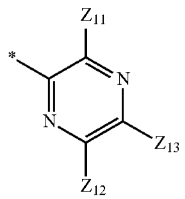
Formula 7-7
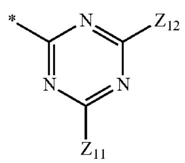
Formula 7-8
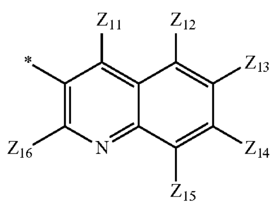
Formula 7-9
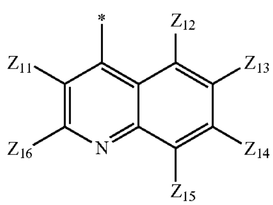
Formula 7-10
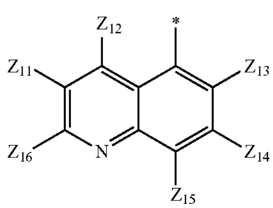
Formula 7-11
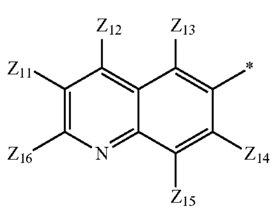
Formula 7-12
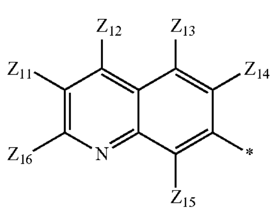
-continued
Formula 7-13
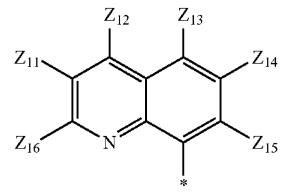
Formula 7-14
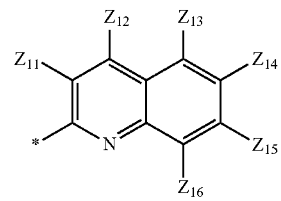
Formula 7-15
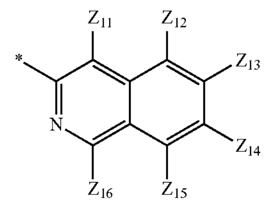
Formula 7-16
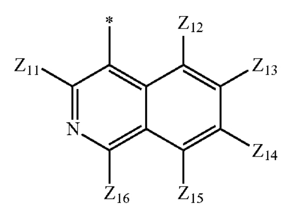
Formula 7-17
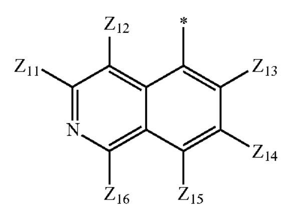
Formula 7-18
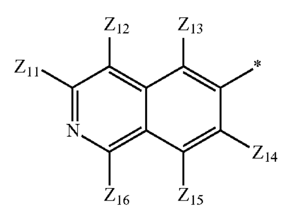
Formula 7-19
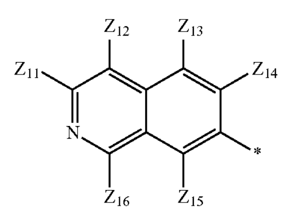

-continued
Formula 7-20
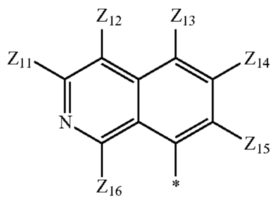
Formula 7-21
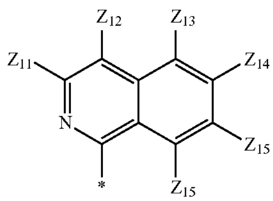
Formula 7-22
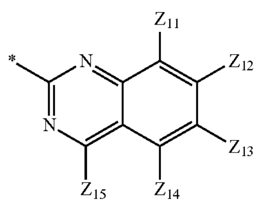
Formula 7-23
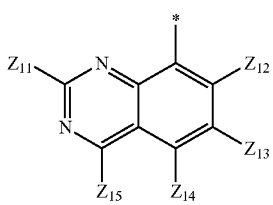
Formula 7-24
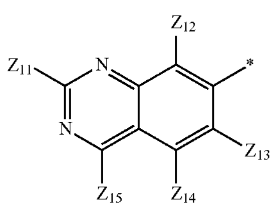
Formula 7-25
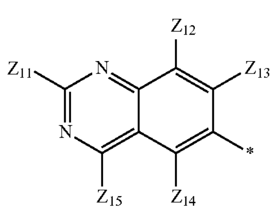
Formula 7-26
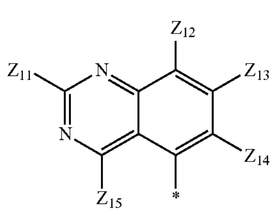
-continued
Formula 7-27
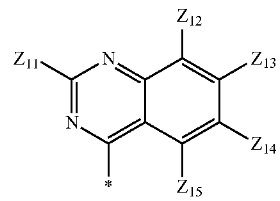
Formula 7-28
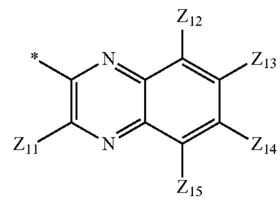
Formula 7-29
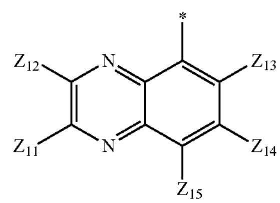
Formula 7-30
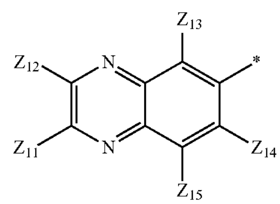
Formula 7-31
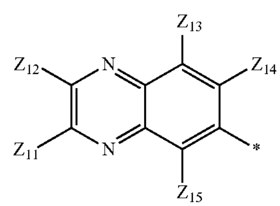
Formula 7-32
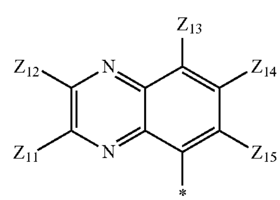
Formula 7-33
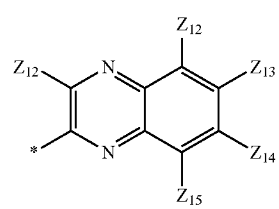
Formula 7-34
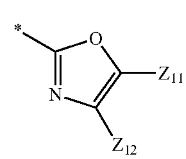

-continued

Formula 7-35

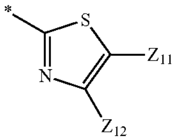

Formula 7-36

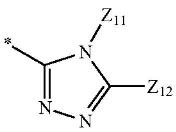

Formula 7-37

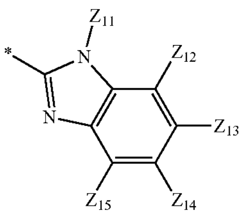

Formula 7-38

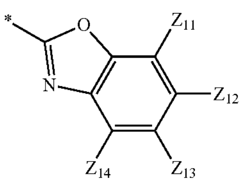

Formula 7-39

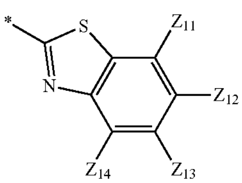

Formula 7-40

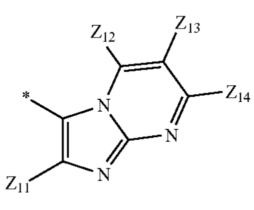

Formula 7-41

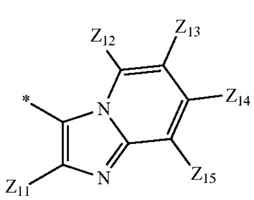

-continued

Formula 7-42

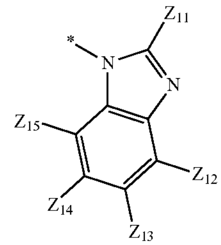

Formula 7-43

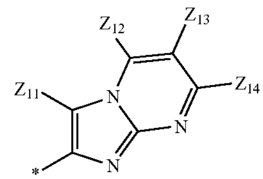

Formula 7-44

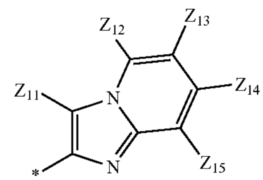

wherein in Formulae 7-1 to 7-44, $Z_{11}$ to $Z_{16}$ are each independently selected from the group consisting of a hydrogen, a deuterium, —F, —Cl, —Br, —I, a hydroxyl group, a cyano group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, phenanthridinyl, acridinyl, phenanthrolinyl, phenazinyl, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, and

* indicates a binding site to a neighboring atom.

10. The organic light-emitting device as claimed in claim 2, wherein in Formulae 1-1(A), 1-1(B), 1-2(A), 1-2(B), 1-3(A), and 1-3(B),
$Y_1$ is N-$(L_1)_{aa}$-$(R_{11})_{ab}$,
$L_1$ is represented by one of Formulae 5-1 to 5-16 below,
aa is 0 or 1,
$R_{11}$ is represented by one of Formulae 8-1 to 8-11 below, and
ab is 1:
Formula 5-1
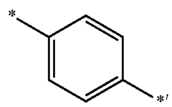
Formula 5-2
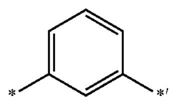
Formula 5-3
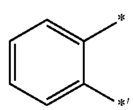
Formula 5-4
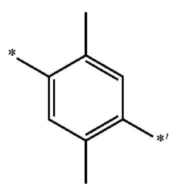
Formula 5-5
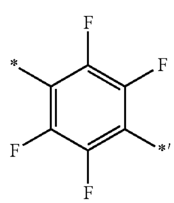
Formula 5-6
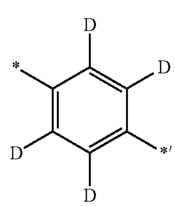
Formula 5-7
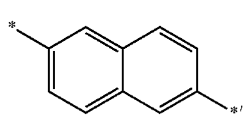
Formula 5-8
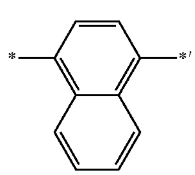
Formula 5-9
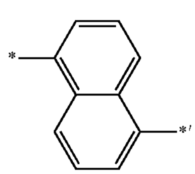
-continued
Formula 5-10
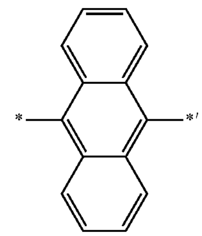
Formula 5-11
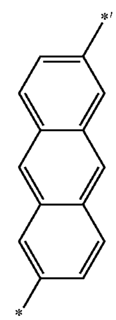
Formula 5-12
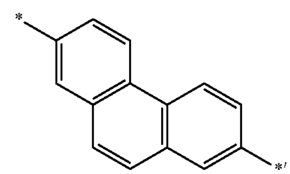
Formula 5-13
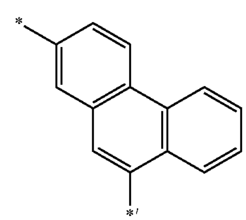
Formula 5-14
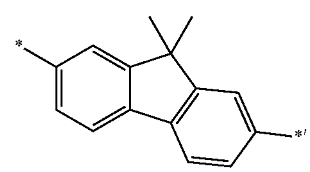
Formula 5-15
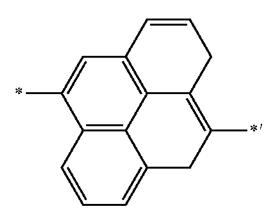
Formula 5-16
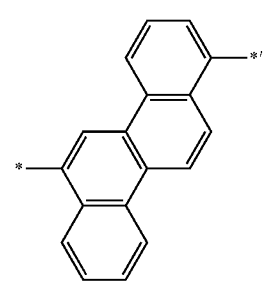

-continued

Formula 8-1

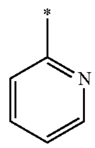

Formula 8-2

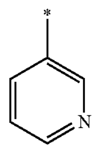

Formula 8-3

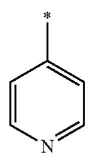

Formula 8-4

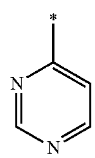

Formula 8-5

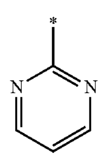

Formula 8-6

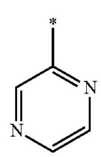

Formula 8-7

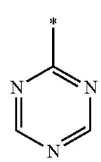

Formula 8-8

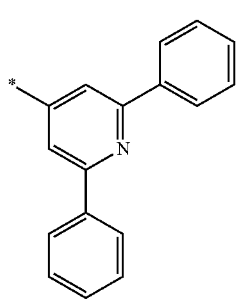

-continued

Formula 8-9

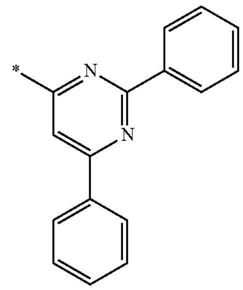

Formula 8-10

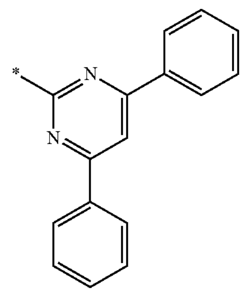

Formula 8-11

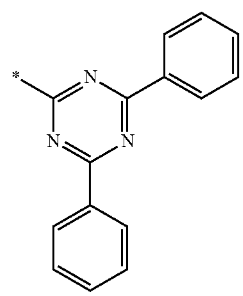

wherein in Formulae 5-1 to 5-16 and 8-1 to 8-11, * and *' indicate a binding site to a neighboring atom.

11. The organic light-emitting device as claimed in claim 2, wherein Formulae 1-1(A), 1-1(B), 1-2(A), 1-2(B), 1-3(A), and 1-3(B), $Y_1$ is S or O, rings $A_5$ and $B_5$ are each independently represented by one of Formulae 8-1(1) to 8-1(4) below, and ring $D_5$ is represented by one of Formulae Formula 8-3(1) to 8-3(4) below:

<Formula 8-1(1)>

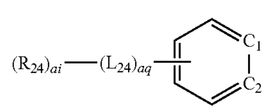

<Formula 8-1(2)>

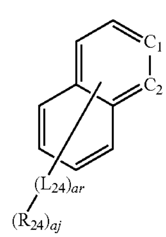

-continued

<Formula 8-1(3)>

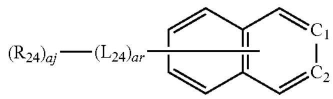

<Formula 8-1(4)>

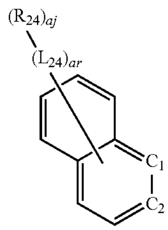

<Formula 8-3(1)>

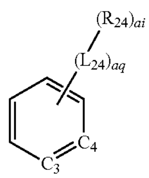

<Formula 8-3(2)>

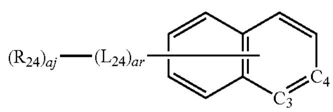

<Formula 8-3(3)>

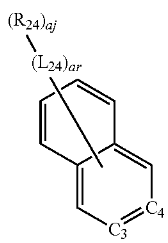

<Formula 8-3(4)>

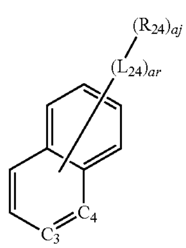

wherein in Formulae 8-1(1) to 8-1(4) and Formula 8-3(1) to 8-3(4), $L_{24}$ is represented by one of Formulae 5-1 to 5-16 below, aq and ar are each independently 0 or 1, $R_{24}$ is represented by one of Formulae 8-1 to 8-11 below, and ai and aj are 1:

wherein in Formulae 5-1 to 5-16 and 8-1 to 8-11, * and *' indicate a binding site to a neighboring atom.

12. The organic light-emitting device as claimed in claim 1, wherein in Formula 2, $R_{12}$ and $R_{13}$ are each independently selected from the group consisting of:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a Spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, a dibenzocarbazolyl group, and —$Si(Q_{31})(Q_{32})(Q_{33})$, $Q_{31}$ to $Q_{33}$ are each independently selected from the group consisting of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group, and $R_{41}$ to $R_{44}$ are each independently selected from the group consisting of:

a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_1$-$C_{20}$ alkoxy group, a substituted or unsubstituted $C_6$-$C_{20}$ aryl group, a substituted or unsubstituted $C_1$-$C_{20}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$-$B(Q_4)(Q_5)$, and $N(Q_6)(Q_7)$.

13. The organic light-emitting device as claimed in claim 1, wherein in Formula 2, $R_{12}$ and $R_{13}$ are each independently represented by one of Formulae 9-1 to 9-6 below, $R_{41}$ to $R_{44}$ are each independently selected from the group consisting of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, and groups of Formulae 10-1 to 10-17 below:

Formula 9-1
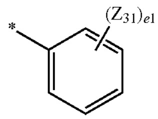
Formula 9-2
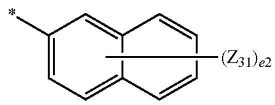
Formula 9-3
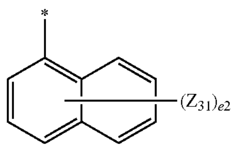
Formula 9-4
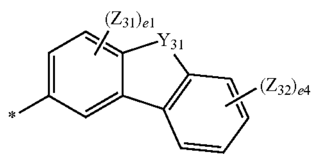
Formula 9-5
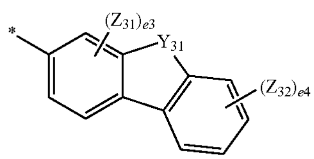
Formula 9-6
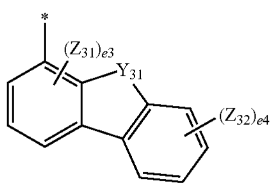
Formula 10-1
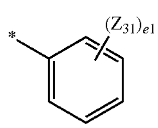
Formula 10-2
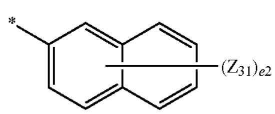
Formula 10-3
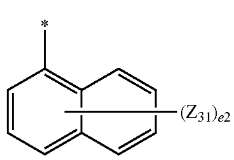
Formula 10-4
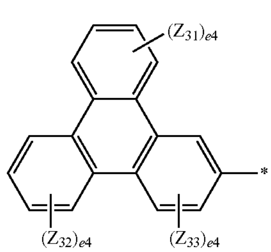
-continued
Formula 10-5
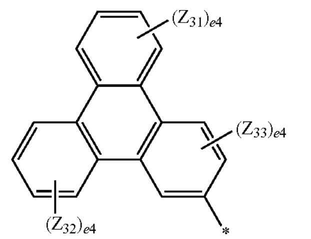
Formula 10-6
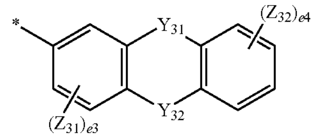
Formula 10-7
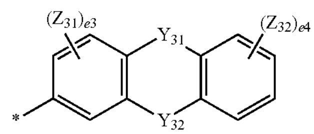
Formula 10-8
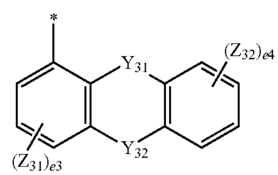
Formula 10-9
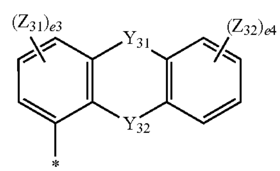
Formula 10-10
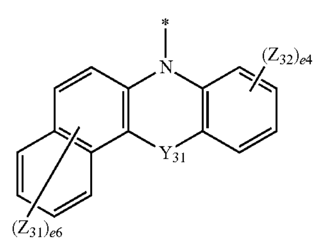
Formula 10-11
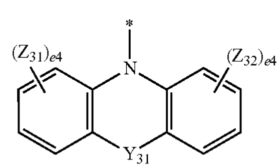
Formula 10-12
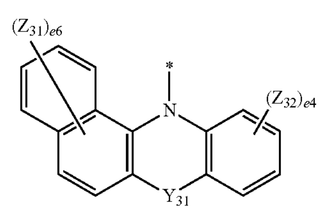

-continued

Formula 10-13

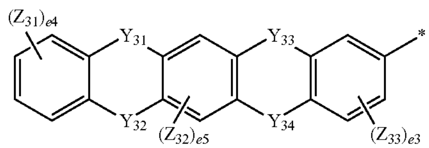

Formula 10-14

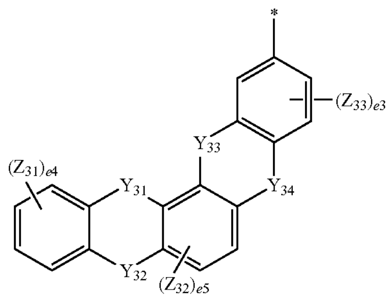

Formula 10-15

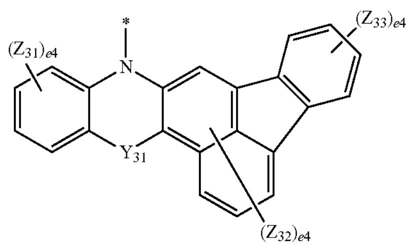

Formula 10-16

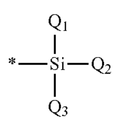

Formula 10-17

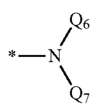

wherein in Formulae 9-1 to 9-6, $Y_{31}$ is $C(Z_{33})(Z_{34})$ or $N(Z_{35})$, $Z_{31}$ to $Z_{35}$ are each independently selected from the group consisting of:

a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof;

phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a carbazolyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, and a naphthyl group; and $Si(Q_{31})(Q_{32})(Q_{33})$, $Q_{31}$ to $Q_{33}$ are each independently selected from the group consisting of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, and a carbazolyl group, e1 is an integer selected from 1 to 5, e2 is an integer selected from 1 to 7, e3 is an integer selected from 1 to 3, and e4 is an integer selected from 1 to 4, and * indicates a binding site to a neighboring atom, and wherein in Formulae 10-1 to 10-17, $Y_{31}$ to $Y_{34}$ are each independently a single bond, O, S, $C(Z_{34})(Z_{35})$, $N(Z_{36})$, or $Si(Z_{37})(Z_{38})$, $Z_{31}$ to $Z_{38}$ are each independently selected from the group consisting of a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, and a phosphoric acid or a salt thereof, a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{20}$ alkoxy group, a $C_{60}$-$C_{20}$ aryl group, a $C_1$-$C_{20}$ heteroaryl group, a monovalent non-aromatic condensed polycyclic group, and a monovalent non-aromatic condensed heteropolycyclic group, $Q_1$ to $Q_3$, $Q_6$, and $Q_7$ are each independently selected from the group consisting of:

a $C_6$-$C_{20}$ aryl group, a $C_1$-$C_{20}$ heteroaryl group, a monovalent non-aromatic condensed polycyclic group, and a monovalent non-aromatic condensed heteropolycyclic group; and a $C_6$-$C_{20}$ aryl group, a $C_1$-$C_{20}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group, e1 is an integer selected from 1 to 5, e2 is an integer selected from 1 to 7, e3 is an integer selected from 1 to 3, e4 is an integer selected from 1 to 4, e5 is 1 or 2, and e6 is an integer selected from 1 to 6, and * indicates a binding site to a neighboring atom.

14. The organic light-emitting device as claimed in claim 1, wherein in Formula 2, $R_{12}$ and $R_{13}$ are each independently one of groups of Formulae 11-1 to 11-15 below, and $R_{41}$ to $R_{44}$ are each independently one of groups of Formulae 12-1 to Formula 12-49 below:

Formula 11-1

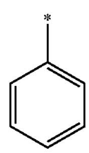

Formula 11-2

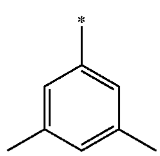

Formula 11-3

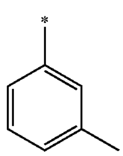

Formula 11-4

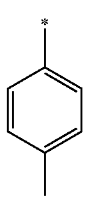

Formula 11-5

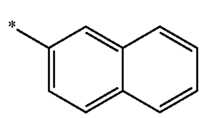

Formula 11-6

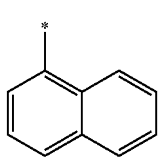

-continued

Formula 11-7

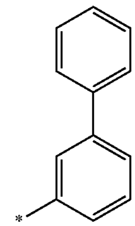

Formula 11-8

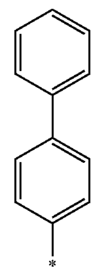

Formula 11-9

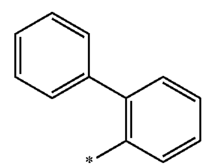

Formula 11-10

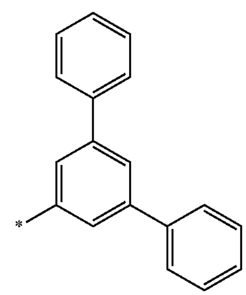

Formula 11-11

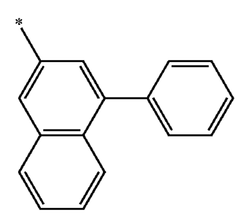

Formula 11-12

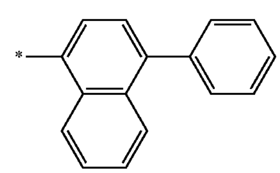

Formula 11-13

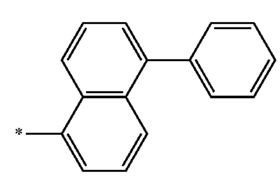

-continued
Formula 11-14
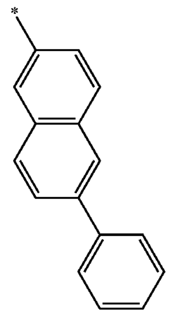
Formula 11-15
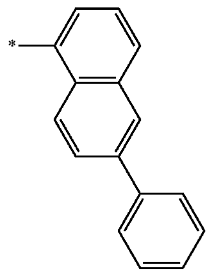
Formula 12-1
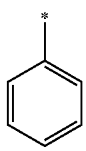
Formula 12-2
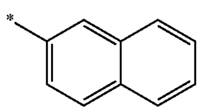
Formula 12-3
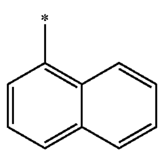
Formula 12-4
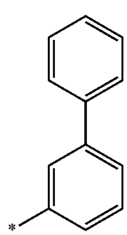
Formula 12-5
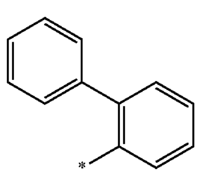
-continued
Formula 12-6
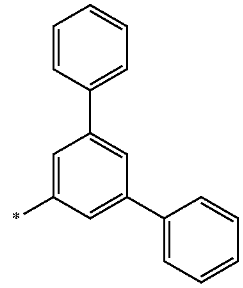
Formula 12-7
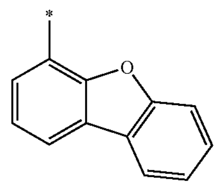
Formula 12-8
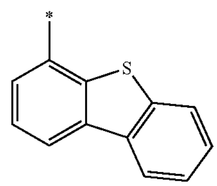
Formula 12-9
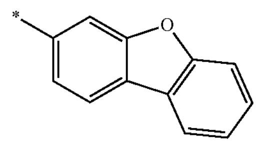
Formula 12-10
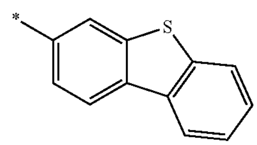
Formula 12-11
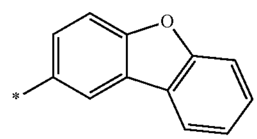
Formula 12-12
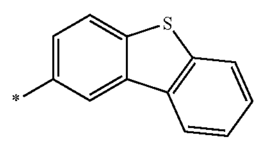
Formula 12-13
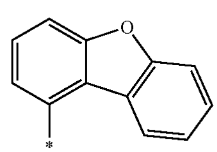
Formula 12-14
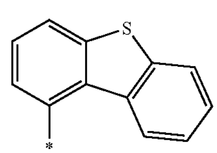

-continued
Formula 12-15
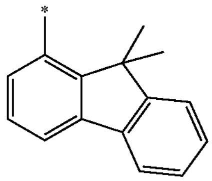
Formula 12-16
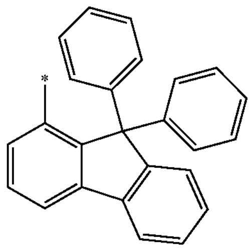
Formula 12-17
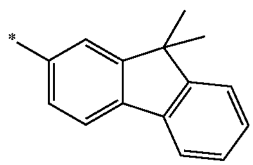
Formula 12-18
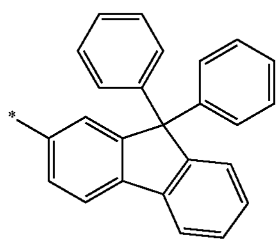
Formula 12-19
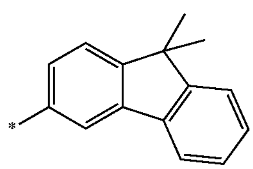
Formula 12-20
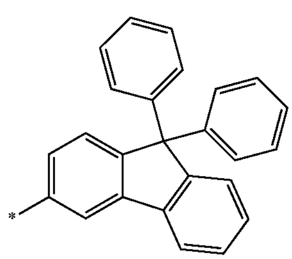
Formula 12-21
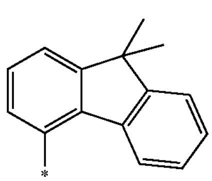
-continued
Formula 12-22
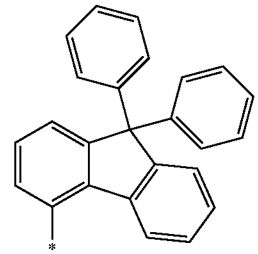
Formula 12-23
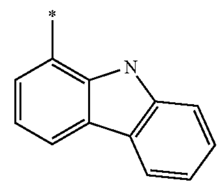
Formula 12-24
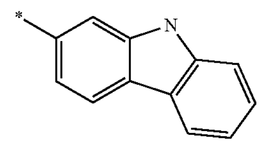
Formula 12-25
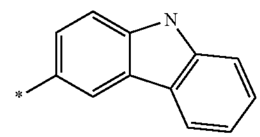
Formula 12-26
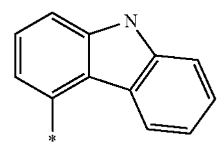
Formula 12-27
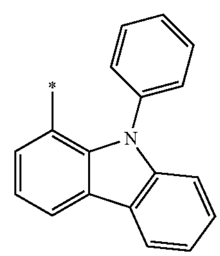
Formula 12-28
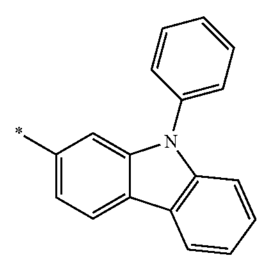

Formula 12-29
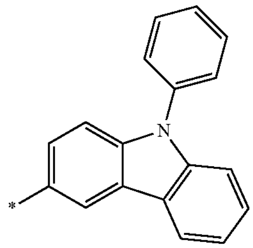
Formula 12-30
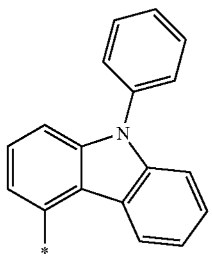
Formula 12-31
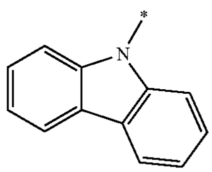
Formula 12-32
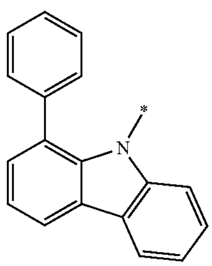
Formula 12-33
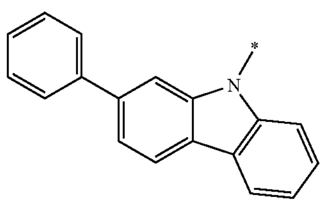
Formula 12-34
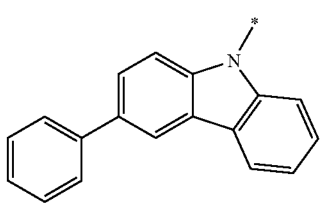
Formula 12-35
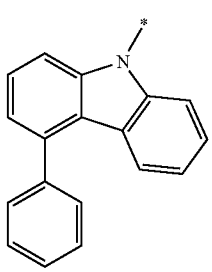
Formula 12-36
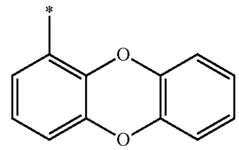
Formula 12-37
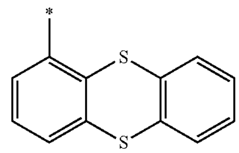
Formula 12-38
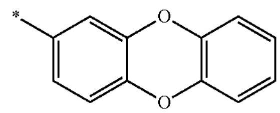
Formula 12-39
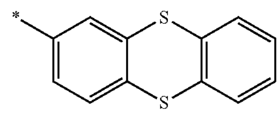
Formula 12-40
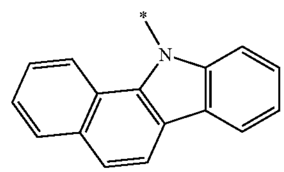
Formula 12-41
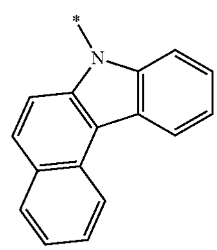
Formula 12-42
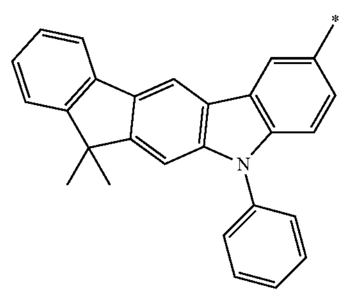
Formula 12-43
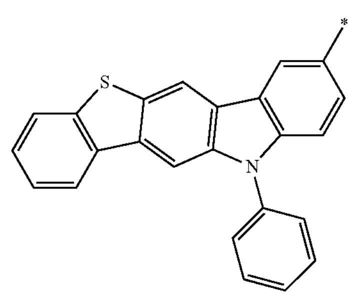

-continued

Formula 12-44

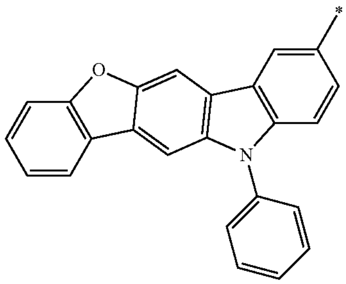

Formula 12-45

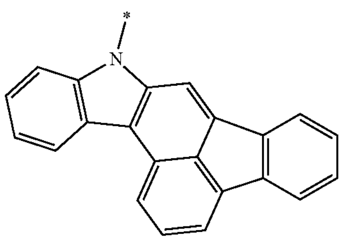

Formula 12-46

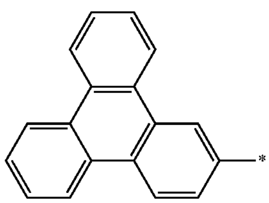

Formula 12-47

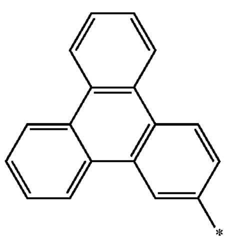

Formula 12-48

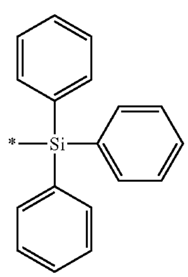

Formula 12-49

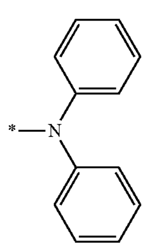

wherein in Formulae 11-1 to 11-15 and 12-1 to 12-49, * indicates a binding site to a neighboring atom.

15. The organic light-emitting device as claimed in claim 1, wherein the first compound is represented by one of Formulae 1-1(A-1) to 1-1(A-20), 1-1(B-1) to 1-1(B-20), 1-2(A-1) to 1-2(A-27), 1-2(B-1) to 1-2(B-19), 1-3(A-1) to 1-3(A-29), and 1-3(B-1) to 1-3(B-27) below, and the second compound is represented by one of Formulae 2(1) to 2(10) below:

<Formula 1-1(A-1)>

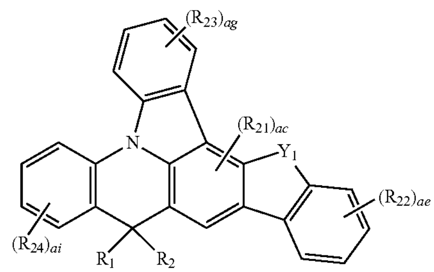

<Formula 1-1(A-2)>

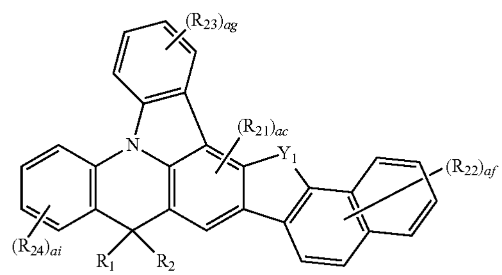

<Formula 1-1(A-3)>

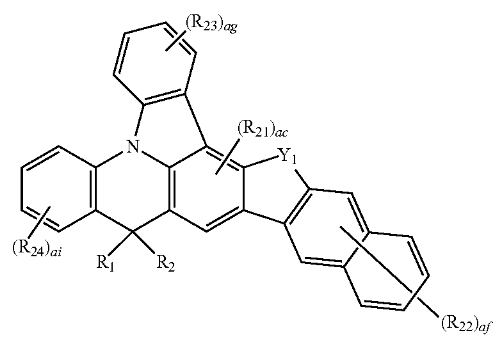

<Formula 1-1(A-4)>

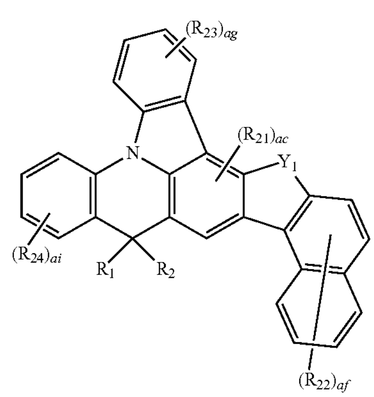

-continued
<Formula 1-1(A-5)>
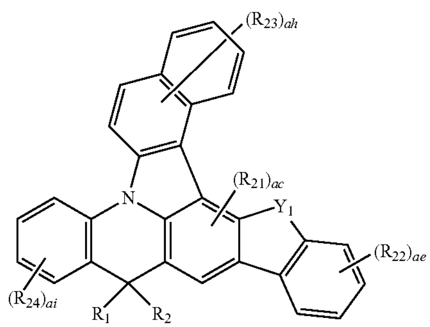
<Formula 1-1(A-6)>
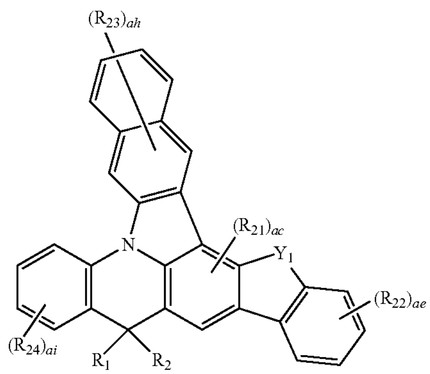
<Formula 1-1(A-7)>
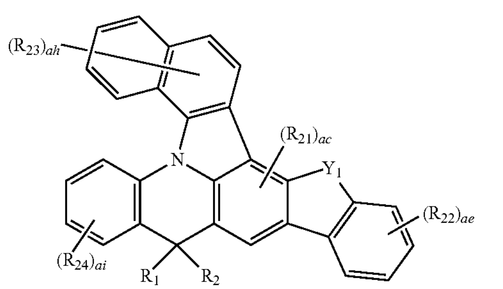
<Formula 1-1(A-8)>
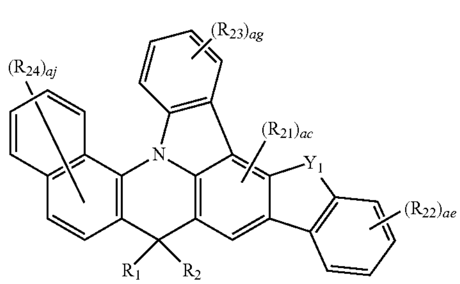
<Formula 1-1(A-9)>
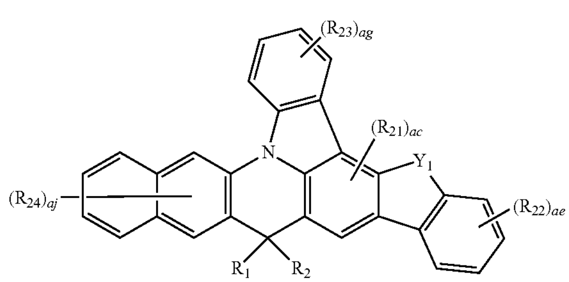
-continued
<Formula 1-1(A-10)>
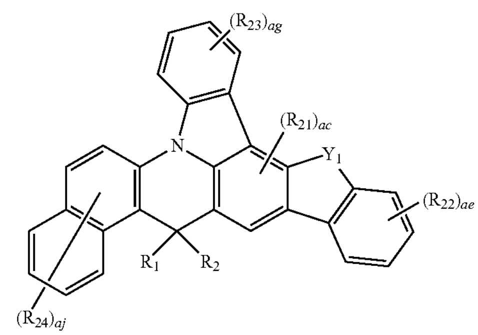
<Formula 1-1(A-11)>
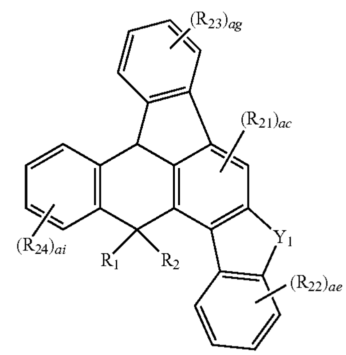
<Formula 1-1(A-12)>
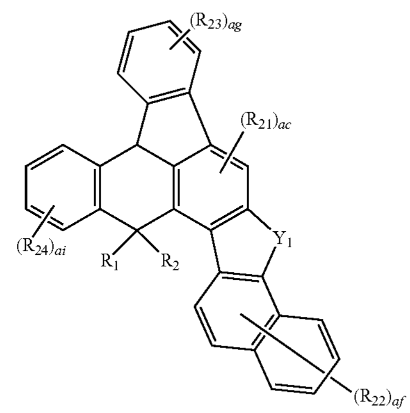
<Formula 1-1(A-13)>
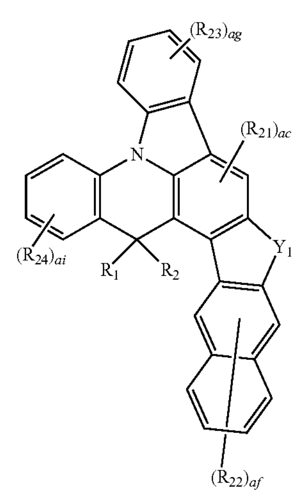

-continued
<Formula 1-1(A-14)>
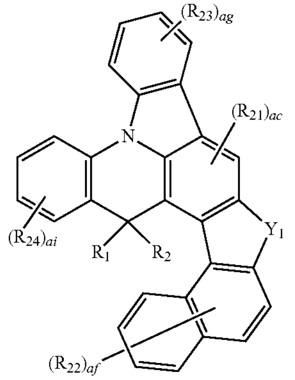
<Formula 1-1(A-15)>
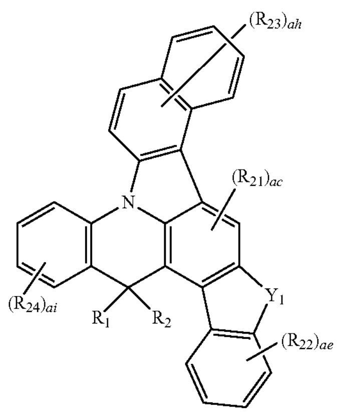
<Formula 1-1(A-16)>
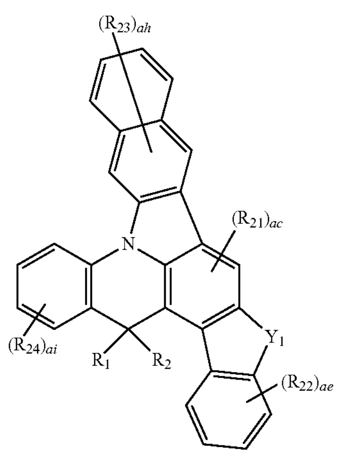
<Formula 1-1(A-17)>
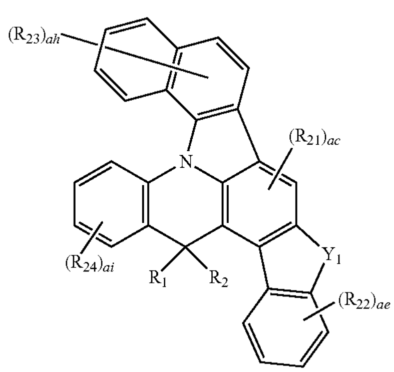
-continued
<Formula 1-1(A-18)>
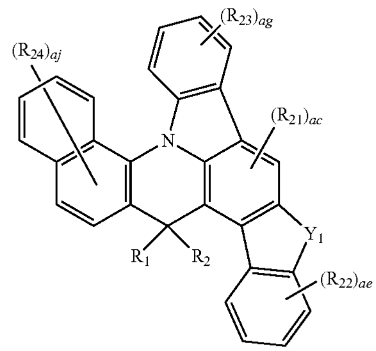
<Formula 1-1(A-19)>
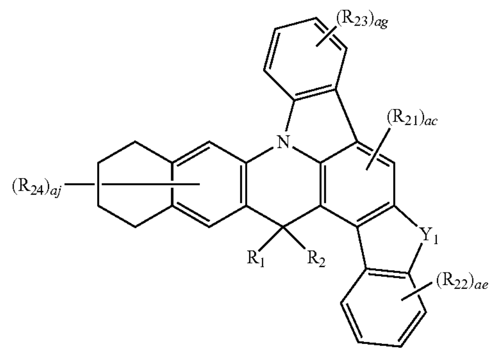
<Formula 1-1(A-20)>
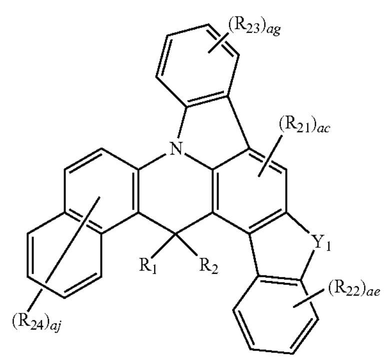
<Formula 1-1(B-1)>
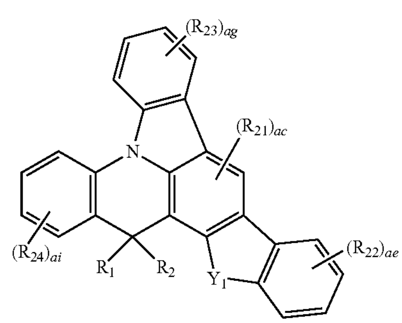

-continued
<Formula 1-1(B-2)>
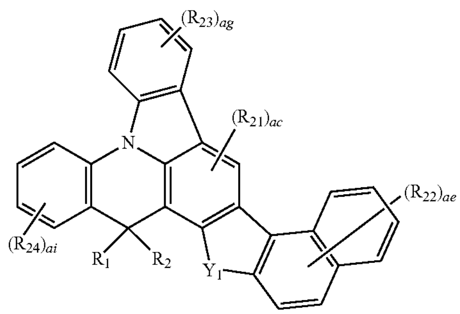
<Formula 1-1(B-3)>
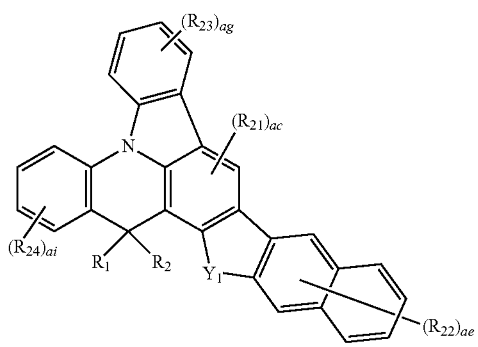
<Formula 1-1(B-4)>
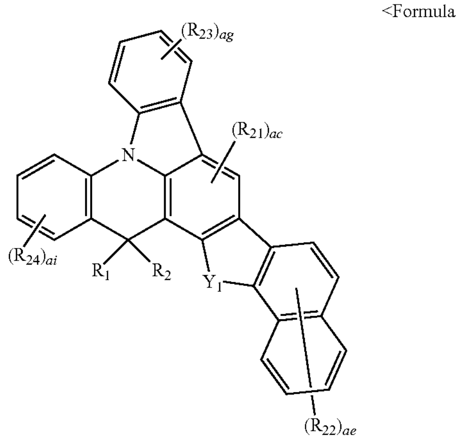
<Formula 1-1(B-5)>
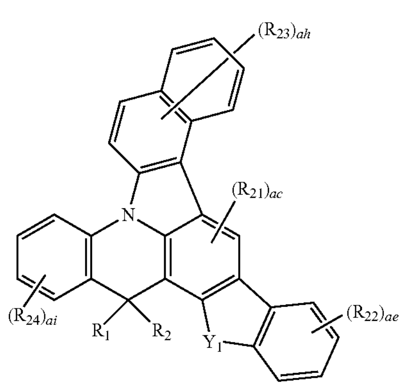
-continued
<Formula 1-1(B-6)>
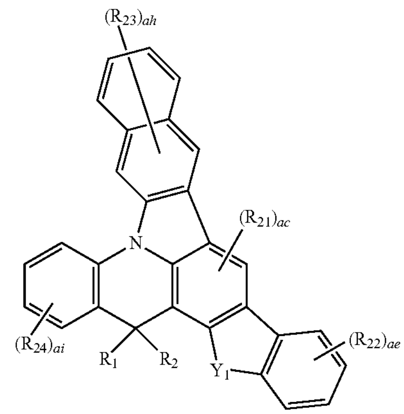
<Formula 1-1(B-7)>
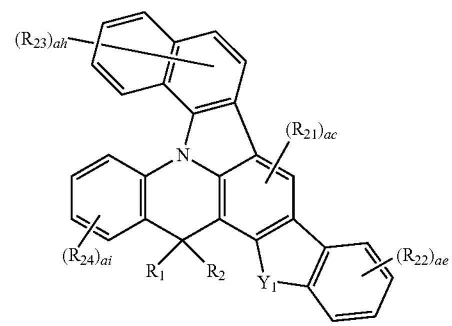
<Formula 1-1(B-8)>
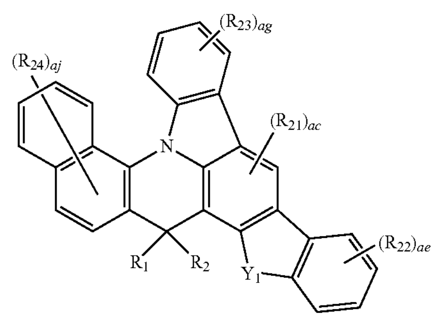
<Formula 1-1(B-9)>
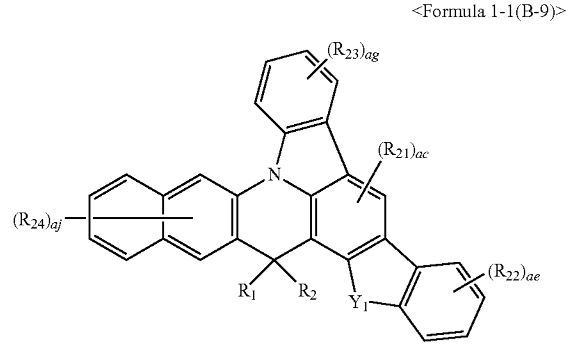

-continued
<Formula 1-1(B-10)>
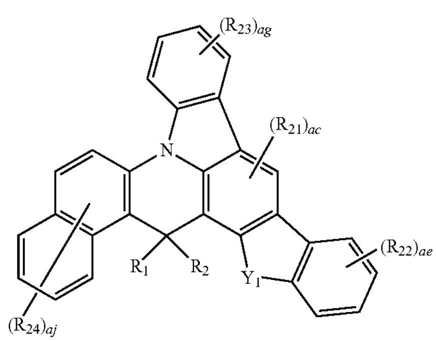
<Formula 1-1(B-11)>
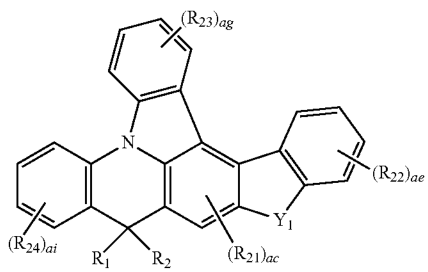
<Formula 1-1(B-12)>
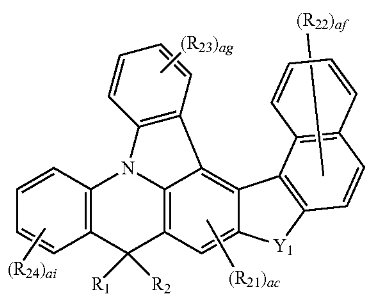
<Formula 1-1(B-13)>
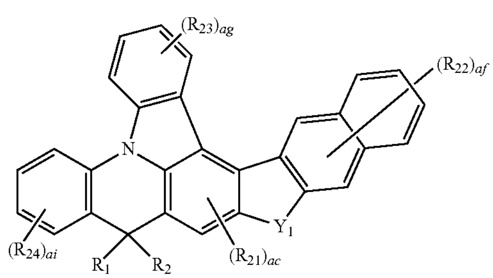
<Formula 1-1(B-14)>
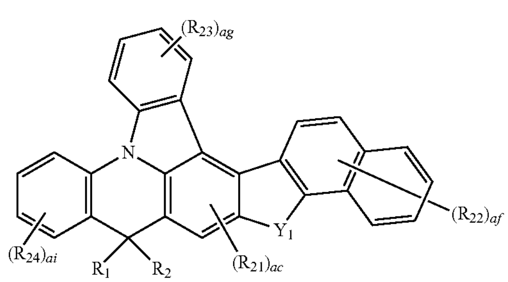
-continued
<Formula 1-1(B-15)>
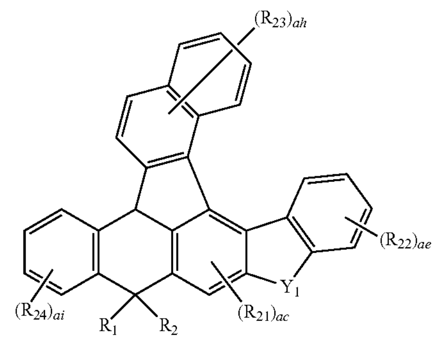
<Formula 1-1(B-16)>
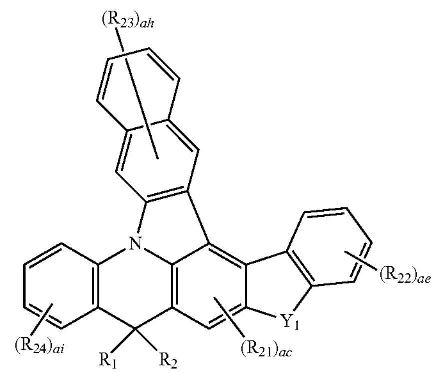
<Formula 1-1(B-17)>
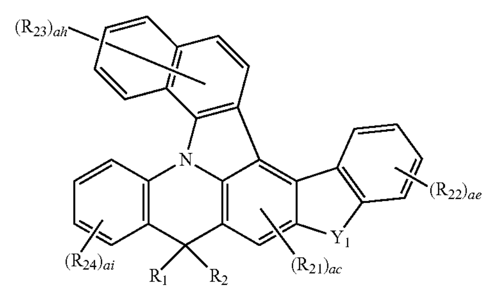
<Formula 1-1(B-18)>
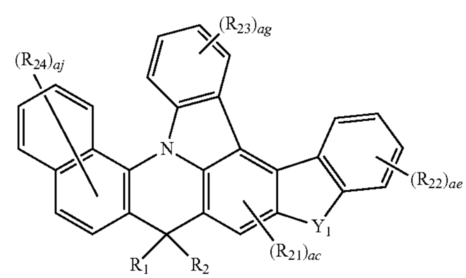
<Formula 1-1(B-19)>
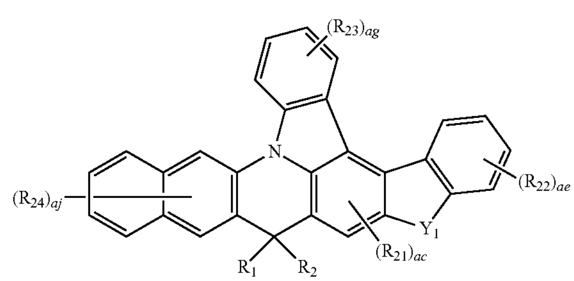

-continued
<Formula 1-1(B-20)>
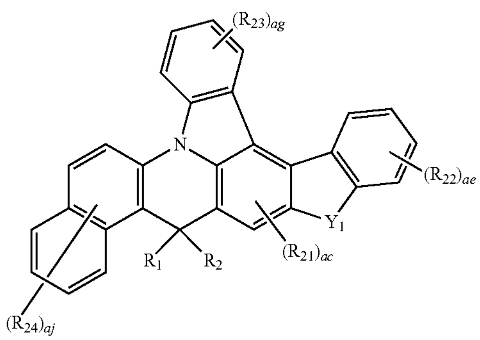
<Formula 1-2(A-1)>
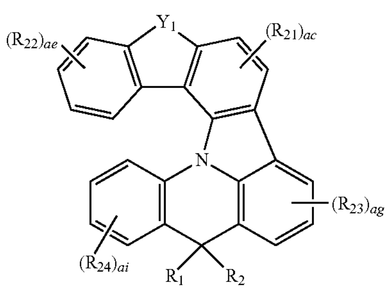
<Formula 1-2(A-2)>
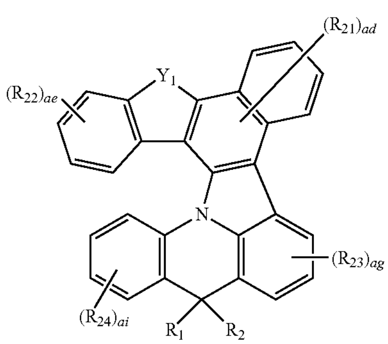
<Formula 1-2(A-3)>
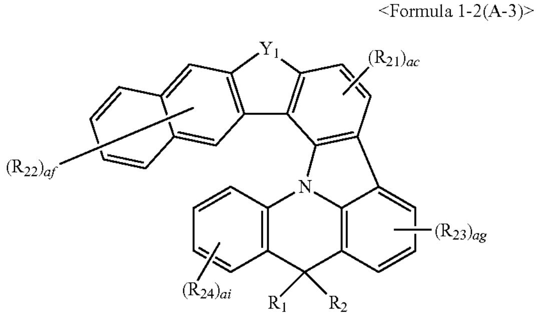
-continued
<Formula 1-2(A-4)>
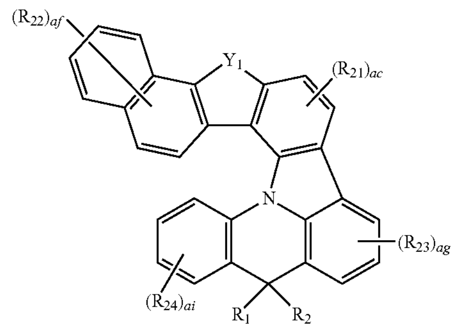
<Formula 1-2(A-5)>
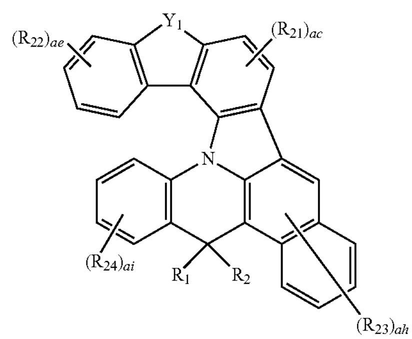
<Formula 1-2(A-6)>
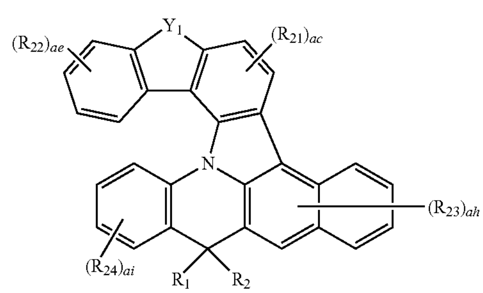
<Formula 1-2(A-7)>
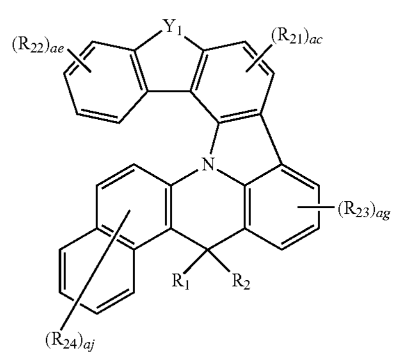

-continued
<Formula 1-2(A-8)>
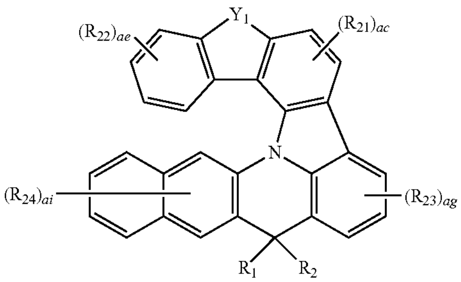
<Formula 1-2(A-9)>
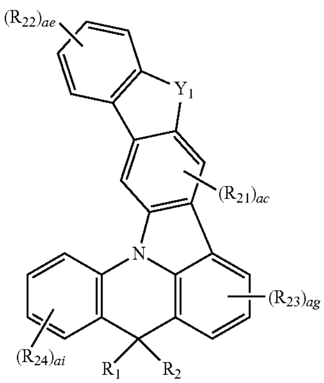
<Formula 1-2(A-10)>
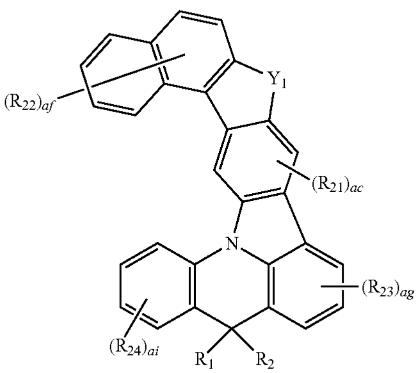
<Formula 1-2(A-11)>
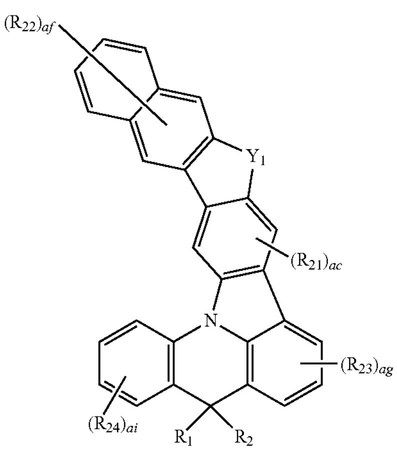
-continued
<Formula 1-2(A-12)>
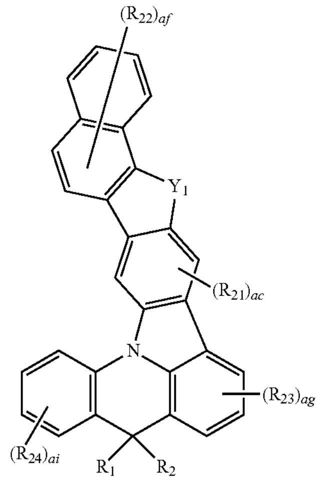
<Formula 1-2(A-13)>
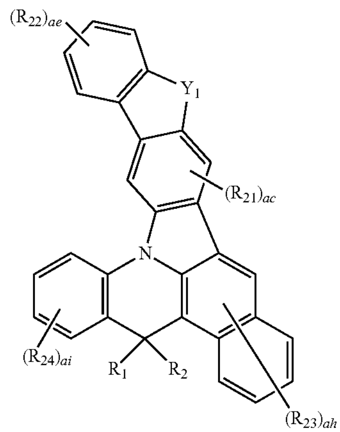
<Formula 1-2(A-14)>
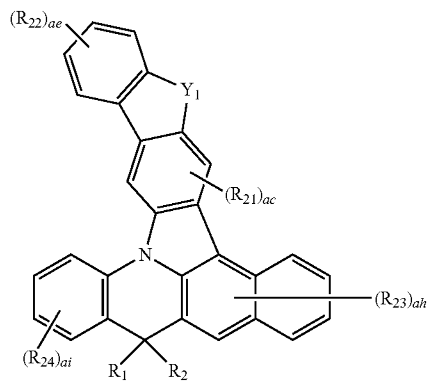

-continued
<Formula 1-2(A-15)>
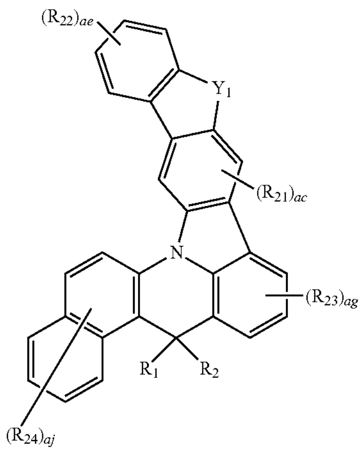
<Formula 1-2(A-16)>
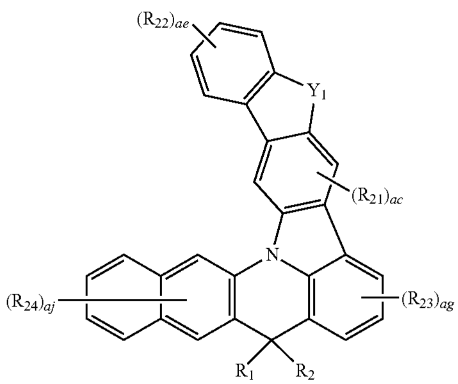
<Formula 1-2 (A-17)>
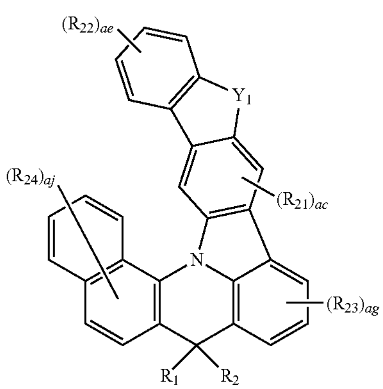
<Formula 1-2 (A-18)>
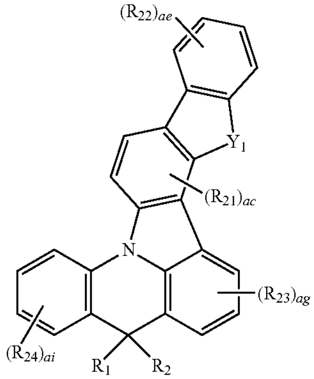
-continued
<Formula 1-2(A-19)>
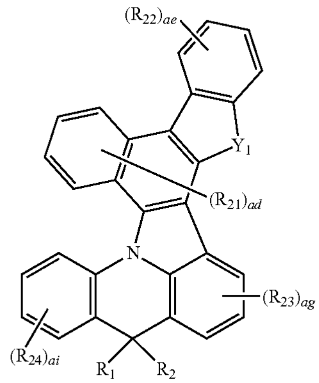
<Formula 1-2(A-20)>
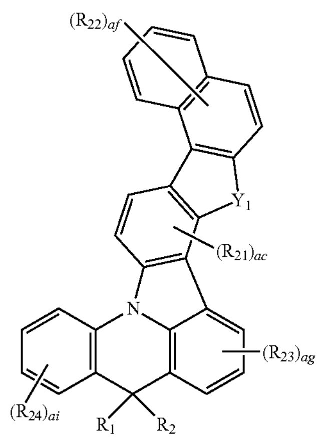
<Formula 1-2(A-21)>
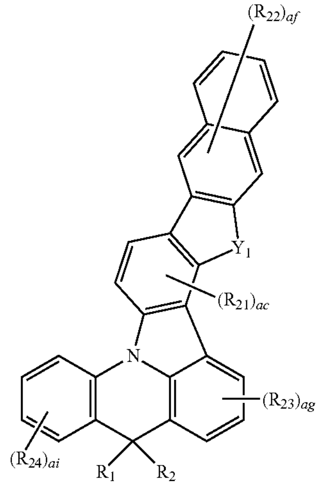

-continued
<Formula 1-2(A-22)>
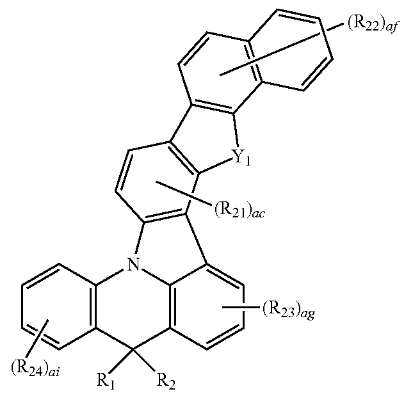
<Formula 1-2(A-23)>
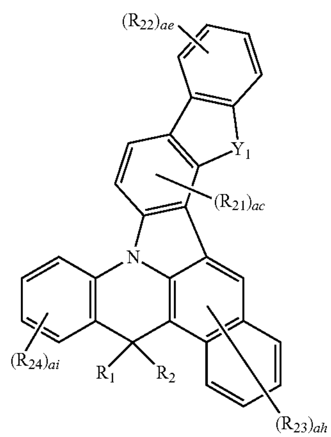
<Formula 1-2(A-24)>
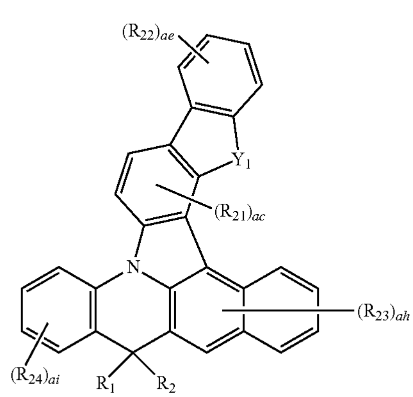
-continued
<Formula 1-2(A-25)>
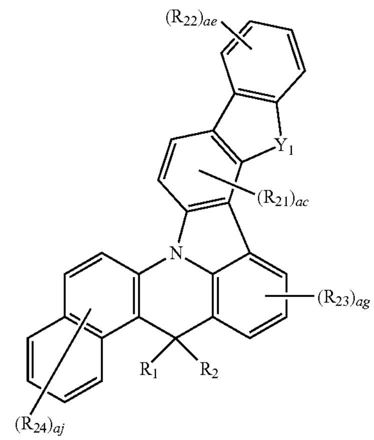
<Formula 1-2(A-26)>
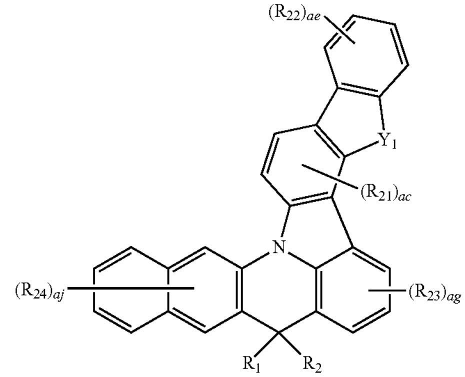
<Formula 1-2(A-27)>
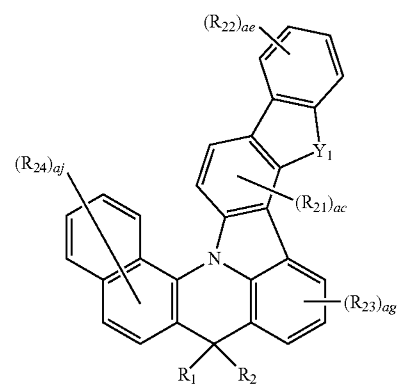
<Formula 1-2(B-1)>
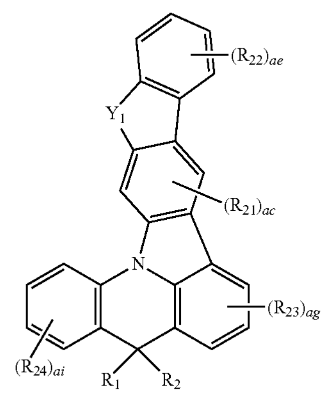

-continued
<Formula 1-2(B-2)>
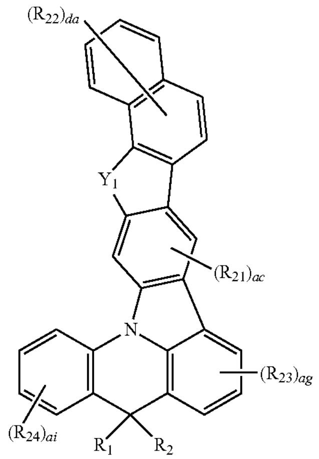
<Formula 1-2(B-3)>
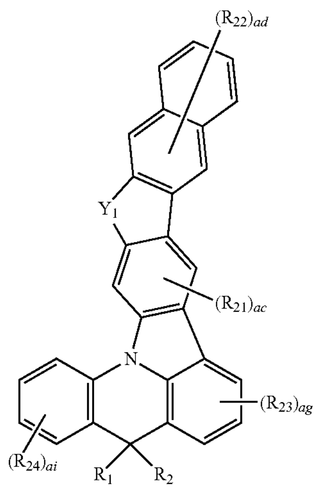
<Formula 1-2(B-4)>
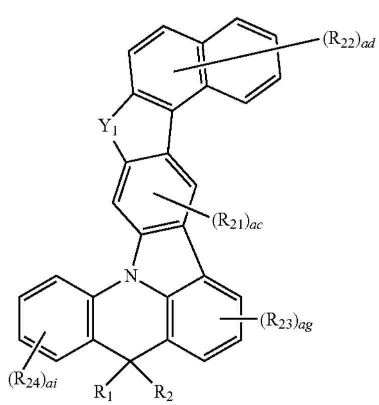
-continued
<Formula 1-2(B-5)>
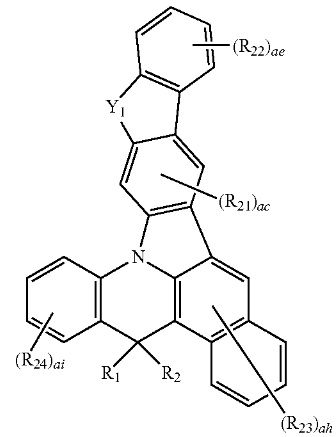
<Formula 1-2(B-6)>
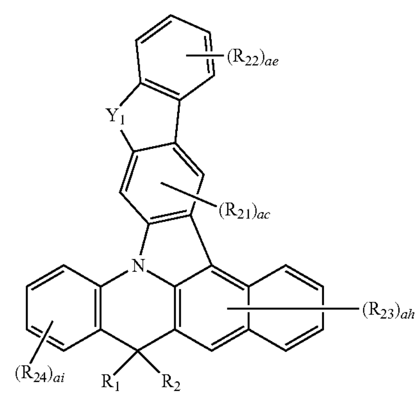
<Formula 1-2(B-7)>
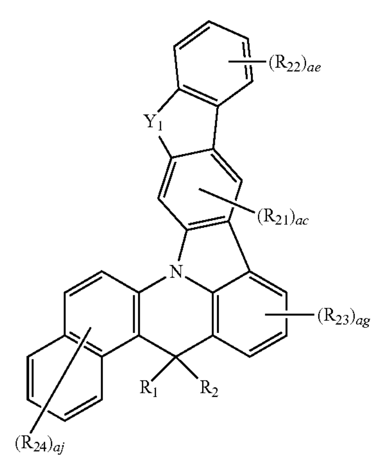

-continued
<Formula 1-2(B-8)>
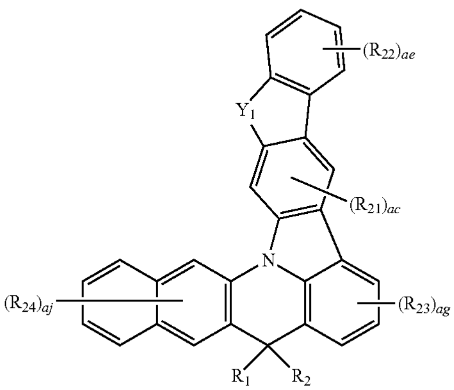
<Formula 1-2(B-9)>
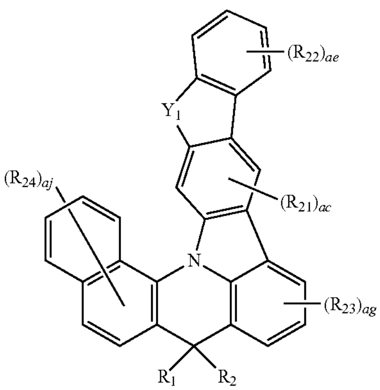
<Formula 1-2(B-10)>
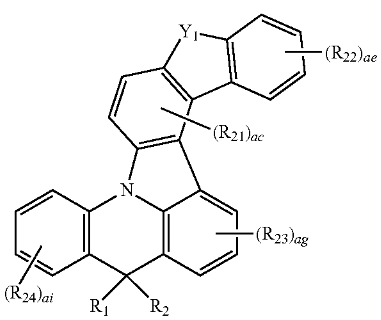
<Formula 1-2(B-11)>
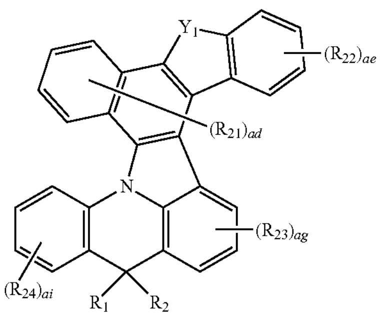
-continued
<Formula 1-2(B-12)>
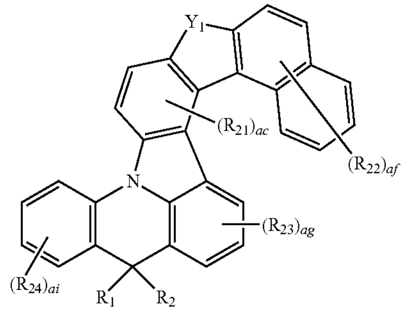
<Formula 1-2(B-13)>
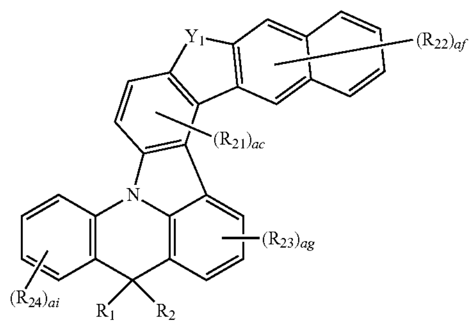
<Formula 1-2(B-14)>
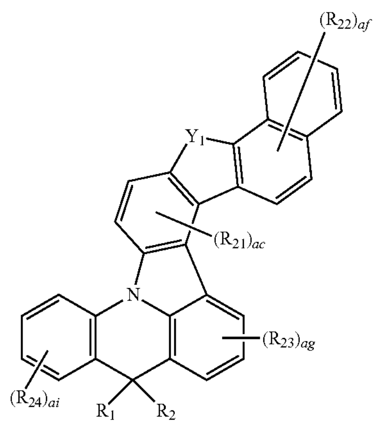
<Formula 1-2(B-15)>
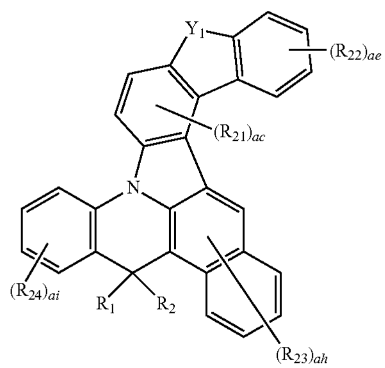

-continued
<Formula 1-2(B-16)>
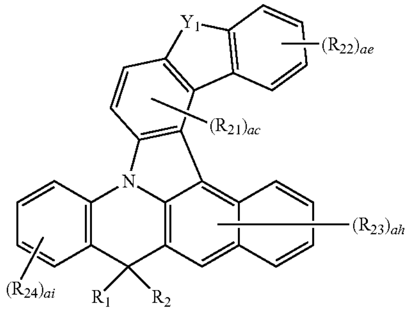
<Formula 1-2(B-17)>
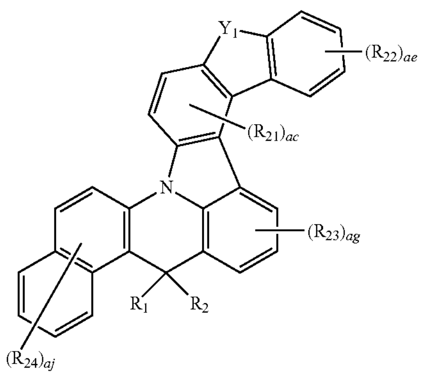
<Formula 1-2(B-18)>
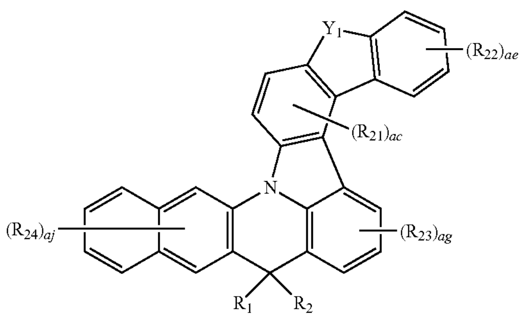
<Formula 1-2(B-19)>
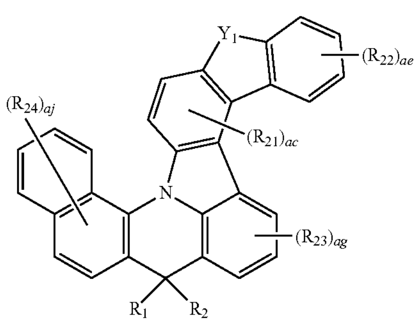
-continued
<Formula 1-3(A-1)>
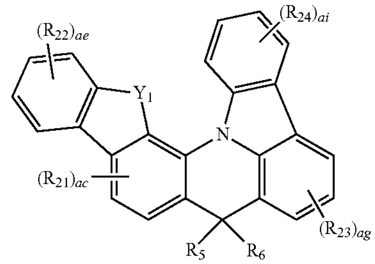
<Formula 1-3(A-2)>
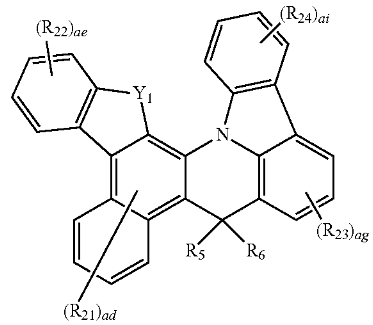
<Formula 1-3(A-3)>
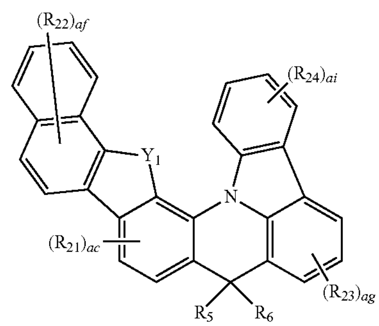
<Formula 1-3(A-4)>
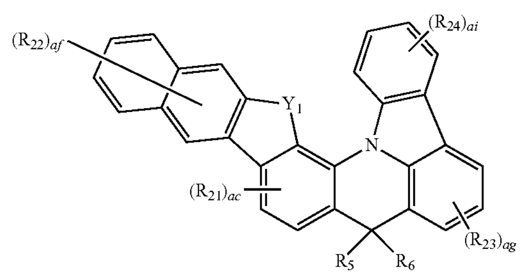
<Formula 1-3(A-5)>
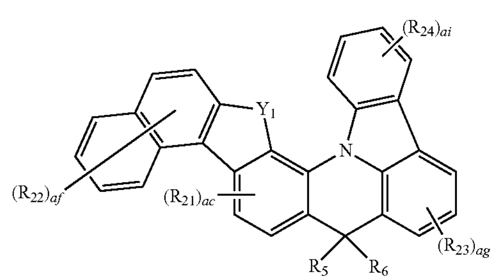

-continued
<Formula 1-3(A-6)>
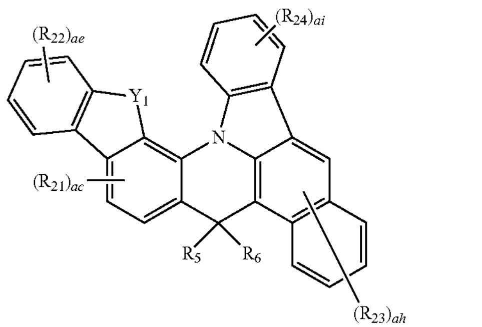
<Formula 1-3(A-7)>
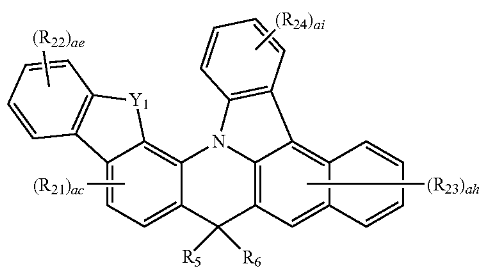
<Formula 1-3(A-8)>
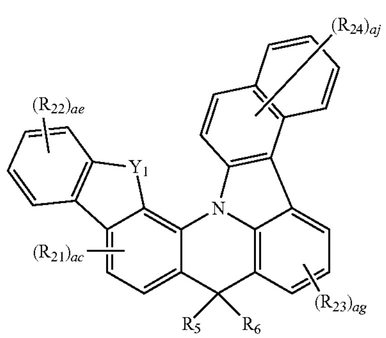
<Formula 1-3(A-9)>
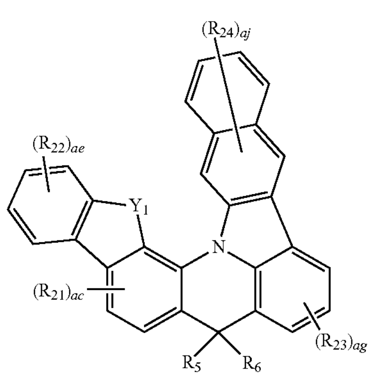
-continued
<Formula 1-3(A-10)>
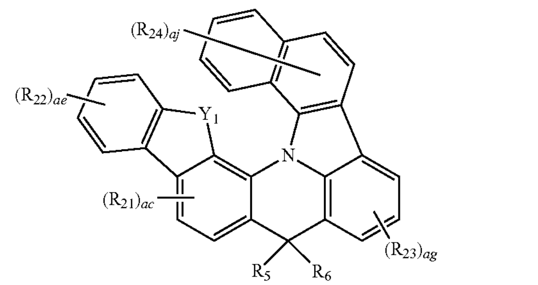
<Formula 1-3(A-11)>
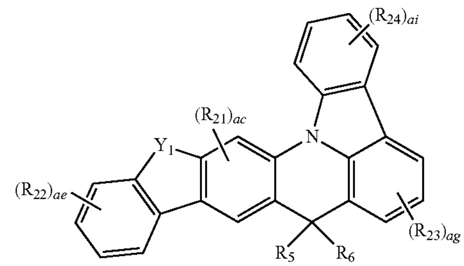
<Formula 1-3(A-12)>
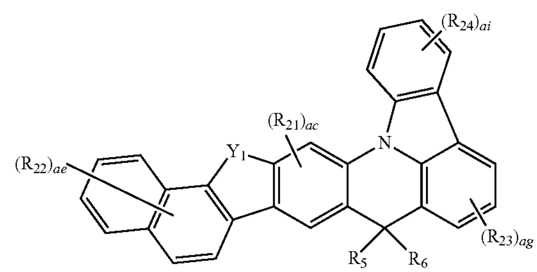
<Formula 1-3(A-13)>
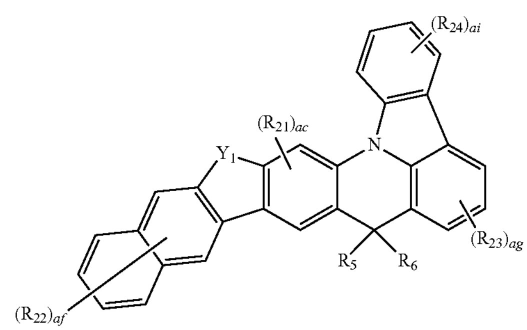
<Formula 1-3(A-14)>
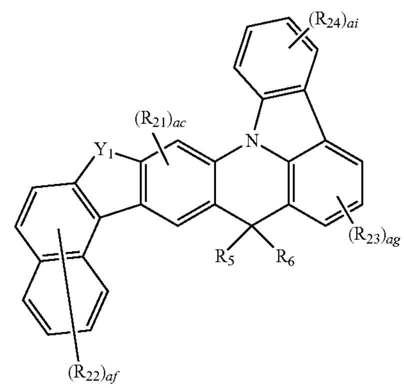

-continued
<Formula 1-3(A-15)>
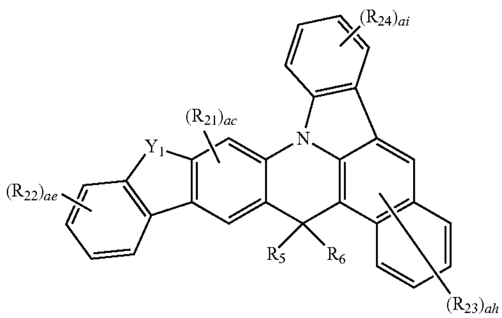
<Formula 1-3(A-16)>
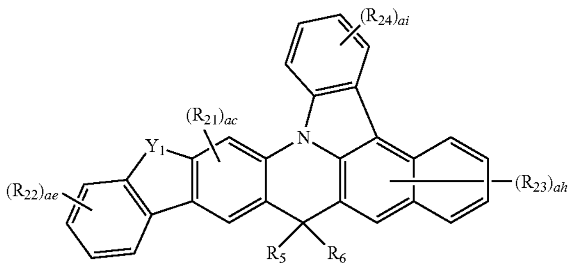
<Formula 1-3(A-17)>
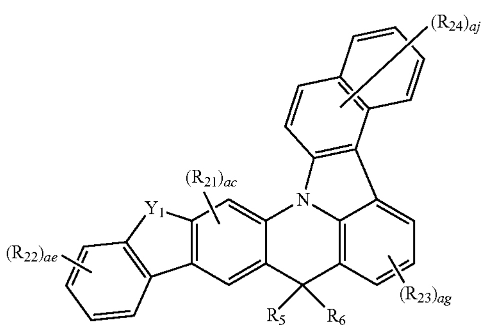
<Formula 1-3(A-18)>
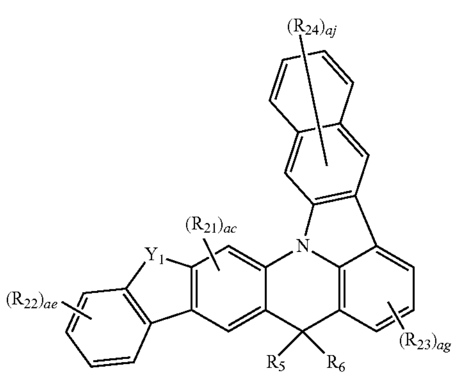
-continued
<Formula 1-3(A-19)>
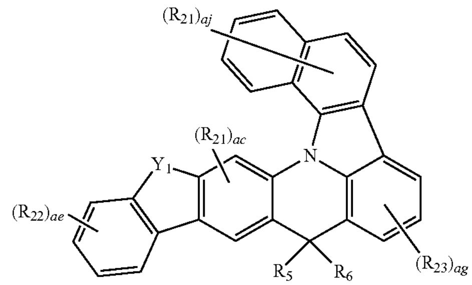
<Formula 1-3(A-20)>
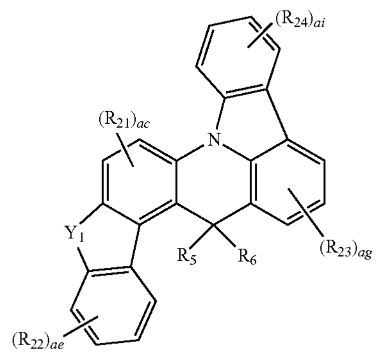
<Formula 1-3(A-21)>
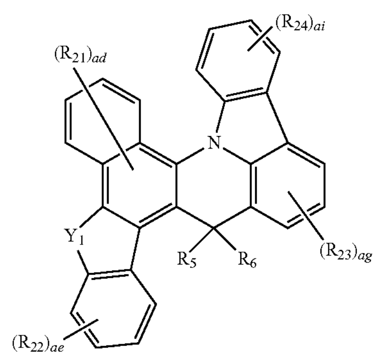
<Formula 1-3(A-22)>
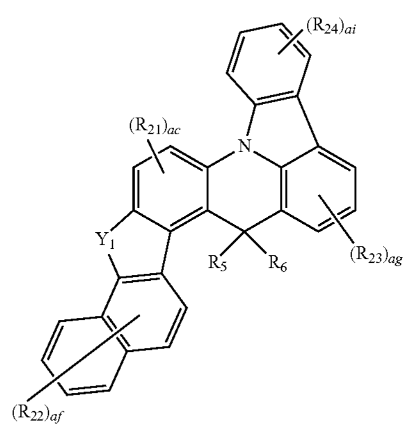

-continued
<Formula 1-3(A-23)>
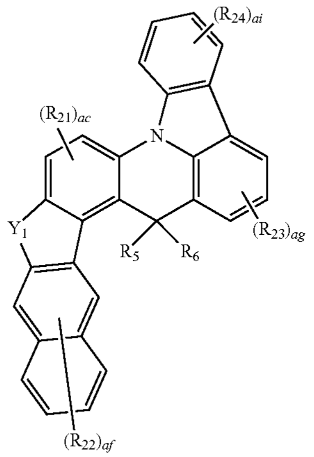
<Formula 1-3(A-24)>
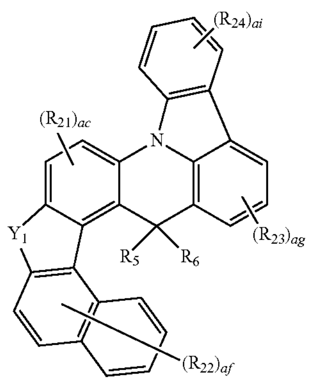
<Formula 1-3(A-25)>
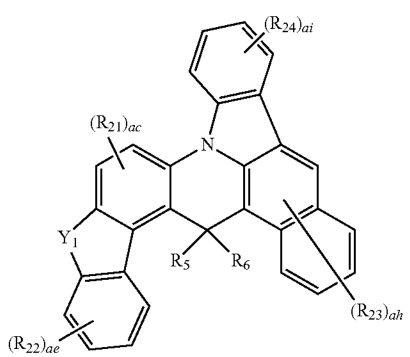
<Formula 1-3(A-26)>
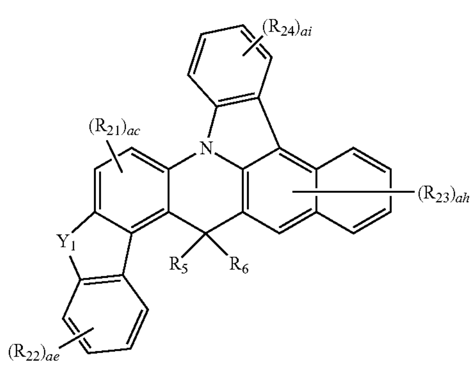
-continued
<Formula 1-3(A-27)>
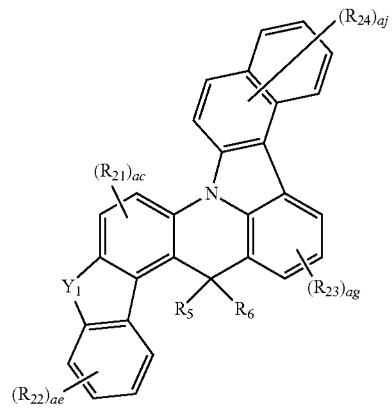
<Formula 1-3(A-28)>
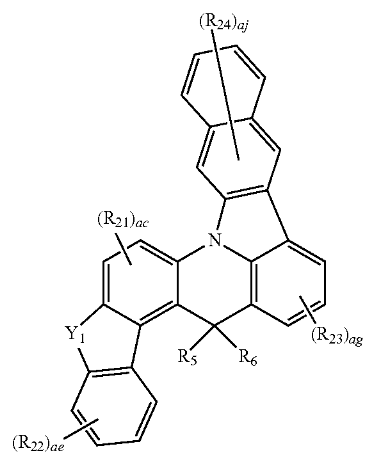
<Formula 1-3(A-29)>
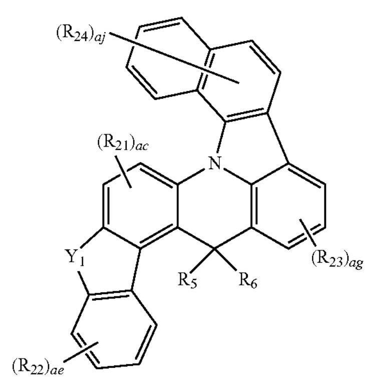
<Formula 1-3(B-1)>
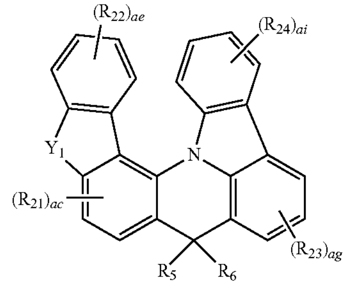

-continued
<Formula 1-3(B-2)>
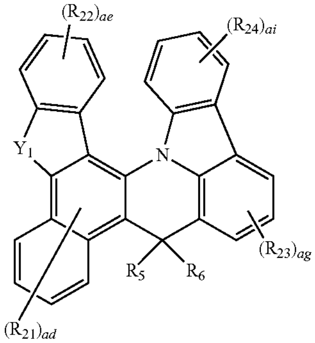
<Formula 1-3(B-3)>
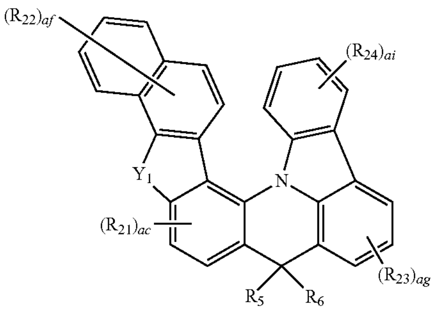
<Formula 1-3(B-4)>
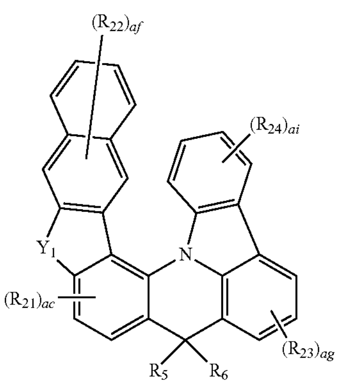
<Formula 1-3(B-5)>
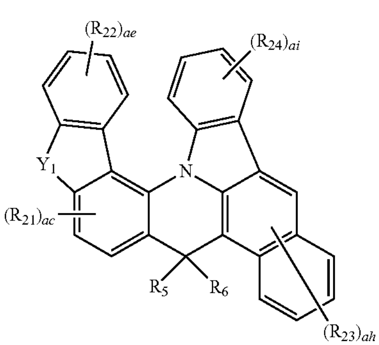
-continued
<Formula 1-3(B-6)>
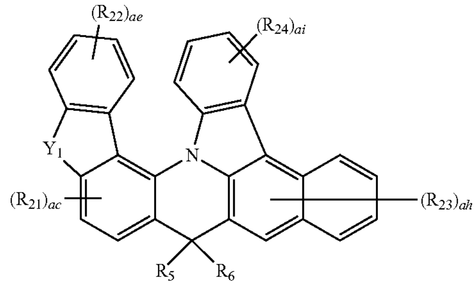
<Formula 1-3(B-7)>
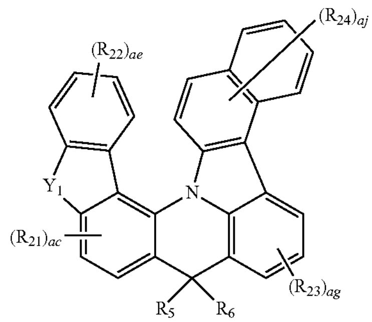
<Formula 1-3(B-8)>
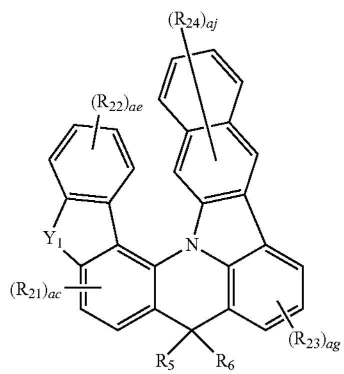
<Formula 1-3(B-9)>
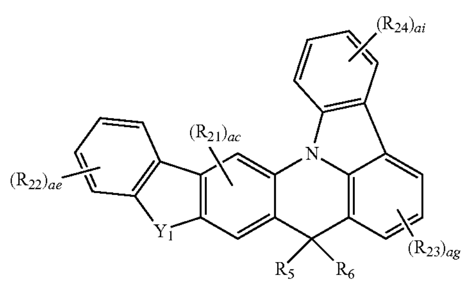
<Formula 1-3(B-10)>
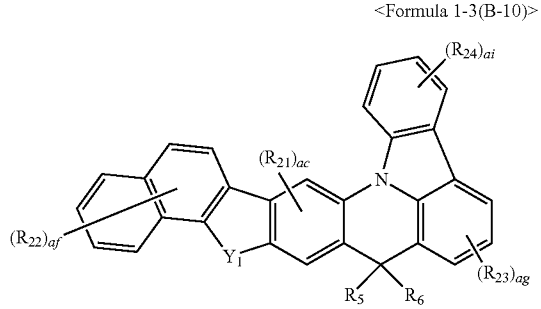

-continued
<Formula 1-3(B-11)>
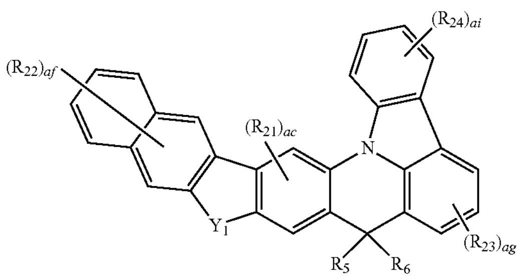
<Formula 1-3(B-12)>
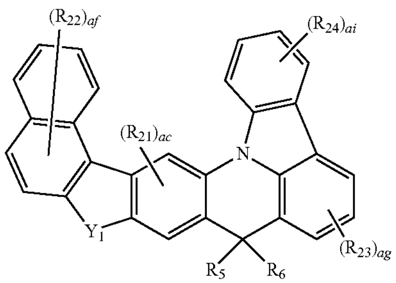
<Formula 1-3(B-13)>
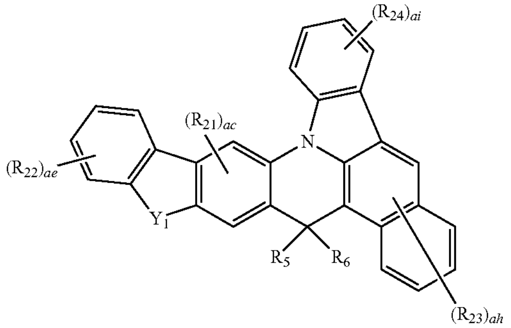
<Formula 1-3(B-14)>
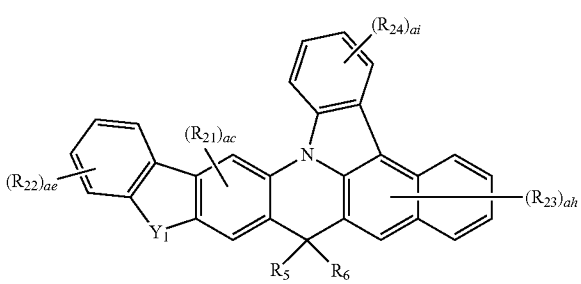
<Formula 1-3(B-15)>
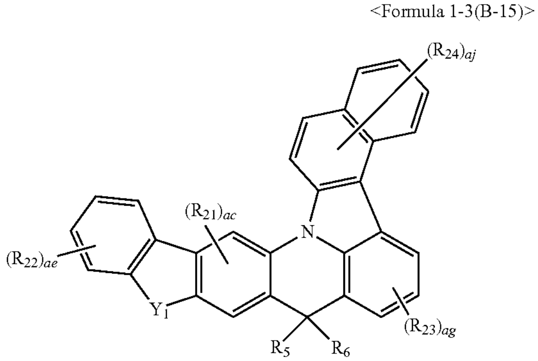
-continued
<Formula 1-3(B-16)>
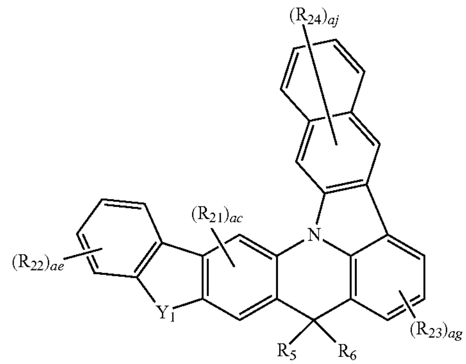
<Formula 1-3(B-17)>
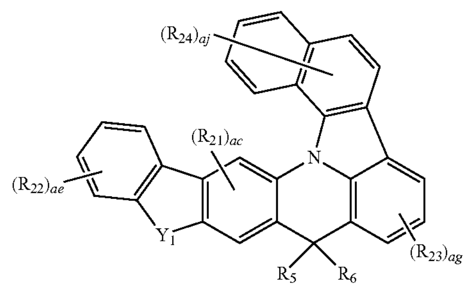
<Formula 1-3(B-18)>
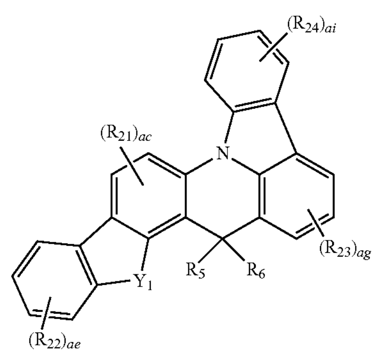
<Formula 1-3(B-19)>
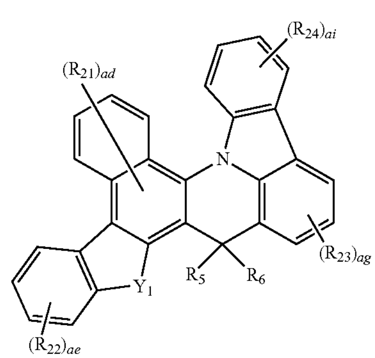

-continued
<Formula 1-3(B-20)>
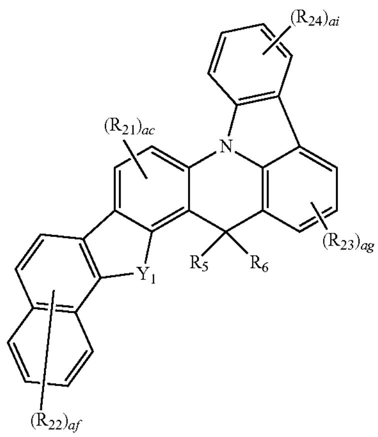
<Formula 1-3(B-21)>
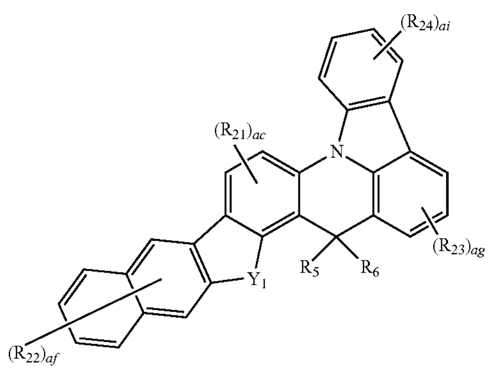
<Formula 1-3(B-22)>
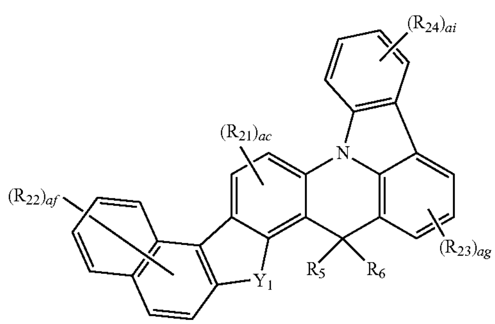
<Formula 1-3(B-23)>
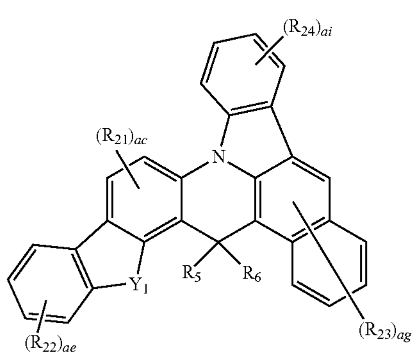
-continued
<Formula 1-3(B-24)>
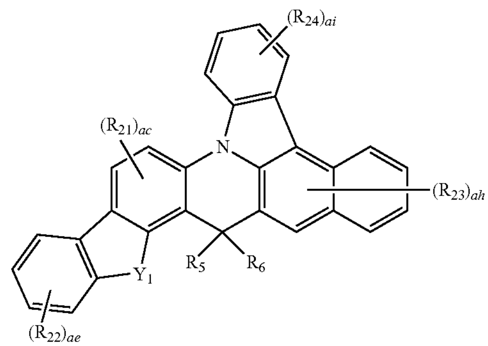
<Formula 1-3(B-25)>
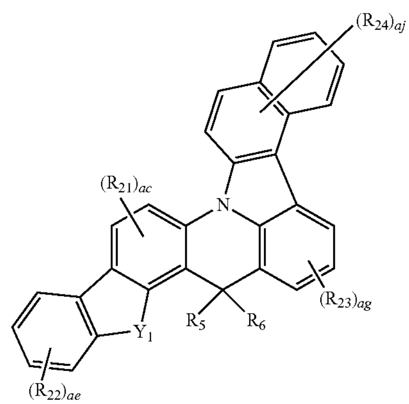
<Formula 1-3(B-26)>
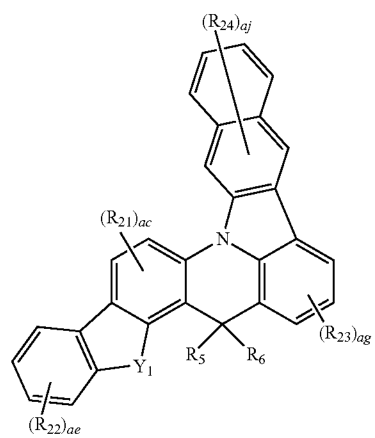
<Formula 1-3(B-27)>
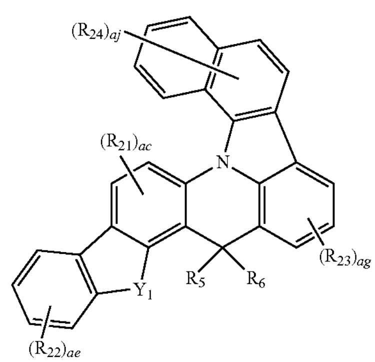

-continued
<Formula 2(1)>
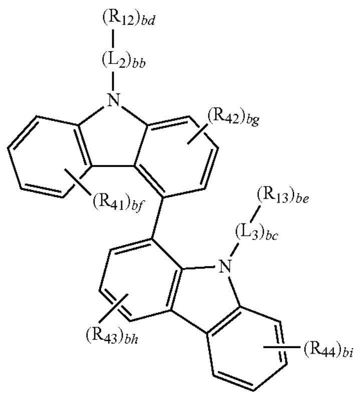
<Formula 2(2)>
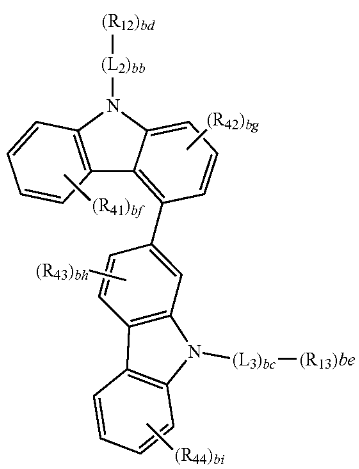
<Formula 2(3)>
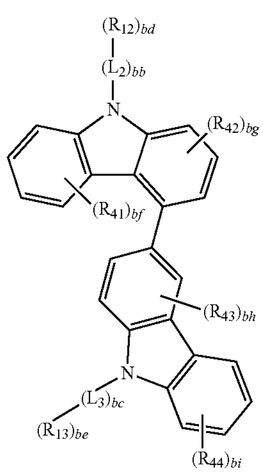
-continued
<Formula 2(4)>
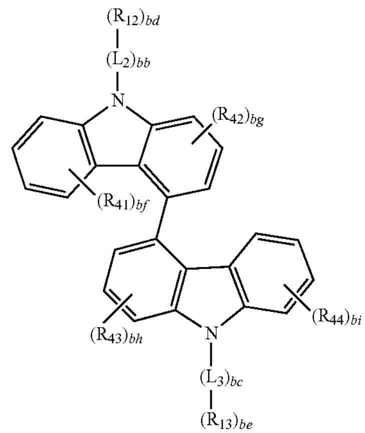
<Formula 2(5)>
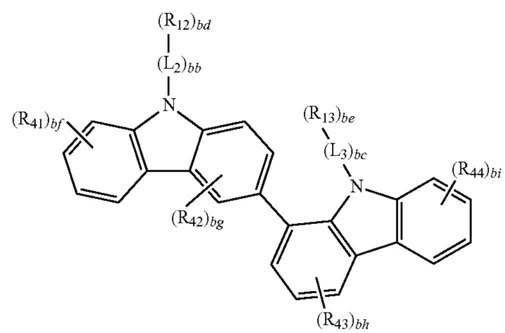
<Formula 2(6)>
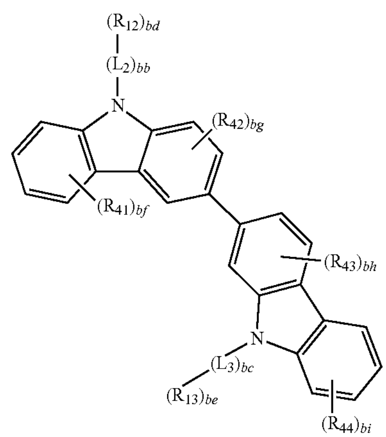
<Formula 2(7)>
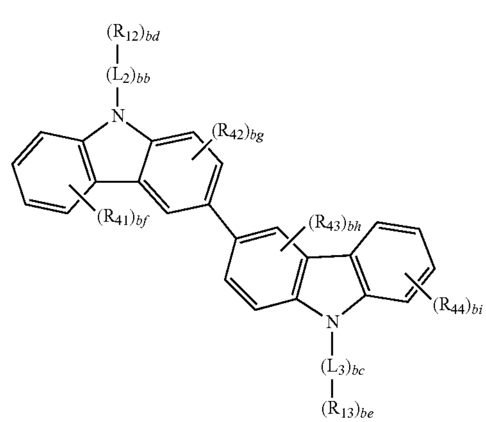

-continued

<Formula 2(8)>

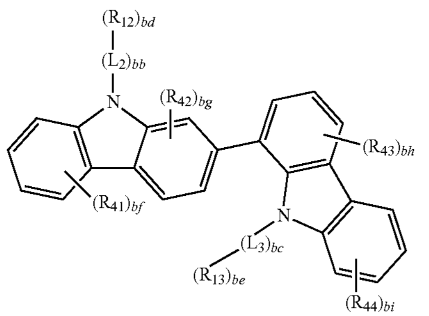

<Formula 2(9)>

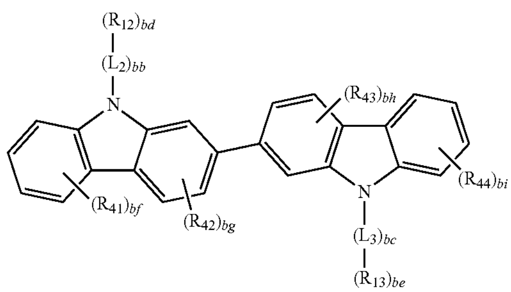

<Formula 2(10)>

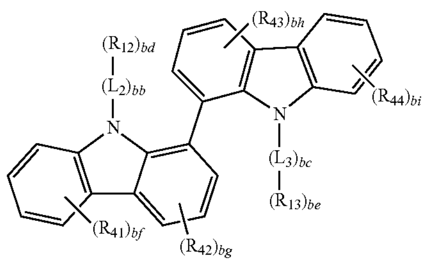

wherein in Formulae 1-1(A-1) to 1-1(A-20), 1-1(B-1) to 1-1(B-20), 1-2(A-1) to 1-2(A-27), 1-2(B-1) to 1-2(B-19), 1-3(A-1) to 1-3(A-29), and 1-3(B-1) to 1-3(B-27), descriptions of $Y_1$, and $R_1$ to $R_6$ are understood by referring to the descriptions as claimed in claim 1, and $R_{21}$ to $R_{24}$ have a same definition as $R_{11}$ to $R_{13}$ and $R_{41}$ to $R_{44}$ in claim 1, ac is 0, 1, or 2, and when ac is 2, 2 $R_{21}$s are identical to or different from each other, ad, ae, ag, and ai are each independently 0, 1, 2, 3, or 4, and when ad, ae, ag, and ai are 2 or more, 2 or more $R_{21}$s, 2 or more $R_{22}$s, 2 or more $R_{23}$s, and 2 or more $R_{24}$s are identical to or different from each other, respectively, af, ah, and aj are each independently 0, 1, 2, 3, 4, 5, or 6, and when af, ah, and aj are 2 or more, 2 or more $R_{22}$s, 2 or more $R_{23}$s and 2 or more $R_{24}$s are identical to or different from each other, respectively, descriptions of $L_3$ and $L_{11}$, $R_{12}$, $R_{13}$, $R_{41}$ to $R_{44}$, and ba to bi in Formulae 2(1) to 2(10) are understood by referring to the descriptions as claimed in claim 1.

16. The organic light-emitting device as claimed in claim 1, wherein the first compound is one of Compounds 1 to 37 below and the second compound is one of Compounds 51 to 68 below:

1

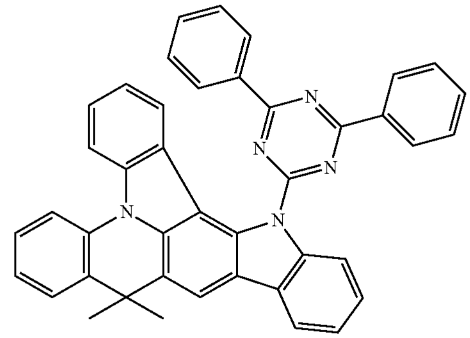

2

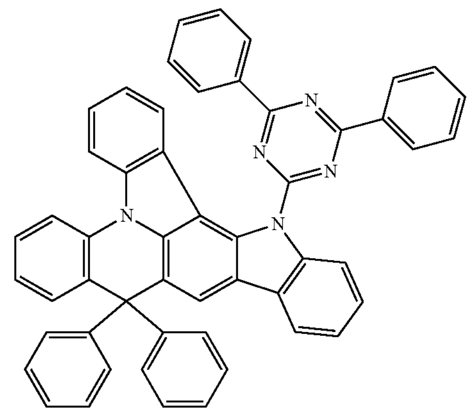

3

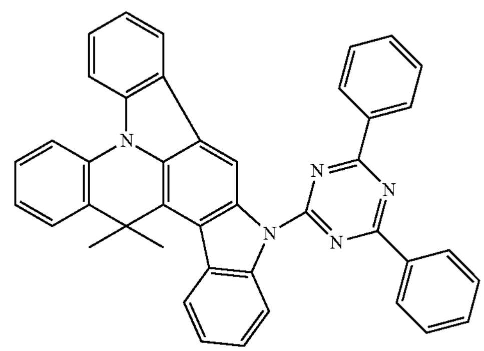

4

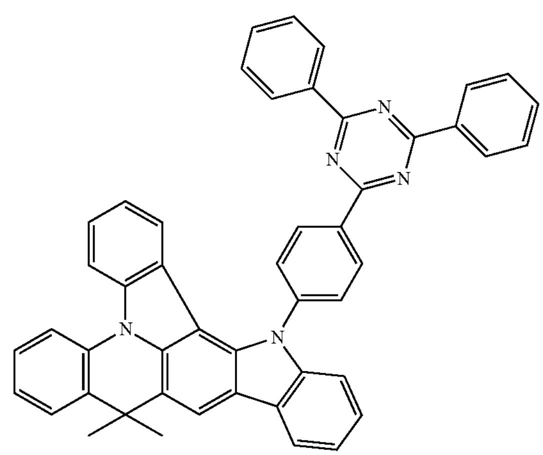

-continued
5
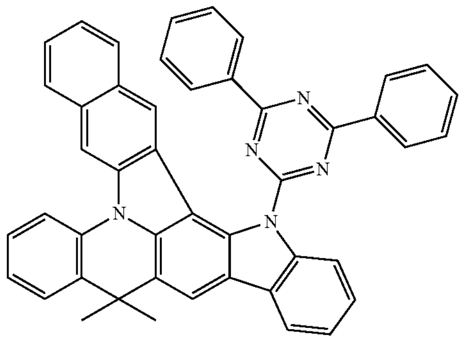
6
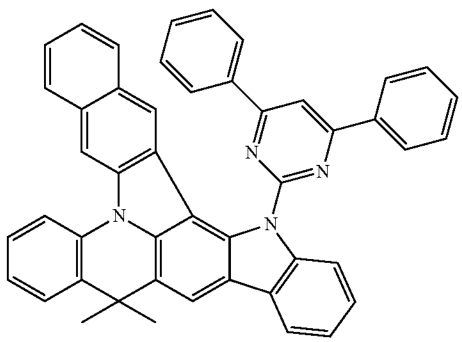
7
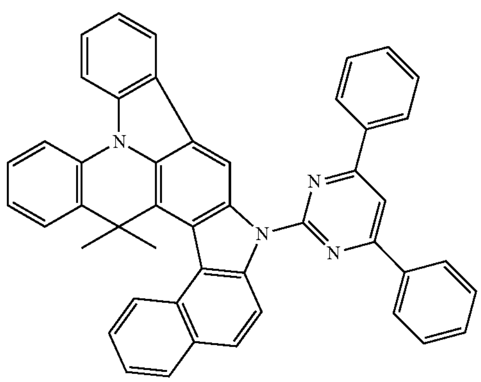
8
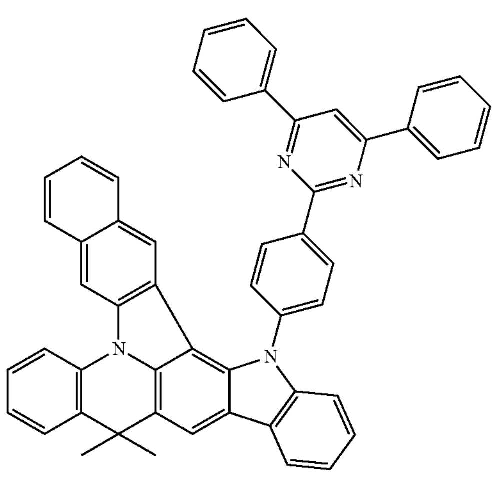
-continued
9
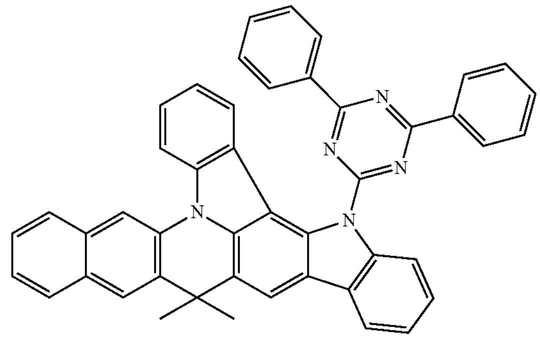
10
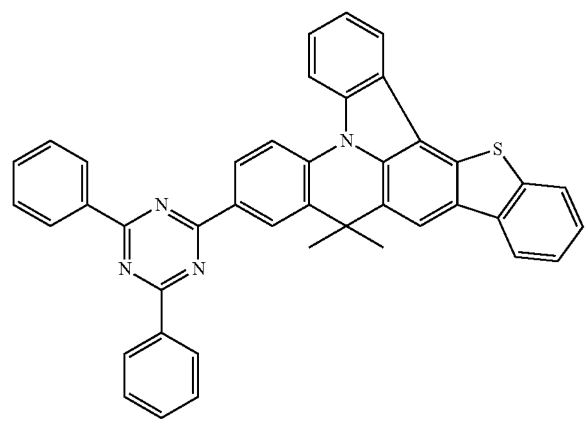
11
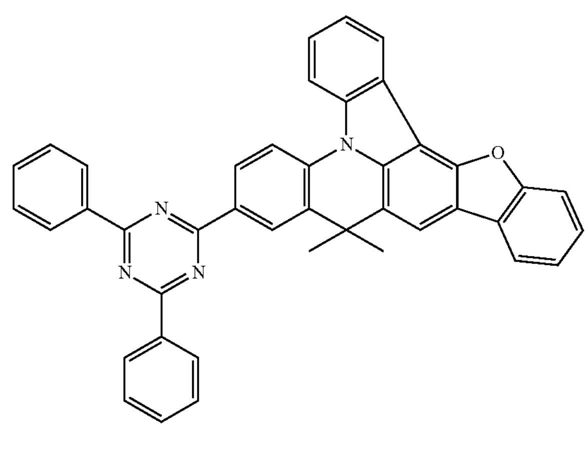

12
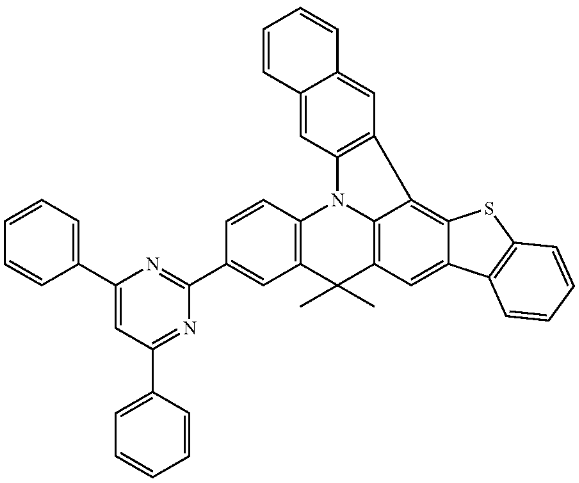
13
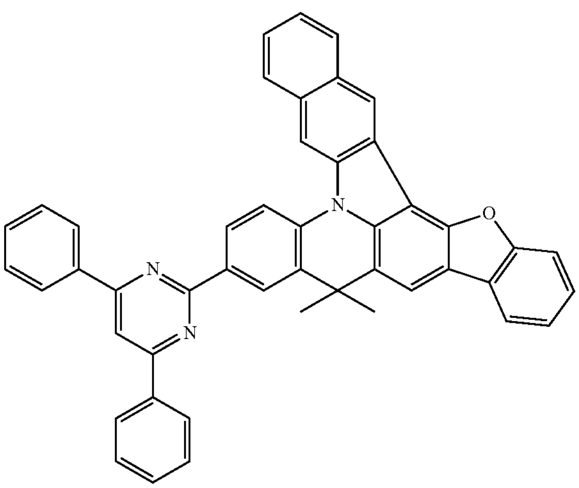
14
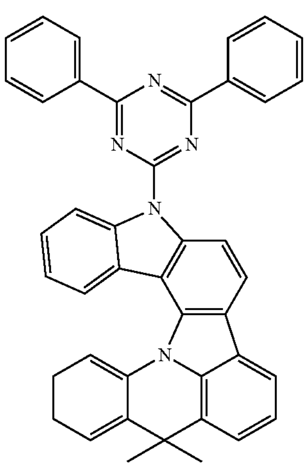
15
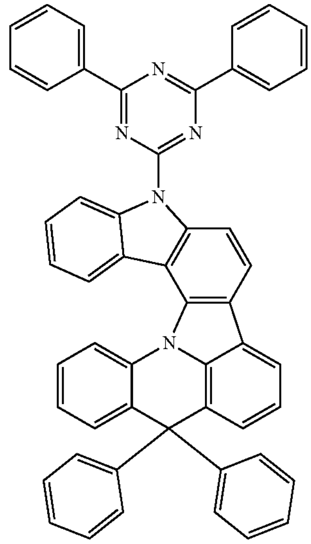
16
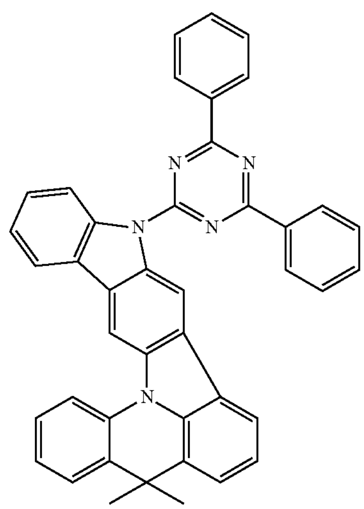
17
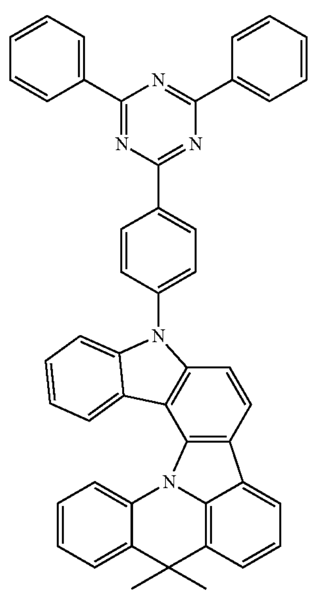

-continued
18
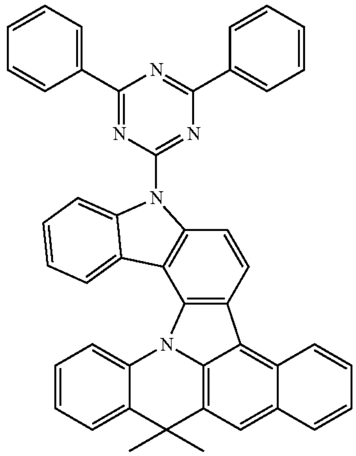
19
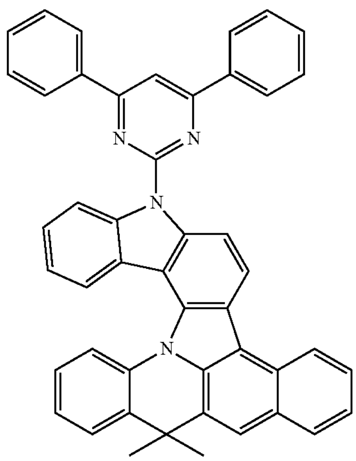
20
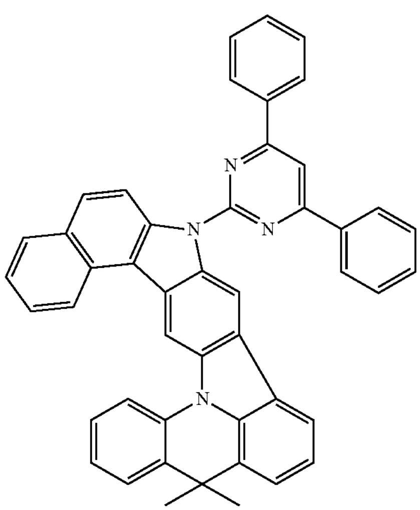
-continued
21
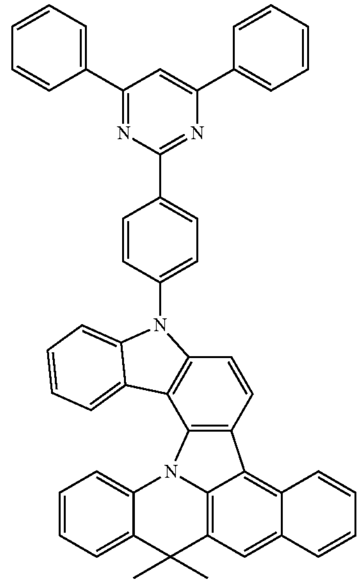
22
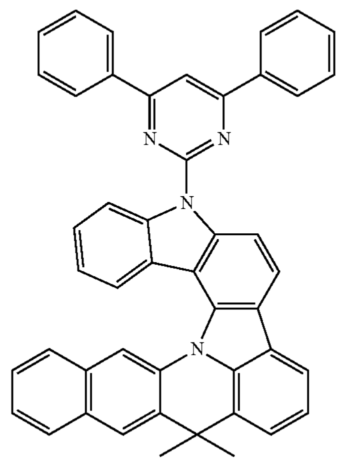
23
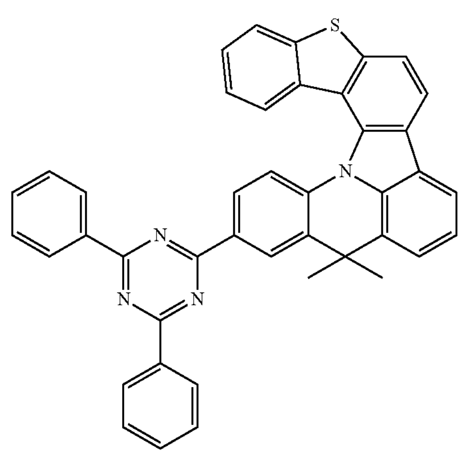

-continued
24
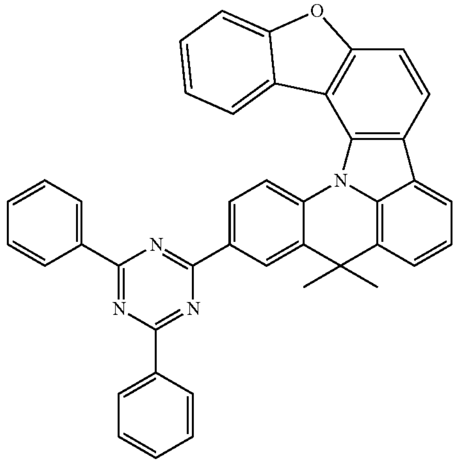
25
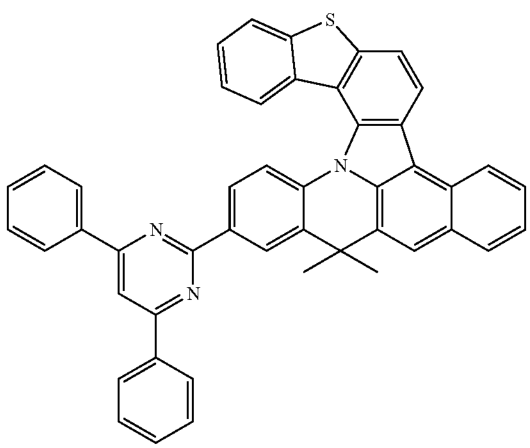
26
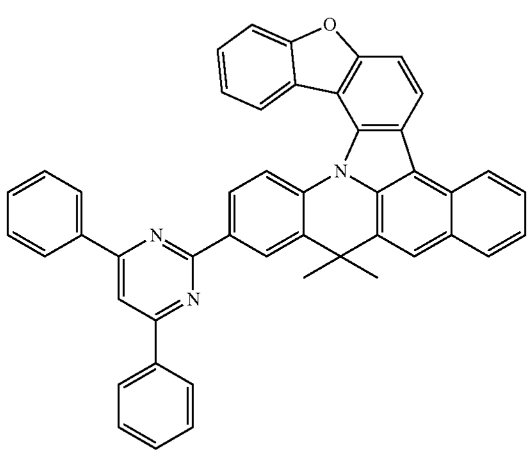
-continued
27
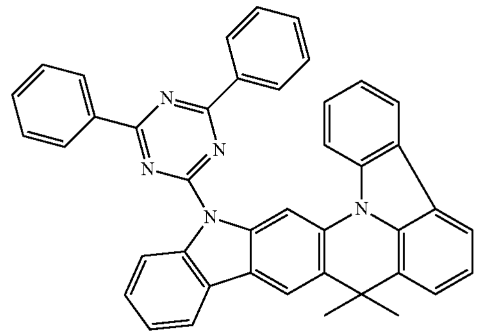
28
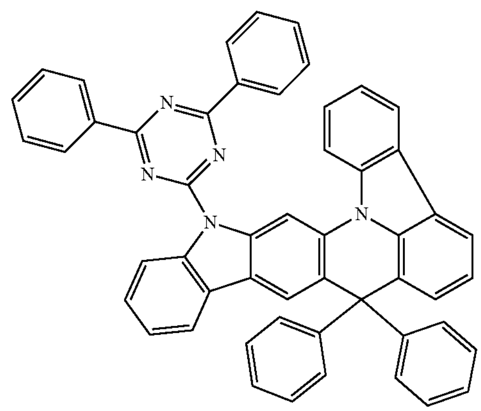
29
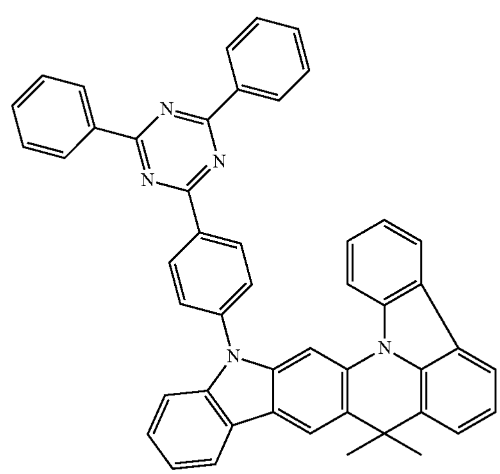

-continued
30
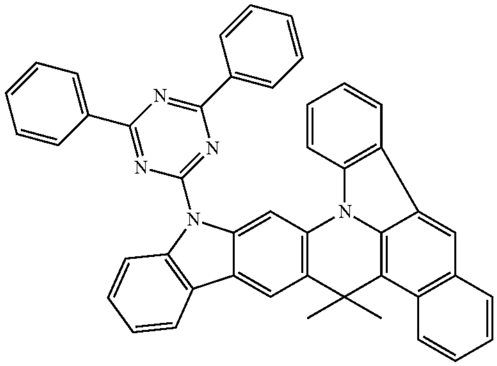
31
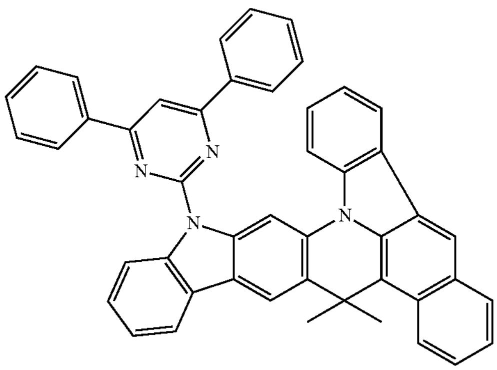
32
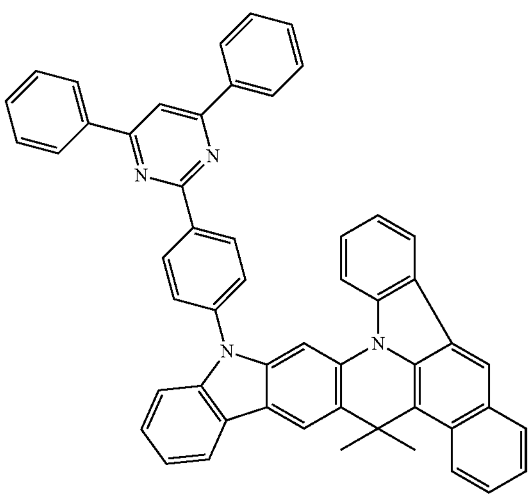
33
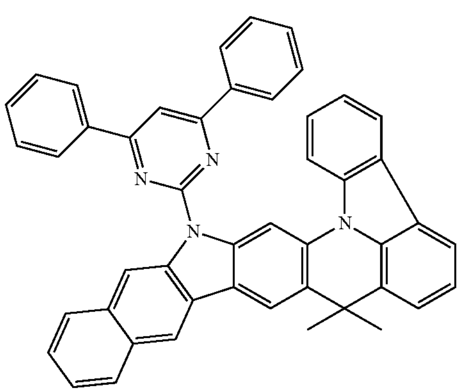
-continued
34
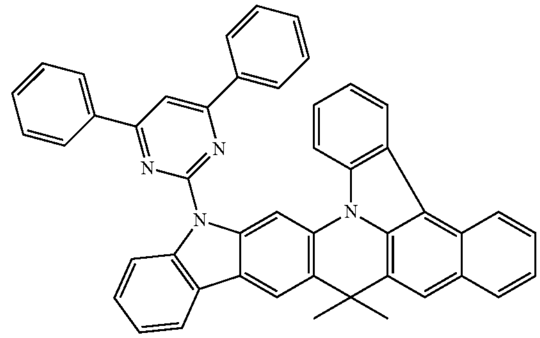
35
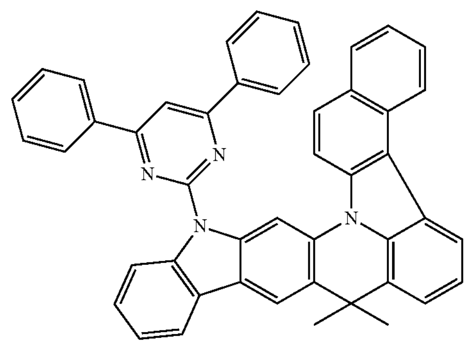
36
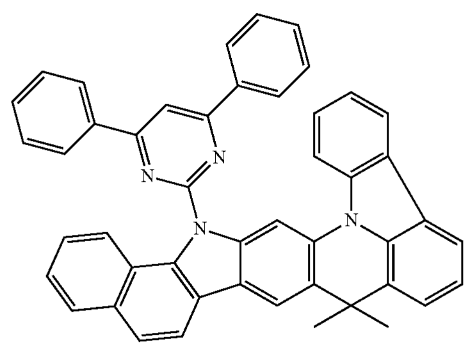
37
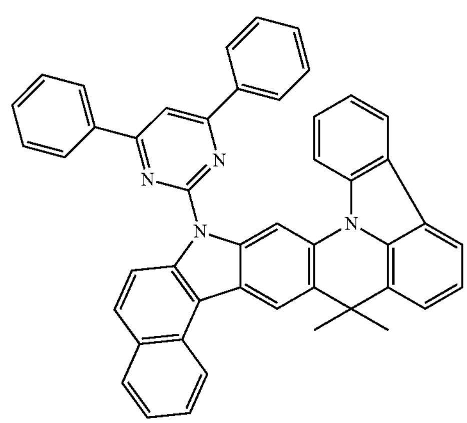

-continued
51
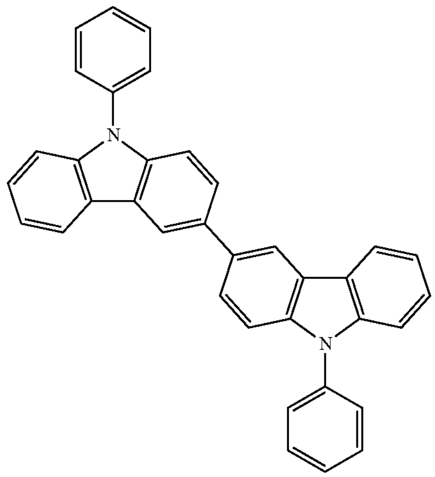
52
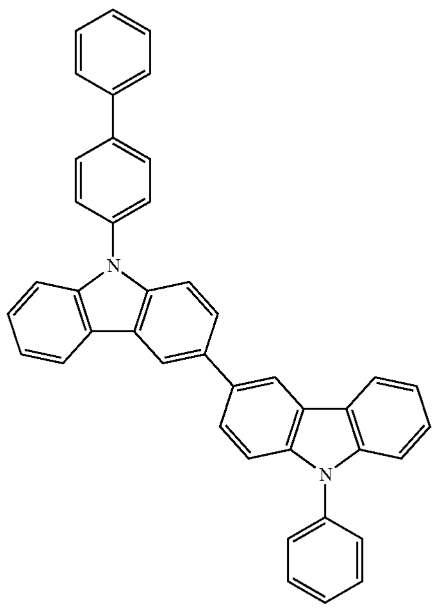
53
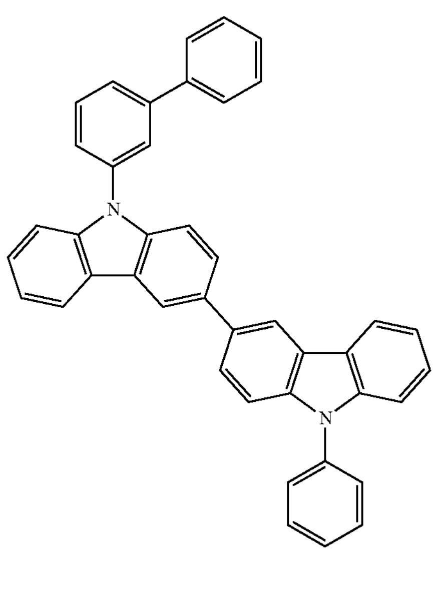
-continued
54
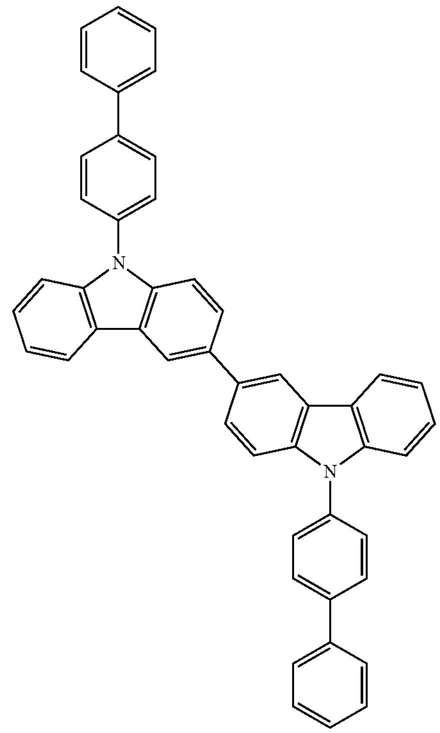
55
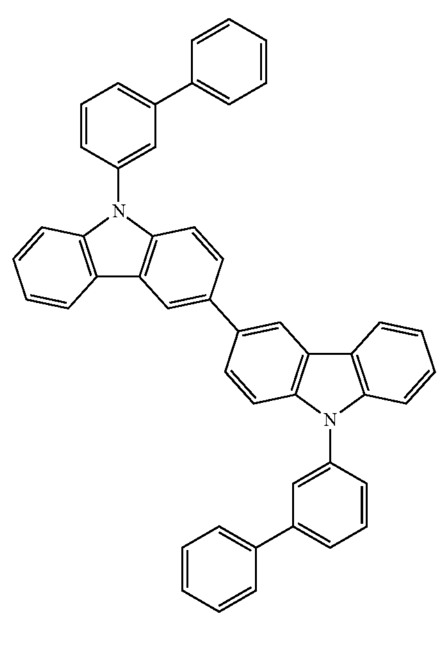

-continued
56
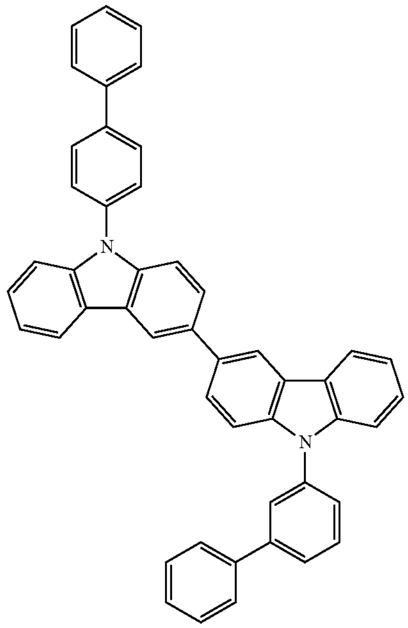
57
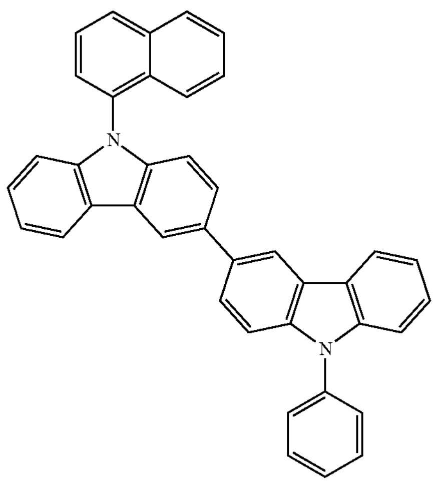
58
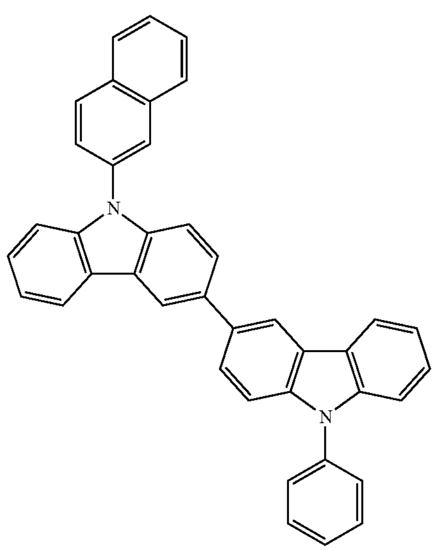
-continued
59
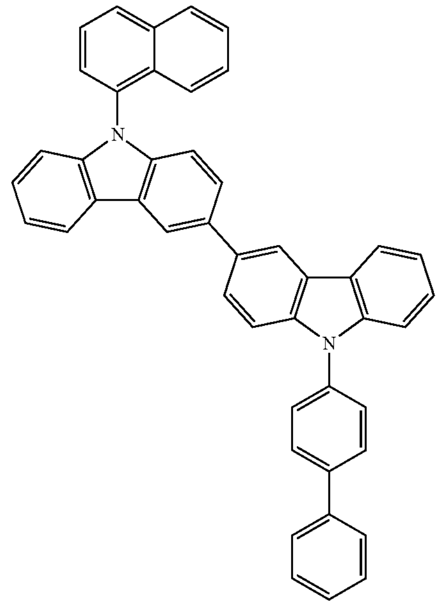
60
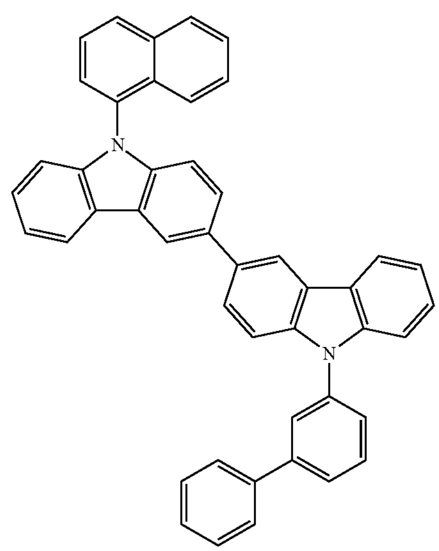

-continued
61
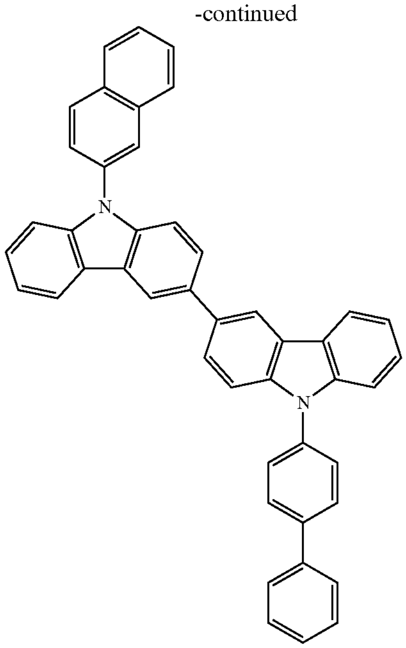
62
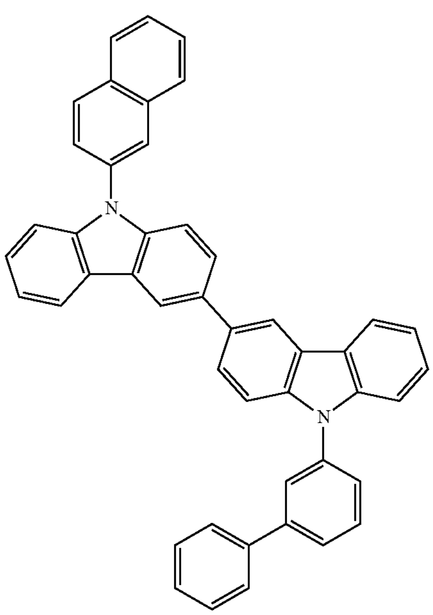
-continued
63
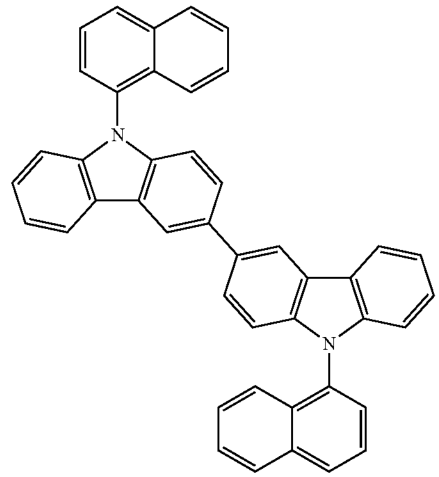
64
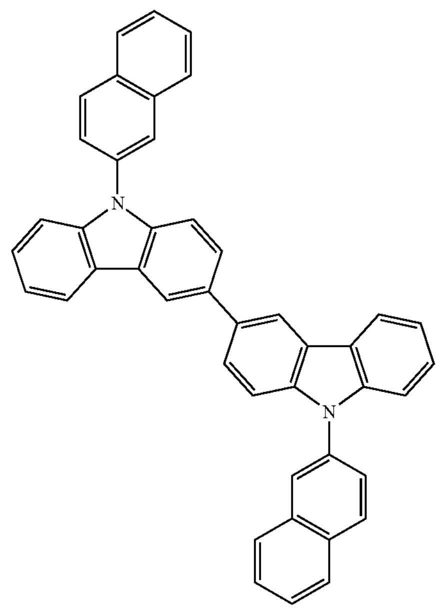
65
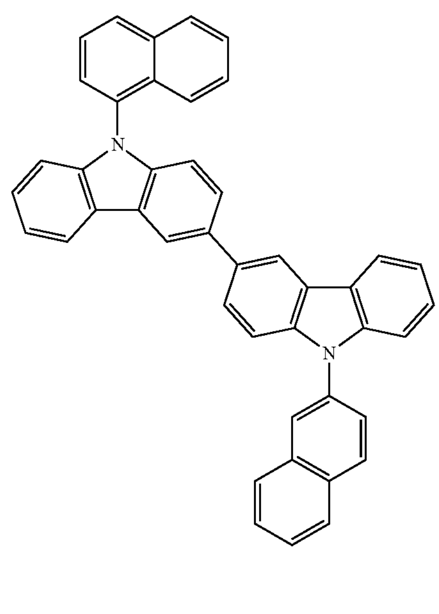

-continued

66

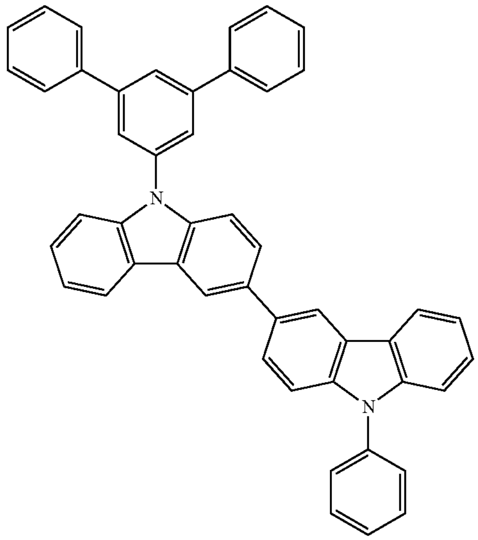

67

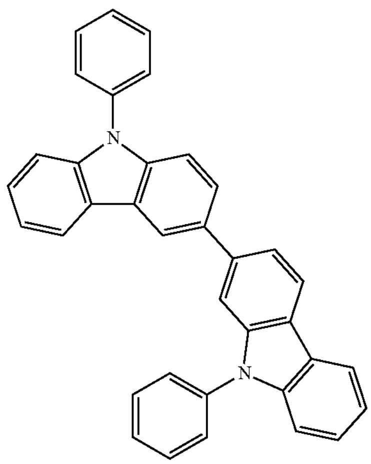

-continued

68

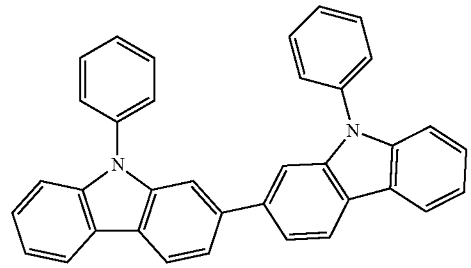

17. The organic light-emitting device as claimed in claim 1, wherein the first electrode is an anode, the second electrode is a cathode, and the organic layer includes i) a hole transport region between the first electrode and the emission layer, the hole transport region including at least one of a hole injection layer, a hole transport layer, a buffer layer, and an electron blocking layer; and ii) an electron transport region between the emission layer and the second electrode, the electron transport region including at least one of a hole blocking layer, an electron transport layer, and an electron injection layer.

18. The organic light-emitting device as claimed in claim 1, wherein the first compound and the second compound are both present in the emission layer.

19. The organic light-emitting device as claimed in claim 1, wherein a weight ratio of the first compound to the second compound is in a range from 10:90 to 90:10.

20. The organic light-emitting device as claimed in claim 18, wherein:

the emission layer includes a host and a dopant, the host includes the first compound and the second compound, and an amount of the host is greater than an amount of the dopant.

* * * * *